United States Patent
Ikegaya et al.

(10) Patent No.: US 10,425,112 B2
(45) Date of Patent: Sep. 24, 2019

(54) DATA PROCESSING DEVICE AND DATA PROCESSING METHOD USING LOW DENSITY PARITY CHECK ENCODING FOR DECREASING SIGNAL-TO-NOISE POWER RATIO

(71) Applicant: Saturn Licensing LLC, New York, NY (US)

(72) Inventors: Ryoji Ikegaya, Kanagawa (JP); Makiko Yamamoto, Tokyo (JP); Yuji Shinohara, Kanagawa (JP)

(73) Assignee: SATURN LICENSING LLC, New York, NY (US)

( * ) Notice: Subject to any disclaimer, the term of this patent is extended or adjusted under 35 U.S.C. 154(b) by 0 days.

(21) Appl. No.: 15/945,361

(22) Filed: Apr. 4, 2018

(65) Prior Publication Data

US 2018/0302107 A1 Oct. 18, 2018

Related U.S. Application Data

(63) Continuation of application No. 15/118,331, filed as application No. PCT/JP2015/053183 on Feb. 5, 2015, now abandoned.

(30) Foreign Application Priority Data

Feb. 19, 2014 (JP) .................... 2014-030014

(51) Int. Cl.
*H03M 13/27* (2006.01)
*H03M 13/00* (2006.01)
(Continued)

(52) U.S. Cl.
CPC ... *H03M 13/2792* (2013.01); *H03M 13/1105* (2013.01); *H03M 13/116* (2013.01);
(Continued)

(58) Field of Classification Search
CPC ........... H03M 13/036; H03M 13/1102; H03M 13/1105; H03M 13/116; H03M 13/1165;
(Continued)

(56) References Cited

U.S. PATENT DOCUMENTS 10,164,661 B2 * 12/2018 Ikegaya ............. H03M 13/036
10,193,571 B2 * 1/2019 Ikegaya ............. H03M 13/116
(Continued)

FOREIGN PATENT DOCUMENTS

| EP | 1 513 258 A2 | 3/2005 |
| JP | 2007-6494 A | 1/2007 |

(Continued)

OTHER PUBLICATIONS

"Digital Video Broadcasting (DVB); Second generation framing structure, channel coding and modulation systems for Broadcasting, Interactive Services, News Gathering and other broadband satellite applications (DVB-S2)," ETSI EN 302 307, V1.2.1, Aug. 2009, 78 pages.

(Continued)

*Primary Examiner* — Kyle Vallecillo
(74) *Attorney, Agent, or Firm* — Oblon, McClelland, Maier & Neustadt, L.L.P.

(57) ABSTRACT

The present technology relates to a data processing device and a data processing method which can ensure high communication quality in data transmission using LDPC codes. In group-wise interleaving, an LDPC code having a code length N of 64800 bits and a coding rate r of 9/15 is interleaved in a unit of a bit group of 360 bits. In group-wise deinterleaving, a sequence of bit groups of the LDPC code which has been subjected to the group-wise interleaving is returned to an original sequence. The present technology can be applied to, for example, a case in which data transmission is performed using LDPC codes.

8 Claims, 132 Drawing Sheets

(51) Int. Cl.
*H03M 13/11* (2006.01)
*H04L 1/00* (2006.01)
*H03M 13/25* (2006.01)
*H04L 27/20* (2006.01)

(52) U.S. Cl.
CPC .... *H03M 13/1165* (2013.01); *H03M 13/1185* (2013.01); *H03M 13/255* (2013.01); *H03M 13/2778* (2013.01); *H03M 13/616* (2013.01); *H04L 1/004* (2013.01); *H04L 1/0057* (2013.01); *H04L 1/0071* (2013.01); *H04L 27/206* (2013.01)

(58) Field of Classification Search
CPC ............ H03M 13/118; H03M 13/152; H03M 13/255; H03M 13/2707; H03M 13/271; H03M 13/2792; H03M 13/2906; H03M 13/356; H03M 13/616; H03M 13/6552; H03M 13/1185; H03M 13/2778; H04L 1/0041; H04L 1/0057; H04L 1/0071; H04L 1/004; H04L 27/206
See application file for complete search history.

(56) References Cited

U.S. PATENT DOCUMENTS

| | | |
|---|---|---|
| 2007/0011570 A1 | 1/2007 | Jeong et al. |
| 2010/0275100 A1 | 10/2010 | Yokokawa et al. |
| 2011/0090948 A1 | 4/2011 | Zhou et al. |
| 2014/0082452 A1 | 3/2014 | Shinohara et al. |
| 2015/0039973 A1* | 2/2015 | Jeong ..................... H03M 13/11 714/776 |
| 2016/0211868 A1* | 7/2016 | Shinohara .......... H03M 13/1165 |
| 2016/0373135 A1* | 12/2016 | Ikegaya .............. H03M 13/036 |
| 2017/0187392 A1* | 6/2017 | Ikegaya .................. H04L 1/004 |

FOREIGN PATENT DOCUMENTS

| | | |
|---|---|---|
| JP | 2011-523318 A | 8/2011 |
| JP | 2013-5124 A | 1/2013 |
| KR | 10-2005-0025085 | 3/2005 |

OTHER PUBLICATIONS

"Digital Video Broadcasting (DVB); Frame structure channel coding and modulation for a second generation digital terrestrial television broadcasting system (DVB-T2)," ETSI EN 302 755, V1.3.1, Apr. 2012, 18 pages.

International Search Report dated Apr. 21, 2015 in PCT/JP2015/053183 filed Feb. 5, 2015.

Notice of Allowance dated Mar. 22, 2017 in Korean Patent Application No. 10-2016-7020548.

Notice of Allowance dated Sep. 10, 2018 in corresponding Korean Patent Application No. 10-2017-7017207, 2 pages.

* cited by examiner

FIG. 3

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

PARITY MATRIX $H_T$

FIG. 13

| Nominal CODING RATE | N=64800 | | | | N=16200 | | | |
|---|---|---|---|---|---|---|---|---|
| | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | — | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | — | — | — | — |

NUMBER OF COLUMNS OF EACH COLUMN WEIGHT

FIG. 21

DISPLAY OF ROW NUMBERS OF PARITY CHECK MATRIX (INFORMATION MATRIX $H_A$) FOR EVERY 360 COLUMNS FROM FIRST COLUMN

ROW NUMBER OF PARITY CHECK MATRIX

```
0   2084 1613 1548 1286 1460 3196 4297 2481 3369 3451 4620 2622
1   122  1516 3448 2880 1407 1847 3799 3529 373  971  4358 3108
2   259  3399 929  2650 864  3996 3833 107  5287 164  3125 2350
3   342  3529
4   4198 2147
5   1880 4836
6   3864 4910
7   243  1542
8   3011 1436
9   2167 2512
10  4606 1003
11  2835 705
12  3426 2365
13  3848 2474
14  1360 1743
0   163  2536
1   2583 1180
2   1542 509
3   4418 1005
4   5212 5117
5   2155 2922
6   347  2696
7   226  4296
8   1560 487
9   3926 1640
10  149  2928
11  2364 563
12  635  688
13  231  1684
14  1129 3894
```

FIRST COLUMN OF $H_A$
361ST COLUMN OF $H_A$
721ST COLUMN OF $H_A$
1081ST COLUMN OF $H_A$ $h_{3,5}$

PARITY CHECK MATRIX INITIAL VALUE TABLE

FIG. 30

```
N=16200, rate=8/15
   5 519 825 1871 2098 2478 2659 2820 3200 3294 3650 3804 3949 4426 4460 4503 456
 8 4590 4949 5219 5662 5738 5905 5911 6160 6404 6637 6708 6737 6814 7263 7412
   81 391 1272 1633 2062 2882 3443 3503 3535 3908 4033 4163 4490 4929 5262 5399 5
 576 5768 5910 6331 6430 6844 6867 7201 7274 7290 7343 7350 7378 7387 7440 7554
   105 975 3421 3480 4120 4444 5957 5971 6119 6617 6761 6810 7067 7353
   6 138 485 1444 1512 2615 2990 3109 5604 6435 6513 6632 6704 7507
   20 858 1051 2539 3049 5162 5308 6158 6391 6604 6744 7071 7195 7238
   1140 5838 6203 6748
   6282 6466 6481 6638
   2346 2592 5436 7487
   2219 3897 5896 7528
   2897 6028 7018
   1285 1863 5324
   3075 6005 6466
   5 6020 7551
   2121 3751 7507
   4027 5488 7542
   2 6012 7011
   3823 5531 5687
   1379 2262 5297
   1882 7498 7551
   3749 4806 7227
   2 2074 6898
   17 616 7482
   9 6823 7480
   5195 5880 7559
```

FIG. 31

```
─ N=16200, rate=10/15 ─
   352 747 894 1437 1688 1807 1883 2119 2159 3321 3400 3543 3588 3770 3821 4384 4
470 4884 5012 5036 5084 5101 5271 5281 5353
   505 915 1156 1269 1518 1650 2153 2256 2344 2465 2509 2867 2875 3007 3254 3519
3687 4331 4439 4532 4940 5011 5076 5113 5367
   268 346 650 919 1260 4389 4653 4721 4838 5054 5157 5162 5275 5362
   220 236 828 1590 1792 3259 3647 4276 4281 4325 4963 4974 5003 5037
   381 737 1099 1409 2364 2955 3228 3341 3473 3985 4257 4730 5173 5242
   88 771 1640 1737 1803 2408 2575 2974 3167 3464 3780 4501 4901 5047
   749 1502 2201 3189
   2873 3245 3427
   2158 2605 3165
   1 3438 3606
   10 3019 5221
   371 2901 2923
   9 3935 4683
   1937 3502 3735
   507 3128 4994
   25 3854 4550
   1178 4737 5366
   2 223 5304
   1146 5175 5197
   1816 2313 3649
   740 1951 3844
   1320 3703 4791
   1754 2905 4058
   7 917 5277
   3048 3954 5396
   4804 4824 5105
   2812 3895 5226
   0 5318 5358
   1483 2324 4826
   2266 4752 5387
```

FIG. 32

```
┌─ N=16200, rate=12/15 ─
│ 3 394 1014 1214 1361 1477 1534 1660 1856 2745 2987 2991 3124 3155
│ 59 136 528 781 803 928 1293 1489 1944 2041 2200 2613 2690 2847
│ 155 245 311 621 1114 1269 1281 1783 1995 2047 2672 2803 2885 3014
│ 79 870 974 1326 1449 1531 2077 2317 2467 2627 2811 3083 3101 3132
│ 4 582 660 902 1048 1482 1697 1744 1928 2628 2699 2728 3045 3104
│ 175 395 429 1027 1061 1068 1154 1168 1175 2147 2359 2376 2613 2682
│ 1388 2241 3118 3148
│ 143 506 2067 3148
│ 1594 2217 2705
│ 398 988 2551
│ 1149 2588 2654
│ 678 2844 3115
│ 1508 1547 1954
│ 1199 1267 1710
│ 2589 3163 3207
│ 1 2583 2974
│ 2766 2897 3166
│ 929 1823 2742
│ 1113 3007 3239
│ 1753 2478 3127
│ 0 509 1811
│ 1672 2646 2984
│ 965 1462 3230
│ 3 1077 2917
│ 1183 1316 1662
│ 968 1593 3239
│ 64 1996 2226
│ 1442 2058 3181
│ 513 973 1058
│ 1263 3185 3229
│ 681 1394 3017
│ 419 2853 3217
│ 3 2404 3175
│ 2417 2792 2854
│ 1879 2940 3235
│ 647 1704 3060
```

FIG. 33

```
─ N=64800, rate=7/15 ─
  7 15 26 69 1439 3712 5756 5792 5911 8456 10579 19462 19782 21709 23214 25142 2
6040 30206 30475 31211 31427 32105 32989 33082 33502 34116 34241 34288 34292 343
18 34373 34390 34465
  83 1159 2271 6500 6807 7823 10344 10700 13367 14162 14242 14352 15015 17301 18
952 20811 24974 25795 27868 28081 33077 33204 33262 33350 33516 33677 33680 3393
0 34090 34250 34290 34377 34398
  25 2281 2995 3321 6006 7482 8428 11489 11601 14011 17409 26210 29945 30675 311
01 31355 31421 31543 31697 32056 32216 33282 33453 33487 33696 34044 34107 34213
 34247 34261 34276 34467 34495
  0 43 87 2530 4485 4595 9951 11212 12270 12344 15566 21335 24699 26580 28518 28
564 28812 29821 30418 31467 31871 32513 32597 33187 33402 33706 33838 33932 3397
7 34084 34283 34440 34473
  81 3344 5540 7711 13308 15400 15885 18265 18632 22209 23657 27736 29158 29701
29845 30409 30654 30855 31420 31604 32519 32901 33267 33444 33525 33712 33878 34
031 34172 34432 34496 34502 34541
  42 50 66 2501 4706 6715 6970 8637 9999 14555 22776 26479 27442 27984 28534 295
87 31309 31783 31907 31927 31934 32313 32369 32830 33364 33434 33553 33654 33725
 33889 33962 34467 34482
  6534 7122 8723 13137 13183 15818 18307 19324 20017 26389 29326 31464 32678 336
66 34217
  50 113 2119 5038 5581 6397 6550 10987 22308 25141 25943 29299 30186 33240 3339
9
  7262 8787 9246 10032 10505 13090 14587 14790 16374 19946 21129 25726 31033 336
60 33675
  5004 5087 5291 7949 9477 11845 12698 14585 15239 17486 18100 18259 21409 21789
 24280
  28 82 3939 5007 6682 10312 12485 14384 21570 25512 26612 26854 30371 31114 326
89
  437 3055 9100 9517 12369 19030 19950 21328 24196 24236 25928 28458 30013 32181
 33560
  18 3590 4832 7053 8919 21149 24256 26543 27266 30747 31839 32671 33089 33571 3
4296
  2678 4569 4667 6551 7639 10057 24276 24563 25818 26592 27879 28028 29444 29873
 34017
  72 77 2874 9092 10041 13669 20676 20778 25566 28470 28888 30338 31772 32143 33
939
  296 2196 7309 11901 14025 15733 16768 23587 25489 30936 31533 33749 34331 3443
1 34507
  6 8144 12490 13275 14140 18706 20251 20644 21441 21938 23703 34190 34444 34463
 34495
  5108 14499 15734 19222 24695 25667 28359 28432 30411 30720 34161 34386 34465 3
4511 34522
  61 89 3042 5524 12128 22505 22700 22919 24454 30526 33437 34114 34188 34490 34
502
  11 83 4668 4856 6361 11633 15342 16393 16958 26613 29136 30917 32559 34346 345
04
  3185 9728 25062
  1643 5531 21573
  2285 6088 24083
```

```
 N=64800, rate=9/15
  113 1557 3316 5680 6241 10407 13404 13947 14040 14353 15522 15698 16079 17363 19374 19543 20530 22833 24339
  271 1361 6236 7006 7307 7333 12768 15441 15568 17923 18341 20321 21502 22023 23938 25351 25590 25876 25910
  73 605 872 4008 6279 7653 10346 10799 12482 12935 13604 15909 16526 19782 20506 22804 23629 24859 25600
  1445 1690 4304 4851 8919 9176 9252 13783 16076 16675 17274 18806 18882 20819 21958 22451 23869 23999 24177
  1290 2337 5661 6371 8996 10102 10941 11360 12242 14918 16808 20571 23374 24046 25045 25060 25662 25783 25913
  28 42 1926 3421 3503 8558 9453 10168 15820 17473 19571 19685 22790 23336 23367 23890 24061 25657 25680
  0 1709 4041 4932 5968 7123 8430 9564 10596 11026 14761 19484 20762 20858 23803 24016 24795 25853 25863
  29 1625 6500 6609 16831 18517 18568 18738 19387 20159 20544 21603 21941 24137 24269 24416 24803 25154 25395
  55 66 871 3700 11426 13221 15001 16367 17601 18380 22796 23488 23938 25476 25635 25678 25807 25857 25872
  1 19 5958 8548 8860 11489 16845 18450 18469 19496 20190 23173 25262 25566 25668 25679 25858 25868 25915
  7520 7690 8855 9183 14654 16695 17121 17854 18083 18428 19633 20470 20736 21720 22335 23273 25083 25293 25403
  48 58 410 1299 3786 10668 18523 18963 20864 22106 22308 23033 23107 23128 23990 24286 24409 24595 25802
  12 51 3894 6539 8276 10885 11644 12777 13427 14039 15954 17078 19053 20537 22863 24521 25087 25463 25838
  3509 8748 9581 11509 15884 16230 17583 19264 20900 21001 21310 22547 22756 22959 24768 24814 25594 25626 25880
  21 29 69 1448 2386 4601 6626 6667 10242 13141 13852 14137 18640 19951 22449 23454 24431 25512 25814
  18 53 7890 9934 10063 16728 19040 19809 20825 21522 21800 23582 24556 25031 25547 25562 25733 25789 25906
  4096 4582 5766 5894 6517 10027 12182 13247 15207 17041 18958 20133 20503 22228 24332 24613 25689 25855 25883
  0 25 819 5539 7076 7536 7695 9532 13668 15051 17683 19665 20253 21996 24136 24890 25758 25784 25807
  34 40 44 4215 6076 7427 7965 8777 11017 15593 19542 22202 22973 23397 23423 24418 24873 25107 25644
  1595 6216 22850 25439
  1562 15172 19517 22362
  7508 12879 24324 24496
  6298 15819 16757 18721
  11173 15175 19966 21195
  59 13505 16941 23793
  2267 4830 12023 20587
  8827 9278 13072 16664
  14419 17463 23398 25348
  6112 16534 20423 22698
  493 8914 21103 24799
```

```
┌─ N=64800, rate=11/15 ─────────────────────────────────────
  696 989 1238 3091 3116 3738 4269 6406 7033 8048 9157 10254 12033 16456 16912
  444 1488 6541 8626 10735 12447 13111 13706 14135 15195 15947 16453 16916 17137 17268
  401 460 992 1145 1576 1678 2238 2320 4280 6770 10027 12486 15363 16714 17157
  1161 3108 3727 4508 5092 5348 5582 7727 11793 12515 12917 13362 14247 16717 17205
  542 1190 6883 7911 8349 8835 10489 11631 14195 15009 15454 15482 16632 17040 17063
  17 487 776 880 5077 6172 9771 11446 12798 16016 16109 16171 17087 17132 17226
  1337 3275 3462 4229 9246 10180 10845 10866 12250 13633 14482 16024 16812 17186 17241
  15 980 2305 3674 5971 8224 11499 11752 11770 12897 14082 14836 15311 16391 17209
  0 3926 5869 8696 9351 9391 11371 14052 14172 14636 14974 16619 16961 17033 17237
  3033 5317 6501 8579 10698 12168 12966 14019 15392 15806 15991 16493 16690 17062 17090
  981 1205 4400 6410 11003 13319 13405 14695 15846 16297 16492 16563 16616 16862 16953
  1725 4276 8869 9588 14062 14466 15474 15548 16300 16432 17042 17050 17060 17175 17273
  1807 5921 9960 10011 14305 14490 14872 15852 16054 16061 16306 16799 16833 17136 17262
  2826 4752 6017 6540 7016 8201 14245 14419 14716 15983 16569 16652 17171 17179 17247
  1662 2516 3345 5229 8086 9686 11456 12210 14595 15808 16011 16421 16825 17112 17195
  2890 4821 5987 7226 8823 9869 12468 14694 15352 15805 16075 16462 17102 17251 17263
  3751 3890 4382 5720 10281 10411 11350 12721 13121 14127 14980 15202 15335 16735 17123
  26 30 2805 5457 6630 7188 7477 7556 11065 16608 16859 16909 16943 17030 17103
  40 4524 5043 5566 9645 10204 10282 11696 13080 14837 15607 16274 17034 17225 17266
  904 3157 6284 7151 7984 11712 12887 13767 15547 16099 16753 16829 17044 17250 17259
  7 311 4876 8334 9249 11267 14072 14559 15003 15235 15686 16331 17177 17238 17253
  4410 8066 8596 9631 10369 11249 12610 15769 16791 16960 17018 17037 17062 17165 17204
  24 8261 9691 10138 11607 12782 12786 13424 13933 15262 15795 16476 17084 17193 17220
  88 11622 14705 15890
  304 2026 2638 6018
  1163 4268 11620 17232
  9701 11785 14463 17260
  4118 10952 12224 17006
  3647 10823 11521 12060
  1717 3753 9199 11642
```

```
─ N=64800, rate=13/15 ─
142 2307 2598 2650 4028 4434 5781 5881 6016 6323 6681 6698 8125
2932 4928 5248 5256 5983 6773 6828 7789 8426 8494 8534 8539 8583
899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5667 6136 6321 6430 6486 7571 8521 8636
3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
```

```
- N=64800, rate=6/15 -
  1606 3402 4961 6751 7132 11516 12300 12482 12592 13342 13764 14123 21576 23946
 24533 25376 25667 26836 31799 34173 35462 36153 36740 37085 37152 37468 37658
  4621 5007 6910 8732 9757 11508 13099 15513 16335 18052 19512 21319 23663 25628
 27208 31333 32219 33003 33239 33447 36200 36473 36938 37201 37283 37495 38642
    16 1094 2020 3080 4194 5098 5631 6877 7889 8237 9804 10067 11017 11366 13136 1
  3354 15379 18934 20199 24522 26172 28666 30386 32714 36390 37015 37162
   700 897 1708 6017 6490 7372 7825 9546 10398 16605 18561 18745 21625 22137 2369
  3 24340 24966 25015 26995 28586 28895 29687 33938 34520 34858 37056 38297
   159 2010 2573 3617 4452 4958 5556 5832 6481 8227 9924 10836 14954 15594 16623
 18065 19249 22394 22677 23408 23731 24076 24776 27007 28222 30343 38371
  3118 3545 4768 4992 5227 6732 8170 9397 10522 11508 15536 20218 21921 28599 29
   445 29758 29968 31014 32027 33685 34378 35867 36323 36728 36870 38335 38623
  1264 4254 6936 9165 9486 9950 10861 11653 13697 13961 15164 15665 18444 19470
 20313 21189 24371 26431 26999 28086 28251 29261 31981 34015 35860 36129 37186
   111 1307 1628 2041 2524 5358 7988 8191 10322 11905 12919 14127 15515 15711 170
 61 19024 21195 22902 23727 24401 24608 25111 25228 27338 35398 37794 38196
   961 3035 7174 7948 13355 13607 14971 16189 18339 18665 18875 19142 20615 21136
 21309 21758 23366 24745 25849 25982 27583 30006 31118 32106 36469 36583 37920
  2990 3549 4273 4808 5707 6021 6509 7456 8240 10044 12262 12660 13085 14750 156
 80 16049 21587 23997 25803 28343 28693 34393 34860 35490 36021 37737 38296
   955 4323 5145 6885 8123 9730 11840 12216 19194 20313 23056 24248 24830 25268 2
  6617 26801 28557 29753 30745 31450 31973 32839 33025 33296 35710 37366 37509
   264 605 4181 4483 5156 7238 8863 10939 11251 12964 16254 17511 20017 22395 228
 18 23261 23422 24064 26329 27723 28186 30434 31956 33971 34372 36764 38123
   520 2562 2794 3528 3860 4402 5676 6963 8655 9018 9783 11933 16336 17193 17320
 19035 20606 23579 23769 24123 24966 27866 32457 34011 34499 36620 37526
 10106 10637 10906 34242
 1856 15100 19378 21848
  943 11191 27806 29411
 4575 6359 13629 19383
 4476 4953 18782 24313
 5441 6381 21840 35943
 9638 9763 12546 30120
 9587 10626 11047 25700
 4088 15298 28768 35047
 2332 6363 8782 28863
 4625 4933 26298 30289
 3541 4918 18257 31746
 1221 25233 26757 34892
 8150 16677 27934 30021
 8500 25016 33043 38070
 7374 10207 16189 35811
  611 18480 20064 38261
 25416 27352 36089 38469
 1667 17614 25839 32776
 4118 12481 21912 37945
 5573 13222 23619 31271
 18271 26251 27182 30587
 14690 26430 26799 34355
```

PROVIDED BY Samsung

FIG. 49

```
 ─ N=64800, rate=8/15 ─
   2768 3039 4059 5856 6245 7013 8157 9341 9802 10470 11521 12063 16610 18361 203
21 24601 27420 28206 29788
   2739 8244 8891 9157 12624 12973 15534 16622 16919 18402 18780 19854 20220 2054
3 22306 25540 27478 27678 28053
   1727 2268 6246 7815 9010 9556 10134 10472 11389 14599 15719 16204 17342 17666
18850 22058 25579 25860 29207
   28 1346 3721 5565 7019 9240 12355 13109 14800 16040 16839 17369 17631 19357 19
473 19891 20381 23911 29683
   869 2450 4386 5316 6160 7107 10362 11132 11271 13149 16397 16532 17113 19894 2
2043 22784 27383 28615 28804
   508 4292 5831 6559 10044 10412 11283 14810 15888 17243 17538 19903 20528 22090
 22652 27235 27384 28208 28485
   389 2248 5840 6043 7000 9054 11075 11760 12217 12565 13587 15403 19422 19528 2
1493 25142 27777 28566 28702
   1015 2002 5764 6777 9346 9629 11039 11153 12690 13068 13990 16841 17702 20021
24106 26300 29332 30081 30196
   1480 3084 3467 4401 4798 5187 7851 11368 12323 14325 14546 16360 17158 18010 2
1333 25612 26556 26906 27005
   6925 8876 12392 14529 15253 15437 19226 19950 20321 23021 23651 24393 24653 26
668 27205 28269 28529 29041 29292
   2547 3404 3538 4666 5126 5468 7695 8799 14732 15072 15881 17410 18971 19609 19
717 22150 24941 27908 29018
   886 1581 2311 5511 7218 9107 10454 12252 13662 15714 15894 17025 18671 24304 2
5316 25556 28489 28977 29212
   1047 1494 1718 4645 5030 6811 7868 8146 10611 15767 17682 18391 22614 23021 23
763 25478 26491 29088 29757
   59 1781 1900 3814 4121 8044 8906 9175 11156 14841 15789 16033 16755 17292 1855
0 19310 22505 29567 29850
   1952 3057 4399 9476 10171 10769 11335 11569 15002 19501 20621 22642 23452 2436
0 25109 25290 25828 28505 29122
   2895 3070 3437 4764 4905 6670 9244 11845 13352 13573 13975 14600 15871 17996 1
9672 20079 20579 25327 27958
   612 1528 2004 4244 4599 4926 5843 7684 10122 10443 12267 14368 18413 19058 229
85 24257 26202 26596 27899
   1361 2195 4146 6708 7158 7538 9138 9998 14862 15359 16076 18925 21401 21573 22
503 24146 24247 27778 29312
   5229 6235 7134 7655 9139 13527 15408 16058 16705 18320 19909 20901 22238 22437
 23654 25131 27550 28247 29903
   697 2035 4887 5275 6909 9166 11805 15338 16381 18403 20425 20688 21547 24590 2
5171 26726 28848 29224 29412
    5379 17329 22659 23062
    11814 14759 22329 22936
    2423 2811 10296 12727
    8460 15260 16769 17290
    14191 14608 29536 30187
    7103 10069 20111 22850
    4285 15413 26448 29069
    548 2137 9189 10928
    4581 7077 23382 23949
```

PROVIDED BY Samsung

PROVIDED BY Samsung

FIG. 52

```
─ N=64800, rate=12/15 ─
584 1472 1621 1867 3338 3568 3723 4185 5126 5889 7737 8632 8940 9725
221 445 590 3779 3835 6939 7743 8280 8448 8491 9367 10042 11242 12917
4662 4837 4900 5029 6449 6687 6751 8684 9936 11681 11811 11886 12089 12909
2418 3018 3647 4210 4473 7447 7502 9490 10067 11092 11139 11256 12201 12383
2591 2947 3349 3406 4417 4519 5176 6672 8498 8863 9201 11294 11376 12184
27 101 197 290 871 1727 3911 5411 6676 8701 9350 10310 10798 12439
1765 1897 2923 3584 3901 4048 6963 7054 7132 9165 10184 10824 11278 12669
2183 3740 4808 5217 5660 6375 6787 8219 8466 9037 10353 10583 11118 12762
73 1594 2146 2715 3501 3572 3639 3725 6959 7187 8406 10120 10507 10691
240 732 1215 2185 2788 2830 3499 3881 4197 4991 6425 7061 9756 10491
831 1568 1828 3424 4319 4516 4639 6018 9702 10203 10417 11240 11519 12458
2024 2970 3048 3638 3676 4152 5284 5779 5926 9426 9945 10873 11787 11837
1049 1218 1651 2328 3493 4363 5750 6483 7613 8782 9738 9803 11744 11937
1193 2060 2289 2964 3478 4592 4756 6709 7162 8231 8326 11140 11908 12243
978 2120 2439 3338 3850 4589 6567 8745 9656 9708 10161 10542 10711 12639
2403 2938 3117 3247 3711 5593 5844 5932 7801 10152 10226 11498 12162 12941
1781 2229 2276 2533 3582 3951 5279 5774 7930 9824 10920 11038 12340 12440
289 384 1980 2230 3464 3873 5958 8656 8942 9006 10175 11425 11745 12530
155 354 1090 1330 2002 2236 3559 3705 4922 5958 6576 8564 9972 12760
303 876 2059 2142 5244 5330 6644 7576 8614 9598 10410 10718 11033 12957
3449 3617 4408 4602 4727 6182 8835 8928 9372 9644 10237 10747 11655 12747
811 2565 2820 8677 8974 9632 11069 11548 11839 12107 12411 12695 12812 12890
972 4123 4943 6385 6449 7339 7477 8379 9177 9359 10074 11709 12552 12831
842 973 1541 2262 2905 5276 6758 7099 7894 8128 8325 8663 8875 10050
474 791 968 3902 4924 4965 5085 5908 6109 6329 7931 9038 9401 10568
1397 4461 4658 5911 6037 7127 7318 8678 8924 9000 9473 9602 10446 12692
1334 7571 12881
1393 1447 7972
633 1257 10597
4843 5102 11056
3294 8015 10513
1108 10374 10546
5353 7824 10111
3398 7674 8569
7719 9478 10503
2997 9418 9581
5777 6519 11229
1966 5214 9899
6 4088 5827
836 9248 9612
483 7229 7548
7865 8289 9804
2915 11098 11900
6180 7096 9481
1431 6786 8924
748 6757 8625
3312 4475 7204
1852 8958 11020
1915 2903 4006
```

PROVIDED BY Samsung

PROVIDED BY Samsung

PROVIDED BY Samsung

FIG. 55

```
— N=16200, rate=6/15 —
  27 430 519 828 1897 1943 2513 2600 2640 3310 3415 4266 5044 5100 5328 5483 592
8 6204 6392 6416 6602 7019 7415 7623 8112 8485 8724 8994 9445 9667
  27 174 186 631 1172 1427 1779 2217 2270 2601 2813 3196 3582 3895 3908 3948 446
3 4955 5120 5809 5988 6478 6604 7096 7673 7735 7795 8925 9613 9670
  27 370 617 852 910 1030 1326 1521 1606 2118 2248 2909 3214 3413 3623 3742 3752
 4317 4694 5300 5687 6039 6100 6232 6491 6621 6860 7304 8542 8634
  990 1753 7635 8540
  933 1415 5666 8745
  27 6567 8707 9216
  2341 8692 9580 9615
  260 1092 5839 6080
  352 3750 4847 7726
  4610 6580 9506 9597
  2512 2974 4814 9348
  1461 4021 5060 7009
  1796 2883 5553 8306
  1249 5422 7057
  3965 6968 9422
  1498 2931 5092
  27 1090 6215
  26 4232 6354                                      PROVIDED BY LGE
```

FIG. 56

```
— N=16200, rate=7/15 —
  553 742 901 1327 1544 2179 2519 3131 3280 3603 3789 3792 4253 5340 5934 5962 6
004 6698 7793 8001 8058 8126 8276 8559
  503 590 598 1185 1266 1336 1806 2473 3021 3356 3490 3680 3936 4501 4659 5891 6
132 6340 6602 7447 8007 8045 8059 8249
  795 831 947 1330 1502 2041 2328 2513 2814 2829 4048 4802 6044 6109 6461 6777 6
800 7099 7126 8095 8428 8519 8556 8610
  601 787 899 1757 2259 2518 2783 2816 2823 2949 3396 4330 4494 4684 4700 4837 4
881 4975 5130 5464 6554 6912 7094 8297
  4229 5628 7917 7992
  1506 3374 4174 5547
  4275 5650 8208 8533
  1504 1747 3433 6345
  3659 6955 7575 7852
  607 3002 4913 6453
  3533 6860 7895 8048
  4094 6366 8314
  2206 4513 5411
  32 3882 5149
  389 3121 4626
  1308 4419 6520
  2092 2373 6849
  1815 3679 7152
  3582 3979 6948
  1049 2135 3754
  2276 4442 6591                                    PROVIDED BY LGE
```

FIG. 57

```
─ N=16200, rate=9/15 ─
 212  255  540  967 1033 1517 1538 3124 3408 3800 4373 4864 4905 5163 5177 6186
 275  660 1351 2211 2876 3063 3433 4088 4273 4544 4618 4632 5548 6101 6111 6136
 279  335  494  865 1662 1681 3414 3775 4252 4595 5272 5471 5796 5907 5986 6008
 345  352 3094 3188 4297 4338 4490 4865 5303 6477
 222  681 1218 3169 3850 4878 4954 5666 6001 6237
 172  512 1536 1559 2179 2227 3334 4049 6464
 716  934 1694 2890 3276 3608 4332 4468 5945
1133 1593 1825 2571 3017 4251 5221 5639 5845
1076 1222 6465
 159 5064 6078
 374 4073 5357
2833 5526 5845
1594 3639 5419
1028 1392 4239
 115  622 2175
 300 1748 6245
2724 3276 5349
1433 6117 6448
 485  663 4955
 711 1132 4315
 177 3266 4339
1171 4841 4982
  33 1584 3692
2820 3485 4249
1716 2428 3125
 250 2275 6338
 108 1719 4961                                            PROVIDED BY LGE
```

FIG. 58

```
―N=16200, rate=11/15―
49 719 784 794 968 2382 2685 2873 2974 2995 3540 4179
272 281 374 1279 2034 2067 2112 3429 3613 3815 3838 4216
206 714 820 1800 1925 2147 2168 2769 2806 3253 3415 4311
62 159 166 605 1496 1711 2652 3016 3347 3517 3654 4113
363 733 1118 2062 2613 2736 3143 3427 3664 4100 4157 4314
57 142 436 983 1364 2105 2113 3074 3639 3835 4164 4242
870 921 950 1212 1861 2128 2707 2993 3730 3968 3983 4227
185 2684 3263
2035 2123 2913
883 2221 3521
1344 1773 4132
438 3178 3650
543 756 1639
1057 2337 2898
171 3298 3929
1626 2960 3503
484 3050 3323
2283 2336 4189
2732 4132 4318
225 2335 3497
600 2246 2658
1240 2790 3020
301 1097 3539
1222 1267 2594
1364 2004 3603
1142 1185 2147
564 1505 2086
697 991 2908
1467 2073 3462
2574 2818 3637
748 2577 2772
1151 1419 4129
164 1238 3401
```

PROVIDED BY LGE

FIG. 59

```
N=16200, rate=13/15
71 334 645 779 786 1124 1131 1267 1379 1554 1766 1798 1939
6 183 364 506 512 922 972 981 1039 1121 1537 1840 2111
6 71 153 204 253 268 781 799 873 1118 1194 1661 2036
6 247 353 581 921 940 1108 1146 1208 1268 1511 1527 1671
6 37 466 548 747 1142 1203 1271 1512 1516 1837 1904 2125
6 171 863 953 1025 1244 1378 1396 1723 1783 1816 1914 2121
1268 1360 1647 1769
6 458 1231 1414
183 535 1244 1277
107 360 498 1456
6 2007 2059 2120
1480 1523 1670 1927
139 573 711 1790
6 1541 1889 2023
6 374 957 1174
287 423 872 1285
6 1809 1918
65 818 1396
590 766 2107
192 814 1843
775 1163 1256
42 735 1415
334 1008 2055
109 596 1785
406 534 1852
684 719 1543
401 465 1040
112 392 621
82 897 1950
887 1962 2125
793 1088 2159
723 919 1139
610 839 1302
218 1080 1816
627 1646 1749
496 1165 1741
916 1055 1662
182 722 945
5 595 1674
```

PROVIDED BY LGE

FIG. 60

```
┌─ N=64800, rate=10/15 ─────────────────────────────────────────────
│   316 1271 3692 9495 12147 12849 14928 16671 16938 17864 19108 20502 21097 21115
│   2341 2559 2643 2816 2865 5137 5331 7000 7523 8023 10439 10797 13208 15041
│   5556 6858 7677 10162 10207 11349 12321 12398 14787 15743 15859 15952 19313 20879
│   349 573 910 2702 3654 6214 9246 9353 10638 11772 14447 14953 16620 19888
│   204 1390 2887 3835 6230 6533 7443 7876 9299 10291 10896 13960 18287 20086
│   541 2429 2838 7144 8523 8637 10490 10585 11074 12074 15762 16812 17900 18548
│   733 1659 3838 5323 5805 7882 9429 10682 13697 16909 18846 19587 19592 20904
│   1134 2136 4631 4653 4718 5197 10410 11666 14996 15305 16048 17417 18960 20303
│   734 1001 1283 4959 10016 10176 10973 11578 12051 15550 15915 19022 19430 20121
│   745 4057 5855 9885 10594 10989 13156 13219 13351 13631 13685 14577 17713 20386
│   968 1446 2130 2502 3092 3787 5323 8104 8418 9998 11681 13972 17747 17929
│   3020 3857 5275 5786 6319 8608 11943 14062 17144 17752 18001 18453 19311 21414
│   709 747 1038 2181 5320 8292 10584 10859 13964 15009 15277 16953 20675 21509
│   1663 3247 5003 5760 7186 7360 10346 14211 14717 14792 15155 16128 17355 17970
│   516 578 1914 6147 9419 11148 11434 13289 13325 13332 19106 19257 20962 21556
│   5009 5632 6531 9430 9886 10621 11765 13969 16178 16413 18110 18249 20616 20759
│   457 2686 3318 4608 5620 5858 6480 7430 9602 12691 14664 18777 20152 20848
│   33 2877 5334 6851 7907 8654 10688 15401 16123 17942 17969 18747 18931 20224
│   87 897 7636 8063 11425 12288 12672 14199 16435 17615 17950 18953 19667 20281
│   1042 1832 2545 2719 2947 3672 3700 6249 6398 6833 11114 14283 17694 20477
│   326 488 2662 2880 3009 5357 6587 8882 11604 14374 18781 19051 19057 20508
│   854 1294 2436 2852 4903 6466 7761 9072 9564 10321 13638 15658 16946 19119
│   194 899 1711 2408 2786 5391 7108 8079 8716 11453 17303 19484 20989 21389
│   1631 3121 3994 5005 7810 8850 10315 10589 13407 17162 18624 18758 19311 20301
│   736 2424 4792 5600 6370 10061 16053 16775 18600
│   1254 8163 8876 9157 12141 14587 16545 17175 18191
│   388 6641 8974 10607 10716 14477 16825 17191 18400
│   5578 6082 6824 7360 7745 8655 11402 11665 12428
│   3603 8729 13463 14698 15210 19112 19550 20727 21052
│   48 1732 3805 5158 15442 16909 19854 21071 21579
│   11707 14014 21531
│   1542 4133 4925
│   10083 13505 21198
│   14300 15765 16752
│   778 1237 11215
│   1325 3199 14534
│   2007 14510 20599
│   1996 5881 16429
│   5111 15018 15980
│   4989 10681 12810
│   3763 10715 16515
│   2259 10080 15642
│   9032 11319 21305
│   3915 15213 20884
│   11150 15022 20201
│   1147 6749 19625
│   12139 12939 18870
│   3840 4634 10244
```

PROVIDED BY LGE

PROVIDED BY LGE

FIG. 63

```
┌─ N=64800, rate=9/15 ─────────────────────────────────────────────
   218  592 1116 2229 2989 3217 3922 4338 5063 7196 8516 9168 10774 12013 12355 12
485 13238 13315 13365 15102 16325 16379 17222 17866 19091 21096 21677 22183 2288
4 23023 23059 23295 23694 24888 25755
   142  556  754 1359 1813 2861 3733 4015 4103 4137 4590 5431 7423 8429 9924 10043
11764 12672 13476 14250 15182 15575 15835 16093 16893 17014 17993 18328 19778 20
782 22151 22347 23841 25434 25647
     8 1287 1813 2927 4094 4691 5599 7087 7503 8777 9100 11299 11310 12283 12638 12
774 12983 13161 13750 13899 14093 14581 15066 18310 19537 21141 21530 21920 2272
6 23080 23250 23588 23749 25129 25493
   170 2231 2273 4646 5468 5912 7624 7804 8019 8715 9157 10173 10978 13144 14209
14508 15118 15510 16699 17285 18189 18842 19164 19242 19568 20657 20745 22599 22
754 24105 24136 24644 25091 25259 25476
   611 3593 5689 5980 6779 7830 8200 8420 8701 10161 10601 10863 11251 11540 1230
6 12364 12396 13247 13256 13454 13683 13810 13912 14254 14665 15530 16749 18022
21173 21359 21564 21860 23562 23936 25873
   225  490 1197 1357 2322 3436 3759 5720 5886 10068 10994 12476 13186 13403 13774
 14376 14505 14946 15555 16515 17068 17581 18317 19533 19993 20376 20597 21656 2
3103 23230 23860 24883 25100 25576 25835
   910 1479 3144 3600 4255 5851 6277 6587 7337 8562 9592 11428 11534 12127 12452
13565 14336 15311 15470 16915 17520 18194 18324 18385 18575 19627 20126 20219 21
108 21294 22218 22466 22541 23614 24218
   120 6693 11582 11756 14656 16088 24473 24811
   990 3571 8517 10259 14187 15732 17864 23697
  2366 5536 8236 14281 16178 19247 25431 25641
  9056 10221 16011 17287 22095 22694 23634 24541
  1138 3241 4444 11816 14651 17585 20317 24036
  3166 5421 7828 11855 13148 16492 22830 25181
  3644 5858 7555 12551 14018 15716 20181 20877
  3405 7546 10508 12355 12455 16386 22014 22846
  5305 12878 13734 15949 16747 17458 18068 23552
  2717 4365 5192 9626 11487 17811 24163 25201
  4705 5787 12649 14298 15570 19876 23193 24688
  3394 4960 9629 11445 19031 23128 23563 25774
  1648 4768 8372 11388 11448 13373 14773 15814
  4043 10049 13225 14765 18206 19663 20316 25534
  8820 15709 17949 18383 18624 19746 23307 25346
   221 10075 12281 13163 16430 18834 20637 21646
   264  296 2837 4856 9223 10324 16336 18557
  4532 7935 12782 16508 17549 21310 23929 24846
  5143 5666 6753 8248 12394 13840 14926 15611
  4289 9811 10826 11025 11425 15567 20767 25246
  1826 4386 6372 6698 7467 20479 23360 24751
   740 1873 3727 8628 11803 21326 24482 25134
   315  664 2026 10700 12624 21194 24678 24802
  8431 9604 11559 12120 19557 21047 21161 21584
  6275 8787 9830 10580 12795 15287 20794 21063
  3780 7735 9717 10410 14334 19217 24239 24857
  4214 9796 10451 17817 18072 18697 19265 24591
  2497 5485 6337 10065 13070 14240 20115 23668
```

PROVIDED BY NERC

PROVIDED BY NERC

PROVIDED BY NERC

FIG. 66

N=16200, rate=5/15

```
69   244  706  5145 5994 6066 6763 6815 8509
257  541  618  3933 6188 7048 7484 8424 9104
69   500  536  1494 1669 7075 7553 8202 10305
11   189  340  2103 3199 6775 7471 7918 10530
333  400  434  1806 3264 5693 8534 9274 10344
111  129  260  3562 3676 3680 3809 5169 7308 8280
100  303  342  3133 3952 4226 4713 5053 5717 9931
83   87   374  828  2460 4943 6311 8657 9272 9571
114  166  325  2680 4698 7703 7886 8791 9978 10684
281  542  549  1671 3178 3955 7153 7432 9052 10219
202  271  608  3860 4173 4203 5169 6871 8113 9757
16   359  419  3333 4198 4737 6170 7987 9573 10095
235  244  584  4640 5007 5563 6029 6816 7678 9968
123  449  646  2460 3845 4161 6610 7245 7686 8651
136  231  468  835  2622 3292 5158 5294 6584 9926
3085 4683 8191 9027 9922 9928 10550
2462 3185 3976 4091 8089 8772 9342
```

PROVIDED BY CRC/ETRI

FIG. 67

```
┌─ N=64800, rate=5/15 ─────────────────────────────────────────
  221 1011 1218 4299 7143 8728 11072 15533 17356 33909 36833
  360 1210 1375 2313 3493 16822 21373 23588 23656 26267 34098
  544 1347 1433 2457 9186 10945 13583 14858 19195 34606 37441
  37 596 715 4134 8091 12106 24307 24658 34108 40591 42883
  235 398 1204 2075 6742 11670 13512 23231 24784 27915 34752
  204 873 890 13550 16570 19774 34012 35249 37655 39885 42890
  221 371 514 11984 14972 15690 28827 29069 30531 31018 43121
  280 549 1435 1889 3310 10234 11575 15243 20748 30469 36005
  223 666 1248 13304 14433 14732 18943 21248 23127 38529 39272
  370 819 1065 9461 10319 25294 31958 33542 37458 39681 40039
  585 870 1028 5087 5216 12228 16216 16381 16937 27132 27893
  164 167 1210 7386 11151 20413 22713 23134 24188 36771 38992
  298 511 809 4620 7347 8873 19602 24162 29198 34304 41145
  105 830 1212 2415 14759 15440 16361 16748 22123 32684 42575
  659 665 668 6458 22130 25972 30697 31074 32048 36078 37129
  91 808 953 8015 8988 13492 13987 15979 28355 34509 39698
  594 983 1265 3028 4029 9366 11069 11512 27066 40939 41639
  506 740 1321 1484 10747 16376 17384 20285 31502 38925 42606
  338 356 975 2022 3578 18689 18772 19826 22914 24733 27431
  709 1264 1366 4617 8893 25226 27800 29080 30277 37781 39644
  840 1179 1338 2973 3541 7043 12712 15005 17149 19910 36795
  1009 1267 1380 4919 12679 22889 29638 30987 34637 36232 37284
  466 913 1247 1646 3049 5924 9014 20539 34546 35029 36540
  374 697 984 1654 5870 10883 11684 20294 28888 31612 34031
  117 240 635 5093 8673 11323 12456 14145 21397 39619 42559
  122 1265 1427 13528 14282 15241 16852 17227 34723 36836 39791
  595 1180 1310 6952 17916 24725 24971 27243 29555 32138 35987
  140 470 1017 13222 13253 18462 20806 21117 28673 31598 37235
  7 710 1072 8014 10804 13303 14292 16690 26676 36443 41966
  48 189 759 12438 14523 16388 23178 27315 28656 29111 29694
  285 387 410 4294 4467 5949 25386 27898 34880 41169 42614
  474 545 1320 10506 13186 18126 27110 31498 35353 36193 37322
  1075 1130 1424 11390 13312 14161 16927 25071 25844 34287 38151
  161 396 427 5944 17281 22201 25218 30143 35566 38261 42513
  233 247 694 1446 3180 3507 9069 20764 21940 33422 39358
  271 508 1013 6271 21760 21858 24887 29808 31099 35475 39924
  8 674 1329 3135 5110 14460 28108 28388 31043 31137 31863
  1035 1222 1409 8287 16083 24450 24888 29356 30329 37834 39684
  391 1090 1128 1866 4095 10643 13121 14499 20056 22195 30593
  55 161 1402 6289 6837 8791 17937 21425 26602 30461 37241
  110 377 1228 6875 13253 17032 19008 23274 32285 33452 41630
  360 638 1355 5933 12593 13533 23377 23881 24586 26040 41663
  535 1240 1333 3354 10860 16032 32573 34908 34957 39255 40759
  526 936 1321 7992 10260 18527 28248 29356 32636 34666 35552
  336 785 875 7530 13062 13075 18925 27963 28703 33688 36502
  36 591 1062 1518 3821 7048 11197 17781 19408 22731 24783
  214 1145 1223 1546 9475 11170 16061 21273 38688 40051 42479
  1136 1226 1423 20227 22573 24951 26462 29586 34915 42441 43048  PROVIDED BY CRC/ETRI
  26 276 1425 6048 7224 7917 8747 27559 28515 35002 37649
```

PROVIDED BY CRC/ETRI

FIG. 69

```
─ N=64800, rate=6/15 ─────────────────────────────────────
   71  276  856 6867 12964 17373 18159 26420 28460 28477
  257  322  672 2533 5316 6578 9037 10231 13845 36497
  233  765  904 1366 3675 13145 15409 18620 23910 30825
  100  224  405 12776 13868 14787 16781 23686 29099 31419
   23  496  891 2512 12589 14074 19392 20339 27658 28684
  473  712  759 1283 4374 9898 12551 13814 24242 32728
  511  567  815 11823 17106 17900 19338 22315 24396 26448
   45  733  836 1923 3727 17468 25746 33806 35995 36657
   17  487  675 2670 3922 5145 18009 23993 31073 36624
   72  751  773 1937 17324 28512 30666 30934 31016 31849
  257  343  594 14041 19141 24914 26864 28809 32055 34753
   99  241  491 2650 9670 17433 17785 18988 22235 30742
  198  299  655 6737 8304 10917 16092 19387 20755 37690
  351  916  926 16151 21708 23216 30321 33579 34052 37949
   54  332  373 2010 3332 5623 16301 34337 36451 37861
  139  257 1068 11090 20289 29694 29732 32640 35133 36404
  457  885  968 2115 4956 5422 5949 17570 26673 32387
  137  570  619 5006 6099 7979 14429 16650 25443 32789
   46  282  287 10258 18383 20258 27186 27494 28429 38266
  445  486 1058 1868 9976 11294 20364 23695 30826 35330
  134  900  931 12518 14544 17715 19623 21111 33868 34570
   62   66  586 8020 20270 23831 31041 31965 32224 35189
  174  290  784 6740 14673 17642 26286 27382 33447 34879
  332  675 1033 1838 12004 15439 20765 31721 34225 38863
  527  558  832 3667 6319 8317 10883 13466 18427 25377
  431  790 1021 1112 2873 7675 13059 17793 20570 20771
  339  536 1015 5725 6916 10846 14487 21156 28123 32614
  456  830 1078 7511 11801 12362 12705 17401 28867 34032
  222  538  989 5593 6022 8302 14008 23445 25127 29022
   37  393  788 3025 7768 11367 22276 22761 28232 30394
  234  257 1045 1307 2908 6337 26530 28142 34129 35997
   35   46  978 9912 9978 12567 17843 24194 34887 35206
   39  959  967 5027 10847 14657 18859 28075 28214 36325
  275  477  823 11376 18073 28997 30521 31661 31941 32116
  185  580  966 11733 12013 12760 13358 19372 32534 35504
  760  891 1046 11150 20358 21638 29930 31014 33050 34840
  360  389 1057 5316 5938 14186 16404 32445 34021 35722
  306  344  679 5224 6674 10305 18753 25583 30585 36943
  103  171 1016 8780 11741 12144 19470 20955 22495 27377
  818  832  894 3683 14279 14497 22505 28129 28719 31246
  215  411  760 5886 25612 28556 32213 32704 35901 36130
  229  489 1067 2385 8587 20565 23431 28102 30147 32859
  288  664  980 8138 8531 21676 23787 26708 28798 34490
   89  552  847 6656 9889 23949 26226 27080 31236 35823
   66  142  443 3339 3813 7977 14944 15464 19186 25983
  605  876  931 16682 17669 25800 28220 33432 35738 37382
  346  423  806 5669 7668 8789 9928 19724 24039 27893
   48  460 1055 3512 7389 7549 20216 22180 28221 35437
  187  636  824 1678 4508 13588 19683 21750 30311 33480
```

PROVIDED BY CRC/ETRI

PROVIDED BY CRC/ETRI

FIG. 71

```
─ N=64800, rate=7/15 ─
460 792 1007 4580 11452 13130 26882 27020 32439
35 472 1056 7154 12700 13326 13414 16828 19102
45 440 772 4854 7863 26945 27684 28651 31875
744 812 892 1509 9018 12925 14140 21357 25106
271 474 761 4268 6706 9609 19701 19707 24870
223 477 662 1987 9247 18376 22148 24948 27694
44 379 786 8823 12322 14666 16377 28688 29924
104 219 562 5832 19665 20615 21043 22759 32180
41 43 870 7963 13718 14136 17216 30470 33428
592 744 887 4513 6192 18116 19482 25032 34095
456 821 1078 7162 7443 8774 15567 17243 33085
151 666 977 6946 10358 11172 18129 19777 32234
236 793 870 2001 6805 9047 13877 30131 34252
297 698 772 3449 4204 11608 22950 26071 27512
202 428 474 3205 3726 6223 7708 20214 25283
139 719 915 1447 2938 11864 15932 21748 28598
135 853 902 3239 18590 20579 30578 33374 34045
9 13 971 11834 13642 17628 21669 24741 30965
344 531 730 1880 16895 17587 21901 28620 31957
7 192 380 3168 3729 5518 6827 20372 34168
28 521 681 4313 7465 14209 21501 23364 25980
269 393 898 3561 11066 11985 17311 26127 30309
42 82 707 4880 4890 9818 23340 25959 31695
189 262 707 6573 14082 22259 24230 24390 24664
383 568 573 5498 13449 13990 16904 22629 34203
585 596 820 2440 2468 21956 28261 28703 29591
755 763 795 5636 16433 21714 23452 31150 34545
23 343 669 1159 3507 13096 17978 24241 34321
316 384 944 4872 8491 18913 21085 23198 24798
64 314 765 3706 7136 8634 14227 17127 23437
220 693 899 8791 12417 13487 18335 22126 27428
285 794 1045 8624 8801 9547 19167 21894 32657
386 621 1045 1634 1882 3172 13686 16027 22448
95 622 693 2827 7098 11452 14112 18831 31308
446 813 928 7976 8935 13146 27117 27766 33111
89 138 241 3218 9283 20458 31484 31538 34216
277 420 704 9281 12576 12788 14496 15357 20585
141 643 758 4894 10264 15144 16357 22478 26461
17 108 160 13183 15424 17939 19276 23714 26655
109 285 608 1682 20223 21791 24615 29622 31983
123 515 622 7037 13946 15292 15606 16262 23742
264 565 923 6460 13622 13934 23181 25475 26134
202 548 789 8003 10993 12478 16051 25114 27579
121 450 575 5972 10062 18693 21852 23874 28031
507 560 889 12064 13316 19629 21547 25461 28732
664 786 1043 9137 9294 10163 23389 31436 34297
45 830 907 10730 16541 21232 30354 30605 31847
203 507 1060 6971 12216 13321 17861 22671 29825
369 881 952 3035 12279 12775 17682 17805 34281
```

PROVIDED BY CRC/ETRI

PROVIDED BY CRC/ETRI

CODE LENGTH : N=64800
CODING RATE : {7, 9, 11, 13}/15

| Rate | PERFORMANCE THRESHOLD VALUE (Es/N0) | MINIMUM CYCLE LENGTH |
|---|---|---|
| 7/15 | −0.093751 | 6 |
| 9/15 | 1.658523 | 8 |
| 11/15 | 3.351930 | 6 |
| 13/15 | 5.301749 | 6 |

| Rate | X1 | KX1 | X2 | KX2 | Y1 | KY1 | Y2 | KY2 | M |
|---|---|---|---|---|---|---|---|---|---|
| 7/15 | 33 | 2160 | 15 | 5040 | 4 | 0 | 3 | 23040 | 34560 |
| 9/15 | 19 | 6840 | — | 0 | 4 | 6840 | 3 | 25200 | 25920 |
| 11/15 | 15 | 8280 | — | 0 | 4 | 2520 | 3 | 36720 | 17280 |
| 13/15 | 13 | 9360 | — | 0 | 4 | 360 | 3 | 46440 | 8640 |

FIG. 77

CODE LENGTH : N=64800
CODING RATE : {6, 8, 12}/15

| Rate | X1 | KX1 | X2 | KX2 | Y1 | KY1 | Y2 | KY2 | M |
|------|----|-----|----|----|----|-----|----|-----|------|
| 6/15 | 27 | 4680 | — | 0 | 4 | 13680 | 3 | 7560 | 38880 |
| 8/15 | 19 | 7200 | — | 0 | 4 | 5760 | 3 | 21600 | 30240 |
| 12/15 | 14 | 9360 | — | 0 | 4 | 0 | 3 | 42480 | 12960 |

PROVIDED BY Samsung

FIG. 78

CODE LENGTH : N=16200
CODING RATE : {6, 7, 9, 11, 13}/15

| Rate | X1 | KX1 | X2 | KX2 | Y1 | KY1 | Y2 | KY2 | M |
|---|---|---|---|---|---|---|---|---|---|
| 6/15 | 30 | 1080 | - | - | 4 | 3600 | 3 | 1800 | 9720 |
| 7/15 | 24 | 1440 | - | - | 4 | 2520 | 3 | 3600 | 8640 |
| 9/15 | 16 | 1080 | 10 | 720 | 9 | 1080 | 3 | 6840 | 6480 |
| 11/15 | 12 | 2520 | - | - | - | - | 3 | 9360 | 4320 |
| 13/15 | 13 | 2160 | - | - | 4 | 3600 | 3 | 8280 | 2160 |

PROVIDED BY LGE

FIG. 87

| Input cell word y | Constellation point zq |
|:---:|:---:|
| (00) | $(1+1i)/\sqrt{2}$ |
| (01) | $(1-1i)/\sqrt{2}$ |
| (10) | $(-1+1i)/\sqrt{2}$ |
| (11) | $(-1-1i)/\sqrt{2}$ |

FIG. 88

| w/Shape | NUC_16_5/15 | NUC_16_6/15 | NUC_16_7/15 | NUC_16_8/15 |
|---|---|---|---|---|
| w0 | 0.5309 + 1.1928i | 0.5115 + 1.2092i | 0.5029 + 1.1949i | 0.4951 + 1.2068i |
| w1 | 1.1928 + 0.5309i | 1.2092 + 0.5115i | 1.1962 + 0.5050i | 1.2068 + 0.4951i |
| w2 | 0.2842 + 0.4633i | 0.2663 + 0.4530i | 0.2632 + 0.4959i | 0.2575 + 0.4819i |
| w3 | 0.4633 + 0.2842i | 0.4530 + 0.2663i | 0.4993 + 0.2625i | 0.4819 + 0.2575i |

| w/Shape | NUC_16_9/15 | NUC_16_10/15 | NUC_16_11/15 | NUC_16_12/15 | NUC_16_13/15 |
|---|---|---|---|---|---|
| w0 | 0.4967 + 1.1932i | 0.4487 + 1.1657i | 0.9342 + 0.9847i | 0.9555 + 0.9555i | 0.9517 + 0.9511i |
| w1 | 1.1896 + 0.4896i | 1.2080 + 0.5377i | 0.9866 + 0.2903i | 0.9555 + 0.2949i | 0.9524 + 0.3061i |
| w2 | 0.2452 + 0.5326i | 0.2213 + 0.4416i | 0.2716 + 0.9325i | 0.2949 + 0.9555i | 0.3067 + 0.9524i |
| w3 | 0.5210 + 0.2440i | 0.6186 + 0.2544i | 0.2901 + 0.2695i | 0.2949 + 0.2949i | 0.3061 + 0.3067i |

FIG. 89

| w/Shape | NUC_64_5/15 | NUC_64_6/15 | NUC_64_7/15 | NUC_64_8/15 |
|---|---|---|---|---|
| w0 | 1.4327+0.3305i | 1.4521+0.3005i | 1.4865+0.2932i | 1.4827+0.2920i |
| w1 | 1.0909+0.2971i | 1.2657+0.8178i | 1.2618+0.8446i | 1.2563+0.8411i |
| w2 | 1.2484+0.7803i | 1.0666+0.2744i | 1.0271+0.2345i | 1.0211+0.2174i |
| w3 | 0.9762+0.5715i | 0.9500+0.5641i | 0.8976+0.5624i | 0.8798+0.5702i |
| w4 | 0.3309+1.4326i | 0.3011+1.4529i | 0.2943+1.4811i | 0.2920+1.4827i |
| w5 | 0.2979+1.0923i | 0.8202+1.2651i | 0.8402+1.2602i | 0.8410+1.2563i |
| w6 | 0.7829+1.2477i | 0.2750+1.0676i | 0.2356+1.0261i | 0.2174+1.0211i |
| w7 | 0.5739+0.9763i | 0.5656+0.9499i | 0.5632+0.8957i | 0.5702+0.8798i |
| w8 | 0.3901+0.2112i | 0.3553+0.1948i | 0.3147+0.1567i | 0.3040+0.1475i |
| w9 | 0.5317+0.2475i | 0.3569+0.2094i | 0.3116+0.1730i | 0.3028+0.1691i |
| w10 | 0.3945+0.2289i | 0.5596+0.2431i | 0.6512+0.2053i | 0.6855+0.1871i |
| w11 | 0.5236+0.2894i | 0.5410+0.3002i | 0.5965+0.3353i | 0.6126+0.3563i |
| w12 | 0.2108+0.3911i | 0.1946+0.3566i | 0.1567+0.3125i | 0.1475+0.3040i |
| w13 | 0.2475+0.5327i | 0.2094+0.3579i | 0.1733+0.3091i | 0.1691+0.3028i |
| w14 | 0.2287+0.3955i | 0.2430+0.5607i | 0.2056+0.6506i | 0.1871+0.6855i |
| w15 | 0.2898+0.5246i | 0.3004+0.5417i | 0.3364+0.5943i | 0.3563+0.6126i |

| w/Shape | NUC_64_9/15 | NUC_64_10/15 | NUC_64_11/15 | NUC_64_12/15 | NUC_64_13/15 |
|---|---|---|---|---|---|
| w0 | 1.4678+0.3029i | 1.4388+0.2878i | 1.4443+0.2683i | 1.4480+0.2403i | 1.4303+0.2329i |
| w1 | 1.2296+0.8500i | 1.2150+0.8133i | 0.7471+1.2243i | 0.6406+1.1995i | 0.6297+1.1818i |
| w2 | 1.0496+0.2245i | 1.0385+0.2219i | 1.1749+0.7734i | 1.0952+0.9115i | 1.0803+0.9154i |
| w3 | 0.8739+0.6079i | 0.8494+0.6145i | 0.7138+0.8201i | 0.6868+0.8108i | 0.6870+0.8095i |
| w4 | 0.2834+1.4645i | 0.2931+1.4656i | 0.1638+1.0769i | 1.0500+0.1642i | 1.0444+0.1681i |
| w5 | 0.8084+1.2532i | 0.8230+1.2278i | 0.2927+1.4217i | 0.7170+0.1473i | 0.7240+0.1548i |
| w6 | 0.2038+1.0260i | 0.2069+1.0649i | 0.1462+0.7457i | 1.0519+0.5188i | 1.0553+0.5250i |
| w7 | 0.5574+0.8905i | 0.5677+0.8971i | 0.4134+0.7408i | 0.7146+0.4532i | 0.7142+0.4710i |
| w8 | 0.3884+0.1313i | 0.4119+0.1177i | 1.0203+0.1517i | 0.1677+1.0405i | 0.2114+1.4305i |
| w9 | 0.3771+0.1914i | 0.3998+0.2516i | 0.6653+0.1357i | 0.2402+1.4087i | 0.2020+1.0575i |
| w10 | 0.7243+0.1752i | 0.7442+0.1559i | 0.9639+0.4465i | 0.1369+0.7073i | 0.1221+0.6613i |
| w11 | 0.6116+0.4008i | 0.5954+0.4328i | 0.6746+0.4339i | 0.4044+0.7057i | 0.3735+0.7557i |
| w12 | 0.1358+0.2445i | 0.1166+0.1678i | 0.1271+0.1428i | 0.1374+0.1295i | 0.1455+0.1275i |
| w13 | 0.1677+0.2860i | 0.1582+0.3325i | 0.3782+0.1406i | 0.4185+0.1357i | 0.4322+0.1389i |
| w14 | 0.1555+0.6756i | 0.1355+0.7408i | 0.1311+0.4288i | 0.1325+0.3998i | 0.1432+0.3852i |
| w15 | 0.3472+0.6007i | 0.3227+0.6200i | 0.3919+0.4276i | 0.4122+0.4120i | 0.4220+0.4278i |

| w/Shape | NUC_256_6/15 | NUC_256_7/15 | NUC_256_8/15 | NUC_256_9/15 | NUC_256_10/15 | NUC_256_11/15 | NUC_256_12/15 | NUC_256_13/15 |
|---|---|---|---|---|---|---|---|---|
| w0 | 0.6800+1.6926i | 1.2905+1.3099i | 1.0804+1.3788i | 1.3231+1.1506i | 1.6097+0.1548i | 0.3105+0.3382i | 1.1014+1.1670i | 0.3556+0.3497i |
| w1 | 0.3911+1.3645i | 1.0504+0.9577i | 1.0487+0.9862i | 0.9851+1.2311i | 1.5549+0.4605i | 0.4342+0.3360i | 0.8557+1.2421i | 0.3579+0.4945i |
| w2 | 0.2191+1.7524i | 1.5329+0.8935i | 1.6464+0.7428i | 1.1439+0.8974i | 1.3226+0.1290i | 0.3149+0.4829i | 1.2957+0.8039i | 0.5049+0.3571i |
| w3 | 0.2274+1.4208i | 1.1577+0.8116i | 1.3245+0.9414i | 0.9343+0.9271i | 1.2772+0.3829i | 0.4400+0.4807i | 1.0881+0.8956i | 0.5056+0.5063i |
| w4 | 0.8678+1.2487i | 1.7881+0.2509i | 0.7198+1.2427i | 1.5398+0.7962i | 1.2753+1.0242i | 0.1811+0.3375i | 0.5795+1.2110i | 0.2123+0.3497i |
| w5 | 0.7275+1.1667i | 1.4275+0.1400i | 0.8106+1.0040i | 0.9092+0.5599i | 1.4434+0.7540i | 0.0633+0.3404i | 0.6637+1.4215i | 0.2116+0.4900i |
| w6 | 0.8747+1.0470i | 1.4784+0.5201i | 0.5595+1.0317i | 1.2222+0.6574i | 1.0491+0.8476i | 0.1818+0.4851i | 0.6930+1.0082i | 0.0713+0.3489i |
| w7 | 0.7930+1.0406i | 1.3408+0.4346i | 0.6118+0.9722i | 0.9579+0.6373i | 1.1861+0.6253i | 0.0633+0.4815i | 0.8849+0.9647i | 0.0690+0.4960i |
| w8 | 0.2098+0.9768i | 0.7837+0.5867i | 1.6768+0.2002i | 0.7748+1.5867i | 0.9326+0.0970i | 0.3084+0.1971i | 1.2063+0.5115i | 0.3527+0.2086i |
| w9 | 0.2241+1.0454i | 0.8250+0.6455i | 0.9997+0.6844i | 0.6876+1.2489i | 0.8962+0.2804i | 0.4356+0.1993i | 1.0059+0.4952i | 0.3497+0.0713i |
| w10 | 0.1858+0.9878i | 0.8256+0.5601i | 1.4212+0.4769i | 0.5992+0.9208i | 1.1044+0.1102i | 0.3098+0.0676i | 1.4171+0.5901i | 0.4960+0.2123i |
| w11 | 0.1901+1.0659i | 0.8777+0.6110i | 1.1479+0.6312i | 0.6796+0.9743i | 1.0648+0.3267i | 0.4342+0.0691i | 1.0466+0.6935i | 0.4974+0.0698i |
| w12 | 0.5547+0.8312i | 1.0080+0.1843i | 0.6079+0.6566i | 0.5836+0.5879i | 0.7325+0.6071i | 0.1775+0.1985i | 0.6639+0.6286i | 0.2086+0.2079i |
| w13 | 0.5479+0.8651i | 1.0759+0.1721i | 0.7284+0.6957i | 0.6915+0.5769i | 0.8260+0.4559i | 0.0640+0.1978i | 0.8353+0.5851i | 0.2094+0.0690i |
| w14 | 0.6073+0.8182i | 1.0056+0.2758i | 0.5724+0.7031i | 0.5858+0.7058i | 0.8744+0.7153i | 0.1775+0.0676i | 0.6879+0.8022i | 0.0676+0.2079i |
| w15 | 0.5955+0.8420i | 1.0662+0.2964i | 0.6302+0.7259i | 0.6868+0.6793i | 0.9882+0.5300i | 0.0647+0.0669i | 0.8634+0.7622i | 0.0698+0.0683i |
| w16 | 1.4070+0.1790i | 0.8334+1.5554i | 0.1457+1.4010i | 1.6118+0.1497i | 0.1646+1.6407i | 0.7455+0.3411i | 0.1213+1.4366i | 0.3586+0.7959i |
| w17 | 1.7227+0.2900i | 0.8165+1.1092i | 0.1866+1.7346i | 0.9511+0.1140i | 0.4867+1.5743i | 0.5811+0.3396i | 0.1077+1.2098i | 0.3571+0.6392i |
| w18 | 1.3246+0.2562i | 0.6092+1.2729i | 0.1174+1.1035i | 1.2970+0.1234i | 0.1363+1.3579i | 0.7556+0.4669i | 0.0651+0.9801i | 0.5034+0.8271i |
| w19 | 1.3636+0.3654i | 0.6728+1.1456i | 0.1095+1.0132i | 1.0266+0.1191i | 0.4023+1.3026i | 0.5862+0.4758i | 0.2009+1.0115i | 0.5063+0.6600i |
| w20 | 1.3708+1.2834i | 0.3061+1.7469i | 0.4357+1.3636i | 1.5831+0.4496i | 1.0542+1.2584i | 0.9556+0.3280i | 0.3764+1.4264i | 0.2146+0.7862i |
| w21 | 1.6701+0.8403i | 0.1327+1.4056i | 0.5853+1.6820i | 0.9328+0.3588i | 0.7875+1.4450i | 1.1767+0.3091i | 0.3237+1.2130i | 0.2109+0.6340i |
| w22 | 1.1614+0.7909i | 0.3522+1.3414i | 0.3439+1.0689i | 1.2796+0.3894i | 0.8687+1.0407i | 0.9673+0.4720i | 0.5205+0.9814i | 0.0713+0.8093i |
| w23 | 1.2241+0.7367i | 0.2273+1.3081i | 0.3234+0.9962i | 1.0188+0.3447i | 0.6502+1.1951i | 1.2051+0.5135i | 0.3615+1.0163i | 0.0698+0.6467i |
| w24 | 0.9769+0.1863i | 0.5007+0.8098i | 0.1092+0.6174i | 0.5940+0.1059i | 0.0982+0.9745i | 0.7367+0.2015i | 0.0715+0.6596i | 0.2799+1.0862i |
| w25 | 0.9452+0.2057i | 0.5528+0.8347i | 0.1074+0.6307i | 0.7215+0.1100i | 0.2842+0.9344i | 0.5811+0.2015i | 0.2116+0.6597i | 0.2806+1.2755i |
| w26 | 1.0100+0.2182i | 0.4843+0.8486i | 0.1109+0.6996i | 0.5863+0.1138i | 0.1142+1.1448i | 0.7316+0.0669i | 0.0729+0.8131i | 0.4328+0.9904i |
| w27 | 0.9795+0.2417i | 0.5304+0.8759i | 0.1076+0.7345i | 0.6909+0.1166i | 0.3385+1.0973i | 0.5782+0.0669i | 0.2158+0.8246i | 0.4551+1.1812i |
| w28 | 0.8241+0.4856i | 0.1715+0.9147i | 0.3291+0.6264i | 0.5843+0.3604i | 0.6062+0.7465i | 0.9062+0.1971i | 0.5036+0.6467i | 0.2309+0.9414i |
| w29 | 0.8232+0.4837i | 0.1540+0.9510i | 0.3126+0.6373i | 0.6970+0.3592i | 0.4607+0.8538i | 1.2829+0.1185i | 0.3526+0.6572i | 0.1077+1.3891i |
| w30 | 0.8799+0.5391i | 0.1964+0.9438i | 0.3392+0.6999i | 0.5808+0.3250i | 0.7263+0.8764i | 0.9156+0.0735i | 0.5185+0.8086i | 0.0772+0.9852i |
| w31 | 0.8796+0.5356i | 0.1788+0.9832i | 0.3202+0.7282i | 0.6678+0.3290i | 0.5450+1.0067i | 1.1011+0.0735i | 0.3593+0.8245i | 0.0802+1.1753i |
| w32 | 0.1376+0.3342i | 0.3752+0.1667i | 0.9652+0.1066i | 0.1406+1.6182i | 0.2655+0.0746i | 0.3244+0.8044i | 1.2545+0.1010i | 0.8301+0.3727i |
| w33 | 0.1383+0.3292i | 0.3734+0.1667i | 0.9075+0.1066i | 0.1272+1.2984i | 0.2664+0.0759i | 0.4589+0.8218i | 1.0676+0.0956i | 0.8256+0.5256i |
| w34 | 0.1363+0.3322i | 0.3758+0.1661i | 0.9724+0.1171i | 0.1211+0.9644i | 0.4571+0.0852i | 0.3207+0.6415i | 1.4782+0.1167i | 0.6593+0.3668i |
| w35 | 0.1370+0.3273i | 0.3746+0.1649i | 0.9186+0.1752i | 0.1220+1.0393i | 0.4516+0.1062i | 0.4509+0.6371i | 0.8981+0.0882i | 0.6623+0.5182i |
| w36 | 0.1655+0.3265i | 0.4013+0.1230i | 0.6342+0.1372i | 0.1124+0.6101i | 0.2559+0.1790i | 0.1920+0.8196i | 0.5518+0.0690i | 1.0186+0.3645i |
| w37 | 0.1656+0.3227i | 0.4001+0.1230i | 0.6550+0.1495i | 0.1177+0.6041i | 0.2586+0.1772i | 0.0633+0.8167i | 0.6903+0.0552i | 1.0001+0.5242i |
| w38 | 0.1634+0.3246i | 0.4037+0.1230i | 0.6290+0.1393i | 0.1136+0.7455i | 0.3592+0.2811i | 0.1811+0.6371i | 0.5742+0.1987i | 1.1857+0.2725i |
| w39 | 0.1636+0.3208i | 0.4019+0.1218i | 0.6494+0.1504i | 0.1185+0.7160i | 0.3728+0.2654i | 0.0640+0.6415i | 0.7374+0.1564i | 1.3928+0.3408i |
| w40 | 0.1779+0.6841i | 0.6025+0.3934i | 1.3127+0.1240i | 0.4324+1.5679i | 0.7706+0.0922i | 0.3331+1.0669i | 1.2378+0.3049i | 0.8011+0.2227i |
| w41 | 0.1828+0.6845i | 0.5946+0.3928i | 0.9572+0.4344i | 0.3984+1.2825i | 0.7407+0.2260i | 0.4655+1.0087i | 1.0518+0.3032i | 0.7981+0.0735i |
| w42 | 0.1745+0.6828i | 0.6116+0.3879i | 1.2403+0.2631i | 0.3766+0.9534i | 0.6180+0.0927i | 0.3433+1.2865i | 1.4584+0.3511i | 0.6459+0.2198i |
| w43 | 0.1793+0.6829i | 0.6019+0.3837i | 1.0254+0.4130i | 0.3668+1.0301i | 0.6019+0.1658i | 0.5004+1.5062i | 0.9107+0.2603i | 0.6430+0.0713i |
| w44 | 0.3547+0.6009i | 0.7377+0.1618i | 0.6096+0.4214i | 0.3667+0.5995i | 0.6007+0.4980i | 0.1971+1.0051i | 0.6321+0.4729i | 0.9681+0.2205i |
| w45 | 0.3593+0.6011i | 0.7298+0.1582i | 0.6773+0.4284i | 0.3328+0.5960i | 0.6673+0.3928i | 0.0735+1.0298i | 0.7880+0.4392i | 0.9615+0.0735i |
| w46 | 0.3576+0.5990i | 0.7274+0.1782i | 0.5995+0.4102i | 0.3687+0.7194i | 0.4786+0.3935i | 0.1498+1.5018i | 0.6045+0.3274i | 1.3327+0.1039i |
| w47 | 0.3624+0.5994i | 0.7165+0.1746i | 0.6531+0.4101i | 0.3373+0.6964i | 0.5176+0.3391i | 0.0865+1.2553i | 0.7629+0.2965i | 1.1359+0.0809i |
| w48 | 0.2697+0.1443i | 0.1509+0.2425i | 0.1250+0.1153i | 0.1065+0.1146i | 0.0757+0.1003i | 0.7811+0.8080i | 0.0596+0.0739i | 0.8382+0.8709i |
| w49 | 0.2704+0.1433i | 0.1503+0.2400i | 0.1252+0.1158i | 0.1145+0.1108i | 0.0753+0.1004i | 0.6167+0.8153i | 0.1767+0.0731i | 0.8145+0.6934i |
| w50 | 0.2644+0.1442i | 0.1515+0.2437i | 0.1245+0.1152i | 0.1053+0.1274i | 0.0777+0.4788i | 0.7636+0.6255i | 0.0612+0.2198i | 0.6645+0.8486i |
| w51 | 0.2650+0.1432i | 0.1503+0.2425i | 0.1247+0.1156i | 0.1134+0.1236i | 0.0867+0.4754i | 0.6000+0.6327i | 0.1815+0.2192i | 0.6600+0.6786i |
| w52 | 0.2763+0.1638i | 0.1285+0.2388i | 0.3768+0.1244i | 0.1111+0.3821i | 0.1023+0.2243i | 0.9898+0.7680i | 0.4218+0.0715i | 1.1612+0.6949i |
| w53 | 0.2768+0.1626i | 0.1279+0.2419i | 0.3707+0.1237i | 0.1186+0.3867i | 0.1010+0.2242i | 1.5855+0.1498i | 0.2978+0.0725i | 0.9785+0.6942i |
| w54 | 0.2715+0.1630i | 0.1279+0.2431i | 0.3779+0.1260i | 0.1080+0.3431i | 0.1950+0.3919i | 0.9476+0.6175i | 0.4337+0.2115i | 1.3698+0.6259i |
| w55 | 0.2719+0.1618i | 0.1279+0.2406i | 0.3717+0.1252i | 0.1177+0.3459i | 0.1881+0.3969i | 1.4625+0.4015i | 0.3057+0.2167i | 1.2183+0.4841i |
| w56 | 0.6488+0.1696i | 0.3394+0.5764i | 0.1161+0.3693i | 0.3644+0.1080i | 0.0930+0.8122i | 0.8276+1.0225i | 0.0667+0.5124i | 0.7989+1.0498i |
| w57 | 0.6462+0.1706i | 0.3364+0.5722i | 0.1157+0.3645i | 0.3262+0.1104i | 0.2215+0.7840i | 0.6313+1.0364i | 0.2008+0.5095i | 0.4395+1.4203i |
| w58 | 0.6456+0.1745i | 0.3328+0.5758i | 0.1176+0.3469i | 0.3681+0.1173i | 0.0937+0.6514i | 0.8815+1.2865i | 0.0625+0.3658i | 0.6118+1.0246i |
| w59 | 0.6431+0.1753i | 0.3303+0.5698i | 0.1171+0.3424i | 0.3289+0.1196i | 0.1540+0.6366i | 0.6342+1.2705i | 0.1899+0.3842i | 0.6303+1.2421i |
| w60 | 0.5854+0.3186i | 0.1491+0.6316i | 0.3530+0.3899i | 0.3665+0.3758i | 0.4810+0.6306i | 1.0422+0.9593i | 0.4818+0.4946i | 1.0550+0.8924i |
| w61 | 0.5862+0.3167i | 0.1461+0.6280i | 0.3422+0.3808i | 0.3310+0.3795i | 0.3856+0.7037i | 1.2749+0.8538i | 0.3380+0.5050i | 0.8612+1.2800i |
| w62 | 0.5864+0.3275i | 0.1509+0.6280i | 0.3614+0.3755i | 0.3672+0.3353i | 0.3527+0.5230i | 1.1556+1.1847i | 0.4571+0.3499i | 1.2696+0.8969i |
| w63 | 0.5873+0.3254i | 0.1473+0.6225i | 0.3509+0.3656i | 0.3336+0.3402i | 0.3100+0.5559i | 1.4771+0.6742i | 0.3216+0.3599i | 1.0342+1.1181i |

| u/Shape | NUC_1k_6/15 | NUC_1k_7/15 | NUC_1k_8/15 | NUC_1k_9/15 | NUC_1k_10/15 | NUC_1k_11/15 | NUC_1k_12/15 | NUC_1k_13/15 |
|---|---|---|---|---|---|---|---|---|
| u1 | 1.0003 | 1 | 1.0005 | 1 | 1.0772 | 1.16666667 | 2.5963 | 2.85714286 |
| u2 | 1.0149 | 1.04 | 2.0897 | 2.78571429 | 2.8011 | 3.08333333 | 4.5193 | 4.85714286 |
| u3 | 1.0158 | 1.04 | 2.0888 | 2.78571429 | 2.9634 | 3.33333333 | 6.1649 | 6.85714286 |
| u4 | 2.6848 | 3 | 3.9945 | 4.85714286 | 4.8127 | 5.16666667 | 8.2107 | 8.85714286 |
| u5 | 2.6903 | 3.04 | 3.9931 | 4.85714286 | 5.1864 | 5.75 | 9.9594 | 11 |
| u6 | 2.882 | 3.28 | 5.3843 | 6.85714286 | 6.7838 | 7.41666667 | 12.0321 | 13.2857143 |
| u7 | 2.8747 | 3.32 | 5.3894 | 6.85714286 | 7.5029 | 8.5 | 13.9574 | 15.7142857 |
| u8 | 4.7815 | 5.24 | 7.5206 | 9.14285714 | 9.238 | 10.0833333 | 16.2598 | 18.1428571 |
| u9 | 4.7619 | 5.32 | 7.6013 | 9.28571429 | 10.32 | 11.5833333 | 18.4269 | 20.7142857 |
| u10 | 5.5779 | 6.04 | 9.3371 | 11.5714286 | 12.0115 | 13.3333333 | 20.9273 | 23.4285714 |
| u11 | 5.6434 | 6.28 | 9.8429 | 12.2142857 | 13.5356 | 15.25 | 23.4863 | 26.2857143 |
| u12 | 7.3854 | 8.24 | 11.9255 | 14.6428571 | 15.6099 | 17.3333333 | 26.4823 | 29.2857143 |
| u13 | 7.8797 | 8.84 | 13.3962 | 16.4285714 | 17.7524 | 19.75 | 29.7085 | 32.4285714 |
| u14 | 9.635 | 11.04 | 15.8981 | 19.4285714 | 20.5256 | 22.4166667 | 33.6247 | 35.7142857 |
| u15 | 11.7874 | 13.68 | 19.1591 | 23.2857143 | 24.1254 | 25.5833333 | 38.5854 | 39.4285714 |

| | QPSK | 16QAM | 64QAM | 256QAM | 1024QAM |
|---|---|---|---|---|---|
| | | | N=64800 | | |
| C | 2 | 4 | 6 | 8 | 10 |
| R1 | 32400 | 16200 | 10800 | 7920 | 6480 |
| R2 | 0 | 0 | 0 | 180 | 0 |

| | QPSK | 16QAM | 64QAM | 256QAM | 1024QAM |
|---|---|---|---|---|---|
| | | | N=16200 | | |
| C | 2 | 4 | 6 | 8 | 10 |
| R1 | 7920 | 3960 | 2520 | 1800 | 1440 |
| R2 | 180 | 90 | 180 | 225 | 180 |

C: NUMBER OF columns (NUMBER OF SYMBOL BITS)
R1: NUMBER OF ROWS OF Part1
R2: NUMBER OF ROWS OF Part2

DATA PROCESSING DEVICE AND DATA PROCESSING METHOD USING LOW DENSITY PARITY CHECK ENCODING FOR DECREASING SIGNAL-TO-NOISE POWER RATIO

CROSS REFERENCE TO RELATED APPLICATIONS

This application is a continuation of U.S. application Ser. No. 15/118,331, filed Aug. 11, 2016, which is a National Stage of PCT/JP2015/053183, filed Feb. 5, 2015, and claims the benefit of priority under 35 U.S.C. § 119 of Japanese Application No. 2014-030014, filed Feb. 19, 2014. The entire contents of which are incorporated herein by reference.

TECHNICAL FIELD

The present technology relates to a data processing device and a data processing method, and more particularly, to a data processing device and a data processing method which can ensure high communication quality in data transmission using, for example, an LDPC code.

BACKGROUND ART

Some of information used in the specification and the drawings is provided by Samsung Electronics Co., Ltd. (hereinafter, referred to as Samsung), LG Electronics Inc., NERC, and CRC/ETRI (which is clarified in the drawings).

A low density parity check (LDPC) code has a high error correction capability and has been widely adopted in transmission systems for digital broadcasting, for example, Digital Video Broadcasting (DVB)-S.2, DVB-T.2, and DVB-C.2 used in Europe, and Advanced Television Systems Committee (ATSC) 3.0 used in the U.S. (for example, see Non-Patent Document 1).

The recent study shows that the performance of an LDPC code becomes closer to a Shannon limit as the code length thereof becomes larger, similar to a turbo code. The LDPC code has the property that the shortest distance is proportional to the code length. Therefore, the LDPC code has the advantages that block error probability characteristics are excellent and a so-called error floor phenomenon which is observed in the decoding characteristics of, for example, a turbo code rarely occurs.

CITATION LIST

Non-Patent Document

Non-Patent Document 1: DVB-S.2: ETSI EN 302 307 V1.2.1 (2009-08)

SUMMARY OF THE INVENTION

Problems to be Solved by the Invention

In data transmission using LDPC codes, for example, an LDPC code serves as a symbol (changes to a symbol) of quadrature modulation (digital modulation), such as quadrature phase shift keying (QPSK), and the symbol is mapped to a signal point of the quadrature modulation and is transmitted.

The data transmission using LDPC codes has come into widespread use and there has been a demand for ensuring high communication (transmission) quality.

The present technology has been made in view of the above-mentioned problems and an objective of the present technology is to ensure high communication quality in data transmission using LDPC codes.

Solutions to Problems

A first data processing device/method according to the present technology includes: a coding unit/step that performs LDPC coding on the basis of a parity check matrix of an LDPC code having a code length N of 64800 bits and a coding rate r of 9/15; a group-wise interleaving unit/step that performs group-wise interleaving which interleaves the LDPC code in a unit of a bit group of 360 bits; and a mapping unit/step that maps the LDPC code to any one of four signal points which are determined by a modulation method in a unit of 2 bits. In the group-wise interleaving, an (i+1)-th bit group from a head of the LDPC code is set as a bit group i and a sequence of bit groups 0 to 179 of the 64800-bit LDPC code is interleaved into a sequence of the following bit groups.

0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, 179

The LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table indicates positions of elements "1" in the information matrix portion for every 360 columns and includes the following.

113 1557 3316 5680 6241 10407 13404 13947 14040 14353 15522 15698 16079 17363 19374 19543 20530 22833 24339

271 1361 6236 7006 7307 7333 12768 15441 15568 17923 18341 20321 21502 22023 23938 25351 25590 25876 25910

73 605 872 4008 6279 7653 10346 10799 12482 12935 13604 15909 16526 19782 20506 22804 23629 24859 25600

1445 1690 4304 4851 8919 9176 9252 13783 16076 16675 17274 18806 18882 20819 21958 22451 23869 23999 24177

1290 2337 5661 6371 8996 10102 10941 11360 12242 14918 16808 20571 23374 24046 25045 25060 25662 25783 25913

28 42 1926 3421 3503 8558 9453 10168 15820 17473 19571 19685 22790 23336 23367 23890 24061 25657 25680

0 1709 4041 4932 5968 7123 8430 9564 10596 11026 14761 19484 20762 20858 23803 24016 24795 25853 25863

29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915
7520 7690 8855 9183 14654 16695 17121 17854 18083 18428 19633 20470 20736 21720 22335 23273 25083 25293 25403
48 58 410 1299 3786 10668 18523 18963 20864 22106 22308 23033 23107 23128 23990 24286 24409 24595 25802
12 51 3894 6539 8276 10885 11644 12777 13427 14039 15954 17078 19053 20537 22863 24521 25087 25463 25838
3509 8748 9581 11509 15884 16230 17583 19264 20900 21001 21310 22547 22756 22959 24768 24814 25594 25626 25880
21 29 69 1448 2386 4601 6626 6667 10242 13141 13852 14137 18640 19951 22449 23454 24431 25512 25814
18 53 7890 9934 10063 16728 19040 19809 20825 21522 21800 23582 24556 25031 25547 25562 25733 25789 25906
4096 4582 5766 5894 6517 10027 12182 13247 15207 17041 18958 20133 20503 22228 24332 24613 25689 25855 25883
0 25 819 5539 7076 7536 7695 9532 13668 15051 17683 19665 20253 21996 24136 24890 25758 25784 25807
34 40 44 4215 6076 7427 7965 8777 11017 15593 19542 22202 22973 23397 23423 24418 24873 25107 25644
1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609

In the first data processing device/method, the LDPC coding is performed on the basis of the parity check matrix of the LDPC code having a code length N of 64800 bits and a coding rate r of 9/15. The group-wise interleaving which interleaves the LDPC code in a unit of a bit group of 360 bits is performed. Then, the LDPC code is mapped to any one of four signal points which are determined by the modulation method in a unit of 2 bits. In the group-wise interleaving, the (i+1)-th bit group from the head of the LDPC code is set as the bit group i and a sequence of bit groups 0 to 179 of the 64800-bit LDPC code is interleaved into a sequence of the following bit groups.

0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, 179

The LDPC code includes the information bits and the parity bits. The parity check matrix includes the information matrix portion corresponding to the information bits and the parity matrix portion corresponding to the parity bits. The information matrix portion is represented by the parity check matrix initial value table. The parity check matrix initial value table indicates the positions of the elements "1" in the information matrix portion for every 360 columns and includes the following.

113 1557 3316 5680 6241 10407 13404 13947 14040 14353 15522 15698 16079 17363 19374 19543 20530 22833 24339

271 1361 6236 7006 7307 7333 12768 15441 15568 17923 18341 20321 21502 22023 23938 25351 25590 25876 25910

73 605 872 4008 6279 7653 10346 10799 12482 12935 13604 15909 16526 19782 20506 22804 23629 24859 25600

1445 1690 4304 4851 8919 9176 9252 13783 16076 16675 17274 18806 18882 20819 21958 22451 23869 23999 24177

1290 2337 5661 6371 8996 10102 10941 11360 12242 14918 16808 20571 23374 24046 25045 25060 25662 25783 25913

28 42 1926 3421 3503 8558 9453 10168 15820 17473 19571 19685 22790 23336 23367 23890 24061 25657 25680

0 1709 4041 4932 5968 7123 8430 9564 10596 11026 14761 19484 20762 20858 23803 24016 24795 25853 25863

29 1625 6500 6609 16831 18517 18568 18738 19387 20159 20544 21603 21941 24137 24269 24416 24803 25154 25395

55 66 871 3700 11426 13221 15001 16367 17601 18380 22796 23488 23938 25476 25635 25678 25807 25857 25872

1 19 5958 8548 8860 11489 16845 18450 18469 19496 20190 23173 25262 25566 25668 25679 25858 25888 25915

7520 7690 8855 9183 14654 16695 17121 17854 18083 18428 19633 20470 20736 21720 22335 23273 25083 25293 25403

48 58 410 1299 3786 10668 18523 18963 20864 22106 22308 23033 23107 23128 23990 24286 24409 24595 25802

12 51 3894 6539 8276 10885 11644 12777 13427 14039 15954 17078 19053 20537 22863 24521 25087 25463 25838

3509 8748 9581 11509 15884 16230 17583 19264 20900 21001 21310 22547 22756 22959 24768 24814 25594 25626 25880

21 29 69 1448 2386 4601 6626 6667 10242 13141 13852 14137 18640 19951 22449 23454 24431 25512 25814

18 53 7890 9934 10063 16728 19040 19809 20825 21522 21800 23582 24556 25031 25547 25562 25733 25789 25906

4096 4582 5766 5894 6517 10027 12182 13247 15207 17041 18958 20133 20503 22228 24332 24613 25689 25855 25883

0 25 819 5539 7076 7536 7695 9532 13668 15051 17683 19665 20253 21996 24136 24890 25758 25784 25807

34 40 44 4215 6076 7427 7965 8777 11017 15593 19542 22202 22973 23397 23423 24418 24873 25107 25644

1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444

24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609

A second data processing device/method according to the present technology includes: a group-wise deinterleaving unit/step that returns a sequence of an LDPC code, which has been subjected to group-wise interleaving and is obtained from data transmitted from a transmitting device, to an original sequence. The transmitting device includes: a coding unit that performs LDPC coding on the basis of a parity check matrix of the LDPC code having a code length N of 64800 bits and a coding rate r of 9/15; a group-wise interleaving unit that performs the group-wise interleaving which interleaves the LDPC code in a unit of a bit group of 360 bits; and a mapping unit that maps the LDPC code to any one of four signal points which are determined by a modulation method in a unit of 2 bits. In the group-wise interleaving, an (i+1)-th bit group from a head of the LDPC code is set as a bit group i and a sequence of bit groups 0 to 179 of the 64800-bit LDPC code is interleaved into a sequence of the following bit groups.

0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, 179

The LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table indicates positions of elements "1" in the information matrix portion for every 360 columns and includes the following.

113 1557 3316 5680 6241 10407 13404 13947 14040 14353 15522 15698 16079 17363 19374 19543 20530 22833 24339
271 1361 6236 7006 7307 7333 12768 15441 15568 17923 18341 20321 21502 22023 23938 25351 25590 25876 25910
73 605 872 4008 6279 7653 10346 10799 12482 12935 13604 15909 16526 19782 20506 22804 23629 24859 25600
1445 1690 4304 4851 8919 9176 9252 13783 16076 16675 17274 18806 18882 20819 21958 22451 23869 23999 24177
1290 2337 5661 6371 8996 10102 10941 11360 12242 14918 16808 20571 23374 24046 25045 25060 25662 25783 25913
28 42 1926 3421 3503 8558 9453 10168 15820 17473 19571 19685 22790 23336 23367 23890 24061 25657 25680
0 1709 4041 4932 5968 7123 8430 9564 10596 11026 14761 19484 20762 20858 23803 24016 24795 25853 25863
29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915
7520 7690 8855 9183 14654 16695 17121 17854 18083 18428 19633 20470 20736 21720 22335 23273 25083 25293 25403
48 58 410 1299 3786 10668 18523 18963 20864 22106 22308 23033 23107 23128 23990 24286 24409 24595 25802
12 51 3894 6539 8276 10885 11644 12777 13427 14039 15954 17078 19053 20537 22863 24521 25087 25463 25838
3509 8748 9581 11509 15884 16230 17583 19264 20900 21001 21310 22547 22756 22959 24768 24814 25594 25626 25880
21 29 69 1448 2386 4601 6626 6667 10242 13141 13852 14137 18640 19951 22449 23454 24431 25512 25814
18 53 7890 9934 10063 16728 19040 19809 20825 21522 21800 23582 24556 25031 25547 25562 25733 25789 25906
4096 4582 5766 5894 6517 10027 12182 13247 15207 17041 18958 20133 20503 22228 24332 24613 25689 25855 25883
0 25 819 5539 7076 7536 7695 9532 13668 15051 17683 19665 20253 21996 24136 24890 25758 25784 25807
34 40 44 4215 6076 7427 7965 8777 11017 15593 19542 22202 22973 23397 23423 24418 24873 25107 25644
1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664

14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388

0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609

In the second data processing device/method, the transmitting device includes: the coding unit that performs LDPC coding on the basis of the parity check matrix of the LDPC code having a code length N of 64800 bits and a coding rate r of 9/15; the group-wise interleaving unit that performs the group-wise interleaving which interleaves the LDPC code in a unit of a bit group of 360 bits; and the mapping unit that maps the LDPC code to any one of four signal points which are determined by the modulation method in a unit of 2 bits. In the group-wise interleaving, the (i+1)-th bit group from the head of the LDPC code is set as the bit group i and a sequence of bit groups 0 to 179 of the 64800-bit LDPC code is interleaved into a sequence of the following bit groups.

0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, 179

The LDPC code includes the information bits and the parity bits. The parity check matrix includes the information matrix portion corresponding to the information bits and the parity matrix portion corresponding to the parity bits. The information matrix portion is represented by the parity check matrix initial value table. The parity check matrix initial value table indicates positions of elements "1" in the information matrix portion for every 360 columns and includes the following. A sequence of the bit groups of the LDPC code, which has been subjected to the group-wise interleaving and is obtained from the data transmitted from the transmitting device, is returned to the original sequence.

113 1557 3316 5680 6241 10407 13404 13947 14040 14353 15522 15698 16079 17363 19374 19543 20530 22833 24339
271 1361 6236 7006 7307 7333 12768 15441 15568 17923 18341 20321 21502 22023 23938 25351 25590 25876 25910
73 605 872 4008 6279 7653 10346 10799 12482 12935 13604 15909 16526 19782 20506 22804 23629 24859 25600
1445 1690 4304 4851 8919 9176 9252 13783 16076 16675 17274 18806 18882 20819 21958 22451 23869 23999 24177
1290 2337 5661 6371 8996 10102 10941 11360 12242 14918 16808 20571 23374 24046 25045 25060 25662 25783 25913

28 42 1926 3421 3503 8558 9453 10168 15820 17473 19571 19685 22790 23336 23367 23890 24061 25657 25680
0 1709 4041 4932 5968 7123 8430 9564 10596 11026 14761 19484 20762 20858 23803 24016 24795 25853 25863
29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915
7520 7690 8855 9183 14654 16695 17121 17854 18083 18428 19633 20470 20736 21720 22335 23273 25083 25293 25403
48 58 410 1299 3786 10668 18523 18963 20864 22106 22308 23033 23107 23128 23990 24286 24409 24595 25802
12 51 3894 6539 8276 10885 11644 12777 13427 14039 15954 17078 19053 20537 22863 24521 25087 25463 25838
3509 8748 9581 11509 15884 16230 17583 19264 20900 21001 21310 22547 22756 22959 24768 24814 25594 25626 25880
21 29 69 1448 2386 4601 6626 6667 10242 13141 13852 14137 18640 19951 22449 23454 24431 25512 25814
18 53 7890 9934 10063 16728 19040 19809 20825 21522 21800 23582 24556 25031 25547 25562 25733 25789 25906
4096 4582 5766 5894 6517 10027 12182 13247 15207 17041 18958 20133 20503 22228 24332 24613 25689 25855 25883
0 25 819 5539 7076 7536 7695 9532 13668 15051 17683 19665 20253 21996 24136 24890 25758 25784 25807
34 40 44 4215 6076 7427 7965 8777 11017 15593 19542 22202 22973 23397 23423 24418 24873 25107 25644
1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609

A third data processing device/method according to the present technology includes: a coding unit/step that performs LDPC coding on the basis of a parity check matrix of an LDPC code having a code length N of 64800 bits and a coding rate r of 9/15; a group-wise interleaving unit/step that performs group-wise interleaving which interleaves the LDPC code in a unit of a bit group of 360 bits; and a mapping unit/step that maps the LDPC code to any one of 16 signal points which are determined by a modulation method in a unit of 4 bits. In the group-wise interleaving, an (i+1)-th bit group from a head of the LDPC code is set as a bit group i and a sequence of bit groups 0 to 179 of the 64800-bit LDPC code is interleaved into a sequence of the following bit groups.

11, 5, 8, 18, 1, 25, 32, 31, 19, 21, 50, 102, 65, 85, 45, 86, 98, 104, 64, 78, 72, 53, 103, 79, 93, 41, 82, 108, 112, 116, 120, 124, 128, 132, 136, 140, 144, 148, 152, 156, 160, 164, 168, 172, 176, 4, 12, 15, 3, 10, 20, 26, 34, 23, 33, 68, 63, 69, 92, 44, 90, 75, 56, 100, 47, 106, 42, 39, 97, 99, 89, 52, 109, 113, 117, 121, 125, 129, 133, 137, 141, 145, 149, 153, 157, 161, 165, 169, 173, 177, 6, 16, 14, 7, 13, 36, 28, 29, 37, 73, 70, 54, 76, 91, 66, 80, 88, 51, 96, 81, 95, 38, 57, 105, 107, 59, 61, 110, 114, 118, 122, 126, 130, 134, 138, 142, 146, 150, 154, 158, 162, 166, 170, 174, 178, 0, 9, 17, 2, 27, 30, 24, 22, 35, 77, 74, 46, 94, 62, 87, 83, 101, 49, 43, 84, 48, 60, 67, 71, 58, 40, 55, 111, 115, 119, 123, 127, 131, 135, 139, 143, 147, 151, 155, 159, 163, 167, 171, 175, 179

The LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table indicates positions of elements "1" in the information matrix portion for every 360 columns and includes the following.

113 1557 3316 5680 6241 10407 13404 13947 14040 14353 15522 15698 16079 17363 19374 19543 20530 22833 24339
271 1361 6236 7006 7307 7333 12768 15441 15568 17923 18341 20321 21502 22023 23938 25351 25590 25876 25910
73 605 872 4008 6279 7653 10346 10799 12482 12935 13604 15909 16526 19782 20506 22804 23629 24859 25600
1445 1690 4304 4851 8919 9176 9252 13783 16076 16675 17274 18806 18882 20819 21958 22451 23869 23999 24177
1290 2337 5661 6371 8996 10102 10941 11360 12242 14918 16808 20571 23374 24046 25045 25060 25662 25783 25913
28 42 1926 3421 3503 8558 9453 10168 15820 17473 19571 19685 22790 23336 23367 23890 24061 25657 25680
0 1709 4041 4932 5968 7123 8430 9564 10596 11026 14761 19484 20762 20858 23803 24016 24795 25853 25863
29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915
7520 7690 8855 9183 14654 16695 17121 17854 18083 18428 19633 20470 20736 21720 22335 23273 25083 25293 25403
48 58 410 1299 3786 10668 18523 18963 20864 22106 22308 23033 23107 23128 23990 24286 24409 24595 25802
12 51 3894 6539 8276 10885 11644 12777 13427 14039 15954 17078 19053 20537 22863 24521 25087 25463 25838
3509 8748 9581 11509 15884 16230 17583 19264 20900 21001 21310 22547 22756 22959 24768 24814 25594 25626 25880
21 29 69 1448 2386 4601 6626 6667 10242 13141 13852 14137 18640 19951 22449 23454 24431 25512 25814
18 53 7890 9934 10063 16728 19040 19809 20825 21522 21800 23582 24556 25031 25547 25562 25733 25789 25906
4096 4582 5766 5894 6517 10027 12182 13247 15207 17041 18958 20133 20503 22228 24332 24613 25689 25855 25883
0 25 819 5539 7076 7536 7695 9532 13668 15051 17683 19665 20253 21996 24136 24890 25758 25784 25807
34 40 44 4215 6076 7427 7965 8777 11017 15593 19542 22202 22973 23397 23423 24418 24873 25107 25644
1595 6216 22850 25439 1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768

22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609

In the third data processing device/method, the LDPC coding is performed on the basis of the parity check matrix of the LDPC code having a code length N of 64800 bits and a coding rate r of 9/15. The group-wise interleaving which interleaves the LDPC code in a unit of a bit group of 360 bits is performed. Then, the LDPC code is mapped to any one of 16 signal points which are determined by the modulation method in a unit of 4 bits. In the group-wise interleaving, the (i+1)-th bit group from the head of the LDPC code is set as the bit group i and a sequence of bit groups 0 to 179 of the 64800-bit LDPC code is interleaved into a sequence of the following bit groups.

11, 5, 8, 18, 1, 25, 32, 31, 19, 21, 50, 102, 65, 85, 45, 86, 98, 104, 64, 78, 72, 53, 103, 79, 93, 41, 82, 108, 112, 116, 120, 124, 128, 132, 136, 140, 144, 148, 152, 156, 160, 164, 168, 172, 176, 4, 12, 15, 3, 10, 20, 26, 34, 23, 33, 68, 63, 69, 92, 44, 90, 75, 56, 100, 47, 106, 42, 39, 97, 99, 89, 52, 109, 113, 117, 121, 125, 129, 133, 137, 141, 145, 149, 153, 157, 161, 165, 169, 173, 177, 6, 16, 14, 7, 13, 36, 28, 29, 37, 73, 70, 54, 76, 91, 66, 80, 88, 51, 96, 81, 95, 38, 57, 105, 107, 59, 61, 110, 114, 118, 122, 126, 130, 134, 138, 142, 146, 150, 154, 158, 162, 166, 170, 174, 178, 0, 9, 17, 2, 27, 30, 24, 22, 35, 77, 74, 46, 94, 62, 87, 83, 101, 49, 43, 84, 48, 60, 67, 71, 58, 40, 55, 111, 115, 119, 123, 127, 131, 135, 139, 143, 147, 151, 155, 159, 163, 167, 171, 175, 179

The LDPC code includes the information bits and the parity bits. The parity check matrix includes the information matrix portion corresponding to the information bits and the parity matrix portion corresponding to the parity bits. The information matrix portion is represented by the parity check matrix initial value table. The parity check matrix initial value table indicates the positions of the elements "1" in the information matrix portion for every 360 columns and includes the following.

113 1557 3316 5680 6241 10407 13404 13947 14040 14353 15522 15698 16079 17363 19374 19543 20530 22833 24339
271 1361 6236 7006 7307 7333 12768 15441 15568 17923 18341 20321 21502 22023 23938 25351 25590 25876 25910
73 605 872 4008 6279 7653 10346 10799 12482 12935 13604 15909 16526 19782 20506 22804 23629 24859 25600
1445 1690 4304 4851 8919 9176 9252 13783 16076 16675 17274 18806 18882 20819 21958 22451 23869 23999 24177
1290 2337 5661 6371 8996 10102 10941 11360 12242 14918 16808 20571 23374 24046 25045 25060 25662 25783 25913
28 42 1926 3421 3503 8558 9453 10168 15820 17473 19571 19685 22790 23336 23367 23890 24061 25657 25680
0 1709 4041 4932 5968 7123 8430 9564 10596 11026 14761 19484 20762 20858 23803 24016 24795 25853 25863
29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915
7520 7690 8855 9183 14654 16695 17121 17854 18083 18428 19633 20470 20736 21720 22335 23273 25083 25293 25403
48 58 410 1299 3786 10668 18523 18963 20864 22106 22308 23033 23107 23128 23990 24286 24409 24595 25802
12 51 3894 6539 8276 10885 11644 12777 13427 14039 15954 17078 19053 20537 22863 24521 25087 25463 25838
3509 8748 9581 11509 15884 16230 17583 19264 20900 21001 21310 22547 22756 22959 24768 24814 25594 25626 25880
21 29 69 1448 2386 4601 6626 6667 10242 13141 13852 14137 18640 19951 22449 23454 24431 25512 25814
18 53 7890 9934 10063 16728 19040 19809 20825 21522 21800 23582 24556 25031 25547 25562 25733 25789 25906
4096 4582 5766 5894 6517 10027 12182 13247 15207 17041 18958 20133 20503 22228 24332 24613 25689 25855 25883
0 25 819 5539 7076 7536 7695 9532 13668 15051 17683 19665 20253 21996 24136 24890 25758 25784 25807
34 40 44 4215 6076 7427 7965 8777 11017 15593 19542 22202 22973 23397 23423 24418 24873 25107 25644
1595 6216 22850 25439
1562 15172 19517 22362
7508 12879 24324 24496
6298 15819 16757 18721
11173 15175 19966 21195
59 13505 16941 23793
2267 4830 12023 20587

8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609

A fourth data processing device/method to the present technology includes a group-wise deinterleaving unit/step that returns a sequence of an LDPC code, which has been subjected to group-wise interleaving and is obtained from data transmitted from a transmitting device, to an original sequence. The transmitting device includes: a coding unit that performs LDPC coding on the basis of a parity check matrix of the LDPC code having a code length N of 64800 bits and a coding rate r of 9/15; a group-wise interleaving unit that performs the group-wise interleaving which interleaves the LDPC code in a unit of a bit group of 360 bits; and a mapping unit that maps the LDPC code to any one of 16 signal points which are determined by a modulation method in a unit of 4 bits. In the group-wise interleaving, an (i+1)-th bit group from a head of the LDPC code is set as a bit group i and a sequence of bit groups 0 to 179 of the 64800-bit LDPC code is interleaved into a sequence of the following bit groups.

11, 5, 8, 18, 1, 25, 32, 31, 19, 21, 50, 102, 65, 85, 45, 86, 98, 104, 64, 78, 72, 53, 103, 79, 93, 41, 82, 108, 112, 116, 120, 124, 128, 132, 136, 140, 144, 148, 152, 156, 160, 164, 168, 172, 176, 4, 12, 15, 3, 10, 20, 26, 34, 23, 33, 68, 63, 69, 92, 44, 90, 75, 56, 100, 47, 106, 42, 39, 97, 99, 89, 52, 109, 113, 117, 121, 125, 129, 133, 137, 141, 145, 149, 153, 157, 161, 165, 169, 173, 177, 6, 16, 14, 7, 13, 36, 28, 29, 37, 73, 70, 54, 76, 91, 66, 80, 88, 51, 96, 81, 95, 38, 57, 105, 107, 59, 61, 110, 114, 118, 122, 126, 130, 134, 138, 142, 146, 150, 154, 158, 162, 166, 170, 174, 178, 0, 9, 17, 2, 27, 30, 24, 22, 35, 77, 74, 46, 94, 62, 87, 83, 101, 49, 43, 84, 48, 60, 67, 71, 58, 40, 55, 111, 115, 119, 123, 127, 131, 135, 139, 143, 147, 151, 155, 159, 163, 167, 171, 175, 179

The LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table indicates positions of elements "1" in the information matrix portion for every 360 columns and includes the following.

113 1557 3316 5680 6241 10407 13404 13947 14040 14353 15522 15698 16079 17363 19374 19543 20530 22833 24339

271 1361 6236 7006 7307 7333 12768 15441 15568 17923 18341 20321 21502 22023 23938 25351 25590 25876 25910

73 605 872 4008 6279 7653 10346 10799 12482 12935 13604 15909 16526 19782 20506 22804 23629 24859 25600

1445 1690 4304 4851 8919 9176 9252 13783 16076 16675 17274 18806 18882 20819 21958 22451 23869 23999 24177

1290 2337 5661 6371 8996 10102 10941 11360 12242 14918 16808 20571 23374 24046 25045 25060 25662 25783 25913
28 42 1926 3421 3503 8558 9453 10168 15820 17473 19571 19685 22790 23336 23367 23890 24061 25657 25680
0 1709 4041 4932 5968 7123 8430 9564 10596 11026 14761 19484 20762 20858 23803 24016 24795 25853 25863
29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915
7520 7690 8855 9183 14654 16695 17121 17854 18083 18428 19633 20470 20736 21720 22335 23273 25083 25293 25403
48 58 410 1299 3786 10668 18523 18963 20864 22106 22308 23033 23107 23128 23990 24286 24409 24595 25802
12 51 3894 6539 8276 10885 11644 12777 13427 14039 15954 17078 19053 20537 22863 24521 25087 25463 25838
3509 8748 9581 11509 15884 16230 17583 19264 20900 21001 21310 22547 22756 22959 24768 24814 25594 25626 25880
21 29 69 1448 2386 4601 6626 6667 10242 13141 13852 14137 18640 19951 22449 23454 24431 25512 25814
18 53 7890 9934 10063 16728 19040 19809 20825 21522 21800 23582 24556 25031 25547 25562 25733 25789 25906
4096 4582 5766 5894 6517 10027 12182 13247 15207 17041 18958 20133 20503 22228 24332 24613 25689 25855 25883
0 25 819 5539 7076 7536 7695 9532 13668 15051 17683 19665 20253 21996 24136 24890 25758 25784 25807
34 40 44 4215 6076 7427 7965 8777 11017 15593 19542 22202 22973 23397 23423 24418 24873 25107 25644
1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609

In the fourth data processing device/method, the transmitting device includes: the coding unit that performs LDPC coding on the basis of the parity check matrix of the LDPC code having a code length N of 64800 bits and a coding rate r of 9/15; the group-wise interleaving unit that performs the group-wise interleaving which interleaves the LDPC code in a unit of a bit group of 360 bits; and the mapping unit that maps the LDPC code to any one of 16 signal points which are determined by the modulation method in a unit of 4 bits. In the group-wise interleaving, the (i+1)-th bit group from the head of the LDPC code is set as the bit group i and a sequence of bit groups 0 to 179 of the 64800-bit LDPC code is interleaved into a sequence of the following bit groups.

11, 5, 8, 18, 1, 25, 32, 31, 19, 21, 50, 102, 65, 85, 45, 86, 98, 104, 64, 78, 72, 53, 103, 79, 93, 41, 82, 108, 112, 116, 120, 124, 128, 132, 136, 140, 144, 148, 152, 156, 160, 164, 168, 172, 176, 4, 12, 15, 3, 10, 20, 26, 34, 23, 33, 68, 63, 69, 92, 44, 90, 75, 56, 100, 47, 106, 42, 39, 97, 99, 89, 52, 109, 113, 117, 121, 125, 129, 133, 137, 141, 145, 149, 153, 157, 161, 165, 169, 173, 177, 6, 16, 14, 7, 13, 36, 28, 29, 37, 73, 70, 54, 76, 91, 66, 80, 88, 51, 96, 81, 95, 38, 57, 105, 107, 59, 61, 110, 114, 118, 122, 126, 130, 134, 138, 142, 146, 150, 154, 158, 162, 166, 170, 174, 178, 0, 9, 17, 2, 27, 30, 24, 22, 35, 77, 74, 46, 94, 62, 87, 83, 101, 49, 43, 84, 48, 60, 67, 71, 58, 40, 55, 111, 115, 119, 123, 127, 131, 135, 139, 143, 147, 151, 155, 159, 163, 167, 171, 175, 179

The LDPC code includes the information bits and the parity bits. The parity check matrix includes the information matrix portion corresponding to the information bits and the parity matrix portion corresponding to the parity bits. The information matrix portion is represented by the parity check matrix initial value table. The parity check matrix initial value table indicates positions of elements "1" in the information matrix portion for every 360 columns and includes the following. A sequence of the bit groups of the LDPC code, which has been subjected to the group-wise interleaving and is obtained from the data transmitted from the transmitting device, is returned to the original sequence.

113 1557 3316 5680 6241 10407 13404 13947 14040 14353 15522 15698 16079 17363 19374 19543 20530 22833 24339
271 1361 6236 7006 7307 7333 12768 15441 15568 17923 18341 20321 21502 22023 23938 25351 25590 25876 25910
73 605 872 4008 6279 7653 10346 10799 12482 12935 13604 15909 16526 19782 20506 22804 23629 24859 25600
1445 1690 4304 4851 8919 9176 9252 13783 16076 16675 17274 18806 18882 20819 21958 22451 23869 23999 24177
1290 2337 5661 6371 8996 10102 10941 11360 12242 14918 16808 20571 23374 24046 25045 25060 25662 25783 25913
28 42 1926 3421 3503 8558 9453 10168 15820 17473 19571 19685 22790 23336 23367 23890 24061 25657 25680
0 1709 4041 4932 5968 7123 8430 9564 10596 11026 14761 19484 20762 20858 23803 24016 24795 25853 25863
29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915
7520 7690 8855 9183 14654 16695 17121 17854 18083 18428 19633 20470 20736 21720 22335 23273 25083 25293 25403
48 58 410 1299 3786 10668 18523 18963 20864 22106 22308 23033 23107 23128 23990 24286 24409 24595 25802
12 51 3894 6539 8276 10885 11644 12777 13427 14039 15954 17078 19053 20537 22863 24521 25087 25463 25838
3509 8748 9581 11509 15884 16230 17583 19264 20900 21001 21310 22547 22756 22959 24768 24814 25594 25626 25880
21 29 69 1448 2386 4601 6626 6667 10242 13141 13852 14137 18640 19951 22449 23454 24431 25512 25814
18 53 7890 9934 10063 16728 19040 19809 20825 21522 21800 23582 24556 25031 25547 25562 25733 25789 25906
4096 4582 5766 5894 6517 10027 12182 13247 15207 17041 18958 20133 20503 22228 24332 24613 25689 25855 25883
0 25 819 5539 7076 7536 7695 9532 13668 15051 17683 19665 20253 21996 24136 24890 25758 25784 25807
34 40 44 4215 6076 7427 7965 8777 11017 15593 19542 22202 22973 23397 23423 24418 24873 25107 25644
1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851

549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609

A fifth data processing device/method according to the present technology includes: a coding unit/step that performs LDPC coding on the basis of a parity check matrix of an LDPC code having a code length N of 64800 bits and a coding rate r of 9/15; a group-wise interleaving unit/step that performs group-wise interleaving which interleaves the LDPC code in a unit of a bit group of 360 bits; and a mapping unit/step that maps the LDPC code to any one of 64 signal points which are determined by a modulation method in a unit of 6 bits. In the group-wise interleaving, an (i+1)-th bit group from a head of the LDPC code is set as a bit group i and a sequence of bit groups 0 to 179 of the 64800-bit LDPC code is interleaved into a sequence of the following bit groups.

9, 18, 15, 13, 35, 26, 28, 99, 40, 68, 85, 58, 63, 104, 50, 52, 94, 69, 108, 114, 120, 126, 132, 138, 144, 150, 156, 162, 168, 174, 8, 16, 17, 24, 37, 23, 22, 103, 64, 43, 47, 56, 92, 59, 70, 42, 106, 60, 109, 115, 121, 127, 133, 139, 145, 151, 157, 163, 169, 175, 4, 1, 10, 19, 30, 31, 89, 86, 77, 81, 51, 79, 83, 48, 45, 62, 67, 65, 110, 116, 122, 128, 134, 140, 146, 152, 158, 164, 170, 176, 6, 2, 0, 25, 20, 34, 98, 105, 82, 96, 90, 107, 53, 74, 73, 93, 55, 102, 111, 117, 123, 129, 135, 141, 147, 153, 159, 165, 171, 177, 14, 7, 3, 27, 21, 33, 44, 97, 38, 75, 72, 41, 84, 80, 100, 87, 76, 57, 112, 118, 124, 130, 136, 142, 148, 154, 160, 166, 172, 178, 5, 11, 12, 32, 29, 36, 88, 71, 78, 95, 49, 54, 61, 66, 46, 39, 101, 91, 113, 119, 125, 131, 137, 143, 149, 155, 161, 167, 173, 179

The LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table indicates positions of elements "1" in the information matrix portion for every 360 columns and includes the following.

113 1557 3316 5680 6241 10407 13404 13947 14040 14353 15522 15698 16079 17363 19374 19543 20530 22833 24339
271 1361 6236 7006 7307 7333 12768 15441 15568 17923 18341 20321 21502 22023 23938 25351 25590 25876 25910
73 605 872 4008 6279 7653 10346 10799 12482 12935 13604 15909 16526 19782 20506 22804 23629 24859 25600
1445 1690 4304 4851 8919 9176 9252 13783 16076 16675 17274 18806 18882 20819 21958 22451 23869 23999 24177
1290 2337 5661 6371 8996 10102 10941 11360 12242 14918 16808 20571 23374 24046 25045 25060 25662 25783 25913
28 42 1926 3421 3503 8558 9453 10168 15820 17473 19571 19685 22790 23336 23367 23890 24061 25657 25680
0 1709 4041 4932 5968 7123 8430 9564 10596 11026 14761 19484 20762 20858 23803 24016 24795 25853 25863
29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915
7520 7690 8855 9183 14654 16695 17121 17854 18083 18428 19633 20470 20736 21720 22335 23273 25083 25293 25403
48 58 410 1299 3786 10668 18523 18963 20864 22106 22308 23033 23107 23128 23990 24286 24409 24595 25802
12 51 3894 6539 8276 10885 11644 12777 13427 14039 15954 17078 19053 20537 22863 24521 25087 25463 25838
3509 8748 9581 11509 15884 16230 17583 19264 20900 21001 21310 22547 22756 22959 24768 24814 25594 25626 25880
21 29 69 1448 2386 4601 6626 6667 10242 13141 13852 14137 18640 19951 22449 23454 24431 25512 25814
18 53 7890 9934 10063 16728 19040 19809 20825 21522 21800 23582 24556 25031 25547 25562 25733 25789 25906
4096 4582 5766 5894 6517 10027 12182 13247 15207 17041 18958 20133 20503 22228 24332 24613 25689 25855 25883
0 25 819 5539 7076 7536 7695 9532 13668 15051 17683 19665 20253 21996 24136 24890 25758 25784 25807

34 40 44 4215 6076 7427 7965 8777 11017 15593 19542
22202 22973 23397 23423 24418 24873 25107 25644
1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609

In the fifth data processing device/method, the LDPC coding is performed on the basis of the parity check matrix of the LDPC code having a code length N of 64800 bits and a coding rate r of 9/15. The group-wise interleaving which interleaves the LDPC code in a unit of a bit group of 360 bits is performed. Then, the LDPC code is mapped to any one of 64 signal points which are determined by the modulation method in a unit of 6 bits. In the group-wise interleaving, the (i+1)-th bit group from the head of the LDPC code is set as the bit group i and a sequence of bit groups 0 to 179 of the 64800-bit LDPC code is interleaved into a sequence of the following bit groups.

9, 18, 15, 13, 35, 26, 28, 99, 40, 68, 85, 58, 63, 104, 50, 52, 94, 69, 108, 114, 120, 126, 132, 138, 144, 150, 156, 162, 168, 174, 8, 16, 17, 24, 37, 23, 22, 103, 64, 43, 47, 56, 92, 59, 70, 42, 106, 60, 109, 115, 121, 127, 133, 139, 145, 151, 157, 163, 169, 175, 4, 1, 10, 19, 30, 31, 89, 86, 77, 81, 51, 79, 83, 48, 45, 62, 67, 65, 110, 116, 122, 128, 134, 140, 146, 152, 158, 164, 170, 176, 6, 2, 0, 25, 20, 34, 98, 105, 82, 96, 90, 107, 53, 74, 73, 93, 55, 102, 111, 117, 123, 129, 135, 141, 147, 153, 159, 165, 171, 177, 14, 7, 3, 27, 21, 33, 44, 97, 38, 75, 72, 41, 84, 80, 100, 87, 76, 57, 112, 118, 124, 130, 136, 142, 148, 154, 160, 166, 172, 178, 5, 11, 12, 32, 29, 36, 88, 71, 78, 95, 49, 54, 61, 66, 46, 39, 101, 91, 113, 119, 125, 131, 137, 143, 149, 155, 161, 167, 173, 179

The LDPC code includes the information bits and the parity bits. The parity check matrix includes the information matrix portion corresponding to the information bits and the parity matrix portion corresponding to the parity bits. The information matrix portion is represented by the parity check matrix initial value table. The parity check matrix initial value table indicates the positions of the elements "1" in the information matrix portion for every 360 columns and includes the following.

113 1557 3316 5680 6241 10407 13404 13947 14040 14353 15522 15698 16079 17363 19374 19543 20530 22833 24339

271 1361 6236 7006 7307 7333 12768 15441 15568 17923 18341 20321 21502 22023 23938 25351 25590 25876 25910

73 605 872 4008 6279 7653 10346 10799 12482 12935 13604 15909 16526 19782 20506 22804 23629 24859 25600

1445 1690 4304 4851 8919 9176 9252 13783 16076 16675 17274 18806 18882 20819 21958 22451 23869 23999 24177

1290 2337 5661 6371 8996 10102 10941 11360 12242 14918 16808 20571 23374 24046 25045 25060 25662 25783 25913

28 42 1926 3421 3503 8558 9453 10168 15820 17473 19571 19685 22790 23336 23367 23890 24061 25657 25680

0 1709 4041 4932 5968 7123 8430 9564 10596 11026 14761 19484 20762 20858 23803 24016 24795 25853 25863

29 1625 6500 6609 16831 18517 18568 18738 19387 20159 20544 21603 21941 24137 24269 24416 24803 25154 25395

55 66 871 3700 11426 13221 15001 16367 17601 18380 22796 23488 23938 25476 25635 25678 25807 25857 25872

1 19 5958 8548 8860 11489 16845 18450 18469 19496 20190 23173 25262 25566 25668 25679 25858 25888 25915

7520 7690 8855 9183 14654 16695 17121 17854 18083 18428 19633 20470 20736 21720 22335 23273 25083 25293 25403

48 58 410 1299 3786 10668 18523 18963 20864 22106 22308 23033 23107 23128 23990 24286 24409 24595 25802

12 51 3894 6539 8276 10885 11644 12777 13427 14039 15954 17078 19053 20537 22863 24521 25087 25463 25838

3509 8748 9581 11509 15884 16230 17583 19264 20900 21001 21310 22547 22756 22959 24768 24814 25594 25626 25880

21 29 69 1448 2386 4601 6626 6667 10242 13141 13852 14137 18640 19951 22449 23454 24431 25512 25814

18 53 7890 9934 10063 16728 19040 19809 20825 21522 21800 23582 24556 25031 25547 25562 25733 25789 25906

4096 4582 5766 5894 6517 10027 12182 13247 15207 17041 18958 20133 20503 22228 24332 24613 25689 25855 25883

0 25 819 5539 7076 7536 7695 9532 13668 15051 17683 19665 20253 21996 24136 24890 25758 25784 25807

34 40 44 4215 6076 7427 7965 8777 11017 15593 19542 22202 22973 23397 23423 24418 24873 25107 25644

1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404

21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609

A sixth data processing device/method according to the present technology includes a group-wise deinterleaving unit/step that returns a sequence of an LDPC code, which has been subjected to group-wise interleaving and is obtained from data transmitted from a transmitting device, to an original sequence. The transmitting device includes: a coding unit that performs LDPC coding on the basis of a parity check matrix of the LDPC code having a code length N of 64800 bits and a coding rate r of 9/15; a group-wise interleaving unit that performs the group-wise interleaving which interleaves the LDPC code in a unit of a bit group of 360 bits; and a mapping unit that maps the LDPC code to any one of 64 signal points which are determined by a modulation method in a unit of 6 bits. In the group-wise interleaving, an (i+1)-th bit group from a head of the LDPC code is set as a bit group i and a sequence of bit groups 0 to 179 of the 64800-bit LDPC code is interleaved into a sequence of the following bit groups.

9, 18, 15, 13, 35, 26, 28, 99, 40, 68, 85, 58, 63, 104, 50, 52, 94, 69, 108, 114, 120, 126, 132, 138, 144, 150, 156, 162, 168, 174, 8, 16, 17, 24, 37, 23, 22, 103, 64, 43, 47, 56, 92, 59, 70, 42, 106, 60, 109, 115, 121, 127, 133, 139, 145, 151, 157, 163, 169, 175, 4, 1, 10, 19, 30, 31, 89, 86, 77, 81, 51, 79, 83, 48, 45, 62, 67, 65, 110, 116, 122, 128, 134, 140, 146, 152, 158, 164, 170, 176, 6, 2, 0, 25, 20, 34, 98, 105, 82, 96, 90, 107, 53, 74, 73, 93, 55, 102, 111, 117, 123, 129, 135, 141, 147, 153, 159, 165, 171, 177, 14, 7, 3, 27, 21, 33, 44, 97, 38, 75, 72, 41, 84, 80, 100, 87, 76, 57, 112, 118, 124, 130, 136, 142, 148, 154, 160, 166, 172, 178, 5, 11, 12, 32, 29, 36, 88, 71, 78, 95, 49, 54, 61, 66, 46, 39, 101, 91, 113, 119, 125, 131, 137, 143, 149, 155, 161, 167, 173, 179

The LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table indicates positions of elements "1" in the information matrix portion for every 360 columns and includes the following.

113 1557 3316 5680 6241 10407 13404 13947 14040 14353 15522 15698 16079 17363 19374 19543 20530 22833 24339
271 1361 6236 7006 7307 7333 12768 15441 15568 17923 18341 20321 21502 22023 23938 25351 25590 25876 25910
73 605 872 4008 6279 7653 10346 10799 12482 12935 13604 15909 16526 19782 20506 22804 23629 24859 25600
1445 1690 4304 4851 8919 9176 9252 13783 16076 16675 17274 18806 18882 20819 21958 22451 23869 23999 24177
1290 2337 5661 6371 8996 10102 10941 11360 12242 14918 16808 20571 23374 24046 25045 25060 25662 25783 25913
28 42 1926 3421 3503 8558 9453 10168 15820 17473 19571 19685 22790 23336 23367 23890 24061 25657 25680
0 1709 4041 4932 5968 7123 8430 9564 10596 11026 14761 19484 20762 20858 23803 24016 24795 25853 25863
29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915
7520 7690 8855 9183 14654 16695 17121 17854 18083 18428 19633 20470 20736 21720 22335 23273 25083 25293 25403
48 58 410 1299 3786 10668 18523 18963 20864 22106 22308 23033 23107 23128 23990 24286 24409 24595 25802
12 51 3894 6539 8276 10885 11644 12777 13427 14039 15954 17078 19053 20537 22863 24521 25087 25463 25838
3509 8748 9581 11509 15884 16230 17583 19264 20900 21001 21310 22547 22756 22959 24768 24814 25594 25626 25880
21 29 69 1448 2386 4601 6626 6667 10242 13141 13852 14137 18640 19951 22449 23454 24431 25512 25814
18 53 7890 9934 10063 16728 19040 19809 20825 21522 21800 23582 24556 25031 25547 25562 25733 25789 25906
4096 4582 5766 5894 6517 10027 12182 13247 15207 17041 18958 20133 20503 22228 24332 24613 25689 25855 25883
0 25 819 5539 7076 7536 7695 9532 13668 15051 17683 19665 20253 21996 24136 24890 25758 25784 25807
34 40 44 4215 6076 7427 7965 8777 11017 15593 19542 22202 22973 23397 23423 24418 24873 25107 25644
1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275

12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609

In the sixth data processing device/method, the transmitting device includes: the coding unit that performs LDPC coding on the basis of the parity check matrix of the LDPC code having a code length N of 64800 bits and a coding rate r of 9/15; the group-wise interleaving unit that performs the group-wise interleaving which interleaves the LDPC code in a unit of a bit group of 360 bits; and the mapping unit that maps the LDPC code to any one of 64 signal points which are determined by the modulation method in a unit of 6 bits. In the group-wise interleaving, the (i+1)-th bit group from the head of the LDPC code is set as the bit group i and a sequence of bit groups 0 to 179 of the 64800-bit LDPC code is interleaved into a sequence of the following bit groups.

9, 18, 15, 13, 35, 26, 28, 99, 40, 68, 85, 58, 63, 104, 50, 52, 94, 69, 108, 114, 120, 126, 132, 138, 144, 150, 156, 162, 168, 174, 8, 16, 17, 24, 37, 23, 22, 103, 64, 43, 47, 56, 92, 59, 70, 42, 106, 60, 109, 115, 121, 127, 133, 139, 145, 151, 157, 163, 169, 175, 4, 1, 10, 19, 30, 31, 89, 86, 77, 81, 51, 79, 83, 48, 45, 62, 67, 65, 110, 116, 122, 128, 134, 140, 146, 152, 158, 164, 170, 176, 6, 2, 0, 25, 20, 34, 98, 105, 82, 96, 90, 107, 53, 74, 73, 93, 55, 102, 111, 117, 123, 129, 135, 141, 147, 153, 159, 165, 171, 177, 14, 7, 3, 27, 21, 33, 44, 97, 38, 75, 72, 41, 84, 80, 100, 87, 76, 57, 112, 118, 124, 130, 136, 142, 148, 154, 160, 166, 172, 178, 5, 11, 12, 32, 29, 36, 88, 71, 78, 95, 49, 54, 61, 66, 46, 39, 101, 91, 113, 119, 125, 131, 137, 143, 149, 155, 161, 167, 173, 179

The LDPC code includes the information bits and the parity bits. The parity check matrix includes the information matrix portion corresponding to the information bits and the parity matrix portion corresponding to the parity bits. The information matrix portion is represented by the parity check matrix initial value table. The parity check matrix initial value table indicates positions of elements "1" in the information matrix portion for every 360 columns and includes the following. A sequence of the bit groups of the LDPC code, which has been subjected to the group-wise interleaving and is obtained from the data transmitted from the transmitting device, is returned to the original sequence.

113 1557 3316 5680 6241 10407 13404 13947 14040 14353 15522 15698 16079 17363 19374 19543 20530 22833 24339
271 1361 6236 7006 7307 7333 12768 15441 15568 17923 18341 20321 21502 22023 23938 25351 25590 25876 25910
73 605 872 4008 6279 7653 10346 10799 12482 12935 13604 15909 16526 19782 20506 22804 23629 24859 25600
1445 1690 4304 4851 8919 9176 9252 13783 16076 16675 17274 18806 18882 20819 21958 22451 23869 23999 24177
1290 2337 5661 6371 8996 10102 10941 11360 12242 14918 16808 20571 23374 24046 25045 25060 25662 25783 25913
28 42 1926 3421 3503 8558 9453 10168 15820 17473 19571 19685 22790 23336 23367 23890 24061 25657 25680
0 1709 4041 4932 5968 7123 8430 9564 10596 11026 14761 19484 20762 20858 23803 24016 24795 25853 25863
29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915
7520 7690 8855 9183 14654 16695 17121 17854 18083 18428 19633 20470 20736 21720 22335 23273 25083 25293 25403
48 58 410 1299 3786 10668 18523 18963 20864 22106 22308 23033 23107 23128 23990 24286 24409 24595 25802
12 51 3894 6539 8276 10885 11644 12777 13427 14039 15954 17078 19053 20537 22863 24521 25087 25463 25838
3509 8748 9581 11509 15884 16230 17583 19264 20900 21001 21310 22547 22756 22959 24768 24814 25594 25626 25880
21 29 69 1448 2386 4601 6626 6667 10242 13141 13852 14137 18640 19951 22449 23454 24431 25512 25814
18 53 7890 9934 10063 16728 19040 19809 20825 21522 21800 23582 24556 25031 25547 25562 25733 25789 25906

4096 4582 5766 5894 6517 10027 12182 13247 15207 17041 18958 20133 20503 22228 24332 24613 25689 25855 25883
0 25 819 5539 7076 7536 7695 9532 13668 15051 17683 19665 20253 21996 24136 24890 25758 25784 25807
34 40 44 4215 6076 7427 7965 8777 11017 15593 19542 22202 22973 23397 23423 24418 24873 25107 25644
1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609

The data processing device may be an independent device or an internal block forming one device.

Effects of the Invention

According to the present technology, it is possible to ensure high communication quality in data transmission using LDPC codes.

The effects described herein are not necessarily limited and may be any effect described in the present disclosure.

BRIEF DESCRIPTION OF DRAWINGS

FIG. 3 is a diagram illustrating an example of a parity check matrix of an LDPC code.

FIG. 13 is a diagram illustrating the parity check matrix of the LDPC code defined by the DVB-T.2 standard.

FIG. 21 is a diagram illustrating a method for calculating a parity check matrix H from the parity check matrix initial value table.

FIG. 30 is a diagram illustrating an example of the parity check matrix initial value table.

FIG. 31 is a diagram illustrating an example of the parity check matrix initial value table.

FIG. 32 is a diagram illustrating an example of the parity check matrix initial value table.

FIG. 33 is a diagram illustrating an example of the parity check matrix initial value table.

FIG. 34 is a diagram illustrating the example of the parity check matrix initial value table.

FIG. 36 is a diagram illustrating an example of the parity check matrix initial value table.

FIG. 37 is a diagram illustrating the example of the parity check matrix initial value table.

FIG. 39 is a diagram illustrating an example of the parity check matrix initial value table.

FIG. 40 is a diagram illustrating the example of the parity check matrix initial value table.

FIG. 41 is a diagram illustrating the example of the parity check matrix initial value table.

FIG. 43 is a diagram illustrating an example of the parity check matrix initial value table.

FIG. 44 is a diagram illustrating the example of the parity check matrix initial value table.

FIG. 45 is a diagram illustrating the example of the parity check matrix initial value table.

FIG. 47 is a diagram illustrating an example of the parity check matrix initial value table.

FIG. 49 is a diagram illustrating an example of the parity check matrix initial value table.

FIG. 50 is a diagram illustrating the example of the parity check matrix initial value table.

FIG. 52 is a diagram illustrating an example of the parity check matrix initial value table.

FIG. 53 is a diagram illustrating the example of the parity check matrix initial value table.

FIG. 54 is a diagram illustrating the example of the parity check matrix initial value table.

FIG. 55 is a diagram illustrating an example of the parity check matrix initial value table.

FIG. 56 is a diagram illustrating an example of the parity check matrix initial value table.

FIG. 57 is a diagram illustrating an example of the parity check matrix initial value table.

FIG. 58 is a diagram illustrating an example of the parity check matrix initial value table.

FIG. 59 is a diagram illustrating an example of the parity check matrix initial value table.

FIG. 60 is a diagram illustrating an example of the parity check matrix initial value table.

FIG. 61 is a diagram illustrating the example of the parity check matrix initial value table.

FIG. 63 is a diagram illustrating an example of the parity check matrix initial value table.

FIG. 64 is a diagram illustrating the example of the parity check matrix initial value table.

FIG. 65 is a diagram illustrating the example of the parity check matrix initial value table.

FIG. 66 is a diagram illustrating an example of the parity check matrix initial value table.

FIG. 67 is a diagram illustrating an example of the parity check matrix initial value table.

FIG. 68 is a diagram illustrating the example of the parity check matrix initial value table.

FIG. 69 is a diagram illustrating an example of the parity check matrix initial value table.

FIG. 70 is a diagram illustrating the example of the parity check matrix initial value table.

FIG. 71 is a diagram illustrating an example of the parity check matrix initial value table.

FIG. 72 is a diagram illustrating the example of the parity check matrix initial value table.

FIG. 77 is a diagram illustrating a parity check matrix.
FIG. 78 is a diagram illustrating a parity check matrix.
FIG. 87 is a diagram illustrating an example of the coordinates of a signal point of a UC when the modulation method is QPSK.
FIG. 88 is a diagram illustrating an example of the coordinates of a signal point of a 2D NUC when the modulation method is 16QAM.
FIG. 89 is a diagram illustrating an example of the coordinates of a signal point of a 2D NUC when the modulation method is 64QAM.
FIG. 90 is a diagram illustrating an example of the coordinates of a signal point of a 2D NUC when the modulation method is 256QAM.
FIG. 91 is a diagram illustrating an example of the coordinates of a signal point of a 1D NUC when the modulation method is 1024QAM.
FIG. 92 is a diagram illustrating the relationship between a symbol y, and a real part $R_e(z_q)$ and an imaginary part $Im(z_q)$ of a complex number as the coordinates of a signal point $z_q$ of a 1D NUC corresponding to the symbol y.
FIG. 94 is a diagram illustrating examples of the number of columns C of parts 1 and 2 corresponding to a combination of a code length N and a modulation method and part column lengths R1 and R2.
FIG. 97 is a diagram illustrating a first example of a GW pattern for an LDPC code with a code length N of 64 kbits.
FIG. 98 is a diagram illustrating a second example of the GW pattern for the LDPC code with a code length N of 64 kbits.
FIG. 99 is a diagram illustrating a third example of the GW pattern for the LDPC code with a code length N of 64 kbits.
FIG. 100 is a diagram illustrating a fourth example of the GW pattern for the LDPC code with a code length N of 64 kbits.
FIG. 101 is a diagram illustrating a fifth example of the GW pattern for the LDPC code with a code length N of 64 kbits.
FIG. 102 is a diagram illustrating a sixth example of the GW pattern for the LDPC code with a code length N of 64 kbits.
FIG. 103 is a diagram illustrating a seventh example of the GW pattern for the LDPC code with a code length N of 64 kbits.
FIG. 104 is a diagram illustrating an eighth example of the GW pattern for the LDPC code with a code length N of 64 kbits.
FIG. 105 is a diagram illustrating a ninth example of the GW pattern for the LDPC code with a code length N of 64 kbits.
FIG. 106 is a diagram illustrating a tenth example of the GW pattern for the LDPC code with a code length N of 64 kbits.
FIG. 107 is a diagram illustrating an eleventh example of the GW pattern for the LDPC code with a code length N of 64 kbits.
FIG. 108 is a diagram illustrating a twelfth example of the GW pattern for the LDPC code with a code length N of 64 kbits.
FIG. 109 is a diagram illustrating a thirteenth example of the GW pattern for the LDPC code with a code length N of 64 kbits.
FIG. 110 is a diagram illustrating a fourteenth example of the GW pattern for the LDPC code with a code length N of 64 kbits.
FIG. 111 is a diagram illustrating a fifteenth example of the GW pattern for the LDPC code with a code length N of 64 kbits.

MODE FOR CARRYING OUT THE INVENTION

Hereinafter, an LDPC code will be described before embodiments of the present technology are described.
<LDPC Code>

The LDPC code is a linear code and is not necessarily a binary code. However, here, it is assumed that the LDPC code is a binary code.

The maximum characteristic of the LDPC code is that a parity check matrix defining the LDPC code is sparse. Here, the sparse matrix means a matrix in which the number of "1s" which are elements of a matrix is very small (a matrix in which most of the elements are 0).

Figure 1:
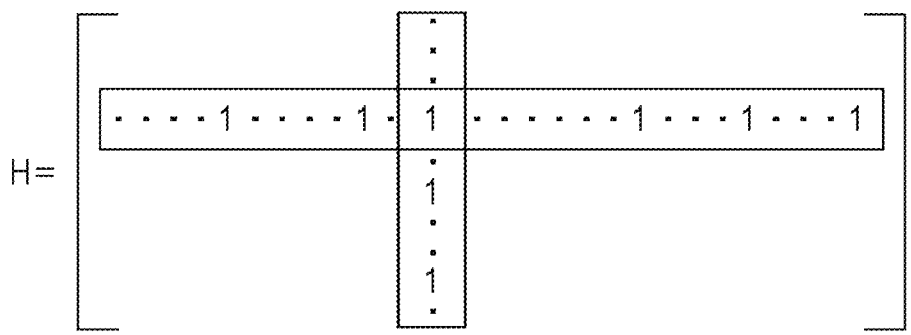
FIG. 1 is a diagram illustrating a parity check matrix H of an LDPC code.

FIG. 1 is a diagram illustrating an example of a parity check matrix H of the LDPC code.

In the parity check matrix H illustrated in FIG. 1, the weight of each column (column weight) (the number of "1s") is "3" and the weight of each row (row weight) is "6".

In coding using the LDPC code (LDPC coding), for example, a generation matrix G is generated on the basis of the parity check matrix H and the generation matrix G is multiplied by binary information bits to generate a code word (LDPC code)

Specifically, first, a coding device that performs the LDPC coding calculates the generation matrix G in which a formula $GH^T=0$ is established between a transposed matrix $H^T$ of the parity check matrix H and the generation matrix G. Here, when the generation matrix G is a K×N matrix, the coding device multiplies the generation matrix G by a bit string (vector u) of information bits including K bits to generate a code word c (=uG) including N bits. The code word (LDPC code) generated by the coding device is received by a receiver side through a predetermined communication path.

The LDPC code can be decoded by an algorithm that is called probabilistic decoding suggested by Gallager, that is, a message passing algorithm using belief propagation on a so-called Tanner graph including a variable node (also referred to as a message node) and a check node. Hereinafter, the variable node and the check node are appropriately referred to as nodes simply.

Figure 2:
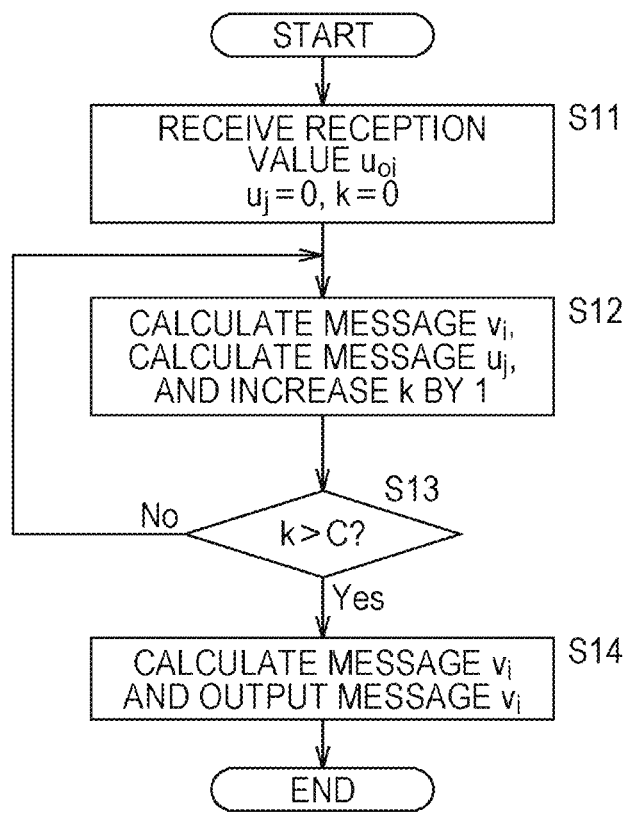
FIG. 2 is a flowchart illustrating an LDPC code decoding process.

FIG. 2 is a flowchart illustrating an LDPC code decoding process.

Hereinafter, a real value (a reception LLR) in which the likelihood of a value "0" of an i-th code bit in the LDPC code (one code word) which is received by the receiver side is represented by a log likelihood ratio is appropriately referred to as a reception value $u_{0\,i}$. In addition, a message that is output from the check node is referred to as $u_j$ and a message that is output from the variable node is referred to as $v_i$.

First, in the decoding of the LDPC code, as illustrated in FIG. 2, in Step S11, the LDPC code is received, the message (check node message) $u_j$ is initialized to "0", and a variable k which is an integer as a counter of a repetition process is initialized to "0". Then, the process proceeds to Step S12. In Step S12, the message (variable node operation) $v_i$ is calculated by performing an operation (variable node operation) represented by Formula (1) on the basis of the reception value $u_{0\,i}$ obtained by receiving the LDPC code and the message $u_j$ is calculated by performing an operation (check node operation) represented by Formula (2) on the basis of the message $v_i$.

[Mathematical Formula 1]

$$v_i = u_{0i} + \sum_{j=1}^{d_v-1} u_j \qquad (1)$$

[Mathematical Formula 2]

$$\tanh\left(\frac{u_j}{2}\right) = \prod_{i=1}^{d_c-1} \tanh\left(\frac{v_i}{2}\right) \qquad (2)$$

Here, $d_v$ and $d_c$ in Formula (1) and Formula (2) are parameters which can be arbitrarily selected and indicate the number of "1s" in the longitudinal direction (column) and the lateral direction (row) of the parity check matrix H, respectively. For example, in the case of an LDPC code ((3, 6) LDPC code) with respect to the parity check matrix H in which the column weight is 3 and the row weight is 6 as illustrated in FIG. 1, $d_v$ is 3 and $d_c$ is 6.

In the variable node operation represented by Formula (1) and the check node operation represented by Formula (2), since the message which is input from an edge (a line connecting the variable node and the check node) for outputting the message is not subjected to the operation, an operation range is from 1 to $d_v-1$ or from 1 to $d_c-1$. In practice, the check node operation represented by Formula (2) is performed by making a table of a function R ($v_1, v_2$) that is represented by Formula (3) defined by two inputs $v_1$ and $v_2$ and one output and by continuously (recursively) using the table, as represented by Formula (4).

[Mathematical Formula 3]

$$x=2\tan h^{-1}\{\tan h(v_1/2)\tan h(v_2/2)\}=R(v_1,v_2) \qquad (3)$$

[Mathematical Formula 4]

$$u_j=R(v_1,R(v_2,R(v_3,\ldots R(v_{d_c-2},v_{d_c-1})))) \qquad (4)$$

In Step S12, the variable k is incremented by "1" and the process proceeds to Step S13. In Step S13, it is determined whether the variable k is greater than a predetermined number of repetitive decoding operations C. When it is determined in Step S13 that the variable k is not greater than C, the process returns to Step S12 and the same process as described above is repeated.

When it is determined in Step S13 that the variable k is greater than C, the process proceeds to Step S14. An operation represented by Formula (5) is performed to calculate the message $v_i$ as the decoding result that is finally output and the message $v_i$ is output. The LDPC code decoding process ends.

[Mathematical Formula 5]

$$v_i = u_{0i} + \sum_{j=1}^{d_v} u_j \qquad (5)$$

Here, the operation represented by Formula (5) is different from the variable node operation represented by Formula (1) and is performed using the messages $u_j$ from all of the edges connected to the variable node.

FIG. 3 is a diagram illustrating an example of the parity check matrix H of the (3, 6) LDPC code (a coding rate of ½ and a code length of 12).

In the parity check matrix H illustrated in FIG. 3, similarly to FIG. 1, the weight of a column is 3 and the weight of a row is 6.

Figure 4:
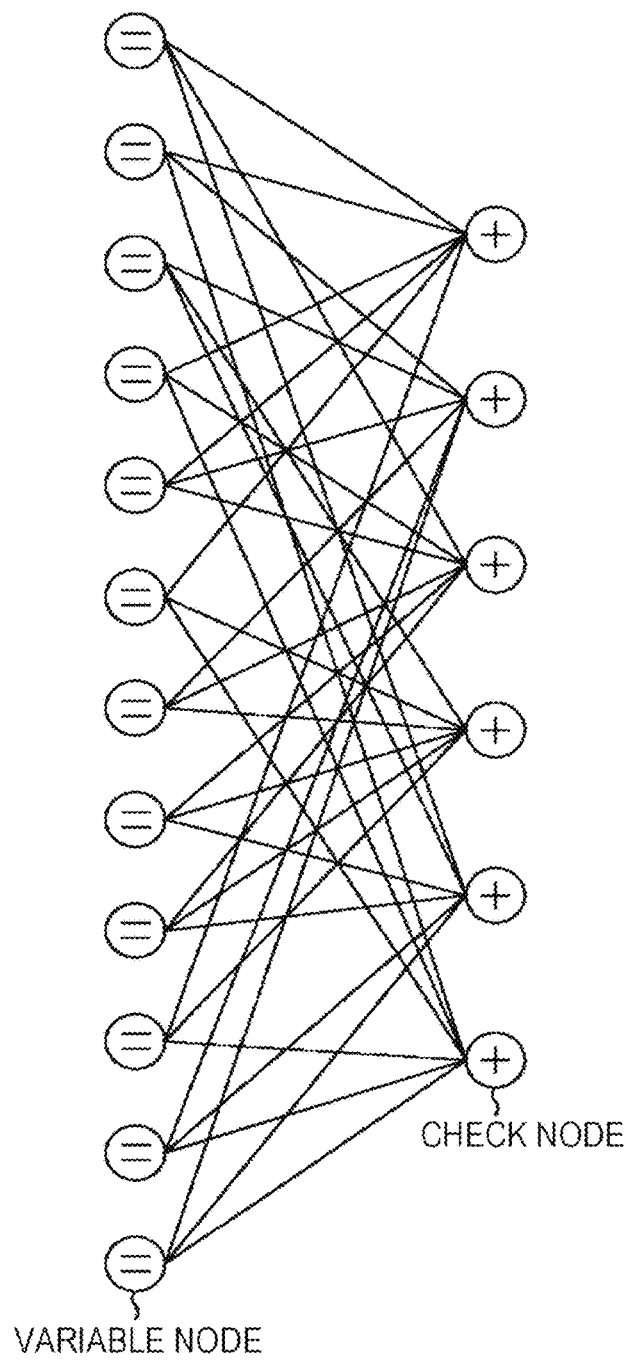
FIG. 4 is a diagram illustrating an example of a Tanner graph of the parity check matrix.

FIG. 4 is a diagram illustrating a Tanner graph of the parity check matrix H illustrated in FIG. 3.

Here, in FIG. 4, the check node is represented by "+" (plus) and the variable node is represented by "=" (equal). The check node and the variable node correspond to a row and a column of the parity check matrix H, respectively. A line that connects the check node and the variable node is the edge and corresponds to an element "1" of the parity check matrix.

That is, in FIG. 4, when an element in a j-th row and an i-th column of the parity check matrix is 1, an i-th variable node (node represented by "=") from the upper side and a j-th check node (node represented by "+") from the upper side are connected by the edge. The edge indicates that a code bit corresponding to the variable node has a restriction condition corresponding to the check node.

In a sum product algorithm that is an LDPC code decoding method, the variable node operation and the check node operation are repetitively performed.

Figure 5:
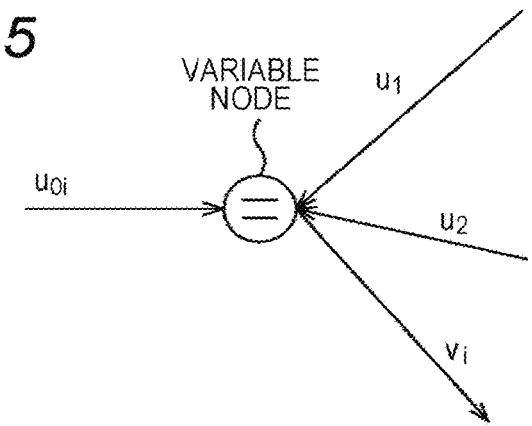
FIG. 5 is a diagram illustrating an example of a variable node.

FIG. 5 is a diagram illustrating the variable node operation performed in the variable node.

In the variable node, the message $v_i$ that corresponds to the edge to be calculated is calculated by the variable node operation represented by Formula (1), using messages $u_1$ and $u_2$ from the remaining edges connected to the variable node and the reception value $u_{0,i}$. The messages that correspond to the other edges are calculated by the same method as described above.

Figure 6:
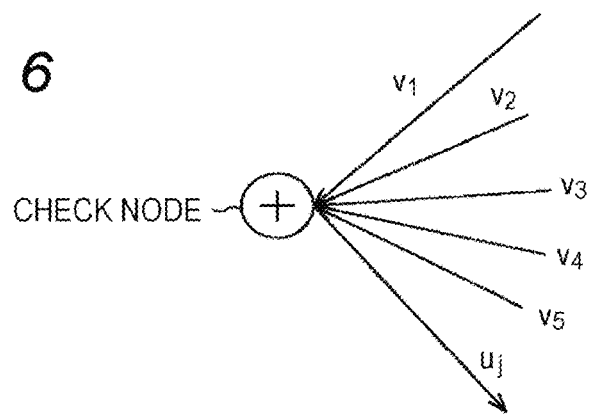
FIG. 6 is a diagram illustrating an example of a check node.

FIG. 6 is a diagram illustrating the check node operation performed in the check node.

Here, the check node operation represented by Formula (2) can be rewritten by Formula (6) using the relationship of the following formula: $a \times b = \exp\{\ln(|a|)+\ln(|b|)\} \times \text{sign}(a) \times \text{sign}(b)$. However, $\text{sign}(x)$ is 1 when $x \geq 0$ is satisfied and is $-1$ when $x < 0$ is satisfied.

[Mathematical Formula 6]

$$\begin{aligned}u_j &= 2\tanh^{-1}\left(\prod_{i=1}^{d_c-1} \tanh\left(\frac{v_i}{2}\right)\right) \\ &= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right] \\ &= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right]\end{aligned} \qquad (6)$$

When a function $\phi(x)$ is defined as a formula $\phi(x)=\ln(\tan h(x/2))$ at $x \geq 0$, a formula $\phi^{-1}(x)=2 \tan h^{-1}(e^{-x})$ is established. Therefore, Formula (6) can be changed to Formula (7).

[Mathematical Formula 7]

$$u_j = \phi^{-1}\left(\sum_{i=1}^{d_c-1} \phi(|v_i|)\right) \times \prod_{i=1}^{d_c-1} \text{sign}(v_i) \qquad (7)$$

In the check node, the check node operation represented by Formula (2) is performed according to Formula (7).

That is, in the check node, as illustrated in FIG. 6, the message $u_j$ corresponding to the edge to be calculated is calculated by the check node operation represented by Formula (7), using messages $v_1$, $v_2$, $v_3$, $v_4$, and $v_5$ from the remaining edges connected to the check node. The messages that correspond to the other edges are calculated by the same method as described above.

The function $\phi(x)$ in Formula (7) can be represented by a formula $\phi(x)=\ln((e^x+1)/(e^x-1))$ and $\phi(x)=\phi^{-1}(x)$ is established when $x>0$ is satisfied. When the functions $\phi(x)$ and $\phi^{-1}(x)$ are provided in hardware, in some cases, they are provided using a lookup table (LUT). Both the functions become the same LUT.

<Example of Structure of Transmission System to which the Present Invention is Applied>

Figure 7:
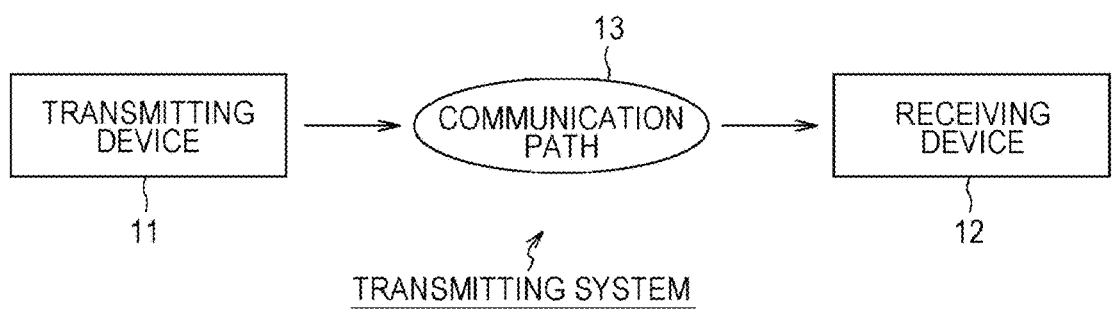
FIG. 7 is a diagram illustrating an example of the structure of an embodiment of a transmission system to which the present technology is applied.

FIG. 7 is a diagram illustrating an example of the structure of an embodiment of a transmission system (a system means a logical group of a plurality of devices and it does not matter whether devices having each structure are provided in the same housing) to which the present technology is applied.

In FIG. 7, the transmission system includes a transmitting device 11 and a receiving device 12.

For example, the transmitting device 11 transmits (broadcasts) (sends) a television program. That is, for example, the transmitting device 11 encodes target data to be transmitted, such as image data and audio data as a program, into LDPC codes, and transmits the LDPC codes through a communication path 13, such as a satellite channel, a terrestrial channel, or a cable (wired line).

The receiving device 12 receives the LDPC codes transmitted from the transmitting device 11 through the communication path 13, decodes the LDPC codes into target data, and outputs the target data.

Here, it has been known that the LDPC code used by the transmission system illustrated in FIG. 7 has very high capability in an additive white Gaussian noise (AWGN) communication path.

In the communication path 13, in some cases, a burst error or erasure occurs. For example, in particular, when the communication path 13 is a terrestrial channel, in some cases, the power of a specific symbol is 0 (erasure) according to the delay of an echo (a channel other than a main channel) in a multi-path environment in which a desired-to-undesired ratio (D/U) is 0 dB (the power of Undesired=echo is equal to the power of Desired=main path) in an orthogonal frequency division multiplexing (OFDM) system.

In a flutter (a communication path in which delay is 0 and to which an echo having a Doppler frequency is added), in some cases, when D/U is 0 dB, the power of all of the OFDM symbols at a specific time is 0 (erasure) according to the Doppler frequency.

In addition, in some cases, a burst error occurs due to the conditions of a wiring line from a receiving unit (not illustrated), such as an antenna that receives signals from the transmitting device 11, on the side of the receiving device 12 to the receiving device 12 or the instability of a power supply of the receiving device 12.

In the decoding of the LDPC code, in the variable node corresponding to the column of the parity check matrix H and the code bit of the LDPC code, as illustrated in FIG. 5, the variable node operation represented by Formula (1) involving the addition of (the reception value $u_{0,i}$ of) the code bit of the LDPC code is performed. Therefore, when an error occurs in the code bits used for the variable node operation, the accuracy of the calculated message is reduced.

In the decoding of the LDPC code, in the check node, the check node operation represented by Formula (7) is performed, using the message calculated in the variable node connected to the check node. Therefore, when the number of check nodes to which (the code bits of the LDPC codes corresponding to) a plurality of variable nodes, in which errors (including erasure) simultaneously occur, are connected increases, a decoding performance deteriorates.

That is, for example, when erasure simultaneously occurs in two or more of the variable nodes connected to the check node, the check node returns a message in which the probability of a value being 0 and the probability of a value being 1 are equal to each other to all of the variable nodes. In this case, the check node that returns the message of the equal probability does not contribute to one decoding process (one set of the variable node operation and the check node operation) As a result, it is necessary to increase the number of times the decoding process is repeated and the decoding performance deteriorates. In addition, the power consumption of the receiving device 12 that decodes the LDPC code increases.

Therefore, in the transmission system illustrated in FIG. 7, it is possible to improve tolerance to a burst error or erasure while maintaining the performance in the AWGN communication path (AWGN channel).

<Example of Structure of Transmitting Device 11>

Figure 8:
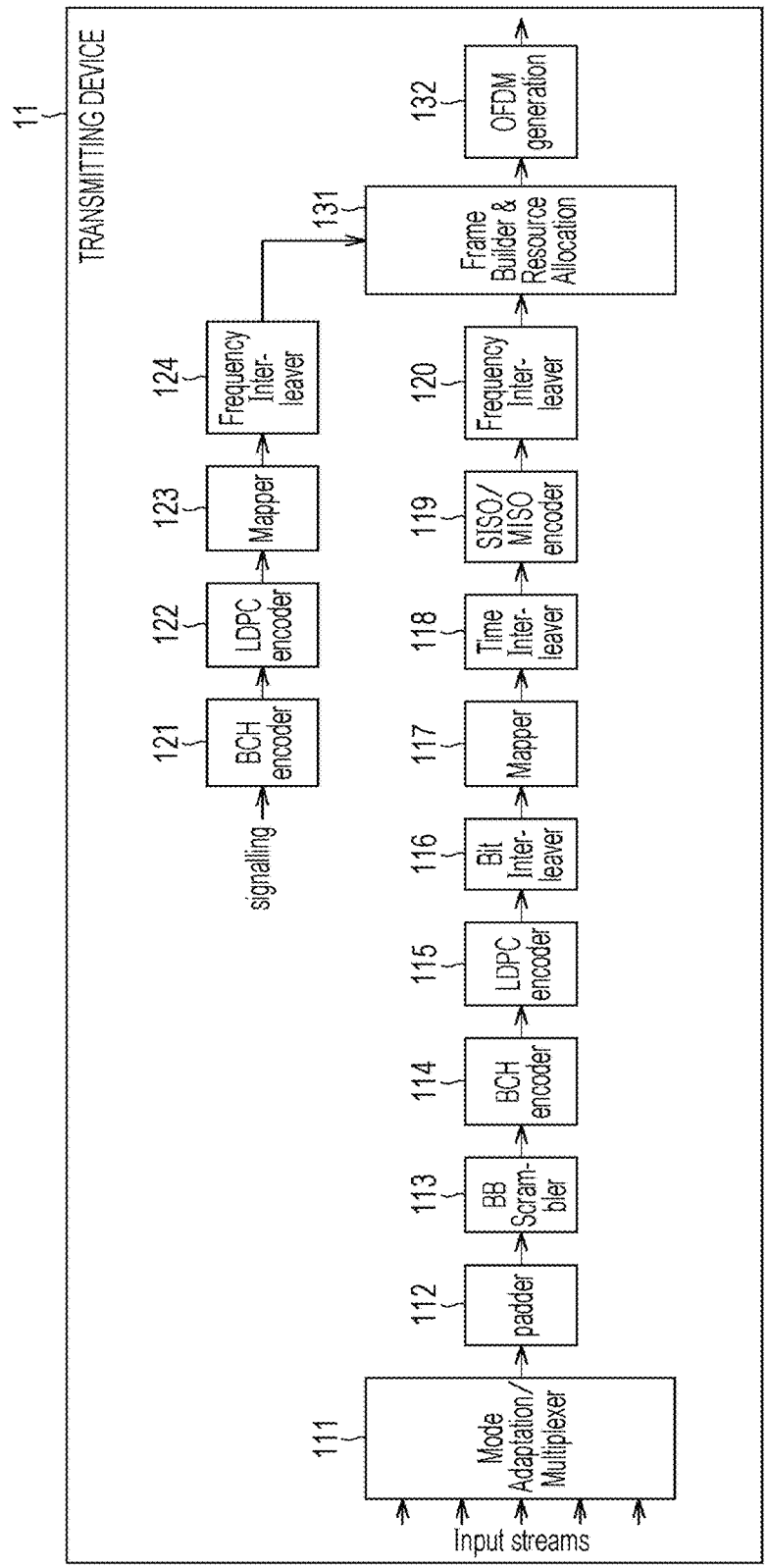
FIG. 8 is a block diagram illustrating an example of the structure of a transmitting device 11.

FIG. 8 is a block diagram illustrating an example of the structure of the transmitting device 11 illustrated in FIG. 7.

In the transmitting device 11, one or more input streams are supplied as target data to a mode adaptation/multiplexer 111.

The mode adaptation/multiplexer 111 performs, for example, a mode selection process and a process of multiplexing one or more input streams supplied thereto, if necessary, and supplies the processed data to a padder 112.

The padder 112 performs necessary zero padding (insertion of Null) for the data from the mode adaptation/multiplexer 111 and supplies data obtained by the zero padding to a BB scrambler 113.

The BB scrambler 113 performs base-band scrambling (BB scrambling) for the data from the padder 112 and supplies data obtained by the BB scrambling to a BCH encoder 114.

The BCH encoder 114 performs BCH coding for the data from the BB scrambler 113 and supplies data obtained by the BCH coding as LDPC target data to be subjected to LDPC coding to an LDPC encoder 115.

The LDPC encoder 115 performs LDPC coding for the LDPC target data supplied from the BCH encoder 114 according to a parity check matrix in which a parity matrix that is a portion corresponding to the parity bits of the LDPC code has a dual diagonal structure and outputs an LDPC code having the LDPC target data as information bits.

That is, the LDPC encoder 115 performs LDPC coding (corresponding to the parity check matrix) which is defined by a predetermined standard, such as DVB-S.2, DVB-T.2, or DVB-C.2, or LDPC coding (corresponding to the parity check matrix) which is scheduled to be used in ATSC3.0 for the LDPC target data and outputs the LDPC code obtained by the LDPC coding.

Here, the LDPC code defined by the DVB-T.2 standard or the LDPC code which is scheduled to be used in ATSC3.0 is an irregular repeat accumulate (IRA) code and a parity matrix of the parity check matrix of the LDPC code has a dual diagonal structure. The parity matrix and the dual diagonal structure will be described below. The IRA code is described in, for example, "Irregular Repeat-Accumulate Codes", H. Jin, A. Khandekar, and R. J. McEliece, in Proceedings of 2nd International Symposium on Turbo codes and Related Topics, pp. 1-8, September 2000.

The LDPC code output from the LDPC encoder 115 is supplied to a bit interleaver 116.

The bit interleaver 116 performs bit interleaving, which will be described below, for the LDPC code supplied from the LDPC encoder 115 and supplies the bit-interleaved LDPC code to a mapper 117.

The mapper 117 maps the LDPC code supplied from the bit interleaver 116 to a signal point indicating one symbol of quadrature modulation in units (symbol unit) of one or more code bits of the LDPC code to perform quadrature modulation (multilevel modulation).

That is, the mapper 117 performs quadrature modulation by mapping the LDPC code supplied from the bit interleaver 116 to a signal point which is determined by a modulation method for performing quadrature modulation for the LDPC code in an IQ plane (IQ constellation) defined by an I-axis indicating an I component that has the same phase as a carrier wave and a Q-axis indicating a Q component that is orthogonal to the carrier wave.

When the number of signal points determined by the quadrature modulation method performed by the mapper 117 is $2^m$, the code bits of m bits of the LDPC code are used as a symbol (one symbol) and the mapper 117 maps the LDPC code supplied from the bit interleaver 116 to a signal point indicating the symbol among $2^m$ signal points in units of symbols.

Here, as the quadrature modulation method performed by the mapper 117, for example, there are the following modulation methods: modulation methods defined by the DVB-T.2 standard; modulation methods scheduled to be used in ATSC3.0; and other modulation methods, such as binary phase shift keying (BPSK), quadrature phase shift keying (QPSK), 8 phase-shift keying (8PSK), 16 amplitude phase-shift keying (16APSK), 32APSK, 16 quadrature amplitude modulation (16QAM), 16QAM, 64QAM, 256QAM, 1024QAM, 4096QAM, and 4 pulse amplitude modulation (4PAM). For example, the operator of the transmitting device 11 presets which modulation method is used for quadrature modulation in the mapper 117.

Data (the result of mapping the symbol to the signal point) obtained by the process of the mapper 117 is supplied to a time interleaver 118.

The time interleaver 118 performs time interleaving (interleaving in a time direction) for the data supplied from the mapper 117 in units of symbols and supplies data obtained by the time interleaving to a single input-single output/ multiple input-single output (SISO/MISO) encoder 119.

The SISO/MISO encoder 119 performs spatiotemporal coding for the data supplied from the time interleaver 118 and supplies the data to a frequency interleaver 120.

The frequency interleaver 120 performs frequency interleaving (interleaving in a frequency direction) for the data supplied from the SISO/MISO encoder 119 in units of symbols and supplies the data to a frame builder/resource allocation unit 131.

For example, control data (signalling) for transmission control, such as base band signalling (BB signalling) (BB header), is supplied to a BCH encoder 121.

The BCH encoder 121 performs BCH coding for the control data supplied thereto, similarly to the BCH encoder 114, and supplies data obtained by the BCH coding to an LDPC encoder 122.

The LDPC encoder 122 performs LDPC coding for the data from the BCH encoder 121 as LDPC target data, similarly to the LDPC encoder 115, and outputs an LDPC code obtained by the LDPC coding to a mapper 123.

Similarly to the mapper 117, the mapper 123 performs quadrature modulation by mapping the LDPC code supplied from the LDPC encoder 122 to a signal point indicating one symbol of quadrature modulation in unit (symbol unit) of one or more code bits of the LDPC code and supplies data obtained by the quadrature modulation to a frequency interleaver 124.

Similarly to the frequency interleaver 120, the frequency interleaver 124 performs frequency interleaving for the data supplied from the mapper 123 in units of symbols and supplies the data to the frame builder/resource allocation unit 131.

The frame builder/resource allocation unit 131 inserts symbols of pilots into necessary positions of the data (symbols) supplied from the frequency interleavers 120 and 124, forms a frame (for example, a physical layer (PL) frame, a T2 frame, or a C2 frame) including a predetermined number of symbols from the resultant data (symbols), and supplies the frame to an OFDM generation unit 132.

The OFDM generation unit 132 generates an OFDM signal, which corresponding to the frame supplied from the frame builder/resource allocation unit 131, from the frame and transmits the OFDM signal through the communication path 13 (FIG. 7).

For example, the transmitting device 11 may be configured, without including some of the blocks illustrated in FIG. 8, such as the time interleaver 118, the SISO/MISO encoder 119, the frequency interleaver 120 and the frequency interleaver 124.

<Example of Structure of Bit Interleaver 116>

Figure 9:
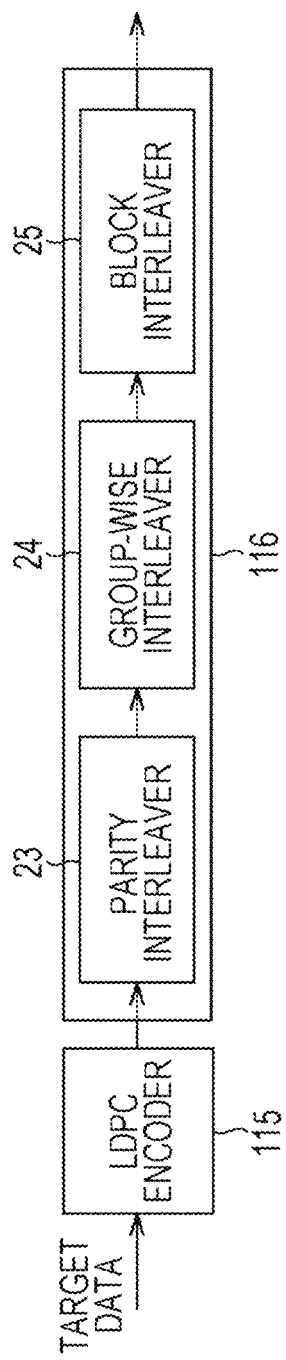
FIG. 9 is a block diagram illustrating an example of the structure of a bit interleaver 116.

FIG. 9 is a block diagram illustrating an example of the structure of the bit interleaver 116 illustrated in FIG. 8.

The bit interleaver 116 has a function of interleaving data and includes a parity interleaver 23, a group-wise interleaver 24, and a block interleaver 25.

The parity interleaver 23 performs parity interleaving for interleaving the parity bits of the LDPC code supplied from the LDPC encoder 115 into the positions of other parity bits and supplies the LDPC code subjected to the parity interleaving to the group-wise interleaver 24.

The group-wise interleaver 24 performs group-wise interleaving for the LDPC code from the parity interleaver 23 and supplies the LDPC code subjected to the group-wise interleaving to the block interleaver 25.

Here, in the group-wise interleaving, an LDPC code corresponding to one code is divided into sections each having 360 bits equal to a unit size P, which will be described below, from the head and 360 bits in each section form a bit group. The LDPC code from the parity interleaver 23 is interleaved in units of bit groups.

When group-wise interleaving is performed, an error rate can be reduced, as compared to a case in which group-wise interleaving is not performed. As a result, it is possible to ensure high communication quality in data transmission.

The block interleaver 25 performs block interleaving for inversely multiplexing the LDPC code from the group-wise interleaver 24 to change the LDPC code corresponding to one code, for example, to an m-bit symbol that is the unit of mapping, and supplies the symbol to the mapper 117 (FIG. 8).

Here, in the block interleaving, for example, in a storage region in which columns that correspond to the number of bits m of the symbol and serve as storage regions for storing a predetermined number of bits in the column (longitudinal) direction are arranged in the row (lateral) direction, the LDPC code from the group-wise interleaver 24 is written in the column direction and is read in the row direction. In this way, the LDPC code corresponding to one code is changed to an m-bit symbol.

<Parity Check Matrix of LDPC Code>

Figure 10:
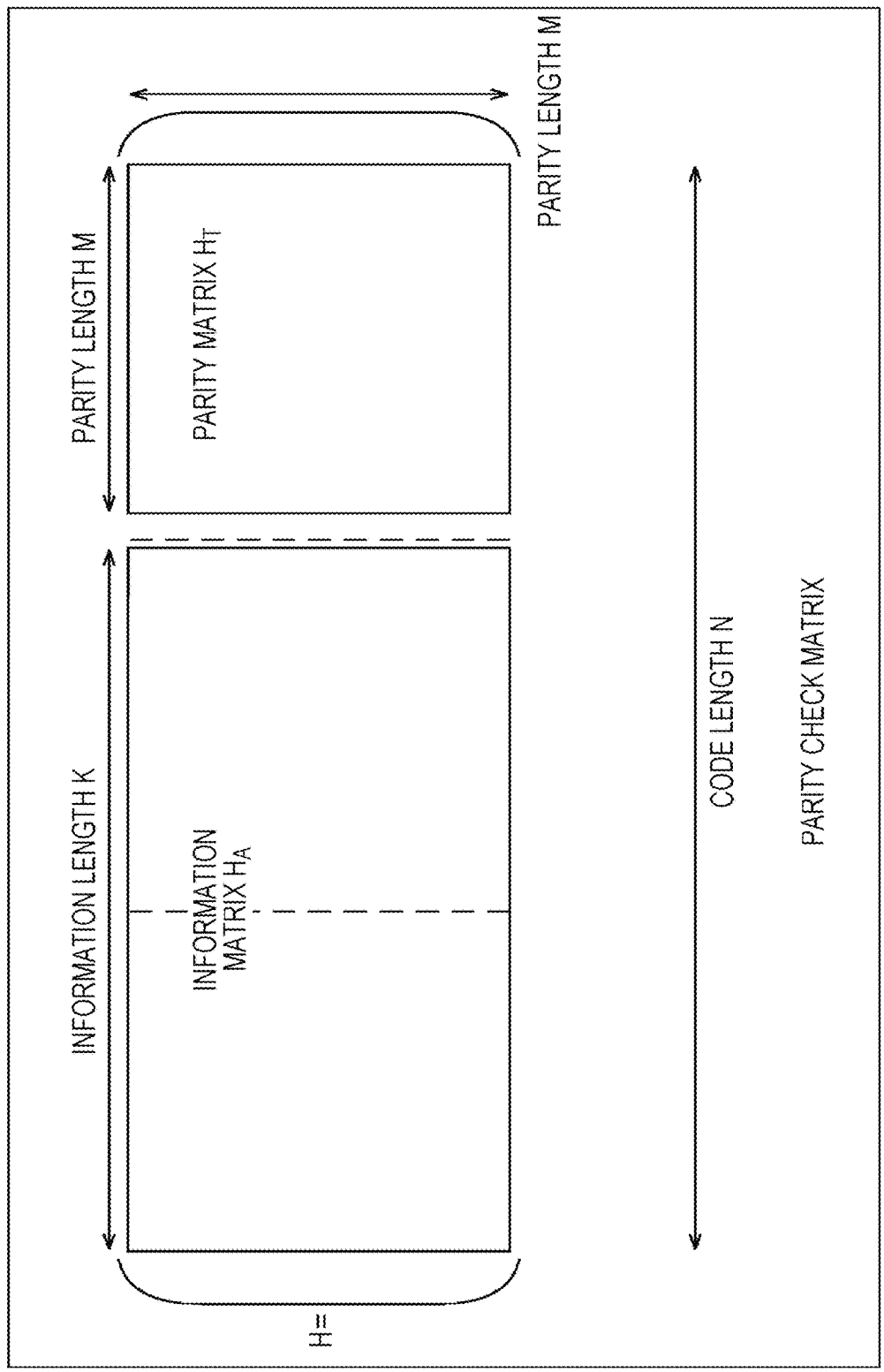
FIG. 10 is a diagram illustrating an example of a parity check matrix.

FIG. 10 is a diagram illustrating an example of the parity check matrix H that is used for LDPC coding by the LDPC encoder 115 illustrated in FIG. 8.

The parity check matrix H has a low-density generation matrix (LDGM) structure and can be represented by a formula $H=[H_A|H_T]$ (a matrix in which elements of an information matrix $H_A$ are left elements and elements of a parity matrix $H_T$ are right elements) using the information matrix $H_A$ corresponding to information bits and the parity matrix $H_T$ corresponding to parity bits among the code bits of the LDPC code.

Here, the number of information bits and the number of parity bits among the code bits of one LDPC code (one code word) are referred to as an information length K and a parity length M, respectively, and the number of code bits of one LDPC code (one code word) is referred to as a code length N (=K+M).

The information length K and the parity length M in the LDPC code having a certain code length N are determined by a coding rate. The parity check matrix H is an M×N matrix (a matrix of M rows and N columns). The information matrix $H_A$ is an M×K matrix and the parity matrix $H_T$ is an M×M matrix.

Figure 11:
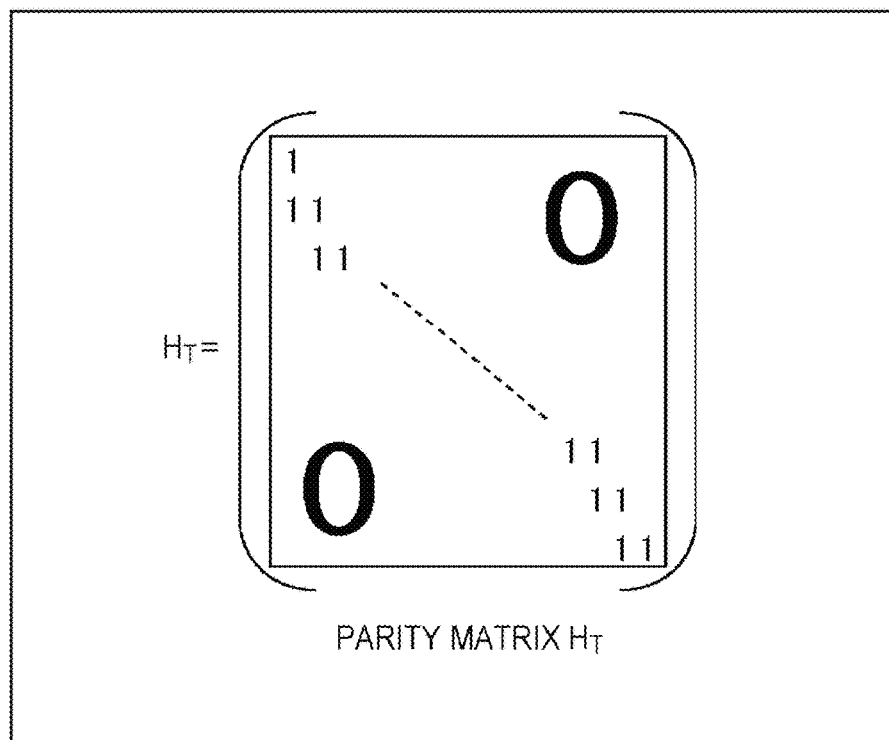
FIG. 11 is a diagram illustrating an example of a parity matrix.

FIG. 11 is a diagram illustrating an example of the parity matrix $H_T$ of the parity check matrix H that is used for LDPC coding by the LDPC encoder 115 illustrated in FIG. 8.

The parity matrix $H_T$ of the parity check matrix H that is used for LDPC coding by the LDPC encoder 115 is the same as the parity matrix $H_T$ of the parity check matrix H of the LDPC code which is defined by, for example, the DVB-T.2 standard.

The parity matrix $H_T$ of the parity check matrix H of the LDPC code which is defined by, for example, the DVB-T.2 standard is a lower bidiagonal matrix in which elements "1"

are arranged in a staircase shape, as illustrated in FIG. 11. In parity matrix $H_T$, the weight of a first row is 1 and the weight of the remaining rows is 2. The weight of the final column is 1 and the weight of the remaining columns is 2.

As described above, the LDPC code of the parity check matrix H in which the parity matrix $H_T$ has the lower bidiagonal structure can be easily generated using the parity check matrix H.

That is, the LDPC code (one code word) is represented by a row vector c and a column vector obtained by transposing the row vector is represented by $c^T$. In addition, in the row vector c which is the LDPC code, the information bits are represented by a row vector A and the parity bits is represented by a row vector T.

In this case, the row vector c can be represented by a formula c=[A|T] (a row vector in which elements of the row vector A are left elements and elements of the row vector T are right elements) using the row vector A as the information bits and the row vector T as the parity bits.

The parity check matrix H and the row vector c=[A|T] as the LDPC code need to satisfy a formula $Hc^T=0$. When the parity matrix $H_T$ of the parity check matrix $H=[H_A|H_T]$ has the dual diagonal structure illustrated in FIG. 11, the row vector T that corresponds to the parity bits forming the row vector c=[A|T] satisfying the formula $Hc^T=0$ can be sequentially (in order) calculated by sequentially setting elements in each row to 0 from elements in a first row of the column vector $Hc^T$ in the formula $Hc^T=0$.

Figure 12:
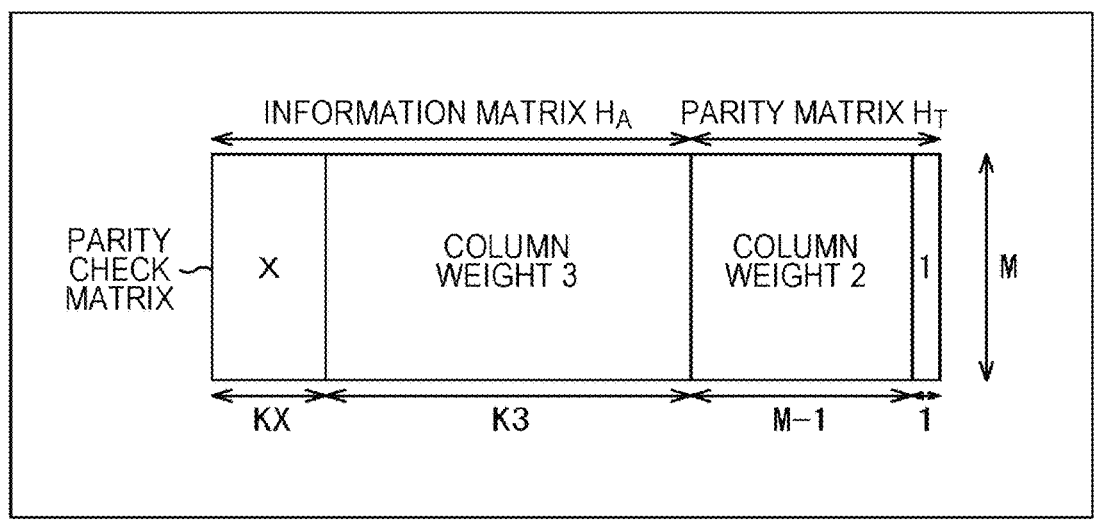
FIG. 12 is a diagram illustrating a parity check matrix of an LDPC code defined by a DVB-T.2 standard.

FIG. 12 is a diagram illustrating the parity check matrix H of the LDPC code which is defined by, for example, the DVB-T.2 standard.

The weight of a KX column from the first column of the parity check matrix H of the LDPC code which is defined by, for example, the DVB-T.2 standard is X. The weight of a K3 column is 3. The weight of an (M−1) column is 2. The weight of the final column is 1.

Here, KX+K3+M−1+1 is equal to the code length N.

FIG. 13 is a diagram illustrating column numbers KX, K3, and M and a column weight X with respect to each coding rate r of the LDPC code which is defined by the DVB-T.2 standard.

For example, in the DVB-T.2 standard, LDPC codes with a code length N of 64800 bits and a code length N of 16200 bits are defined.

For the LDPC code with a code length N of 64800 bits, 11 coding rates (nominal rates) of 1/4, 1/3, 2/5, 1/2, 3/5, 2/3, 3/4, 4/5, 5/6, 8/9, and 9/10 are defined. In the LDPC code with a code length N of 16200 bits, 10 coding rates of 1/4, 1/3, 2/5, 1/2, 3/5, 2/3, 3/4, 4/5, 5/6, and 8/9 are defined.

Hereinafter, a code length N of 64800 bits is referred to as 64 kbits and a code length N of 16200 bits is referred to as 16 kbits.

For the LDPC code, an error rate tends to be lower in a code bit corresponding to a column with a larger column weight in the parity check matrix H.

In the parity check matrix H that is illustrated in FIGS. 12 and 13 and is defined by, for example, the DVB-T.2 standard, a column which is closer to the head side (left side) tends to have a larger weight. Therefore, in the LDPC code corresponding to the parity check matrix H, a code bit that is closer to the head side tends to have higher error tolerance (higher tolerance to errors) and a code bit that is closer to the end tends to have lower tolerance to errors.

<Parity Interleaving>

The parity interleaving performed by the parity interleaver 23 illustrated in FIG. 9 will be described with reference to FIGS. 14 to 16.

Figure 14:
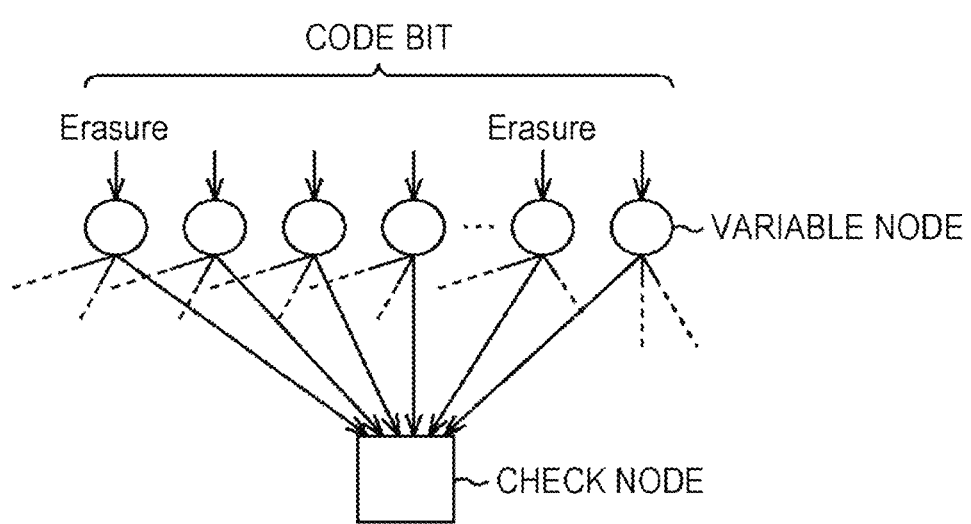
FIG. 14 is a diagram illustrating an example of a Tanner graph for the decoding of an LDPC code.

FIG. 14 is a diagram illustrating an example of (a part of) a Tanner graph of the parity check matrix of the LDPC code.

As illustrated in FIG. 14, when an error, such as erasure, simultaneously occurs in a plurality of variable nodes, for example, two variable nodes among (the code bits corresponding to) the variable nodes connected to the check node, the check node returns a message, in which the probability of a value being 0 and the probability of a value being 1 are equal to each other, to all of the variable nodes connected to the check node. Therefore, when erasure simultaneously occurs in a plurality of variable nodes connected to the same check node, a decoding performance deteriorates.

However, similarly to the LDPC code which is defined by, for example, the DVB-T.2 standard, the LDPC code that is output from the LDPC encoder 115 illustrated in FIG. 8 is an IRA code and the parity matrix $H_T$ of the parity check matrix H has a dual diagonal structure, as illustrated in FIG. 11.

Figure 15:
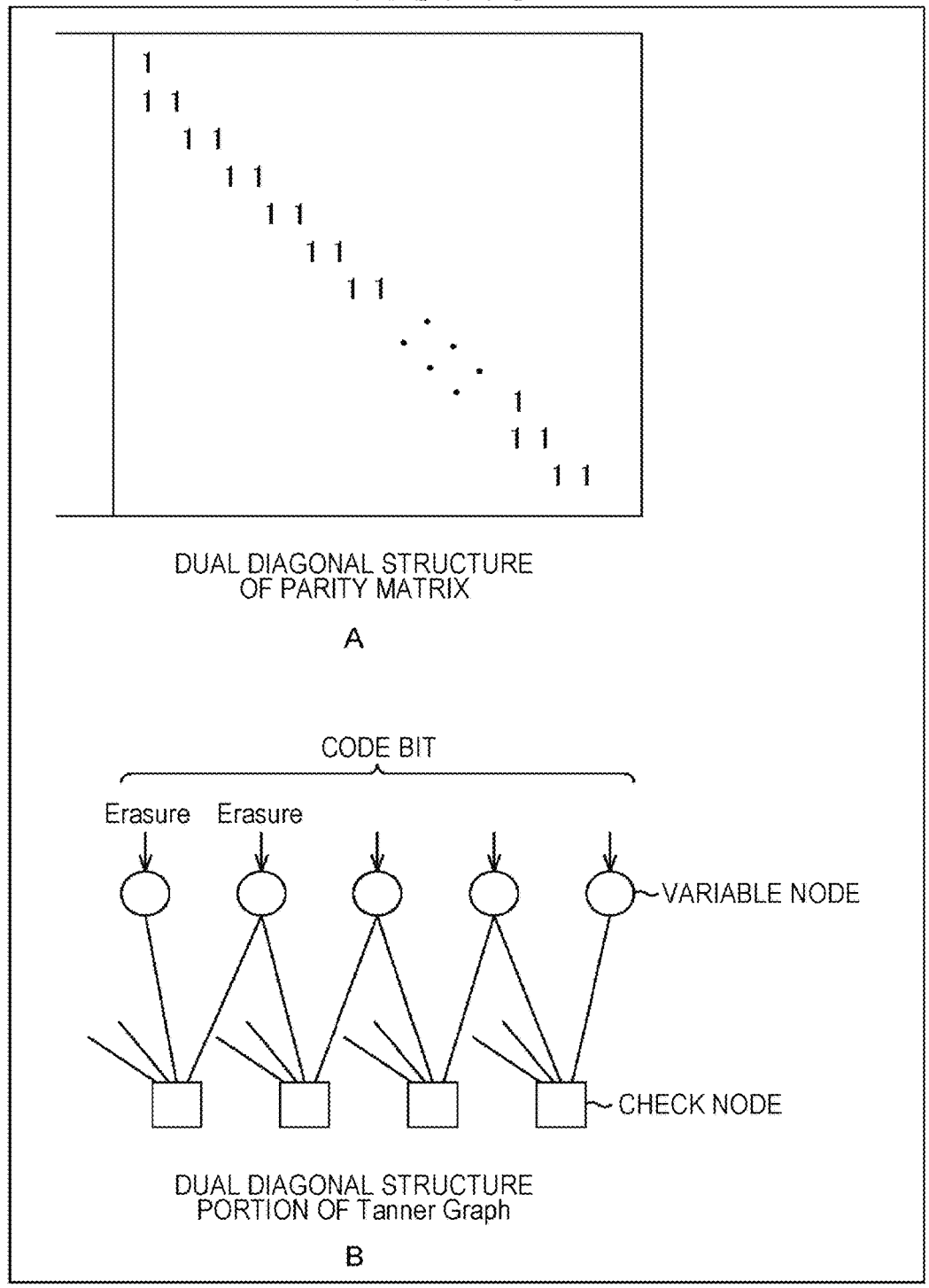
FIG. 15 is a diagram illustrating an example of a parity matrix $H_T$ having a dual diagonal structure and a Tanner graph corresponding to the parity matrix $H_T$.

FIG. 15 is a diagram illustrating an example of the parity matrix $H_T$ having a dual diagonal structure and a Tanner graph corresponding to the parity matrix $H_T$, as illustrated in FIG. 11.

A of FIG. 15 illustrates an example of the parity matrix $H_T$ having a dual diagonal structure and B of FIG. 15 illustrates the Tanner graph corresponding to the parity matrix $H_T$ illustrated in A of FIG. 15.

In the parity matrix $H_T$ with a dual diagonal structure, elements "1" are adjacent to each other in each row (except for the first row). Therefore, in the Tanner graph of the parity matrix $H_T$, two adjacent variable nodes corresponding to a column of two adjacent elements in which the value of the parity matrix $H_T$ is 1 are connected to the same check node.

Therefore, when parity bits corresponding to the two adjacent variable nodes indicate an error at the same time due to, for example, a burst error and erasure, the check node that is connected to two variable nodes (variable nodes requiring a message using parity bits) corresponding to the two parity bits indicating the error returns a message, in which the probability of a value being 0 and the probability of a value being 1 are equal to each other, to the variable nodes connected to the check node. As a result, the decoding performance deteriorates. Furthermore, when the burst length (the number of consecutive parity bits indicating an error) is large, the number of check nodes that return the message indicating equal probability increases and the decoding performance further deteriorates.

Therefore, the parity interleaver 23 (FIG. 9) performs parity interleaving for interleaving the parity bits of the LDPC code supplied from the LDPC encoder 115 into the positions of other parity bits, in order to prevent deterioration of the decoding performance.

Figure 16:
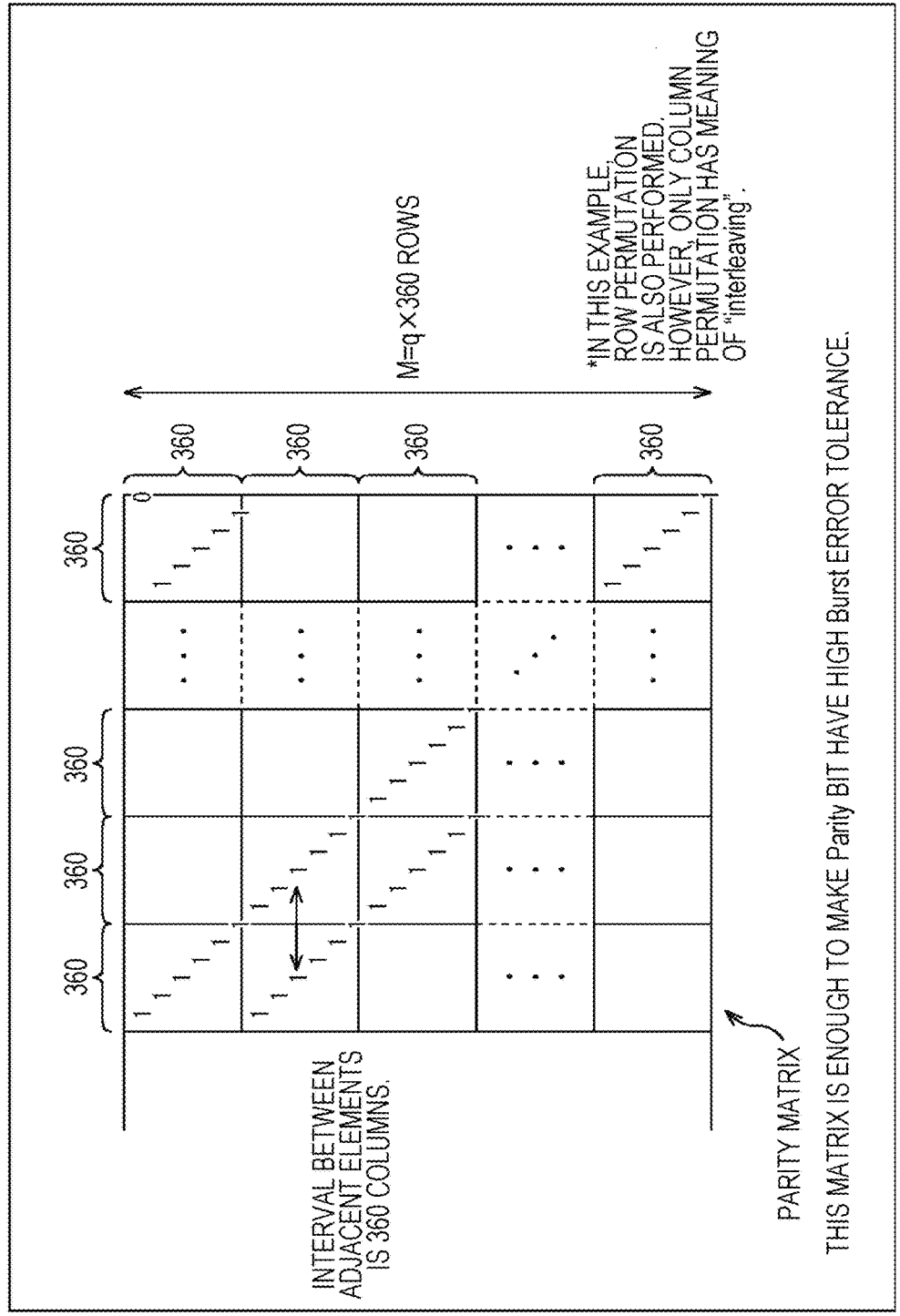
FIG. 16 is a diagram illustrating an example of a parity matrix $H_T$ of a parity check matrix H corresponding to an LDPC code subjected to parity interleaving.

FIG. 16 is a diagram illustrating the parity matrix $H_T$ of the parity check matrix H corresponding to the LDPC code that has been subjected to parity interleaving by the parity interleaver 23 illustrated in FIG. 9.

Here, the information matrix $H_A$ of the parity check matrix H corresponding to the LDPC code that is output from the LDPC encoder 115 has a cyclic structure, similarly to the information matrix of the parity check matrix H corresponding to the LDPC code which is defined by, for example, the DVB-T.2 standard.

The cyclic structure means a structure in which a certain column is matched with a column obtained by cyclically shifting another column. For example, the cyclic structure includes a structure in which the position of 1 in each row of P columns becomes a position obtained by cyclically shifting the first column of the P columns in the column direction by a predetermined value, such as a value that is proportional to a value q obtained by dividing a parity length M, for every P columns. Hereinafter, the P columns in the cyclic structure are appropriately referred to as a unit size.

As the LDPC code that is defined by, for example, the DVB-T.2 standard, as described in FIG. 12 and FIG. 13, there are two kinds of LDPC codes, that is, an LDPC code with a code length N of 64800 bits and an LDPC code with a code length N of 16200 bits. For both the two kinds of LDPC codes, the unit size P is defined as 360 which is one of the divisors of the parity length M except for 1 and M.

The parity length M is a value other than prime numbers represented by a formula M=q×P=q×360, using a value q that varies depending on the coding rate. Therefore, similarly to the unit size P, the value q is another one of the divisors of the parity length M except for 1 and M and is obtained by dividing the parity length M by the unit size P (the product of P and q, which are the divisors of the parity length M, is the parity length M).

As described above, when an information length is K, an integer that is equal to or greater than 0 and less than P is x, and an integer that is equal to or greater than 0 and less than q is y, the parity interleaver 23 parity interleaving for interleaving a (K+qx+y+1)-th code bit among the code bits of an LDPC code of N bits into the position of a (K+Py+x+1)-th code bit.

Since both the (K+qx+y+1)-th code bit and the (K+Py+x+1)-th code bit are code bits after a (K+1)-th code bit, they are parity bits. Therefore, the position of the parity bits of the LDPC code is moved by the parity interleaving.

According to the parity interleaving, (the parity bits corresponding to) the variable nodes connected to the same check node are separated by the unit size P, that is, 360 bits in this example. Therefore, when the burst length is less than 360 bits, it is possible to prevent errors from occurring in a plurality of variable nodes connected to the same check node at the same time. As a result, it is possible to improve tolerance to the burst error.

The LDPC code after the parity interleaving for interleaving the (K+qx+y+1)-th code bit into the position of the (K+Py+x+1)-th code bit is matched with an LDPC code having a parity check matrix (hereinafter, referred to as a transformed parity check matrix) obtained by performing column permutation for substituting the (K+qx+y+1)-th column of the original parity check matrix H with the (K+Py+x+1)-th column.

As illustrated in FIG. 16, a parity matrix of the transformed parity check matrix has a pseudo-cyclic structure that uses the P columns (360 columns in FIG. 16) as a unit.

Here, the pseudo-cyclic structure means a structure in which a part of a matrix is not cyclic.

The transformed parity check matrix that is obtained by performing column permutation corresponding to parity interleaving for the parity check matrix of the LDPC code which is defined by, for example, the DVB-T.2 standard does not have the (perfect) cyclic structure, but has the pseudo-cyclic structure since the number of elements "1" is one short (an element "0" is present) in a 360×360 matrix at the upper right corner (a shifted matrix which will be described below) of the transformed parity check matrix.

The transformed parity check matrix of the parity check matrix of the LDPC code that is output from the LDPC encoder 115 has a pseudo-cyclic structure, similarly to the transformed parity check matrix of the parity check matrix of the LDPC code that is defined, for example, by the DVB-T.2 standard.

The transformed parity check matrix illustrated in FIG. 16 is a matrix that is obtained by performing the permutation of rows (row permutation), in addition to column permutation corresponding to the parity interleaving, for the original parity check matrix H such that the transformed parity check matrix is a constitutive matrix, which will be described below.

Figure 17:
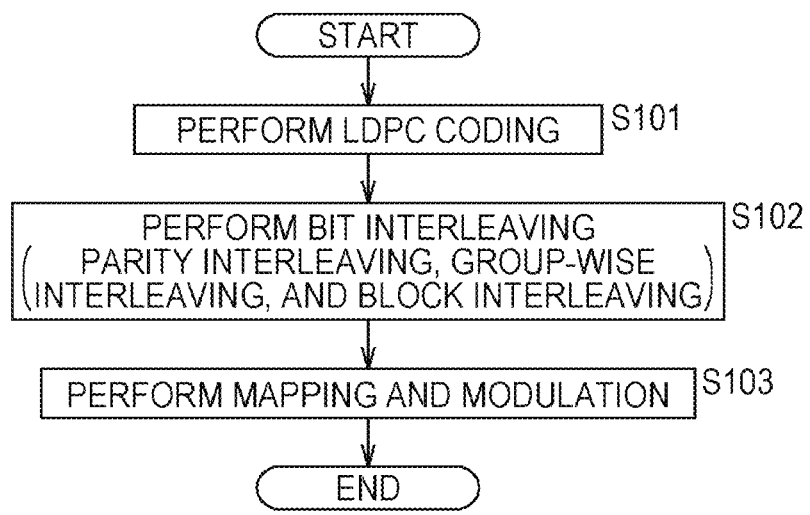
FIG. 17 is a flowchart illustrating an example of a process performed by the bit interleaver 116 and a mapper 117.

FIG. 17 is a flow chart illustrating the process performed by the LDPC encoder 115, the bit interleaver 116, and the mapper 117 illustrated in FIG. 8.

The LDPC encoder 115 waits for the supply of the LDPC target data from the BCH encoder 114. In Step S101, the LDPC encoder 115 encodes the LDPC target data into the LDPC code and supplies the LDPC code to the bit interleaver 116. Then, the process proceeds to Step S102.

In Step S102, the bit interleaver 116 performs bit interleaving for the LDPC code supplied from the LDPC encoder 115 and supplies a symbol obtained by the bit interleaving to the mapper 117. The process proceeds to Step S103.

That is, in Step S102, in the bit interleaver 116 (FIG. 9), the parity interleaver 23 performs parity interleaving for the LDPC code supplied from the LDPC encoder 115 and supplies the LDPC code subjected to the parity interleaving to the group-wise interleaver 24.

The group-wise interleaver 24 performs group-wise interleaving for the LDPC code supplied from the parity interleaver 23 and supplies the LDPC code to the block interleaver 25.

The block interleaver 25 performs block interleaving for the LDPC code subjected to the group-wise interleaving by the group-wise interleaver 24 and supplies an m-bit symbol obtained by the block interleaving to the mapper 117.

In Step S103, the mapper 117 maps the symbol supplied from the block interleaver 25 to any one of $2^m$ signal points which are determined by the quadrature modulation method performed by the mapper 117 to perform quadrature modulation, and supplies data obtained by the quadrature modulation to the time interleaver 118.

As described above, the parity interleaving or the group-wise interleaving makes it possible to improve an error rate when a plurality of code bits of the LDPC code are transmitted as one symbol.

In FIG. 9, for convenience of explanation, the parity interleaver 23, which is a block for performing parity interleaving, and the group-wise interleaver 24, which is a block for performing group-wise interleaving, are individually provided. However, the parity interleaver 23 and the group-wise interleaver 24 may be integrally provided.

That is, both the parity interleaving and the group-wise interleaving can be performed by writing and reading code bits to and from the memory and can be represented by a matrix which converts an address (write address) for writing code bits into an address (read address) for reading code bits.

Therefore, when a matrix obtained by multiplying a matrix indicating parity interleaving by a matrix indicating group-wise interleaving is calculated, code bits are converted by the matrix and parity interleaving is performed. In addition, group-wise interleaving is performed for the LDPC code subjected to the parity interleaving. In this way, it is possible to obtain the result of the group-wise interleaving.

In addition, the parity interleaver 23, the group-wise interleaver 24, and the block interleaver 25 may be integrally provided.

That is, the block interleaving performed by the block interleaver 25 can be represented by a matrix which converts a write address of the memory storing the LDPC code into a read address.

Therefore, when a matrix obtained by multiplying a matrix indicating parity interleaving, a matrix indicating group-wise interleaving, and a matrix indicating block interleaving is calculated, the parity interleaving, the group-wise interleaving, and the block interleaving can be collectively performed by the matrix.

<Example of Structure of LDPC Encoder 115>

Figure 18:
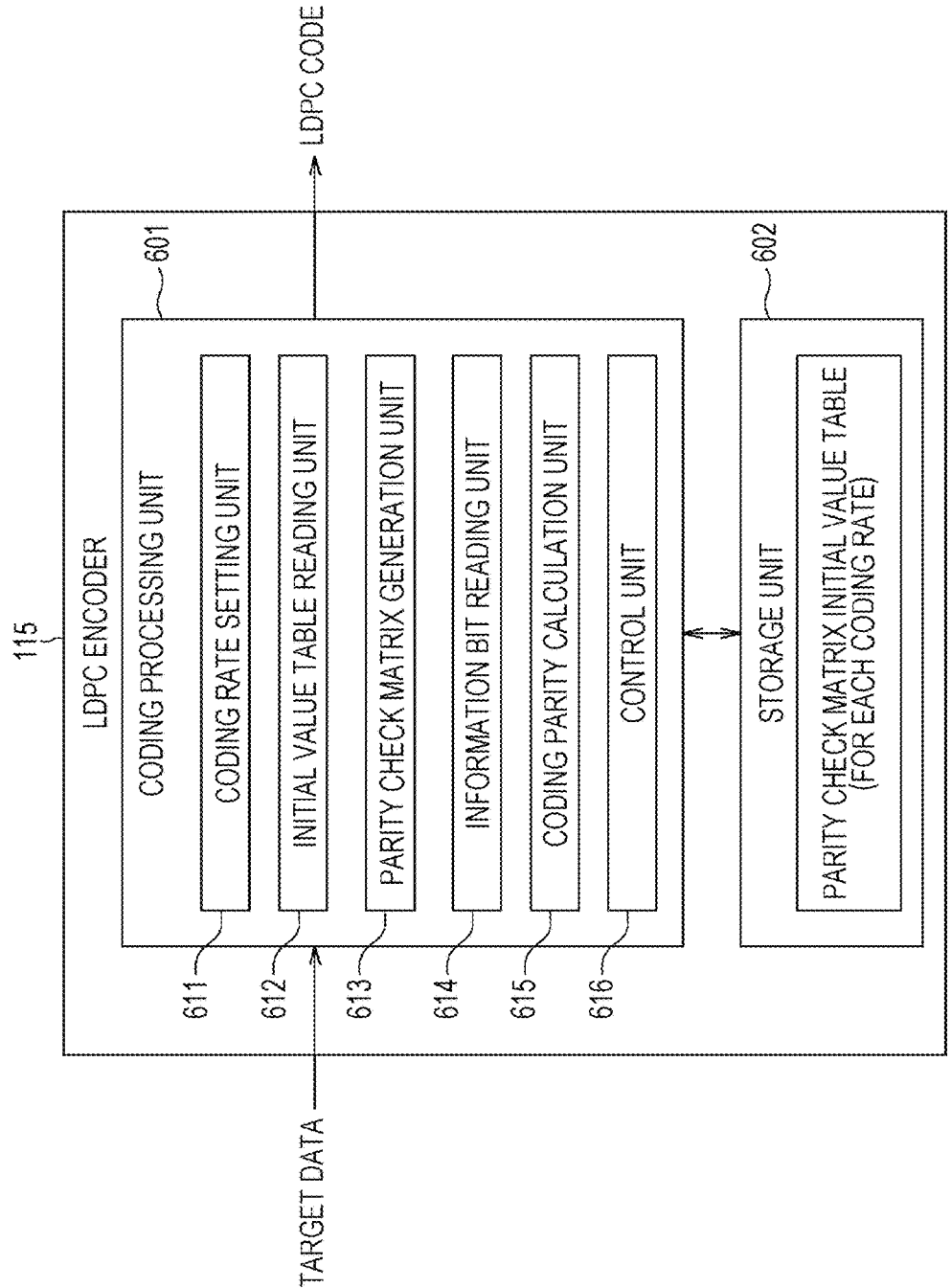
FIG. 18 is a block diagram illustrating an example of the structure of an LDPC encoder 115.

FIG. 18 is a block diagram illustrating an example of the structure of the LDPC encoder 115 illustrated in FIG. 8.

The LDPC encoder 122 illustrated in FIG. 8 has the same structure as the LDPC encoder 115.

As described in FIG. 12 and FIG. 13, for example, in the DVB-T.2 standard, two types of LDPC codes having a code length N of 64800 bits and a code length N of 16200 bits are defined.

For the LDPC code with a code length N of 64800 bits, 11 coding rates of 1/4, 1/3, 2/5, 1/2, 3/5, 2/3, 3/4, 4/5, 5/6, 8/9, and 9/10 are defined. For the LDPC code with a code length N of 16200 bits, 10 coding rates of 1/4, 1/3, 2/5, 1/2, 3/5, 2/3, 3/4, 4/5, 5/6, and 8/9 are defined (FIG. 12 and FIG. 13).

For example, the LDPC encoder 115 can perform coding (error correction coding) for the LDPC code having a code length N of 64800 bits or 16200 bits at each coding rate, according to the parity check matrix H which is prepared for each code length N and each coding rate.

The LDPC encoder 115 includes a coding processing unit 601 and a storage unit 602.

The coding processing unit 601 includes a coding rate setting unit 611, an initial value table reading unit 612, a parity check matrix generation unit 613, an information bit reading unit 614, a coding parity calculation unit 615, and a control unit 616, performs LDPC coding for the LDPC target data supplied from the LDPC encoder 115, and supplies an LDPC code obtained by the LDPC coding to the bit interleaver 116 (FIG. 8).

That is, the coding rate setting unit 611 sets the code length N and the coding rate of the LDPC code, according to, for example, an operation of the operator.

The initial value table reading unit 612 reads a parity check matrix initial value table, which corresponds to the code length N and the coding rate set by the coding rate setting unit 611 and will be described below, from the storage unit 602.

The parity check matrix generation unit 613 arranges elements "1" of an information matrix $H_A$ corresponding to the information length K (=the code length N—the parity length M) which corresponds to the code length N and the coding rate set by the coding rate setting unit 611 in the column direction in a cycle of 360 columns (unit size P) to generate a parity check matrix H, on the basis of the parity check matrix initial value table read by the initial value table reading unit 612, and stores the parity check matrix H in the storage unit 602.

The information bit reading unit 614 reads (extracts) information bits corresponding to the information length K from the LDPC target data supplied to the LDPC encoder 115.

The coding parity calculation unit 615 reads the parity check matrix H generated by the parity check matrix generation unit 613 from the storage unit 602, calculates parity bits for the information bits read by the information bit reading unit 614, on the basis of a predetermined formula, using the parity check matrix H, and generates a code word (LDPC code).

The control unit 616 controls each of the blocks forming the coding processing unit 601.

For example, a plurality of parity check matrix initial value tables that correspond to the plurality of coding rates illustrated in FIGS. 12 and 13 for each code length N of 64800 bits or 16200 bits are stored in the storage unit 602. In addition, the storage unit 602 temporarily stores data that is required for the process of the coding processing unit 601.

Figures 19, 20:
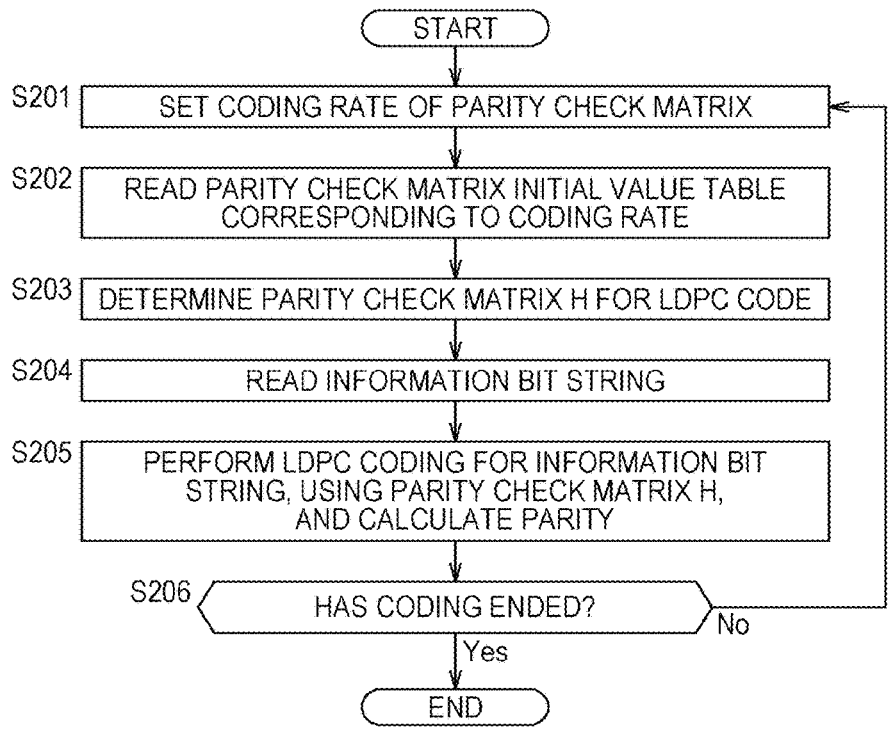
FIG. 19 is a flowchart illustrating an example of the process of the LDPC encoder 115.
FIG. 20 is a diagram illustrating an example of a parity check matrix initial value table for a parity check matrix having a coding rate of ¼ and a code length of 16200.

FIG. 19 is a flowchart illustrating an example of the process of the LDPC encoder 115 illustrated in FIG. 18.

In Step S201, the coding rate setting unit 611 determines (sets) the code length N and the coding rate r for LDPC coding.

In Step S202, the initial value table reading unit 612 reads a predetermined parity check matrix initial value table corresponding to the code length N and the coding rate r determined by the coding rate setting unit 611 from the storage unit 602.

In Step S203, the parity check matrix generation unit 613 calculates (generates) the parity check matrix H of the LDPC code having the code length N and the coding rate r determined by the coding rate setting unit 611, using the parity check matrix initial value table that is read from the storage unit 602 by the initial value table reading unit 612, and supplies the parity check matrix H to the storage unit 602. The parity check matrix H is stored in the storage unit 602.

In Step S204, the information bit reading unit 614 reads the information bits with the information length K (=N×r) corresponding to the code length N and the coding rate r determined by the coding rate setting unit 611 from the LDPC target data supplied to the LDPC encoder 115, reads the parity check matrix H calculated by the parity check matrix generation unit 613 from the storage unit 602, and supplies the information bits and the parity check matrix H to the coding parity calculation unit 615.

In Step S205, the coding parity calculation unit 615 sequentially calculates the parity bits of a code word c satisfying the following Formula (8), using the information bits and the parity check matrix H from the information bit reading unit 614.

$$Hc^T = 0 \qquad (8)$$

In Formula (8), c indicates a row vector as a code word (LDPC code) and $c^T$ indicates the transposition of the row vector c.

As described above, when the information bits of the row vector c as the LDPC code (one code word) are represented by a row vector A and the parity bits thereof are represented by a row vector T, the row vector c can be represented by a formula c=[A/T] using the row vector A as the information bits and the row vector T as the parity bits.

The parity check matrix H and the row vector c=[A|T] as the LDPC code need to satisfy the formula $Hc^T=0$. When the parity matrix $H_T$ of the parity check matrix $H=[H_A|H_T]$ has the dual diagonal structure illustrated in FIG. 11, the row vector T that corresponds to the parity bits forming the row vector c=[A|T] satisfying the formula $Hc^T=0$ can be sequentially calculated by sequentially setting elements in each row to 0 from elements in the first row of the column vector $Hc^T$ in the formula $Hc^T=0$.

The coding parity calculation unit 615 calculates the parity bits T with respect to the information bits A from the information bit reading unit 614 and outputs the code word c=[A/T] represented by the information bits A and the parity bits T as the LDPC coding result of the information bits A.

Then, in Step S206, the control unit 616 determines whether the LDPC coding ends. When it is determined in Step S206 that the LDPC coding does not end, that is, when LDPC target data to be subjected to the LDPC coding remains, the process returns to Step S201 (or Step S204). Then, the process from Step S201 (or Step S204) to Step S206 is repeated.

When it is determined in Step S206 that the LDPC coding ends, that is, when the LDPC target data to be subjected to the LDPC coding does not remain, the LDPC encoder 115 ends the process.

As described above, the parity check matrix initial value tables corresponding to each code length N and each coding rate r are prepared and the LDPC encoder 115 performs LDPC coding for an LDPC code with a predetermined code length N and a predetermined coding rater, using the parity check matrix H that is generated from the parity check matrix initial value table corresponding to the predetermined code length N and the predetermined coding rate r.

<Example of Parity Check Matrix Initial Value Table>

The parity check matrix initial value table is a table that indicates the positions of elements "1" of the information matrix $H_A$ (FIG. 10), which corresponds to the information length K corresponding to the code length N and the coding rate r of the LDPC code (the LDPC code defined by the parity check matrix H), in the parity check matrix H for every 360 columns (unit size P) and is created for each parity check matrix H with each code length N and each coding rate r in advance.

That is, the parity check matrix initial value table indicates at least the positions of the elements "1" of the information matrix $H_A$ for every 360 columns (unit size P)

In addition, examples of the parity check matrix H include a parity check matrix which is defined by, for example, DVB-T.2 and in which the (entire) parity matrix $H_T$ has the dual diagonal structure and a parity check matrix which is suggested by CRC/ETRI and in which a part of the parity matrix $H_T$ has the dual diagonal structure and the remaining portion is a diagonal matrix (unit matrix).

Hereinafter, a method for expressing the parity check matrix initial value table indicating the parity check matrix which is defined by, for example, DVB-T.2 and in which the parity matrix $H_T$ has the dual diagonal structure is referred to as a DVB method and a method for expressing the parity check matrix initial value table indicating the parity check matrix which is suggested by CRC/ETRI is referred to as an ETRI method.

FIG. 20 is a diagram illustrating an example of the parity check matrix initial value table based on the DVB method.

That is, FIG. 20 illustrates a parity check matrix initial value table corresponding to the parity check matrix H which is defined by the DVB-T.2 standard and has a code length N of 16200 bits and a coding rate (a coding rate in DVB-T.2) r of 1/4.

The parity check matrix generation unit 613 (FIG. 18) calculates the parity check matrix H, using the parity check matrix initial value table based on the DVB method, as follows.

FIG. 21 is a diagram illustrating a method for calculating the parity check matrix H from the parity check matrix initial value table based on the DVB method.

That is, FIG. 21 illustrates a parity check matrix initial value table corresponding to a parity check matrix H which is defined by the DVB-T.2 standard and has a code length N of 16200 bits and a coding rate r of 2/3.

The parity check matrix initial value table based on the DVB method is a table which represents the positions of elements "1" of the entire information matrix $H_A$ corresponding to the information length K which corresponds to the code length N and the coding rate r of the LDPC code for every 360 columns (unit size P). In an i-th row of the table, the row numbers of the elements "1" in a (1+360×(i−1))-th column of the parity check matrix H (the row numbers of the elements "1" in the first row of the parity check matrix H are 0) are arranged. The row numbers correspond to the number of column weights of the (1+360× (i−1))-th column.

The parity matrix $H_T$ (FIG. 10) corresponding to the parity length M in the parity check matrix H based on the DVB method is decided to have the dual diagonal structure illustrated in FIG. 15. Therefore, when the information matrix $H_A$ (FIG. 10) corresponding to the information length K can be calculated using the parity check matrix initial value table, it is possible to calculate the parity check matrix H.

The number of rows k+1 in the parity check matrix initial value table based on the DVB method varies depending on the information length K.

Formula (9) is established between the information length K and the number of rows k+1 in the parity check matrix initial value table.

$$K=(k+1)\times 360 \qquad (9)$$

Here, "360" in Formula (9) is the unit size P described in FIG. 16.

In the parity check matrix initial value table illustrated in FIG. 21, 13 numerical values are arranged from the first row to the third row and 3 numerical values are arranged from the fourth row to a (k+1)-th row (a 30th row in FIG. 21).

Therefore, in the parity check matrix H calculated from the parity check matrix initial value table illustrated in FIG. 21, the weight of each of the first column to a (1+360×(3−1)−1)-th column is 13 and the weight of each of a (1+360×(3−1))-th column to a K-th column is 3.

In the first row of the parity check matrix initial value table illustrated in FIG. 21, 0, 2084, 1613, 1548, 1286, 1460, 3196, 4297, 2481, 3369, 3451, 4620, and 2622 are written, which indicates that elements in the rows having row numbers 0, 2084, 1613, 1548, 1286, 1460, 3196, 4297, 2481, 3369, 3451, 4620, and 2622 are 1 (and the other elements are 0) in the first column of the parity check matrix H.

In the second row of the parity check matrix initial value table illustrated in FIG. 21, 1, 122, 1516, 3448, 2880, 1407, 1847, 3799, 3529, 373, 971, 4358, and 3108 are written, which indicates that elements in the rows having row numbers 1, 122, 1516, 3448, 2880, 1407, 1847, 3799, 3529, 373, 971, 4358, and 3108 are 1 in a 361st (=(1+360×(2−1)-th) column of the parity check matrix H.

As such, the parity check matrix initial value table indicates the positions of elements "1" in the information matrix $H_A$ of the parity check matrix H for every 360 columns.

The columns other than the (1+360×(i−1))-th column in the parity check matrix H, that is, a (2+360×(i−1))-th column to a (360×i)-th column are arranged by cyclically shifting elements "1" of the (1+360×(i−1))-th column determined by the parity check matrix initial value table in the downward direction (the downward direction of the columns) according to the parity length M.

That is, for example, a (2+360×(i−1))-th column is obtained by cyclically shifting (1+360×(i−1))-th column in the downward direction by M/360 (=q) and the next (3+360×(i−1))-th column is obtained by cyclically shifting the (1+360×(i−1))-th column in the downward direction by 2×M/360(=2×q) (by cyclically shifting (2+360×(i−1))-th column in the downward direction by M/360(=q)).

When a numerical value in an i-th row (an i-th row from the upper side) and a j-th column (a j-th column from the left side) of the parity check matrix initial value table is represented by $h_{i,j}$ and the row number of a j-th element "1" in a w-th column of the parity check matrix H is represented by $H_{w\text{-}j}$, the row numbers $H_{w\text{-}j}$ of elements "1" in the w-th column, which is other than the (1+360×(i−1))-th column in the parity check matrix H can be calculated by Formula (10).

$$H_{w\text{-}j}=\mod\{h_{i,j}+\mod((w-1),P)\times q, M\} \quad (10)$$

Here, mod(x, y) is the remainder when x is divided by y.

In addition, P is the above-mentioned unit size. In this embodiment, for example, similarly to the DVB-S.2 standard, the DVB-T.2 standard, and the DVB-C.2 standard, P is 360. In addition, q is a value of M/360 that is obtained by dividing the parity length M by the unit size P (=360).

The parity check matrix generation unit 613 (FIG. 18) specifies the row numbers of elements "1" in the (360×(i−1))-th column of the parity check matrix H using the parity check matrix initial value table.

In addition, the parity check matrix generation unit 613 (FIG. 18) calculates the row numbers $H_{w\text{-}j}$ of the elements "1" in the w-th column other than the (1+360×(i−1))-th column of the parity check matrix H, according to Formula (10), and generates a parity check matrix H in which the elements with the obtained row numbers are 1.

Figure 22:
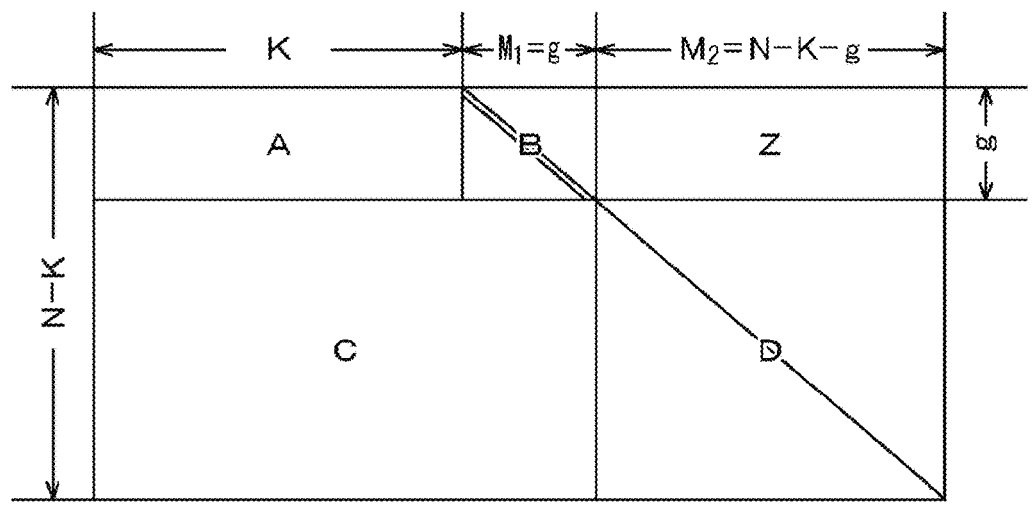
FIG. 22 is a diagram illustrating the structure of a parity check matrix.

FIG. 22 is a diagram illustrating the structure of a parity check matrix based on the ETRI method.

The parity check matrix based on the ETRI method includes an A matrix, a B matrix, a C matrix, a D matrix, and a Z matrix.

The A matrix is a matrix of g rows and K columns which is located on the upper left side of the parity check matrix and is represented by a predetermined value g and the information length K of the LDPC code=the code length N× the coding rate r.

The B matrix is a matrix of g rows and g columns which is adjacent on the right side of the A matrix and has a dual diagonal structure.

The C matrix is a matrix of N−K−g rows and K+g columns which is adjacent to the lower side of the A matrix and the B matrix.

The D matrix is a matrix of N−K−g rows and N−K−g columns which is a unit matrix and is adjacent to the right side of the C matrix.

The Z matrix is a zero matrix (0 matrix) of g rows and N−K−g columns and is adjacent to the right side of the B matrix.

In the parity check matrix based on the ETRI method including the A to D matrices and the Z matrix, the A matrix and a portion of the C matrix form an information matrix, and the B matrix, the remaining portion of the C matrix, the D matrix, and the Z matrix form a parity matrix.

Since the B matrix is a matrix having the dual diagonal structure and the D matrix is the unit matrix, a portion (B matrix) of the parity matrix of the parity check matrix based on the ETRI method has the dual diagonal structure and the remaining portion (D matrix) is a diagonal matrix (unit matrix).

Similarly to the information matrix of the parity check matrix based on the DVB method, the A matrix and the C matrix have a cyclic structure for every 360 columns (unit size P) and the parity check matrix initial value table based on the ETRI method indicates the positions of elements "1" of the A matrix and the C matrix for every 360 columns.

As described above, since the A matrix and a portion of the C matrix form the information matrix, the parity check matrix initial value table based the ETRI method which indicates the positions of elements "1" in the A matrix and the C matrix for every 360 columns can indicate at least the positions of elements "1" in the information matrix $H_A$ for every 360 columns.

Figure 23:
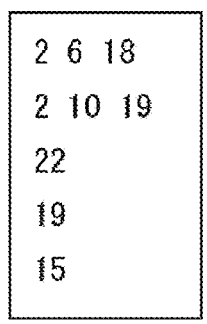
FIG. 23 is a diagram illustrating an example of the parity check matrix initial value table.

FIG. 23 is a diagram illustrating an example of the parity check matrix initial value table based on the ETRI method.

That is, FIG. 23 illustrates an example of a parity check matrix initial value table corresponding to a parity check matrix having a code length N of 50 bits and a coding rate r of 1/2.

The parity check matrix initial value table based on the ETRI method is a table which indicates the positions of the elements "1" in the A and C matrices for each unit size P. In the i-th row of the table, the row numbers of elements "1" in a (1+P×(i−1))-th column of the parity check matrix (the row numbers of elements "1" in the first row of the parity check matrix H are 0) are arranged. The row numbers correspond to the number of column weights of the (1+P×(i−1))-th column.

Here, for simplicity of explanation, it is assumed that the unit size P is, for example, 5.

For the parity check matrix based on the ETRI method, there are parameters $g=M_1$, $M_2$, $Q_1$, and $Q_2$.

Here, $g=M_1$ is a parameter for determining the size of the B matrix and is a multiple of the unit size P. When $g=M_1$ is adjusted, the performance of the LDPC code is changed.

When the parity check matrix is determined, $g=M_1$ is adjusted to a predetermined value. Here, 15 which is three times the unit size P (=5) is used as $g=M_1$.

$M_2$ has a value $M-M_1$ obtained by subtracting $M_1$ from the parity length M.

Here, the information length K is N×r=50×1/2 =25 and the parity length M is N−K=50−25=25. Therefore, $M_2$ is $M-M_1=25-15=10$.

$Q_1$ is calculated according to a formula $Q_1=M_1/P$ and indicates the number of cyclic shifts (the number of rows) in the A matrix.

In other words, columns other than a (1+P×(i−1))-th column, that is, the (2+P×(i−1))-th to (P×i)-th columns in the A matrix of the parity check matrix based on the ETRI method are arranged by cyclically shifting elements "1" in the (1+360×(i−1))-th column determined by the parity check matrix initial value table in the downward direction (the downward direction of the column), and $Q_1$ indicates the number of cyclic shifts in the A matrix.

$Q_2$ is calculated according to a formula $Q_2=M_2/P$ and indicates the number of cyclic shifts (the number of rows) in the C matrix.

That is, in other words, columns other than a (1+P×(i−1))-th column, that is, the (2+P×(i−1))-th to (P×i)-th columns in the C matrix of the parity check matrix based on the ETRI method are arranged by cyclically shifting elements "1" in the (1+360×(i−1))-th column determined by the parity check matrix initial value table in the downward direction (the downward direction of the column), and $Q_2$ indicates the number of cyclic shifts in the C matrix.

Here, $Q_1$ is $M_1/P=15/5=3$ and $Q_2$ is $M_2/P=10/5=2$.

In the parity check matrix initial value table illustrated in FIG. 23, three numerical values are arranged in the first and second rows and one numerical value is arranged in the third to fifth rows. According to the arrangement of the numerical values, for the column weight of the parity check matrix calculated from the parity check matrix initial value table illustrated in FIG. 23, the weight of the first to (1+5×(2−1)−1)-th columns is 3 and the weight of the (1+5×(2−1))-th to fifth columns is 1.

That is, 2, 6, and 18 are arranged in the first row of the parity check matrix initial value table illustrated in FIG. 23, which shows that elements in rows with row numbers 2, 6, and 18 are 1 (and the other elements are 0) in the first column of the parity check matrix.

Here, in this case, the A matrix is a matrix of 15 rows and 25 columns (g rows and K columns) and the C matrix is a matrix of 10 rows and 40 columns (N−K−g rows and K+g columns). Therefore, rows with row numbers 0 to 14 in the parity check matrix are rows of the A matrix, and rows with row numbers 15 to 24 in the parity check matrix are rows of the C matrix.

Therefore, among rows with row numbers 2, 6, and 18 (hereinafter, referred to as rows #2, #6, and #18), the rows #2 and #6 are rows of the A matrix, and the row #18 is a row of the C matrix.

In addition, 2, 10, and 19 are arranged in the second row of the parity check matrix initial value table illustrated in FIG. 23, which shows that elements in rows #2, #10, and #19 are 1 in the 6th (=1+5×(2−1)) column of the parity check matrix.

Here, in the 6th (=1+5×(2−1)) column of the parity check matrix, among the rows #2, #10, and #19, the rows #2 and #10 are rows of the A matrix and the row #19 is a row of the C matrix.

22 is arranged in the third row of the parity check matrix initial value table illustrated in FIG. 23, which shows that elements in the row #22 are 1 in the 11th (=1+5×(3−1)) column of the parity check matrix.

Here, in the 11th (=1+5×(3−1)) column of the parity check matrix, the row #22 is a row of the C matrix.

Similarly, 19 in the fourth row of the parity check matrix initial value table illustrated in FIG. 23 indicates that elements in the row #19 are 1 in the 16th (=1+5×(4−1)) column of the parity check matrix, and 15 in the fifth row of the parity check matrix initial value table illustrated in FIG. 23 indicates that elements in the row #15 are 1 in the 21st (=1+5×(5−1)) column of the parity check matrix.

As described above, the parity check matrix initial value table represents the positions of the elements "1" in the A and C matrices of the parity check matrix for every unit size P (=5 columns).

Columns other than the (1+5×(i−1))-th columns, that is, the (2+5×(i−1))-th to (5×i)-th columns in the A and C matrices are arranged by cyclically shifting elements "1" in the (1+5×(i−1))-th column determined by the parity check matrix initial table in the downward direction (the downward direction of the columns) according to the parameters $Q_1$ and $Q_2$.

That is, for example, the (2+5×(i−1))-th column of the A matrix is obtained by cyclically shifting the (1+5×(i−1))-th column in the downward direction by $Q_1$ (=3) and the next (3+5×(i−1))-th column is obtained by cyclically shifting the (1+5×(i−1))-th column in the downward direction by 2×$Q_1$ (=2×3) (by cyclically shifting the (2+5×(i−1))-th column in the downward direction by $Q_1$).

For example, the (2+5×(i−1))-th column of the C matrix is obtained by cyclically shifting the (1+5×(i−1))-th column in the downward direction by $Q_2$ (=2) and the next (3+5×(i−1))-th column is obtained by cyclically shifting the (1+5×(i−1))-th column in the downward direction by 2×$Q_2$ (=2×2) (by cyclically shifting the (2+5×(i−1))-th column in the downward direction by $Q_2$).

Figure 24:
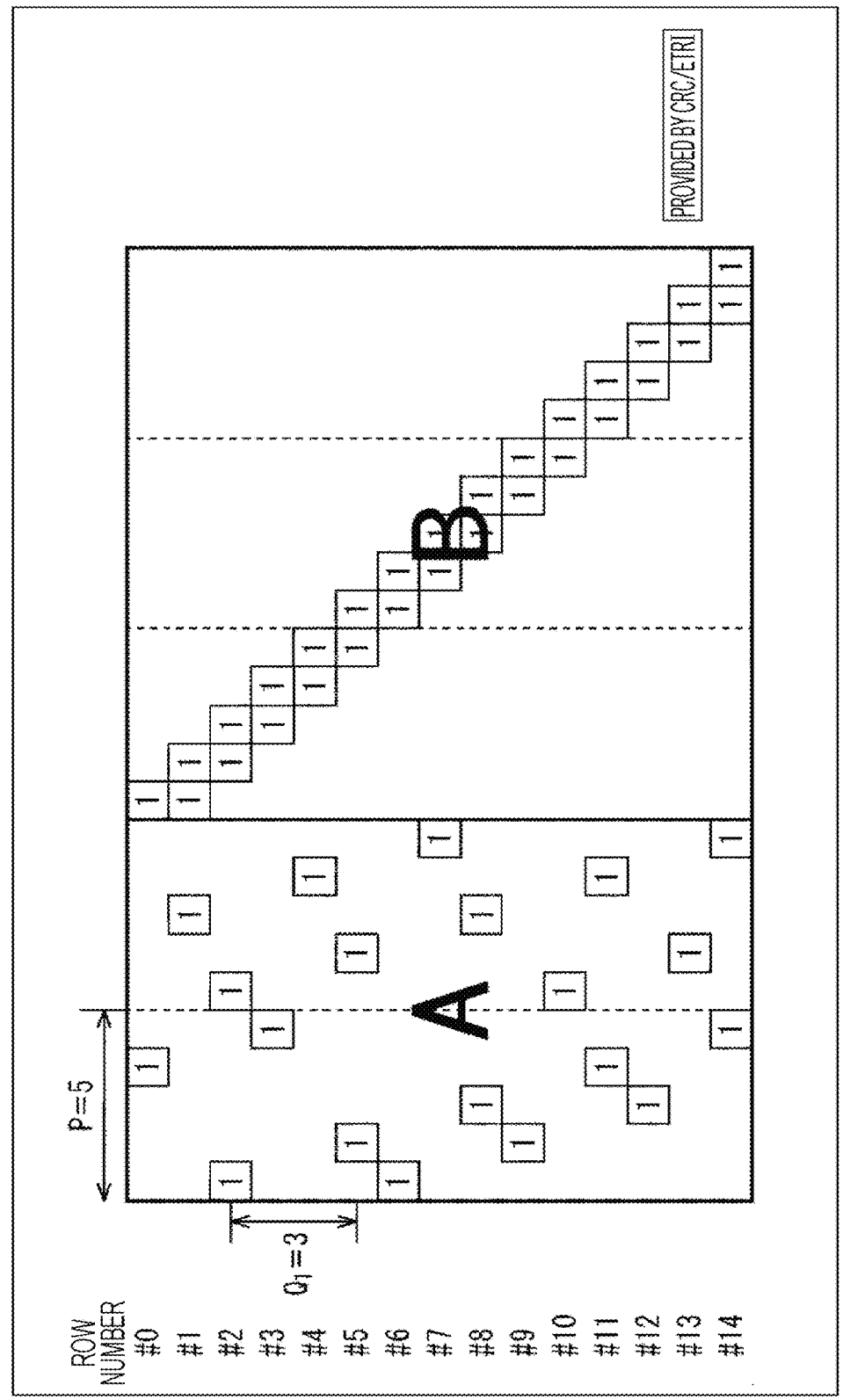
FIG. 24 is a diagram illustrating an A matrix which is generated from the parity check matrix initial value table.

FIG. 24 is a diagram illustrating the A matrix that is generated from the parity check matrix initial value table illustrated in FIG. 23.

In the A matrix illustrated in FIG. 24, elements in rows #2 and #6 and the 1st (=1+5×(1−1)) column are 1 on the basis of the first row of the parity check matrix initial value table illustrated in FIG. 23.

The 2nd (=2+5×(1−1)) to 5th (=5+5×(1−1)) columns are obtained by cyclically shifting the previous columns in the downward direction by $Q_1$=3.

In the A matrix illustrated in FIG. 24, elements in rows #2 and #10 and the 6th (=1+5×(2−1)) column are 1 on the basis of the second row of the parity check matrix initial value table illustrated in FIG. 23.

The 7th (=2+5×(2−1)) to 10th (=5+5×(2−1)) columns are obtained by cyclically shifting the previous columns in the downward direction by $Q_1$=3.

Figure 25:
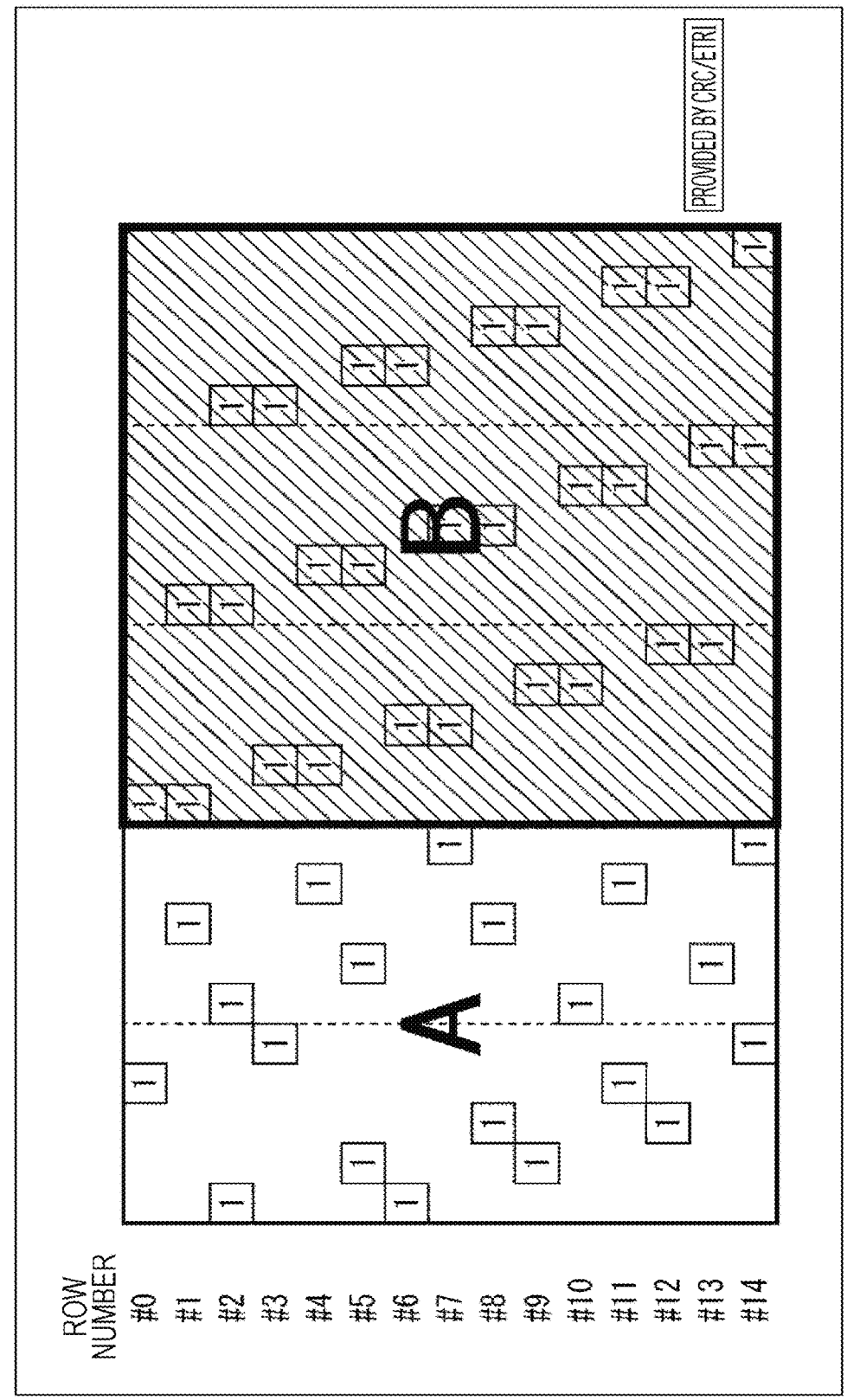
FIG. 25 is a diagram illustrating parity interleaving for a B matrix.

FIG. 25 is a diagram illustrating parity interleaving for the B matrix.

The parity check matrix generation unit 613 (FIG. 18) generates the A matrix, using the parity check matrix initial value table, and arranges the B matrix with the dual diagonal structure so as to be adjacent to the right side of the A matrix. Then, the parity check matrix generation unit 613 regards the B matrix as a parity matrix and performs parity interleaving such that adjacent elements "1" of the B matrix having the dual diagonal structure are separated from each other by the unit size P (=5) in the row direction.

FIG. 25 illustrates the A matrix and the B matrix after the parity interleaving for the B matrix.

Figure 26:
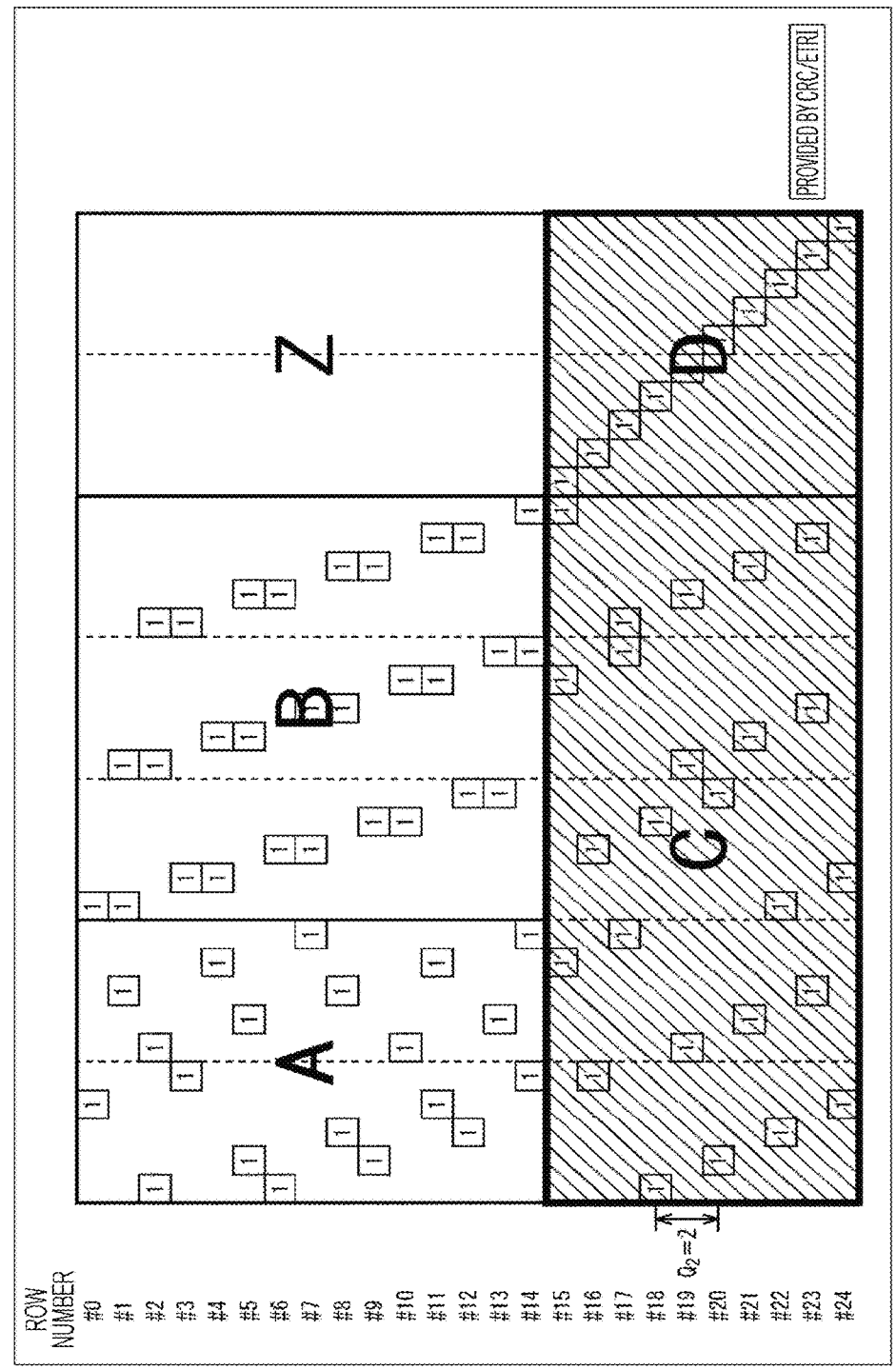
FIG. 26 is a diagram illustrating a C matrix which is generated from the parity check matrix initial value table.

FIG. 26 is a diagram illustrating the C matrix which is generated from the parity check matrix initial value table illustrated in FIG. 23.

In the C matrix illustrated in FIG. 26, an element in a row #18 and the 1st (=1+5×(1−1)) column of the parity check matrix are 1 on the basis of the first row of the parity check matrix initial value table illustrated in FIG. 23.

The 2nd (=2+5×(1−1)) to 5th (=5+5×(1−1)) columns of the C matrix are obtained by cyclically shifting the previous columns by $Q_2$ (=2).

In the C matrix illustrated in FIG. 26, an element in a row #19 and the 6th (=1+5×(2−1)) column, an element in a row #22 and the 11th (=1+5×(3−1)) column, an element in a row #19 and the 16th (=1+5×(4−1)) column, and an element in a row #15 and the 21st (=1+5×(5−1)) column in the parity check matrix are 1 on the basis of the second to fifth rows of the parity check matrix initial value table illustrated in FIG. 23.

The 7th (=2+5×(2−1)) to 10th (=5+5×(2−1)) columns, the 12th (=2+5×(3−1)) to 15th (=5+5×(3−1)) columns, the 17th (=2+5×(4−1)) to 20th (=5+5×(4−1)) columns, and the 22nd (=2+5×(5−1)) to 25th (=5+5×(5−1)) columns are obtained by cyclically shifting the previous columns in the downward direction by $Q_2$ (=2)

The parity check matrix generation unit 613 (FIG. 18) generates the C matrix, using the parity check matrix initial value table, and arranges the C matrix below the A matrix and the (parity-interleaved) B matrix.

In addition, the parity check matrix generation unit 613 arranges the Z matrix so as to be adjacent to the right side of the B matrix, arranges the D matrix so as to be adjacent to the right side of the C matrix, and generates the parity check matrix illustrated in FIG. 26.

Figure 27:
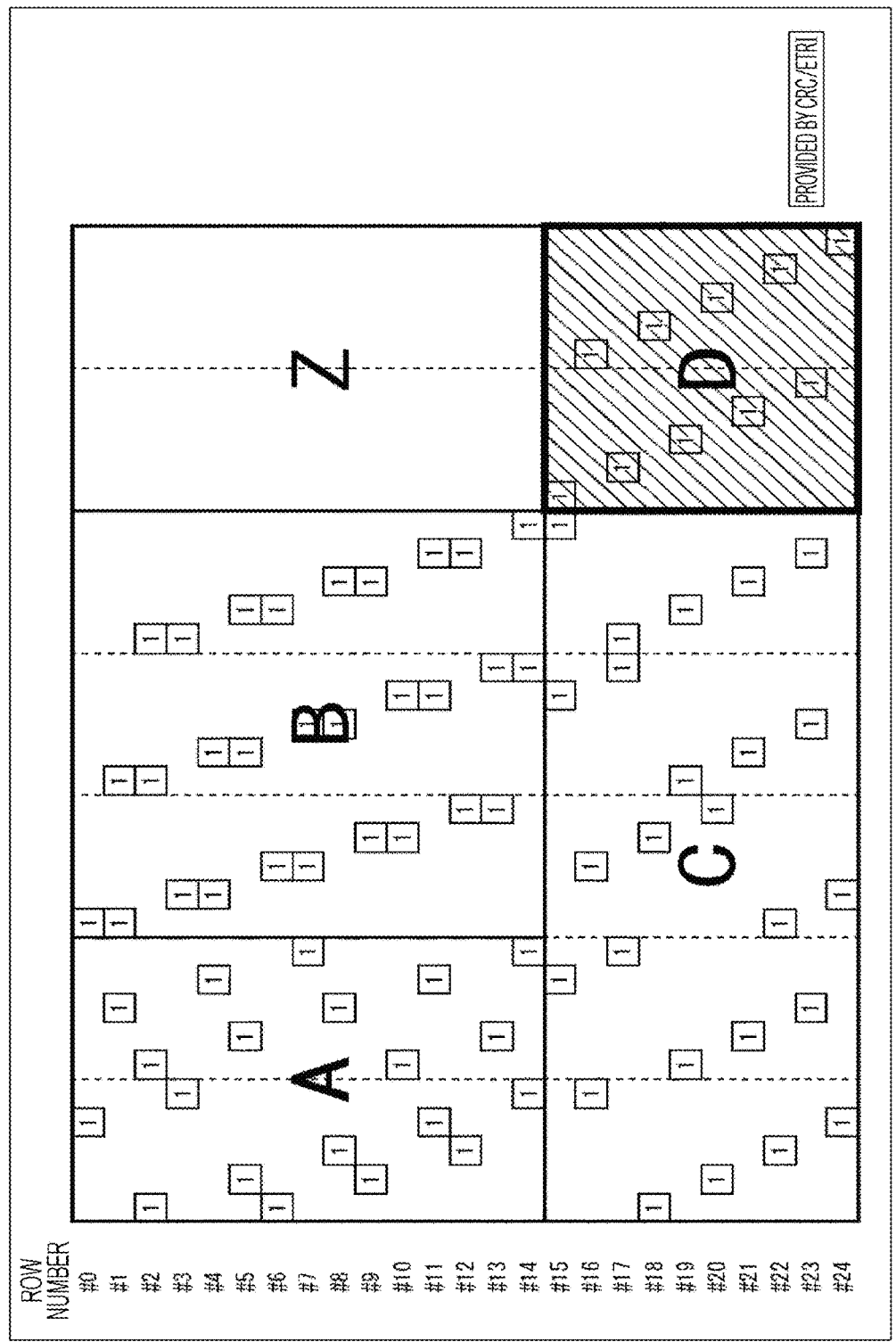
FIG. 27 is a diagram illustrating parity interleaving for a D matrix.

FIG. 27 is a diagram illustrating parity interleaving for the D matrix.

After generating the parity check matrix illustrated in FIG. 26, the parity check matrix generation unit 613 regards the D matrix as a parity matrix and performs parity interleaving (only for the D matrix) such that elements "1" in the odd-numbered rows and the next even-numbered rows of the D matrix, which is the unit matrix, are separated from each other in the row direction by the unit size P (=5).

FIG. 27 illustrates a parity check matrix after parity interleaving is for the D matrix in the parity check matrix illustrated in FIG. 26.

For example, (the coding parity calculation unit 615 (FIG. 18) of) the LDPC encoder 115 performs LDPC coding (the generation of an LDPC code), using the parity check matrix illustrated in FIG. 27.

Here, the LDPC code which is generated using the parity check matrix illustrated in FIG. 27 is an LDPC code subjected to the parity interleaving. Therefore, the parity interleaver 23 (FIG. 9) does not need to perform parity interleaving for the LDPC code which has been generated using the parity check matrix illustrated in FIG. 27.

Figure 28:
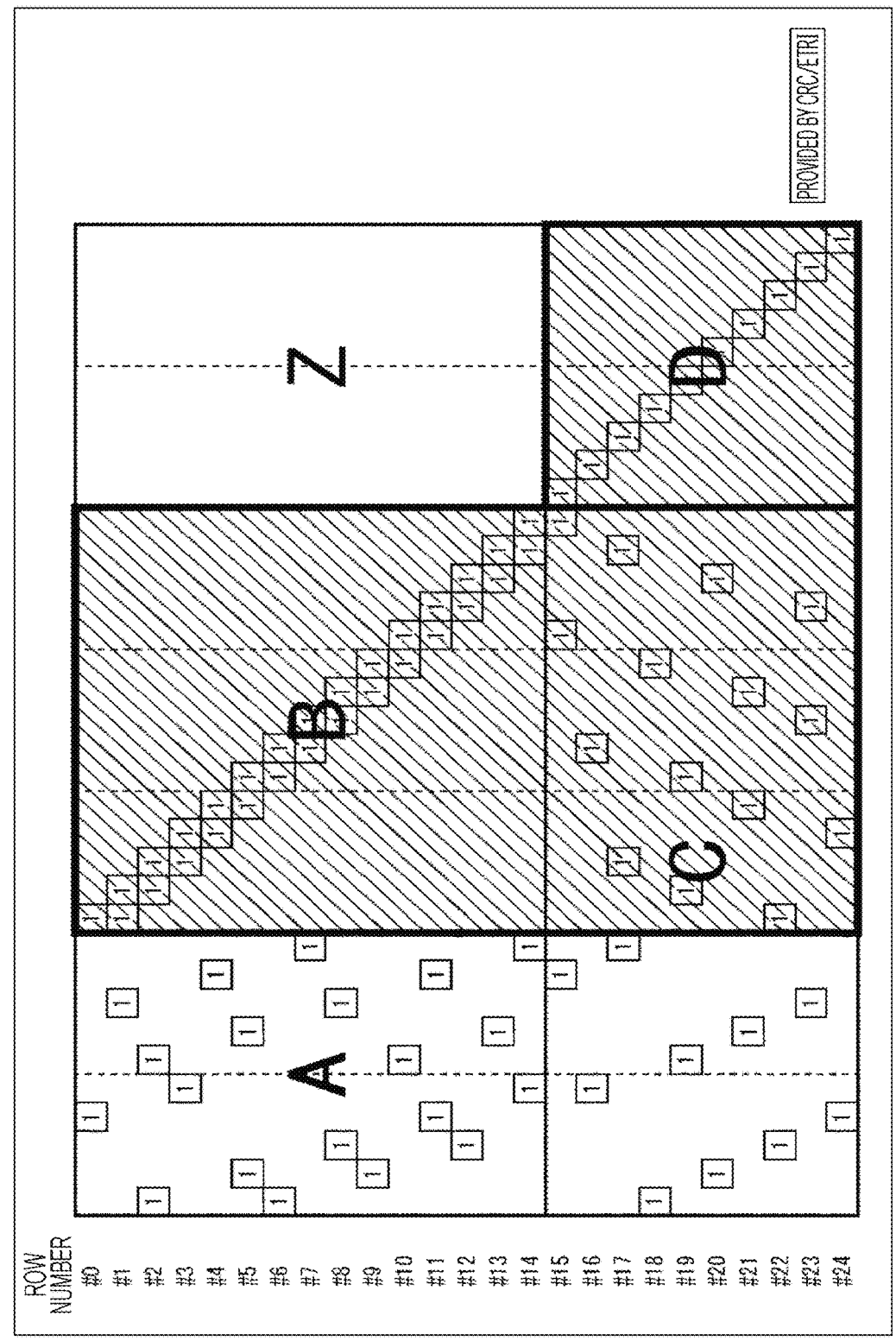
FIG. 28 is a diagram illustrating a parity check matrix obtained by performing column permutation as parity deinterleaving, which returns a sequence subjected to parity interleaving to an original sequence, for the parity check matrix.

FIG. 28 is a diagram illustrating a parity check matrix that is obtained by performing, as parity deinterleaving, a column permutation process which returns the parity-interleaved matrices to the original state for the B matrix, a portion of the C matrix (a portion of the C matrix which is arranged below the B matrix), and the D matrix in the parity check matrix illustrated in FIG. 27.

The LDPC encoder 115 can perform LDPC coding (the generation of the LDPC code), using the parity check matrix illustrated in FIG. 28.

When LDPC coding is performed using the parity check matrix illustrated in FIG. 28, an LDPC code that has not been subjected to parity interleaving is obtained according to the LDPC coding. Therefore, when LDPC coding is performed using the parity check matrix illustrated in FIG. 28, the parity interleaver 23 (FIG. 9) performs parity interleaving.

Figure 29:
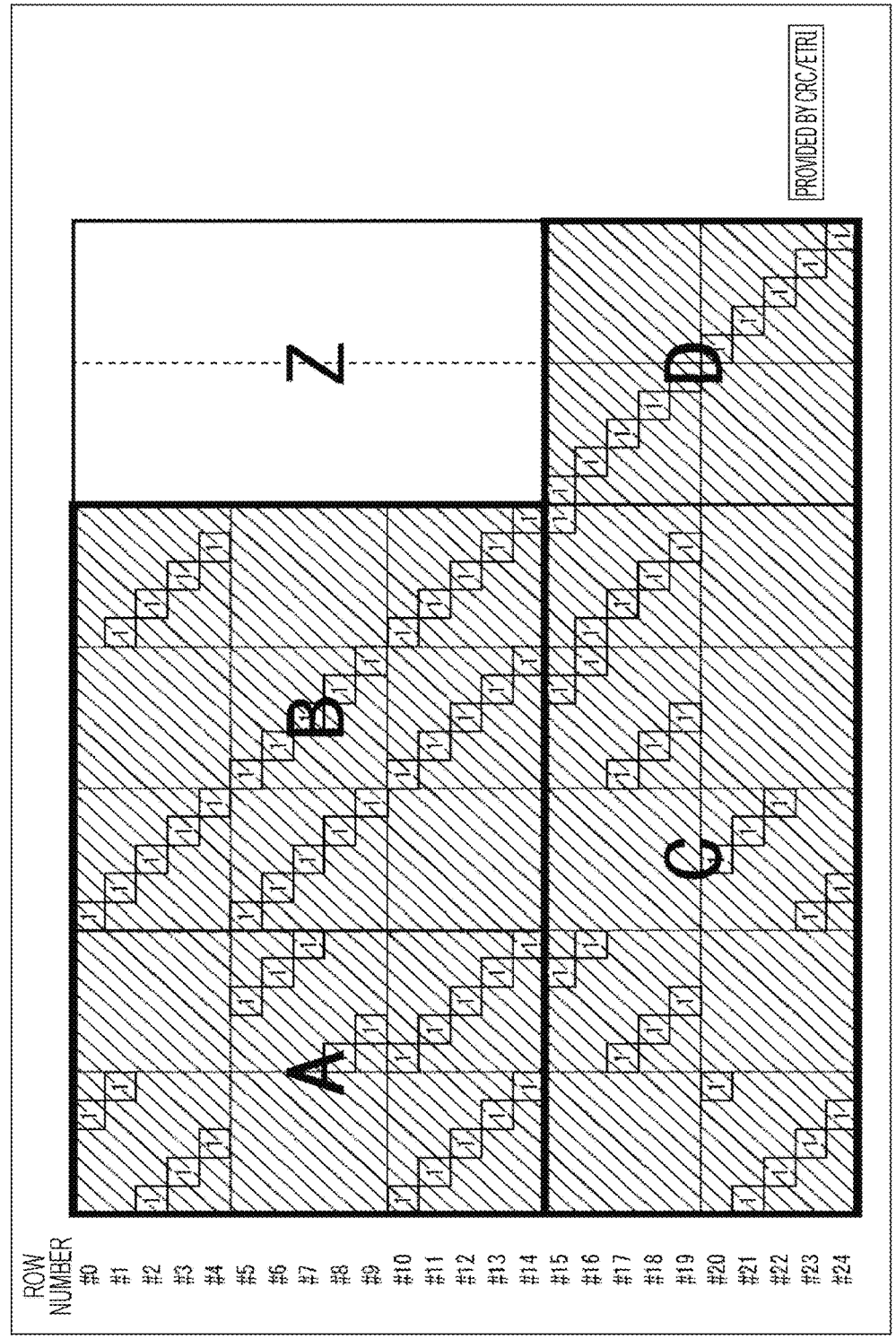
FIG. 29 is a diagram illustrating a transformed parity check matrix obtained by performing row permutation for the parity check matrix.

FIG. 29 is a diagram illustrating a transformed parity check matrix obtained by performing row permutation for the parity check matrix illustrated in FIG. 27.

The transformed parity check matrix is represented by a combination of a P×P unit matrix, a quasi unit matrix obtained by substituting one or more Is of the unit matrix with 0, a shifted matrix obtained by cyclically shifting the unit matrix or the quasi unit matrix, a sum matrix which is the sum of two or more of the unit matrix, the quasi unit matrix, and the shifted matrix, and a P×P zero matrix, which will be described below.

The use of the transformed parity check matrix to decode the LDPC code makes it possible to adopt an architecture in which the check node operation and the variable node operation are simultaneously performed P times during the decoding of the LDPC code, which will be described below.

<New LDPC Code>

In recent years, a terrestrial digital television broadcasting standard, which is called ATSC3.0, has been developed.

A new LDPC code (hereinafter, also referred to as a new LDPC code) which can be used in ATSC3.0 and other data transmission standards will be described.

Examples of the new LDPC code include an LDPC code based on the DVB method or an LDPC code based on the ETRI method which corresponds to a parity check matrix having a cyclic structure and has a unit size P of 360 that is equal to the unit size in, for example, the DVB-T.2 standard.

The LDPC encoder 115 (FIG. 8 and FIG. 18) can perform LDPC coding for the new LDPC code, using a parity check matrix that is calculated from a parity check matrix initial value table of the new LDPC code having a code length N of 16 kbits or 64 kbits and a coding rate r of 5/15, 6, 15, 7/15, 8/15, 9/15, 10/15, 11/15, 12/15, or 13/15, which will be described below.

In this case, the storage unit 602 of the LDPC encoder 115 (FIG. 8) stores the parity check matrix initial value table of the new LDPC code.

FIG. 30 is a diagram illustrating an example of a parity check matrix initial value table based on the DVB method with respect to a parity check matrix of a new LDPC code having a code length N of 16 kbits and a coding rate r of 8/15 (hereinafter, also referred to as a Sony code with (16 k, 8/15)) which is suggested by the inventors.

FIG. 31 is a diagram illustrating an example of a parity check matrix initial value table based on the DVB method with respect to a parity check matrix of a new LDPC code having a code length N of 16 kbits and a coding rate r of 10/15 (hereinafter, also referred to as a Sony code with (16 k, 10/15)) which is suggested by the inventors.

FIG. 32 is a diagram illustrating an example of a parity check matrix initial value table based on the DVB method with respect to a parity check matrix of a new LDPC code having a code length N of 16 kbits and a coding rate r of 12/15 (hereinafter, also referred to as a Sony code with (16 k, 12/15)) which is suggested by the inventors.

Figure 34:
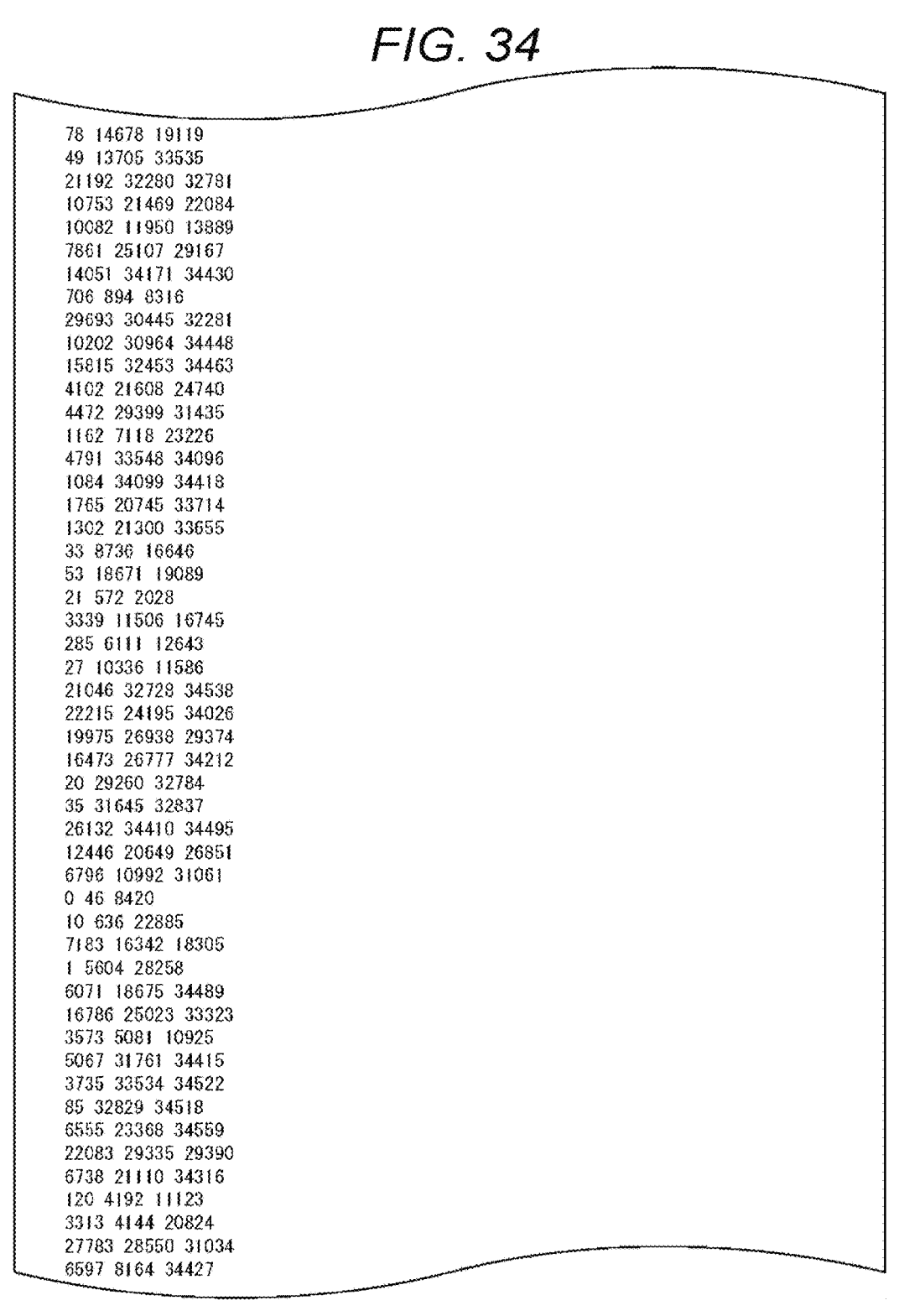
Figure 35:
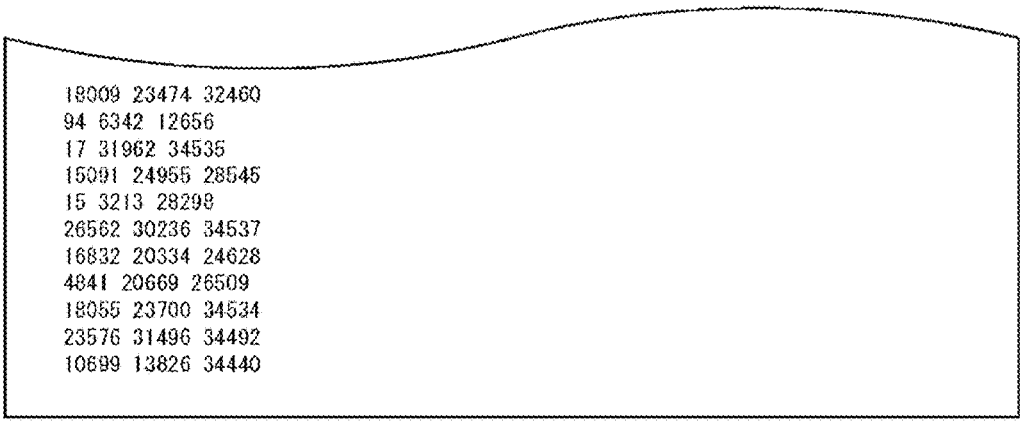
FIG. 35 is a diagram illustrating the example of the parity check matrix initial value table.

FIGS. 33, 34, and 35 are diagrams illustrating an example of a parity check matrix initial value table based on the DVB method with respect to a parity check matrix of a new LDPC code having a code length N of 64 kbits and a coding rate r of 7/15 (hereinafter, also referred to as a Sony code with (64 k, 7/15)) which is suggested by the inventors.

FIG. 34 is a diagram subsequent to FIG. 33 and FIG. 35 is a diagram subsequent to FIG. 34.

Figure 38:
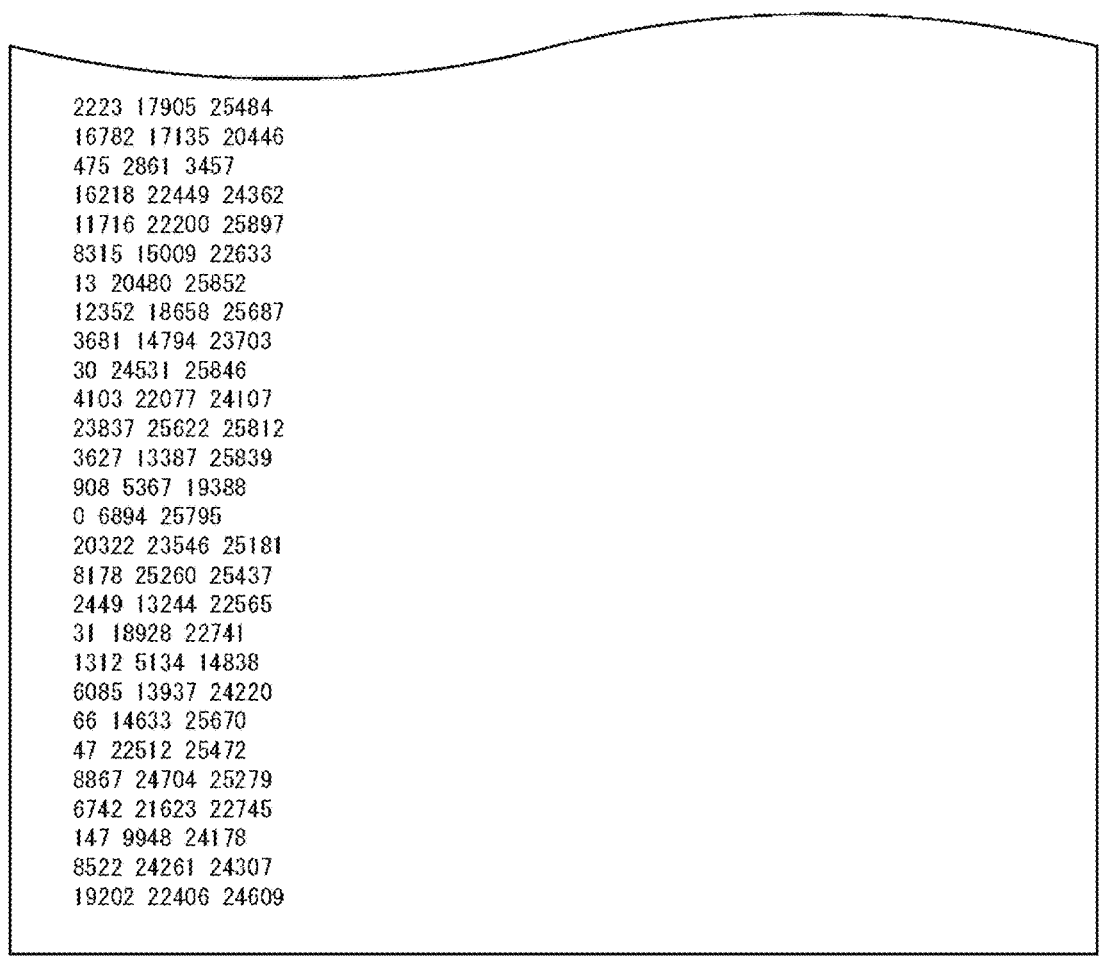
FIG. 38 is a diagram illustrating the example of the parity check matrix initial value table.

FIGS. 36, 37, and 38 are diagrams illustrating an example of a parity check matrix initial value table based on the DVB method with respect to a parity check matrix of a new LDPC code having a code length N of 64 kbits and a coding rate r of 9/15 (hereinafter, also referred to as a Sony code with (64 k, 9/15)) which is suggested by the inventors.

FIG. 37 is a diagram subsequent to FIG. 36 and FIG. 38 is a diagram subsequent to FIG. 37.

FIGS. 39, 40, 41, and 42 are diagrams illustrating an example of a parity check matrix initial value table based on the DVB method with respect to a parity check matrix of a new LDPC code having a code length N of 64 kbits and a coding rate r of 11/15 (hereinafter, also referred to as a Sony code with (64 k, 11/15)) which is suggested by the inventors.

Figure 40:
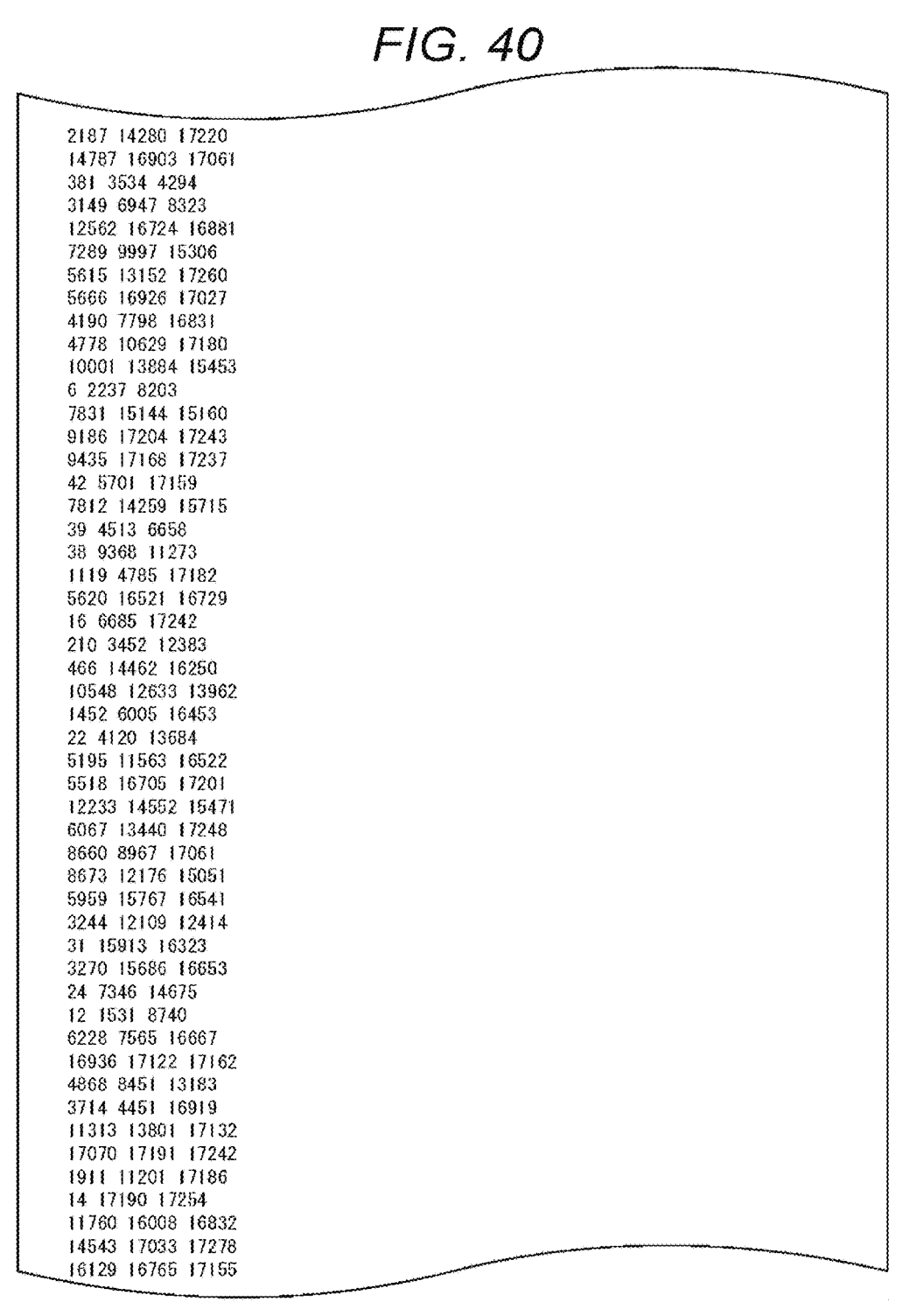
Figure 41:
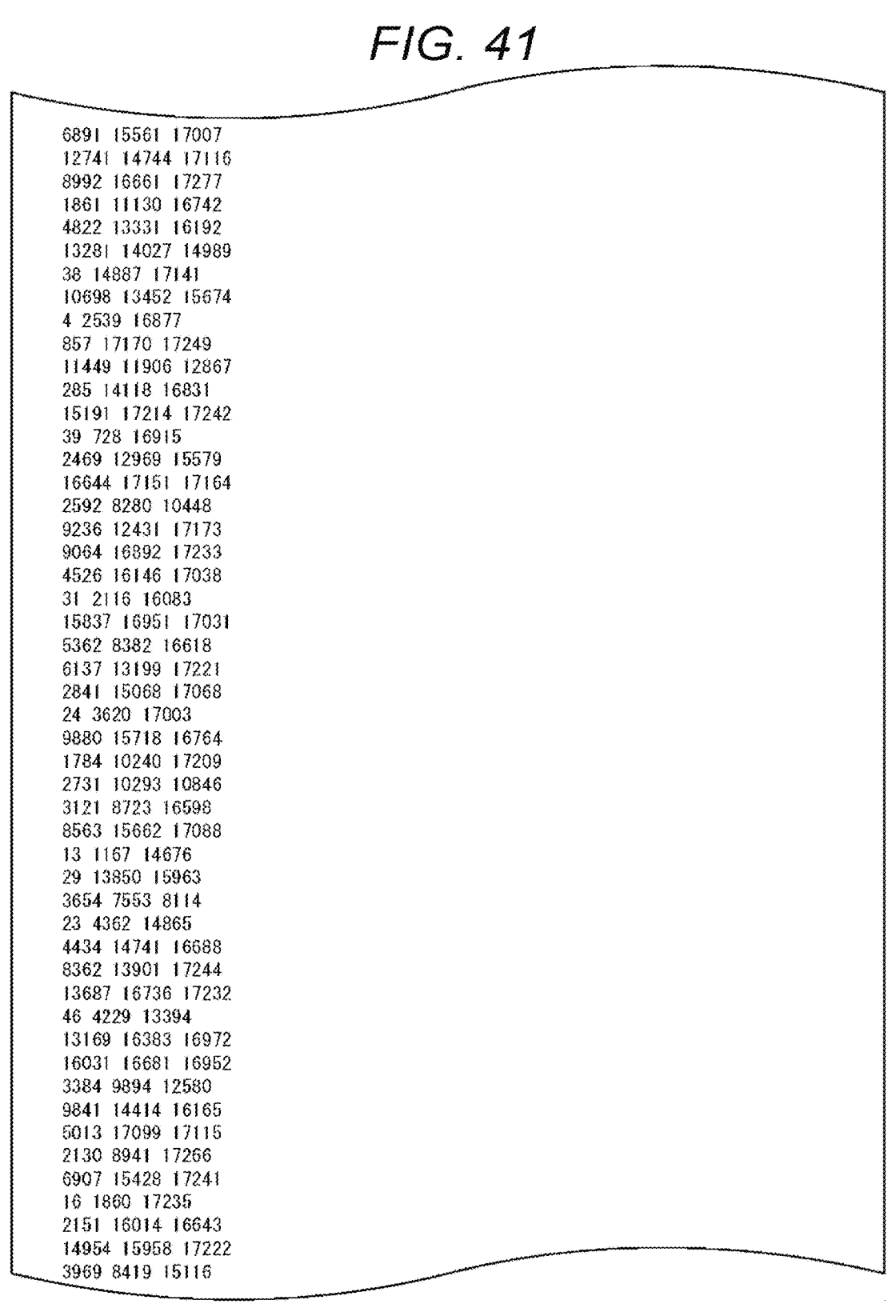
Figure 42:
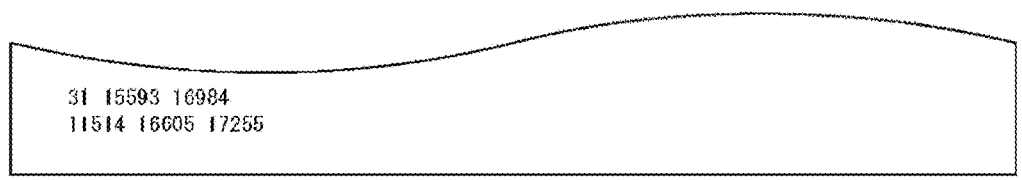
FIG. 42 is a diagram illustrating the example of the parity check matrix initial value table.

FIG. 40 is a diagram subsequent to FIG. 39, FIG. 41 is a diagram subsequent to FIG. 40, and FIG. 42 is a diagram subsequent to FIG. 41.

FIGS. 43, 44, 45, and 46 are diagrams illustrating an example of a parity check matrix initial value table based on the DVB method with respect to a parity check matrix of a new LDPC code having a code length N of 64 kbits and a coding rate r of 13/15 (hereinafter, also referred to as a Sony code with (64 k, 13/15)) which is suggested by the inventors.

Figure 44:
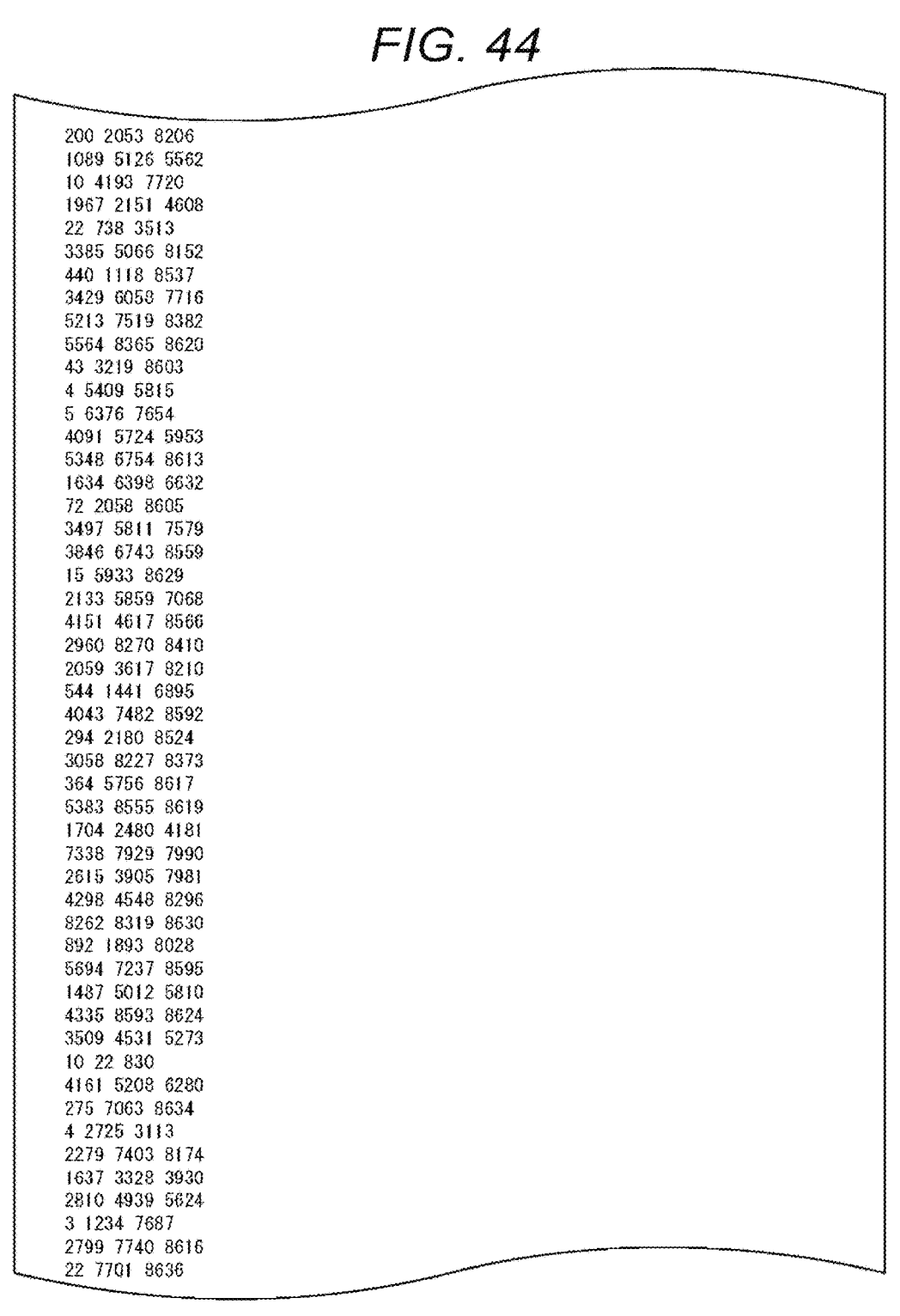
Figure 45:
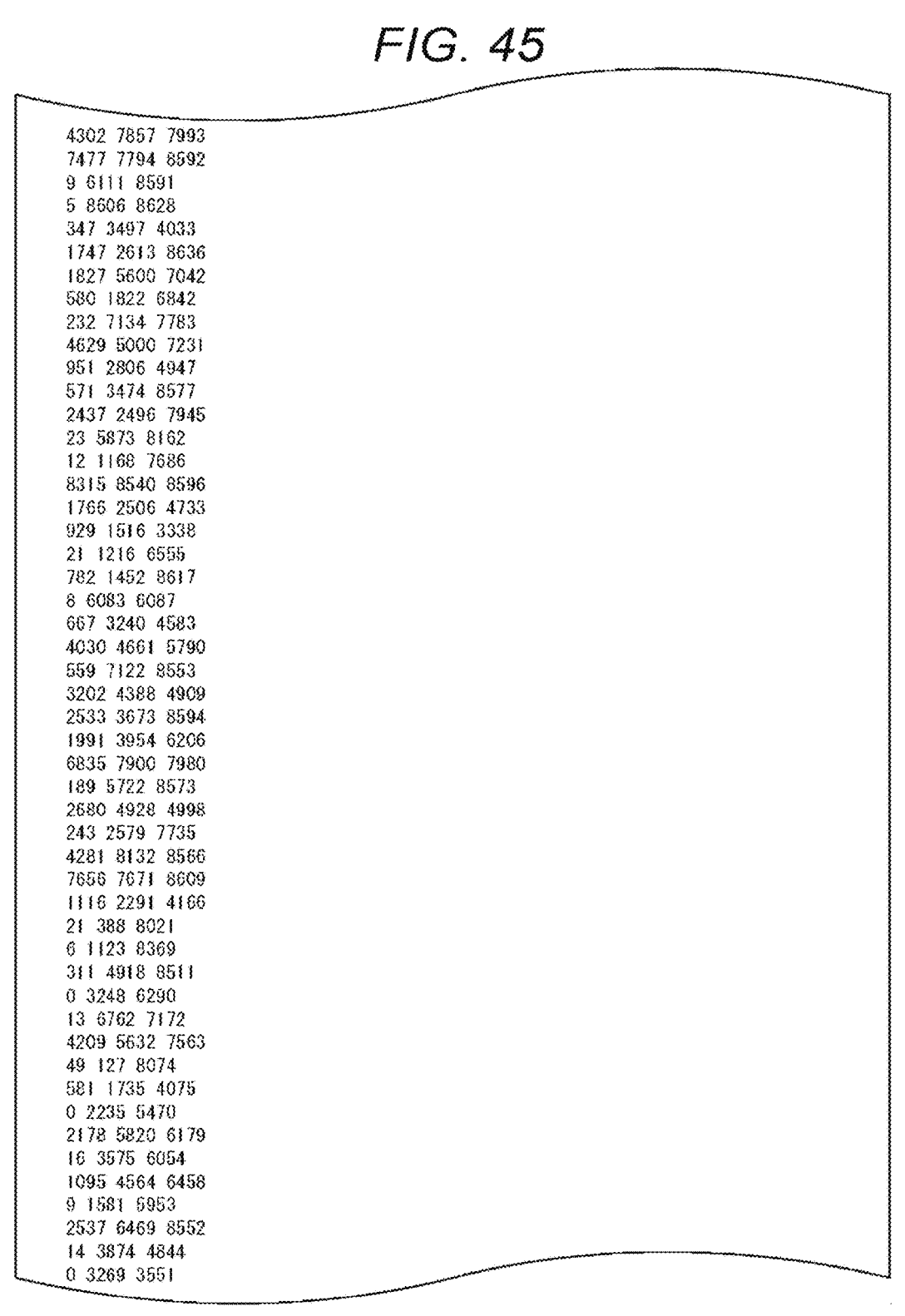
Figure 46:
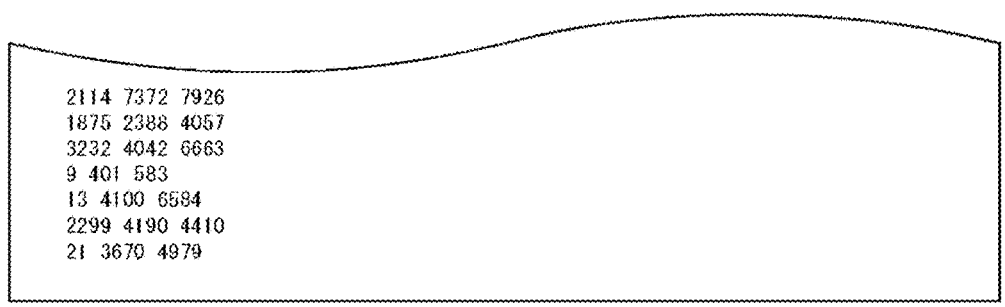
FIG. 46 is a diagram illustrating the example of the parity check matrix initial value table.

FIG. 44 is a diagram subsequent to FIG. 43, FIG. 45 is a diagram subsequent to FIG. 44, and FIG. 46 is a diagram subsequent to FIG. 45.

Figure 48:
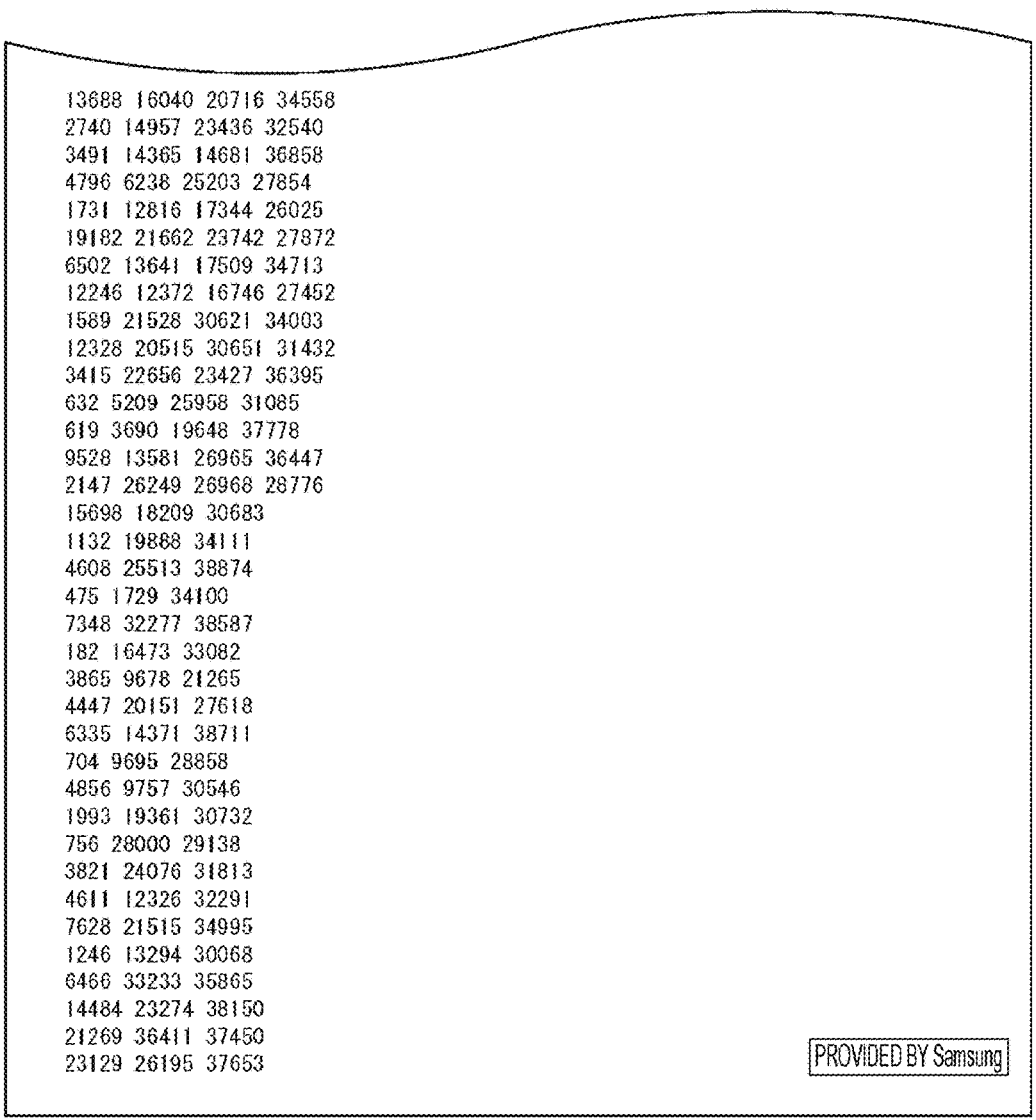
FIG. 48 is a diagram illustrating the example of the parity check matrix initial value table.

FIGS. 47 and 48 are diagrams illustrating an example of a parity check matrix initial value table based on the DVB method with respect to a parity check matrix of a new LDPC code having a code length N of 64 kbits and a coding rate r of 6/15 (hereinafter, also referred to as a Samsung code with (64 k, 6/15)) which is suggested by Samsung Electronics Co., Ltd.

FIG. 48 is a diagram subsequent to FIG. 47.

Figure 50:
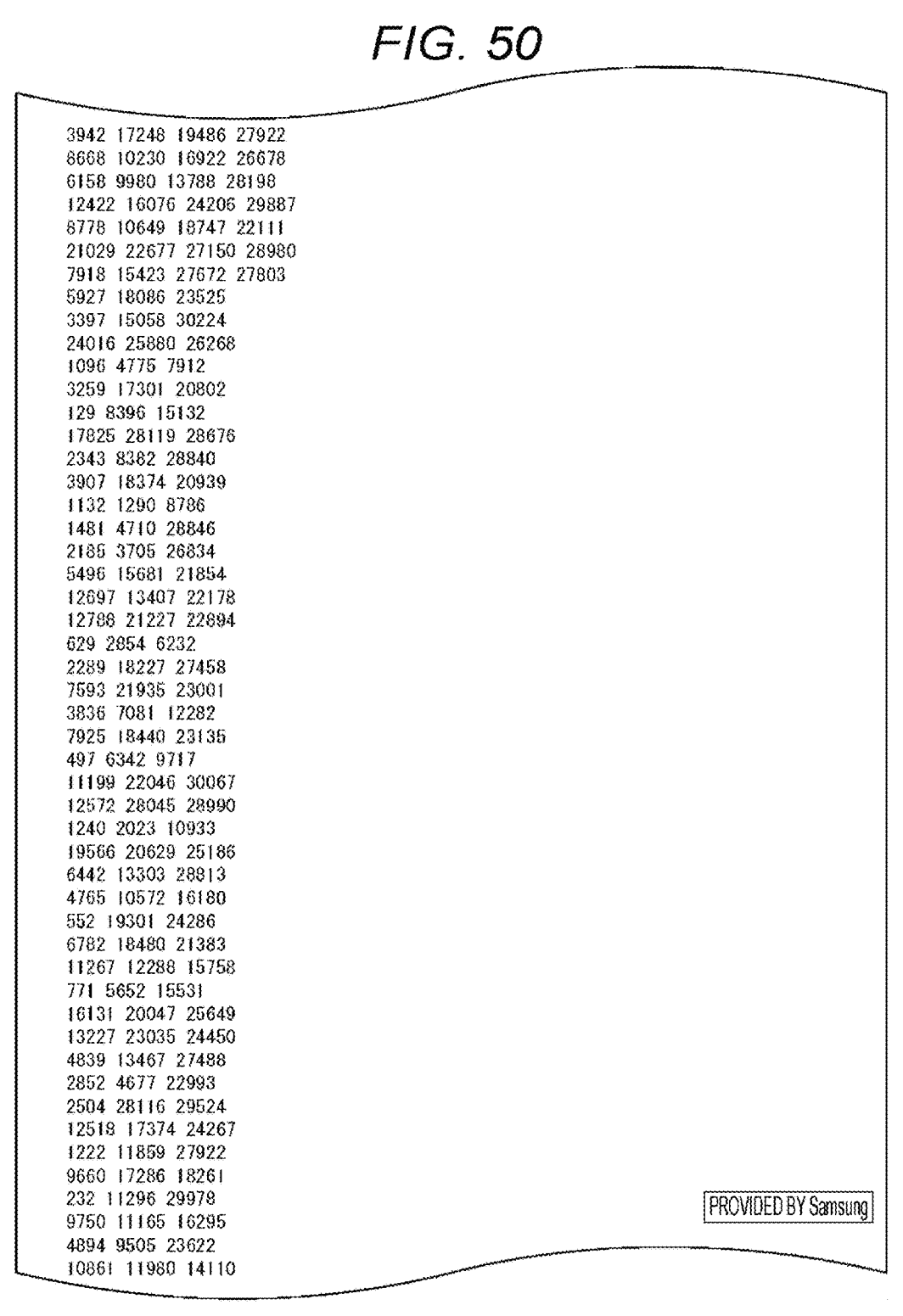
Figure 51:
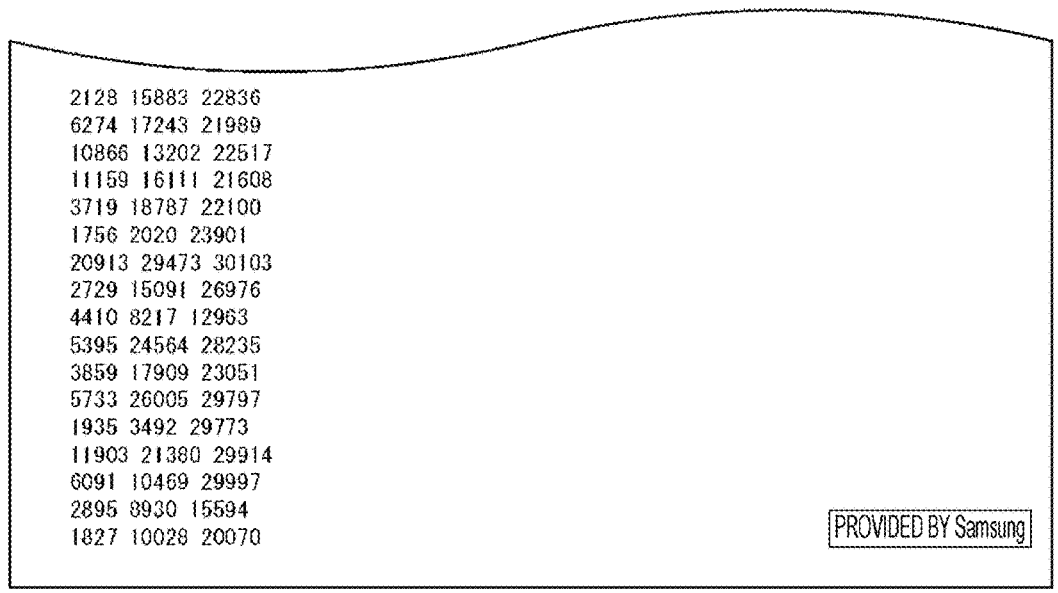
FIG. 51 is a diagram illustrating the example of the parity check matrix initial value table.

FIGS. 49, 50, and 51 are diagrams illustrating an example of a parity check matrix initial value table based on the DVB method with respect to a parity check matrix of a new LDPC code having a code length N of 64 kbits and a coding rate r of 8/15 (hereinafter, also referred to as a Samsung code with (64 k, 8/15)) which is suggested by Samsung Electronics Co., Ltd.

FIG. 50 is a diagram subsequent to FIG. 49 and FIG. 51 is a diagram subsequent to FIG. 50.

Figure 53:
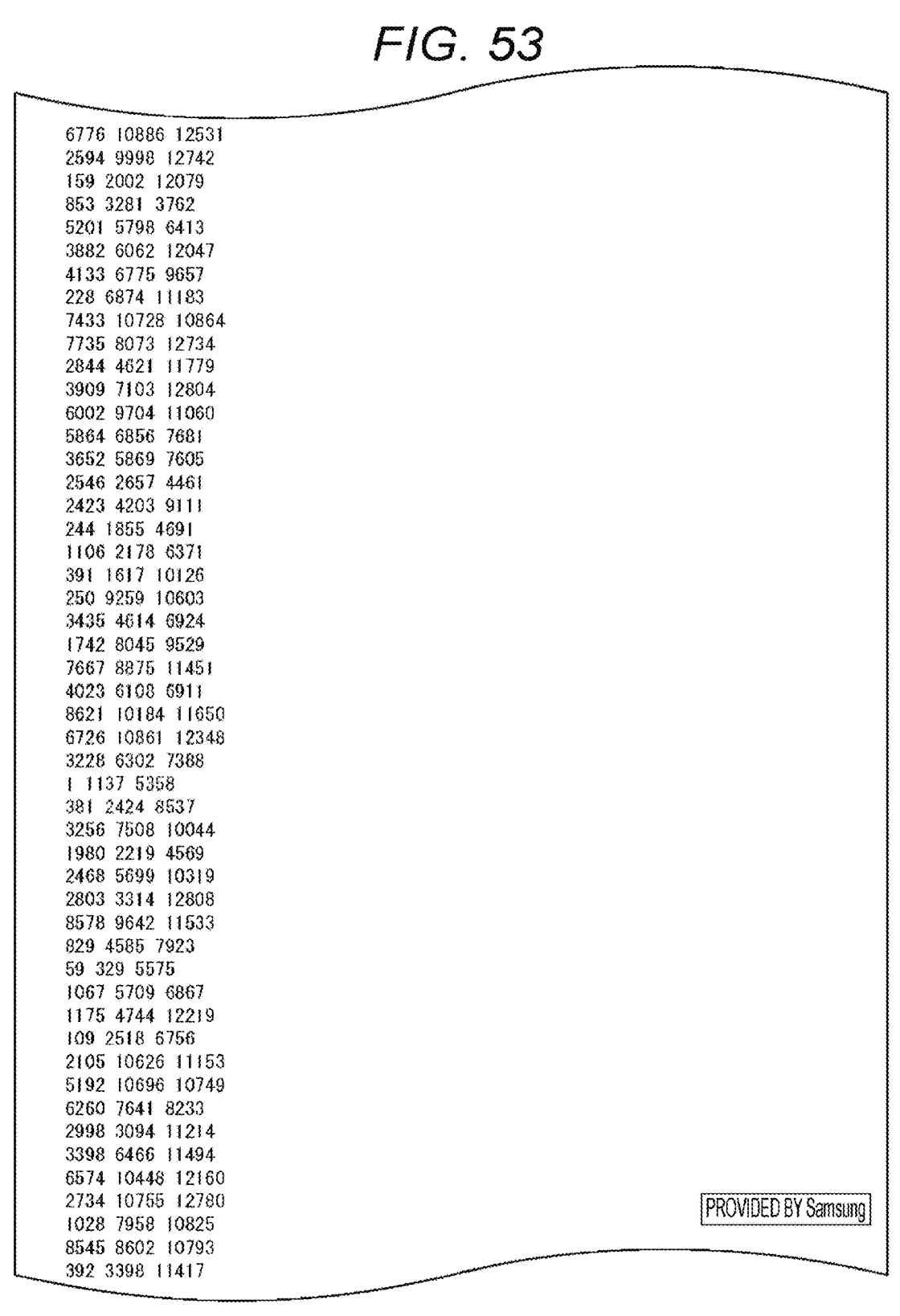
Figure 54:
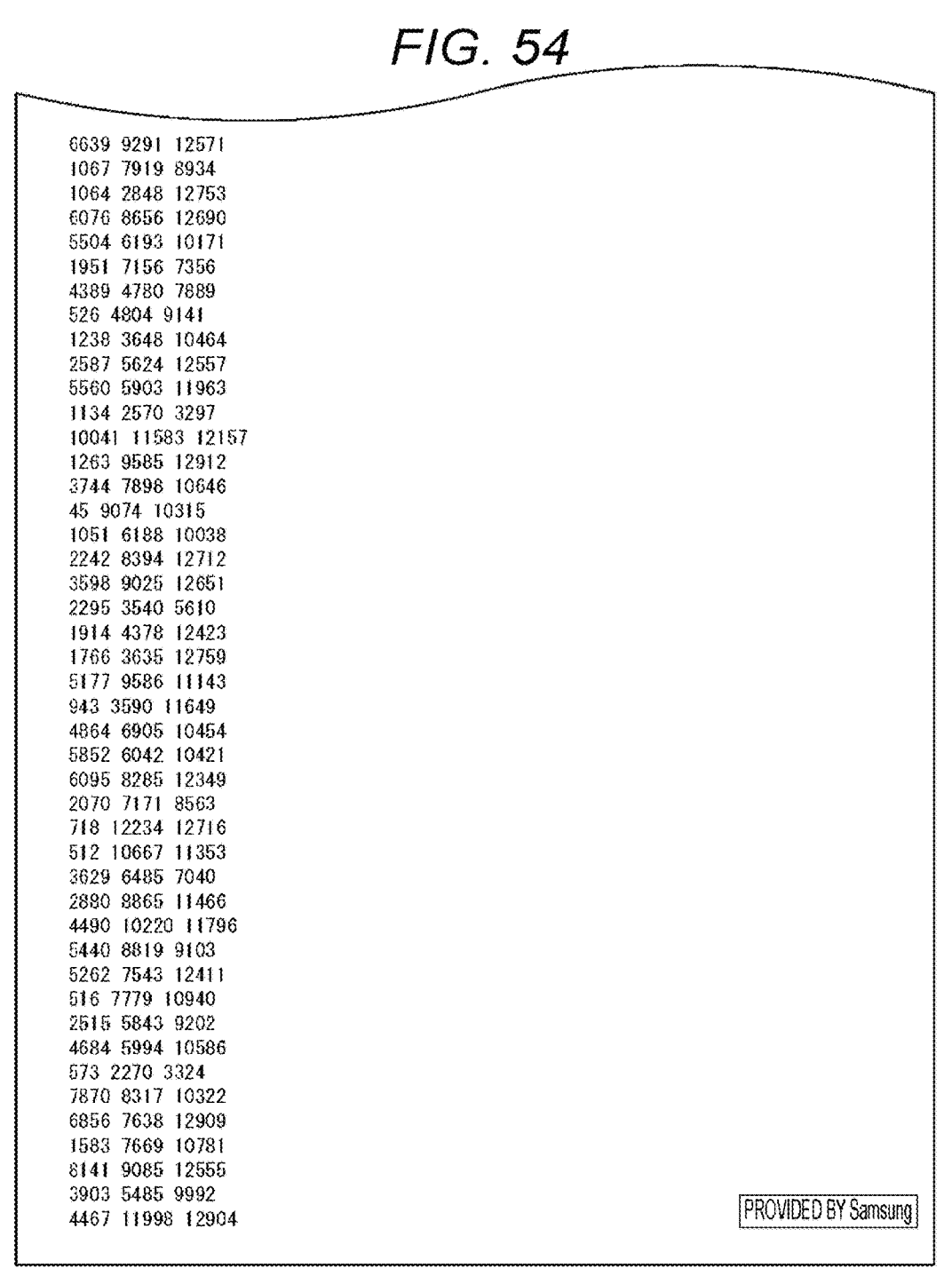

FIGS. 52, 53, and 54 are diagrams illustrating an example of a parity check matrix initial value table based on the DVB method with respect to a parity check matrix of a new LDPC code having a code length N of 64 kbits and a coding rate r of 12/15 (hereinafter, also referred to as a Samsung code with (64 k, 12/15)) which is suggested by Samsung Electronics Co., Ltd.

FIG. 53 is a diagram subsequent to FIG. 52 and FIG. 54 is a diagram subsequent to FIG. 53.

FIG. 55 is a diagram illustrating an example of a parity check matrix initial value table based on the DVB method with respect to a parity check matrix of a new LDPC code having a code length N of 16 kbits and a coding rate r of 6/15 (hereinafter, also referred to as an LGE code with (16 k, 6/15)) which is suggested by LG Electronics Inc.

FIG. 56 is a diagram illustrating an example of a parity check matrix initial value table based on the DVB method with respect to a parity check matrix of a new LDPC code having a code length N of 16 kbits and a coding rate r of 7/15 (hereinafter, also referred to as an LGE code with (16 k, 7/15)) which is suggested by LG Electronics Inc.

FIG. 57 is a diagram illustrating an example of a parity check matrix initial value table based on the DVB method with respect to a parity check matrix of a new LDPC code having a code length N of 16 kbits and a coding rate r of 9/15 (hereinafter, also referred to as an LGE code with (16 k, 9/15)) which is suggested by LG Electronics Inc.

FIG. 58 is a diagram illustrating an example of a parity check matrix initial value table based on the DVB method with respect to a parity check matrix of a new LDPC code having a code length N of 16 kbits and a coding rate r of 11/15 (hereinafter, also referred to as an LGE code with (16 k, 11/15)) which is suggested by LG Electronics Inc.

FIG. 59 is a diagram illustrating an example of a parity check matrix initial value table based on the DVB method with respect to a parity check matrix of a new LDPC code having a code length N of 16 kbits and a coding rate r of 13/15 (hereinafter, also referred to as an LGE code with (16 k, 13/15)) which is suggested by LG Electronics Inc.

Figure 61:
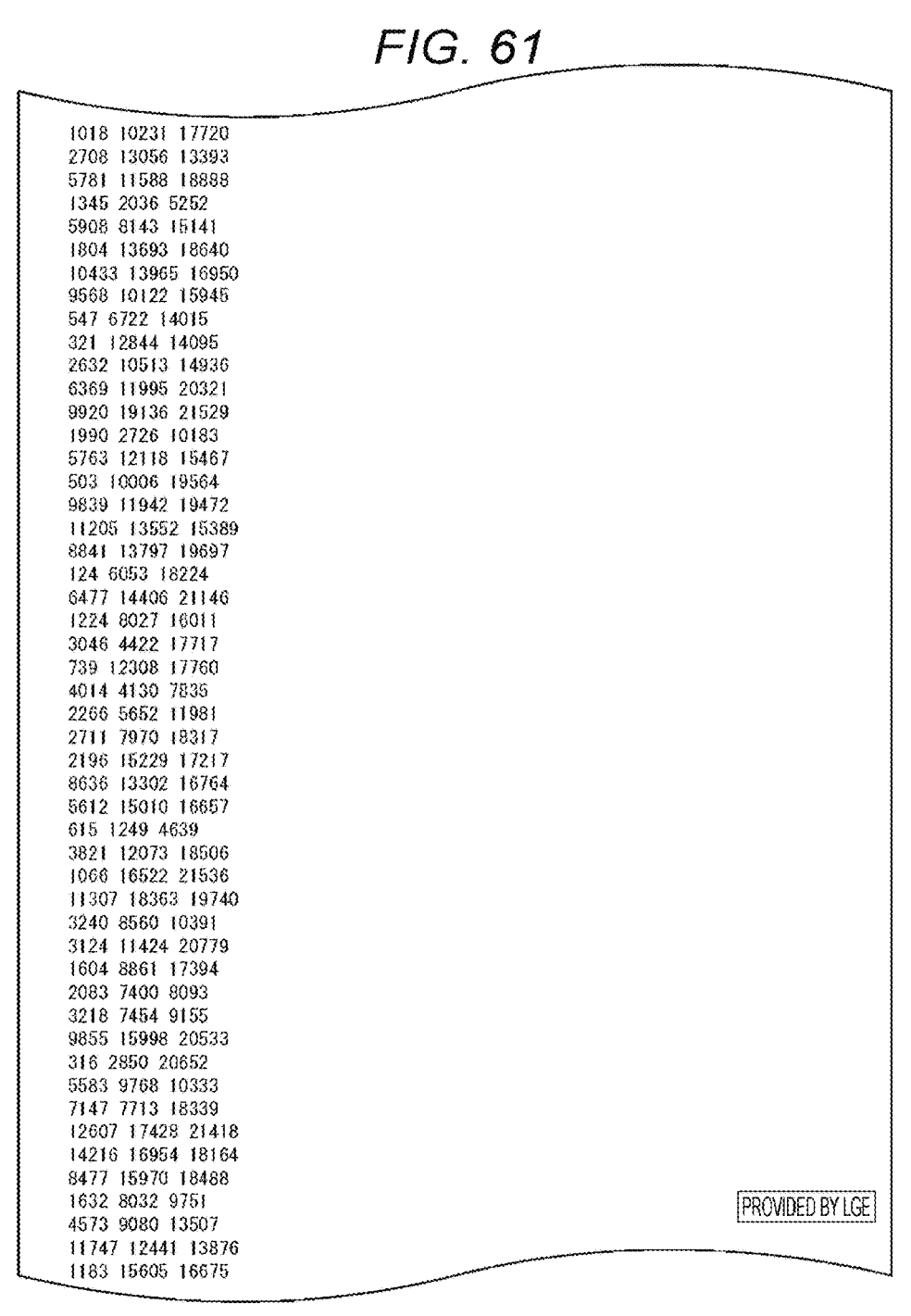
Figure 62:
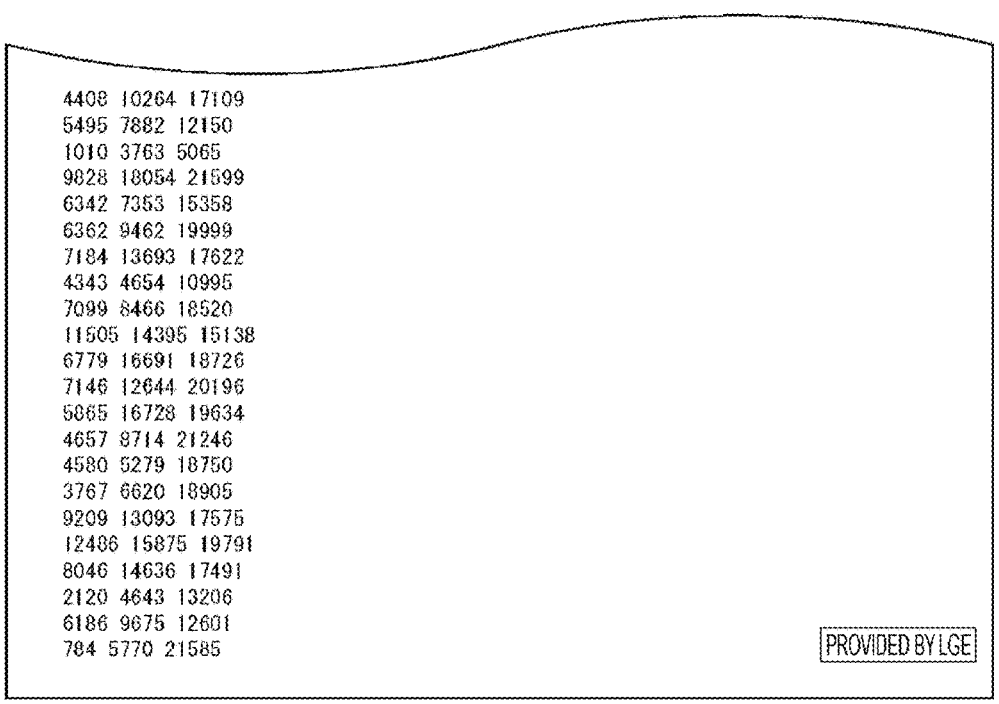
FIG. 62 is a diagram illustrating the example of the parity check matrix initial value table.

FIGS. 60, 61, and 62 are diagrams illustrating an example of a parity check matrix initial value table based on the DVB method with respect to a parity check matrix of a new LDPC code having a code length N of 64 kbits and a coding rate r of 10/15 (hereinafter, also referred to as an LGE code with (64 k, 10/15)) which is suggested by LG Electronics Inc.

FIG. 61 is a diagram subsequent to FIG. 60 and FIG. 62 is a diagram subsequent to FIG. 61.

Figure 64:
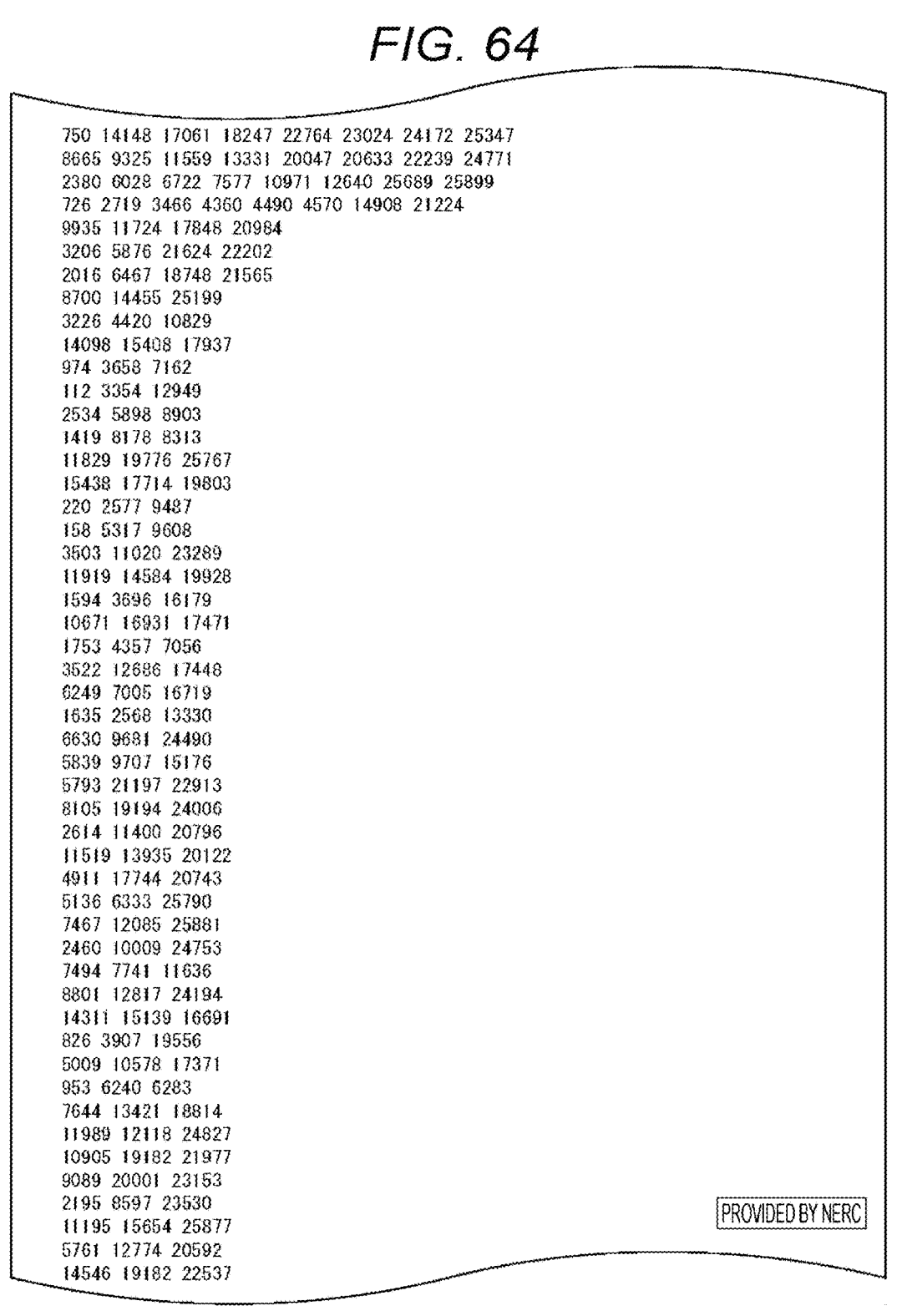
Figures 65, 66:
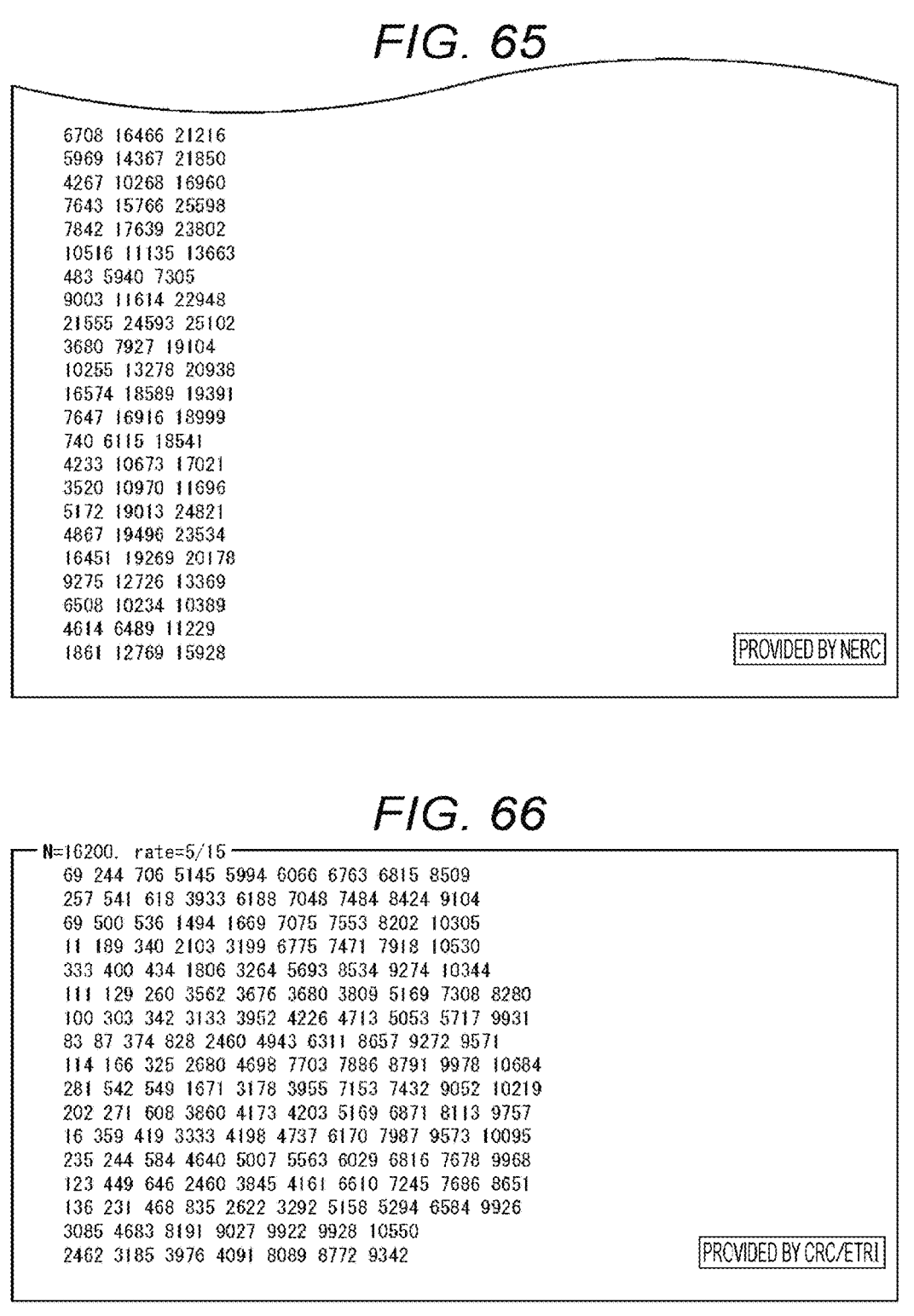

FIGS. 63, 64, and 65 are diagrams illustrating an example of a parity check matrix initial value table based on the DVB method with respect to a parity check matrix of a new LDPC code having a code length N of 64 kbits and a coding rate r of 9/15 (hereinafter, also referred to as a NERC code with (64 k, 9/15)) which is suggested by North American Electric Reliability Corporation (NERC).

FIG. 64 is a diagram subsequent to FIG. 63 and FIG. 65 is a diagram subsequent to FIG. 64.

FIG. 66 is a diagram illustrating an example of a parity check matrix initial value table based on the ETRI method with respect to a parity check matrix of a new LDPC code having a code length N of 16 kbits and a coding rate r of 5/15 (hereinafter, also referred to as an ETRI code with (16 k, 5/15)) which is suggested by CRC/ETRI.

Figure 68:
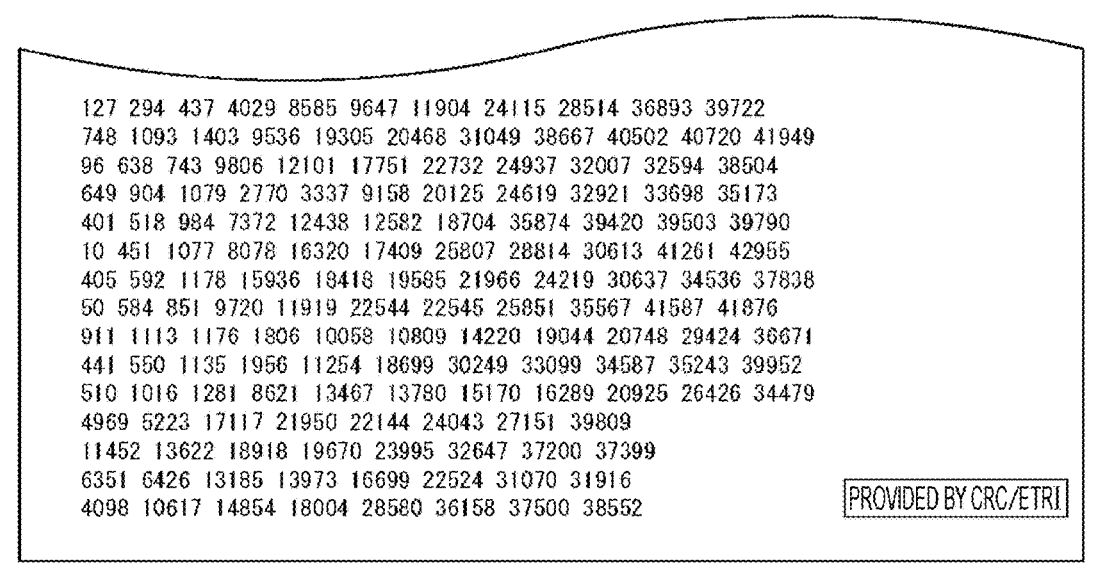

FIGS. 67 and 68 are diagrams illustrating an example of a parity check matrix initial value table based on the ETRI method with respect to a parity check matrix of a new LDPC code having a code length N of 64 kbits and a coding rate r of 5/15 (hereinafter, also referred to as an ETRI code with (64 k, 5/15)) which is suggested by CRC/ETRI.

FIG. 68 is a diagram subsequent to FIG. 67.

Figure 70:
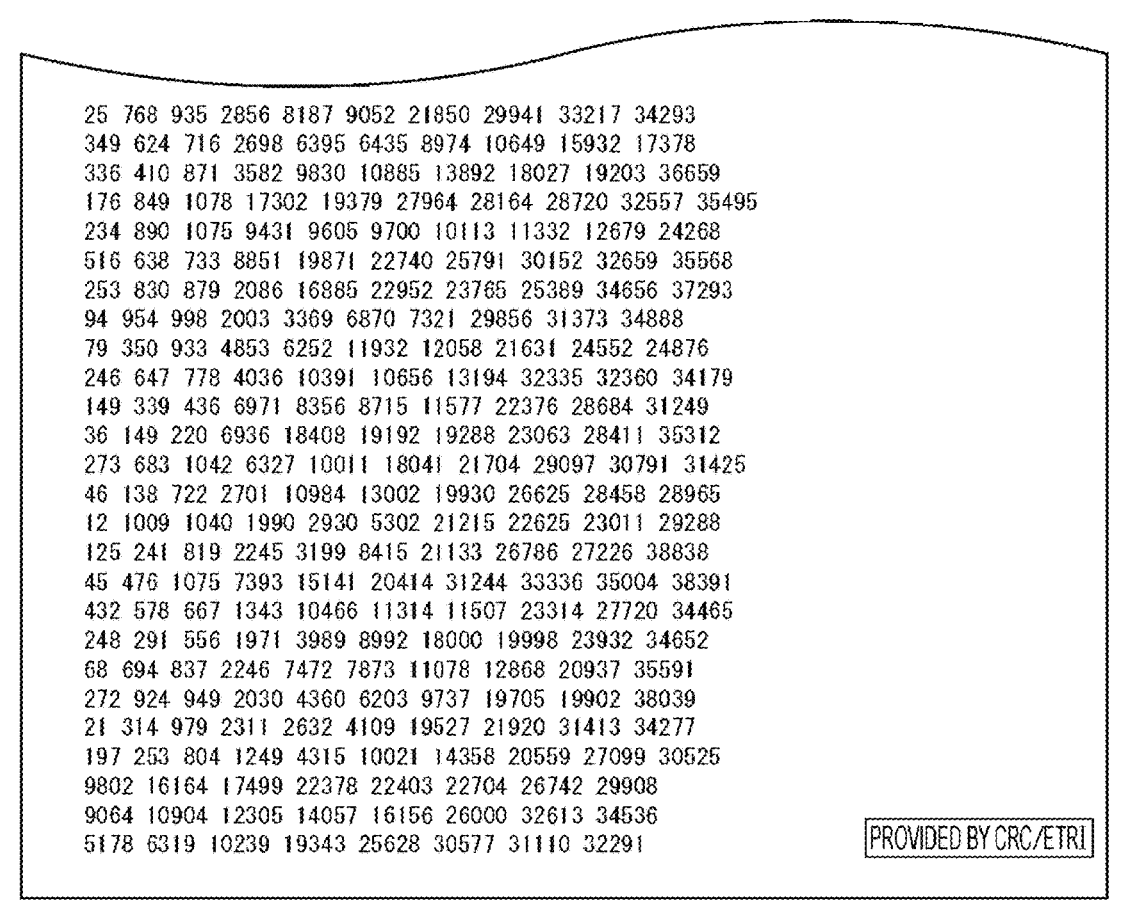

FIGS. 69 and 70 are diagrams illustrating an example of a parity check matrix initial value table based on the ETRI method with respect to a parity check matrix of a new LDPC code having a code length N of 64 kbits and a coding rate r of 6/15 (hereinafter, also referred to as an ETRI code with (64 k, 6/15)) which is suggested by CRC/ETRI.

FIG. 70 is a diagram subsequent to FIG. 69.

Figure 72:
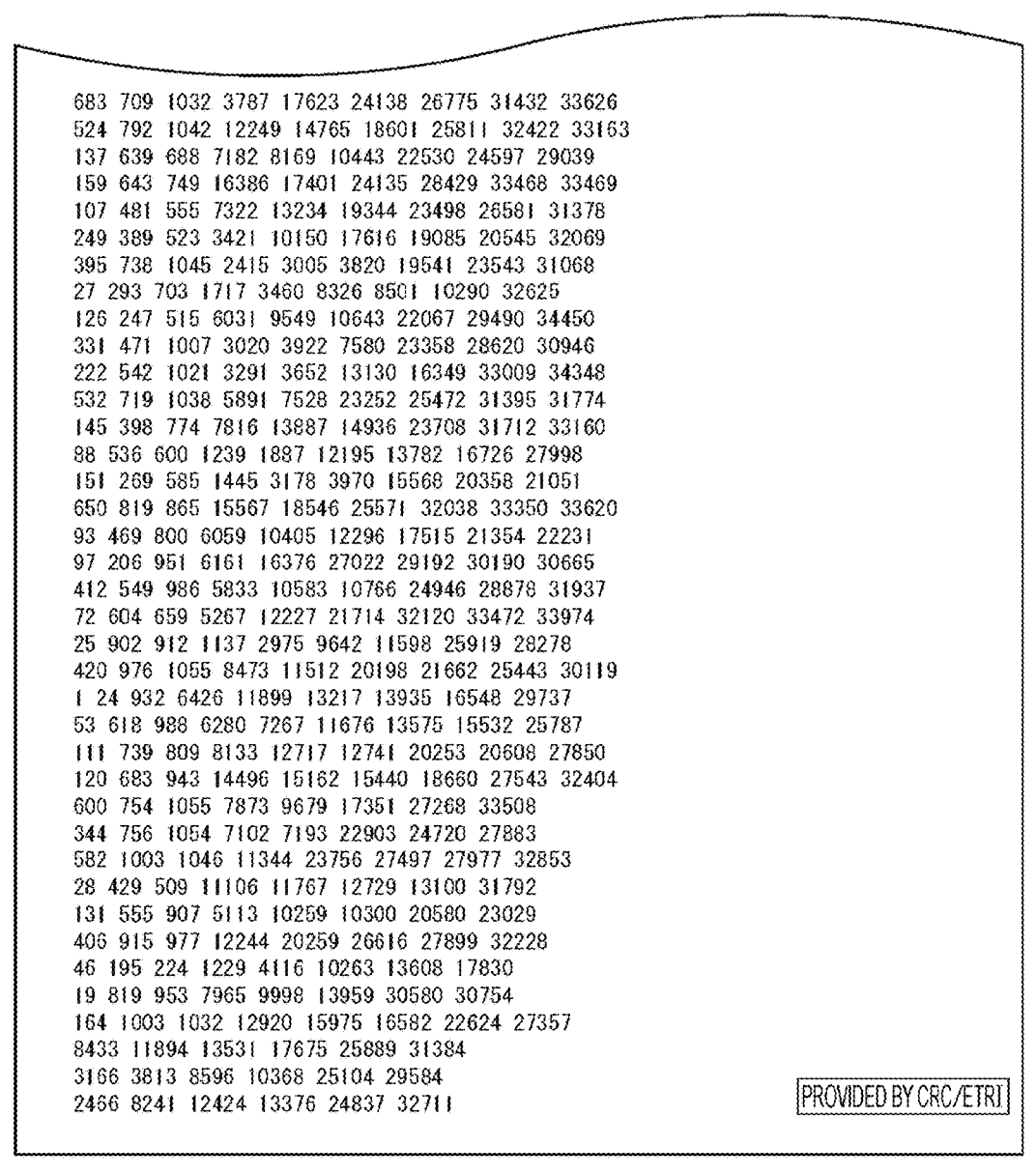

FIGS. 71 and 72 are diagrams illustrating an example of a parity check matrix initial value table based on the ETRI method with respect to a parity check matrix of a new LDPC code having a code length N of 64 kbits and a coding rate r of 7/15 (hereinafter, also referred to as an ETRI code with (64 k, 7/15)) which is suggested by CRC/ETRI.

FIG. 72 is a diagram subsequent to FIG. 71.

Among the LDPC codes, particularly, the Sony codes are high-performance LDPC codes.

Here, the high-performance LDPC code means an LDPC code which is obtained from an appropriate parity check matrix H.

The appropriate parity check matrix H is, for example, a parity check matrix that satisfies a predetermined condition for reducing a bit error rate (BER) (and a frame error rate (FER)) when an LDPC code obtained from the parity check matrix H is transmitted at low $E_s/N_0$ or $E_b/N_o$ (a signal-to-noise power ratio per bit).

For example, the appropriate parity check matrix H can be calculated by a simulation that measures the BER when the LDPC codes obtained from various parity check matrices satisfying a predetermined condition are transmitted at low $E_s/N_o$.

Examples of the predetermined condition to be satisfied by the appropriate parity check matrix H include a condition in which an analysis result obtained by a code performance analysis method that is called density evolution is excellent and a condition in which a loop of elements "1" is not present and which is called cycle 4.

Here, in the information matrix $H_A$, it has been known that the LDPC code decoding performance deteriorates when elements "1" are dense as in cycle 4. Therefore, a condition in which cycle 4 is not present is required as the predetermined condition to be satisfied by the appropriate parity check matrix H.

Here, the predetermined condition to be satisfied by the appropriate parity check matrix H can be arbitrarily determined from the viewpoint of, for example, improving the LDPC code decoding performance and facilitating (simplifying) the LDPC code decoding process.

Figure 73:
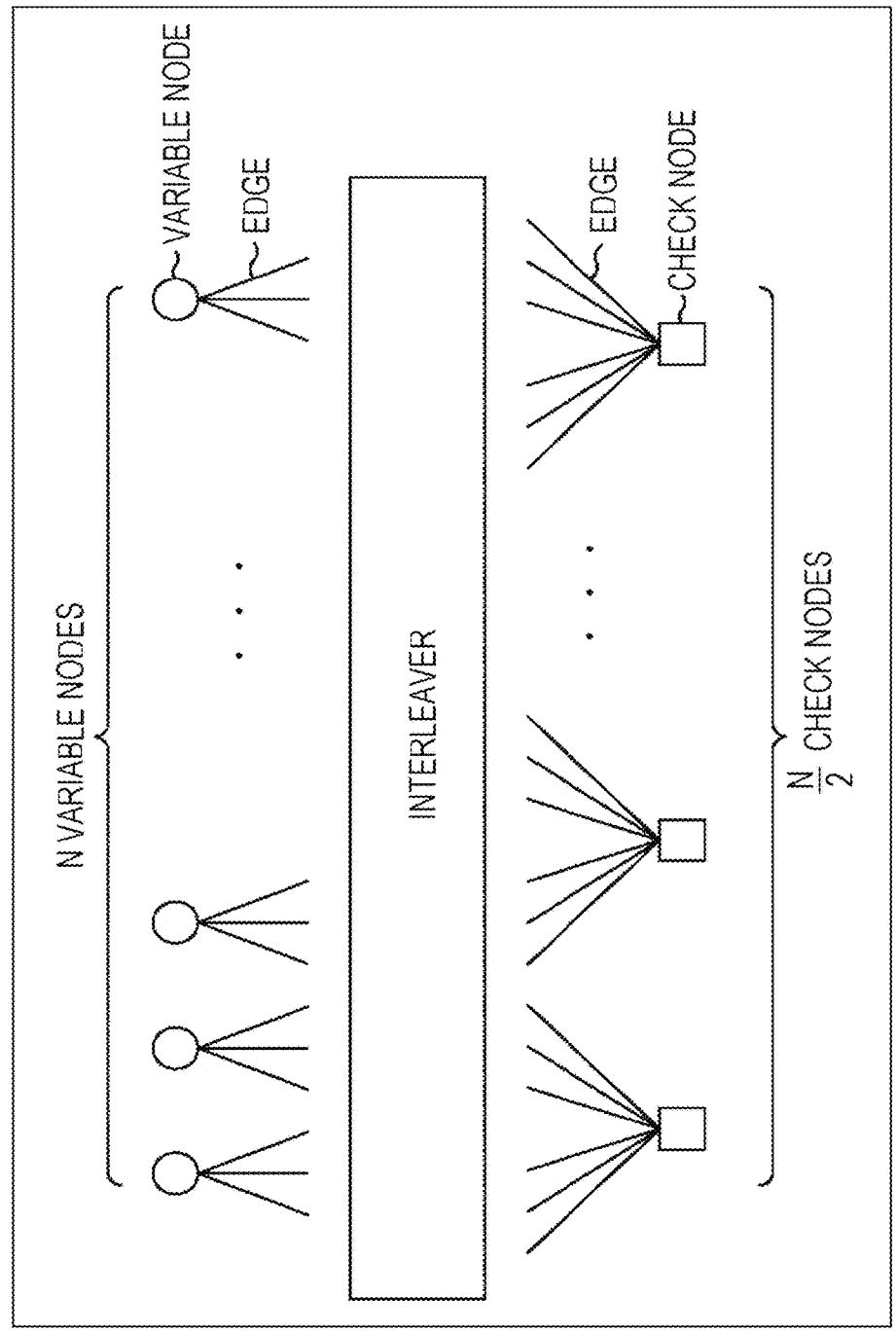
FIG. 73 is a diagram illustrating an example of a Tanner graph of an ensemble of a degree sequence having a column weight of 3 and a row weight of 6.
Figure 74:
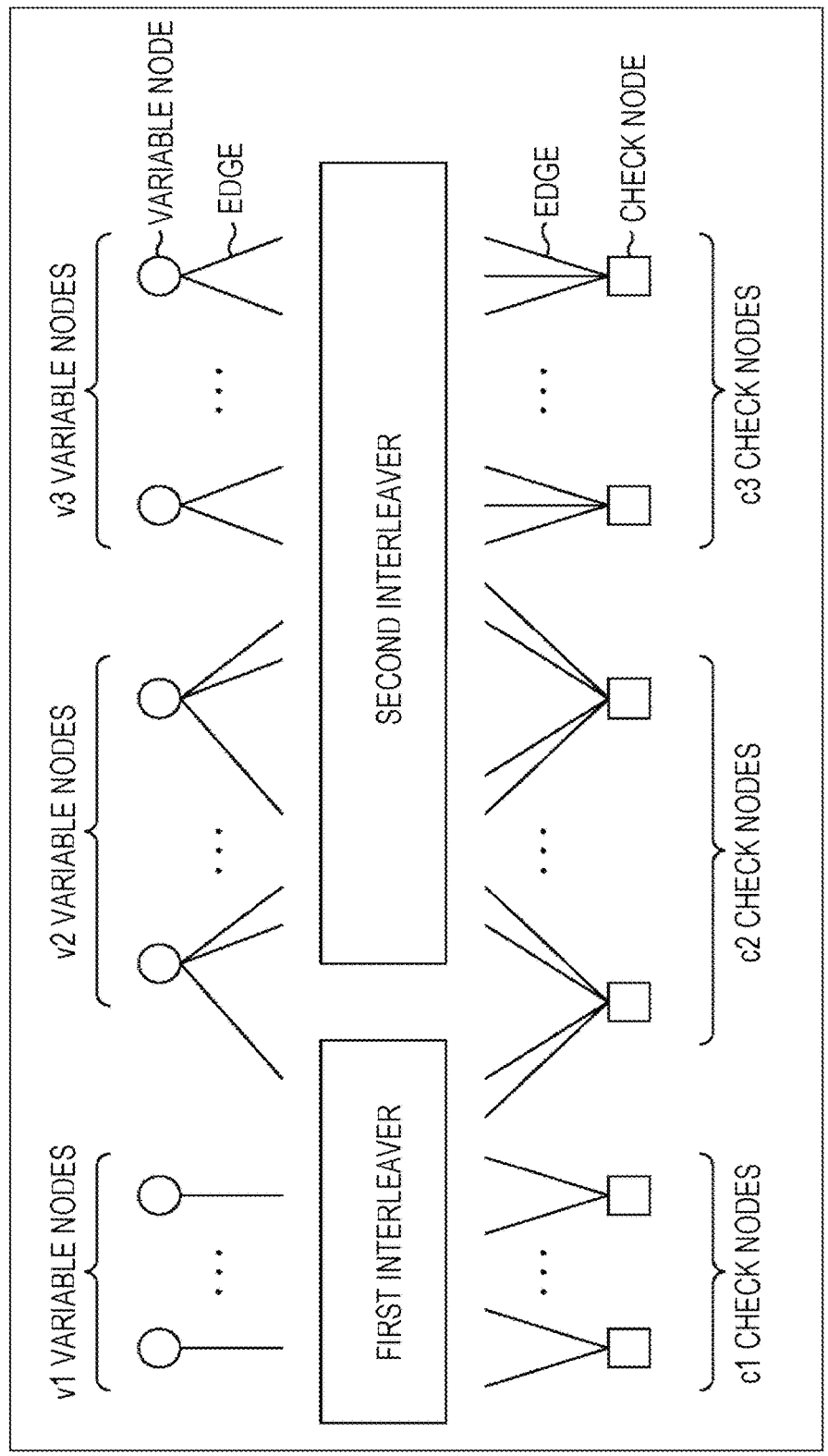
FIG. 74 is a diagram illustrating an example of a Tanner graph of a multi-edge-type ensemble.

FIGS. 73 and 74 are diagrams illustrating density evolution that can obtain the analysis result as the predetermined condition to be satisfied by the appropriate parity check matrix H.

The density evolution is a code analysis method that calculates the expected value of the error probability of the entire LDPC code (ensemble) with a code length N of ∞ which is characterized by a degree sequence, which will be described below.

For example, when a noise variance is gradually increased from 0 on the AWGN channel, the expected value of the error probability of a certain ensemble is 0 at the beginning.

However, when the noise variance is equal to or greater than a certain threshold value, the expected value is not 0.

According to the density evolution, the comparison of the threshold value of the noise variance (hereinafter, also referred to as a performance threshold value) at which the expected value of the error probability is not 0 makes it possible to determine whether the performance of the ensemble is high or low (the appropriateness of the parity check matrix)

For a specific LDPC code, when an ensemble to which the LDPC code belongs is determined and density evolution is performed for the ensemble, it is possible to roughly expect the performance of the LDPC code.

Therefore, when a high-performance ensemble is found, a high-performance LDPC can be found from the LDPC codes belonging to the ensemble.

Here, the above-mentioned degree sequence indicates the proportion of the variable nodes or the check nodes having the weight of each value to the code length N of the LDPC code.

For example, a regular (3, 6) LDPC code with a coding rate of 1/2 belongs to an ensemble characterized by a degree sequence in which the weight (column weight) of all of the variable nodes is 3 and the weight (row weight) of all of the check nodes is 6.

FIG. 73 illustrates a Tanner graph of the ensemble.

In the Tanner graph illustrated in FIG. 73, there are N variable nodes which are represented by a circle (symbol ○) in FIG. 73 and of which the number is equal to the code length N and there are N/2 check nodes which are represented by a rectangle (symbol □) and of which the number is equal to a value obtained by multiplying the code length N by a coding rate of 1/2.

Three edges, of which the number is equal to the column weight, are connected to each variable node. Therefore, a total of 3N edges are connected to N variable nodes.

In addition, six edges, of which the number is equal to the row weight, are connected to each check node. Therefore, a total of 3N edges are connected to N/2 check nodes.

In addition, there is one interleaver in the Tanner graph illustrated in FIG. 73.

The interleaver randomly rearranges 3N edges connected with N variable nodes and connects each of the rearranged edges to any one of 3N edges connected to N/2 check nodes.

There are (3N) ! (=(3N)×(3N−1)× . . . ×1) rearrangement patterns to rearrange 3N edges connected to N variable nodes in the interleaver. Therefore, an ensemble characterized by the degree sequence in which the weight of all of the variable nodes is 3 and the weight of all of the check nodes is 6 is a set of (3N) ! LDPC codes.

In a simulation for finding a high-performance LDPC code (appropriate parity check matrix), a multi-edge-type ensemble was used in density evolution.

In the multi-edge type, an interleaver though which the edges connected to the variable nodes and the edges connected to the check nodes pass is divided into a plurality of portions (multiple edges). Therefore, the ensemble is characterized more strictly.

FIG. 74 illustrates an example of a Tanner graph of the multi-edge-type ensemble.

There are two interleavers, that is, a first interleaver and a second interleaver, in the Tanner graph illustrated in the FIG. 74.

In the Tanner graph chart illustrated in the FIG. 74, there are v1 variable nodes each of which has one edge connected to the first interleaver and no edge connected to the second interleaver, v2 variable nodes each of which has one edge connected to the first interleaver and two edges connected to the second interleaver, and v3 variable nodes each of which has no edge connected to the first interleaver and two edges connected to the second interleaver.

In addition, in the Tanner graph chart illustrated in the FIG. 74, there are c1 check nodes each of which has two edges connected to the first interleaver and no edge connected to the second interleaver, c2 check nodes each of which has two edges connected to the first interleaver and two edges connected to the second interleaver, and c3 check nodes each of which has no edge connected to the first interleaver and three edges connected to the second interleaver.

For example, the density evolution and the mounting thereof are described in "On the Design of Low-Density Parity-Check Codes within 0.0045 dB of the Shannon Limit", S. Y. Chung, G. D. Forney, T. J. Richardson, R. Urbanke, IEEE Communications Leggers, VOL. 5, NO. 2, February 2001.

In a simulation for calculating (a parity check matrix initial value table of) a Sony code, by the multi-edge-type density evaluation is performed to find an ensemble in which a performance threshold value, which is $E_b/N_0$ (a signal-to-noise power ratio per bit) where BER is reduced (decreased), is equal to or less than a predetermined value and an LDPC code that reduce the BER when one or more quadrature modulation methods, such as QPSK, are used is selected as a high-performance LDPC code from LDPC codes belonging to the ensemble.

The parity check matrix initial value table of the Sony code is calculated by the above-mentioned simulation.

Therefore, the Sony code obtained from the parity check matrix initial value table makes it possible to ensure high communication quality in data transmission.

Figure 75:
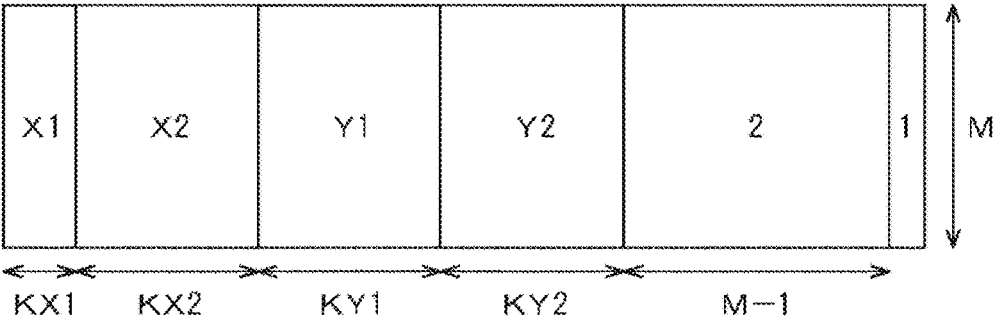
FIG. 75 is a diagram illustrating a parity check matrix.

FIG. 75 is a diagram illustrating a parity check matrix H calculated from the parity check matrix initial value table of Sony codes with (16 k, 8/15), (16 k, 10/15), and (16 k, 12/15) (hereinafter, also referred to as a "parity check matrix H of Sony codes with (16 k, 8/15), (16 k, 10/15), and (16 k, 12/15)").

Each of the minimum cycle lengths of the parity check matrix H of the Sony codes with (16 k, 8/15), (16 k, 10/15), and (16 k, 12/15) is greater than cycle 4 and cycle 4 is not present (a loop of elements "1" with a loop length of 4). Here, the minimum cycle length (girth) means the minimum value of the length of a loop (loop length) formed by elements "1" in the parity check matrix H.

In addition, the performance threshold value of the Sony code with (16 k, 8/15) is 0.805765. The performance threshold value of the Sony code with (16 k, 10/15) is 2.471011. The performance threshold value of the Sony code with (16 k, 12/15) is 4.269922.

In the parity check matrix H of the Sony codes with (16 k, 8/15), (16 k, 10/15), and (16 k, 12/15), the weight of KX1 columns from the first column is X1, the weight of the next KX2 columns is X2, the weight of the next KY1 columns is Y1, the weight of the next KY2 columns is Y2, the weight of the next M−1 columns is 2, and the weight of the final column is 1.

Here, KX1+KX2+KY1+KY2+M−1+1 is equal to the code length N (=16200 bits) of the Sony codes with (16 k, 8/15), (16 k, 10/15), and (16 k, 12/15).

The number of columns KX1, KX2, KY1, KY2, and M and the column weights X1, X2, Y1, and Y2 in the parity check matrix H of the Sony codes with (16 k, 8/15), (16 k, 10/15), and (16 k, 12/15) are set as illustrated in FIG. 75.

For the parity check matrix H of the Sony codes with (16 k, 8/15), (16 k, 10/15), and (16 k, 12/15), similarly to the parity check matrices described in FIGS. 12 and 13, a column that is closer to on the head side (left side) tends to have a greater column weight. Therefore, a code bit that is closer to the head of the Sony code tends to have higher tolerance to errors (to have a higher error tolerance).

According to the simulation performed by the inventors, a high BER/FER is obtained for the Sony codes with (16 k, 8/15), (16 k, 10/15), and (16 k, 12/15). Therefore, it is possible to ensure high communication quality in data transmission using the Sony codes with (16 k, 8/15), (16 k, 10/15), and (16 k, 12/15)

Figure 76:
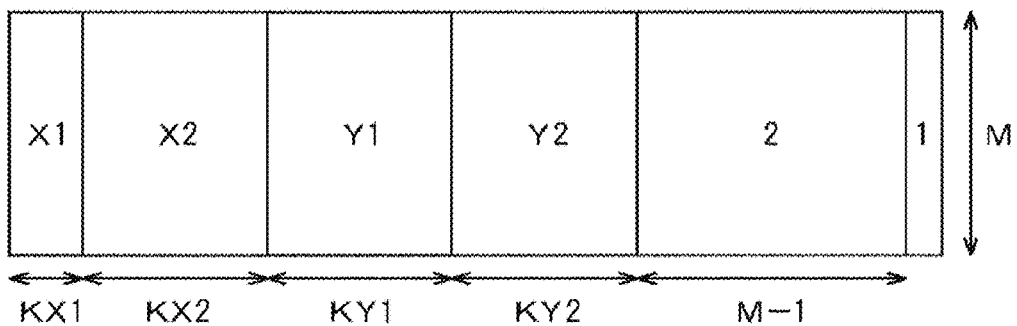
FIG. 76 is a diagram illustrating a parity check matrix.

FIG. 76 is a diagram illustrating of a parity check matrix H of Sony codes with (64 k, 7/15), (64 k, 9/15), (64 k, 11/15), and (64 k, 13/15)

Each of the minimum cycle lengths of the parity check matrix H of the Sony codes with (64 k, 7/15), (64 k, 9/15), (64 k, 11/15), and (64 k, 13/15) is greater than cycle 4. Therefore, cycle 4 is not present.

In addition, the performance threshold value of the Sony code with (64 k, 7/15) is-0.093751. The performance threshold value of the Sony code with (64 k, 9/15) is 1.658523. The performance threshold value of the Sony code with (64 k, 11/15) is 3.351930. The performance threshold value of the Sony code with (64 k, 13/15) is 5.301749.

In the parity check matrix H of the Sony codes with (64 k, 7/15), (64 k, 9/15), (64 k, 11/15), and (64 k, 13/15), the weight of KX1 columns from the first column is X1, the weight of the next KX2 columns is X2, the weight of the next KY1 columns is Y1, the weight of the next KY2 columns is Y2, the weight of the next M−1 columns is 2, and the weight of the final column is 1.

Here, KX1+KX2+KY1+KY2+M−1+1 is equal to the code length N (=64800 bits) of the Sony codes with (64 k, 7/15), (64 k, 9/15), (64 k, 11/15), and (64 k, 13/15).

The number of columns KX1, KX2, KY1, KY2, and M and the column weights X1, X2, Y1, and Y2 in the parity check matrix H of the Sony codes with (64 k, 7/15), (64 k, 9/15), (64 k, 11/15), and (64 k, 13/15) are set as illustrated in FIG. 76.

For the parity check matrix H of the Sony codes with (64 k, 7/15), (64 k, 9/15), (64 k, 11/15), and (64 k, 13/15), similarly to the parity check matrices described in FIGS. 12 and 13, a column that is closer to the head side (left side) tends to have a greater column weight. Therefore, a code bit that is closer to the head of the Sony code tends to have a higher error tolerance.

According to the simulation performed by the inventors, a high BER/FER was obtained for the Sony codes with (64 k, 7/15), (64 k, 9/15), (64 k, 11/15), and (64 k, 13/15). Therefore, it is possible to ensure high communication quality in data transmission using the Sony codes with (64 k, 7/15), (64 k, 9/15), (64 k, 11/15), and (64 k, 13/15).

FIG. 77 is a diagram illustrating a parity check matrix H of Samsung codes with (64 k, 6/15), (64 k, 8/15), and (64 k, 12/15).

In the parity check matrix H of the Samsung code with (64 k, 6/15), (64 k, 8/15), and (64 k, 12/15), the weight of KX1 columns from the first column is X1, the weight of the next KX2 columns is X2, the weight of the next KY1 columns is Y1, the weight of the next KY2 columns is Y2, the weight of the next M−1 columns is 2, and the weight of the final column is 1.

Here, KX1+KX2+KY1+KY2+M−1+1 is equal to the code length N (=64800 bits) of the Samsung codes with (64 k, 6/15), (64 k, 8/15), and (64 k, 12/15).

The number of columns KX1, KX2, KY1, KY2, and M and the column weights X1, X2, Y1, and Y2 in the parity check matrix H of the Samsung codes with (64 k, 6/15), (64 k, 8/15), and (64 k, 12/15) are set as illustrated in FIG. 77.

FIG. 78 is a diagram illustrating a parity check matrix H of LGE codes with (16 k, 6/15), (16 k, 7/15), (16 k, 9/15), (16 k, 11/15), and (16 k, 13/15).

In the parity check matrix H of the LGE codes with (16 k, 6/15), (16 k, 7/15), (16 k, 9/15), (16 k, 11/15), and (16 k, 13/15), the weight of KX1 columns from the first column is X1, the weight of the next KX2 columns is X2, the weight of the next KY1 columns is Y1, the weight of the next KY2 columns is Y2, the weight of the next M−1 columns is 2, and the weight of the final column is 1.

Here, KX1+KX2+KY1+KY2+M−1+1 is equal to the code length N (=16200 bits) of the LGE codes with (16 k, 6/15), (16 k, 7/15), (16 k, 9/15), (16 k, 11/15), and (16 k, 13/15).

The number of columns KX1, KX2, KY1, KY2, and M and the column weights X1, X2, Y1, and Y2 in the parity check matrix H of the LGE codes with (16 k, 6/15), (16 k, 7/15), (16 k, 9/15), (16 k, 11/15), and (16 k, 13/15) are set as illustrated in FIG. 78.

Figure 79:
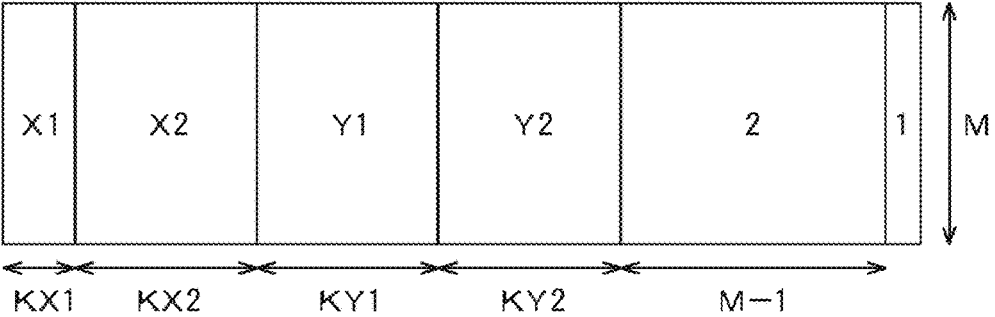
FIG. 79 is a diagram illustrating a parity check matrix.

FIG. 79 is a diagram illustrating a parity check matrix H of an LGE code with (64 k, 10/15).

In the parity check matrix H of the LGE code with (64 k, 10/15), the weight of KX1 columns from the first column is X1, the weight of the next KX2 columns is X2, the weight of the next KY1 columns is Y1, the weight of the next KY2 columns is Y2, the weight of the next M−1 columns is 2, and the weight of the final column is 1.

Here, KX1+KX2+KY1+KY2+M−1+1 is equal to the code length N (=64800 bits) of the LGE code with (64 k, 10/15)

The number of columns KX1, KX2, KY1, KY2, and M and the column weights X1, X2, Y1, and Y2 in the parity check matrix H of the LGE code with (64 k, 10/15) are set as illustrated in FIG. 79.

Figure 80:
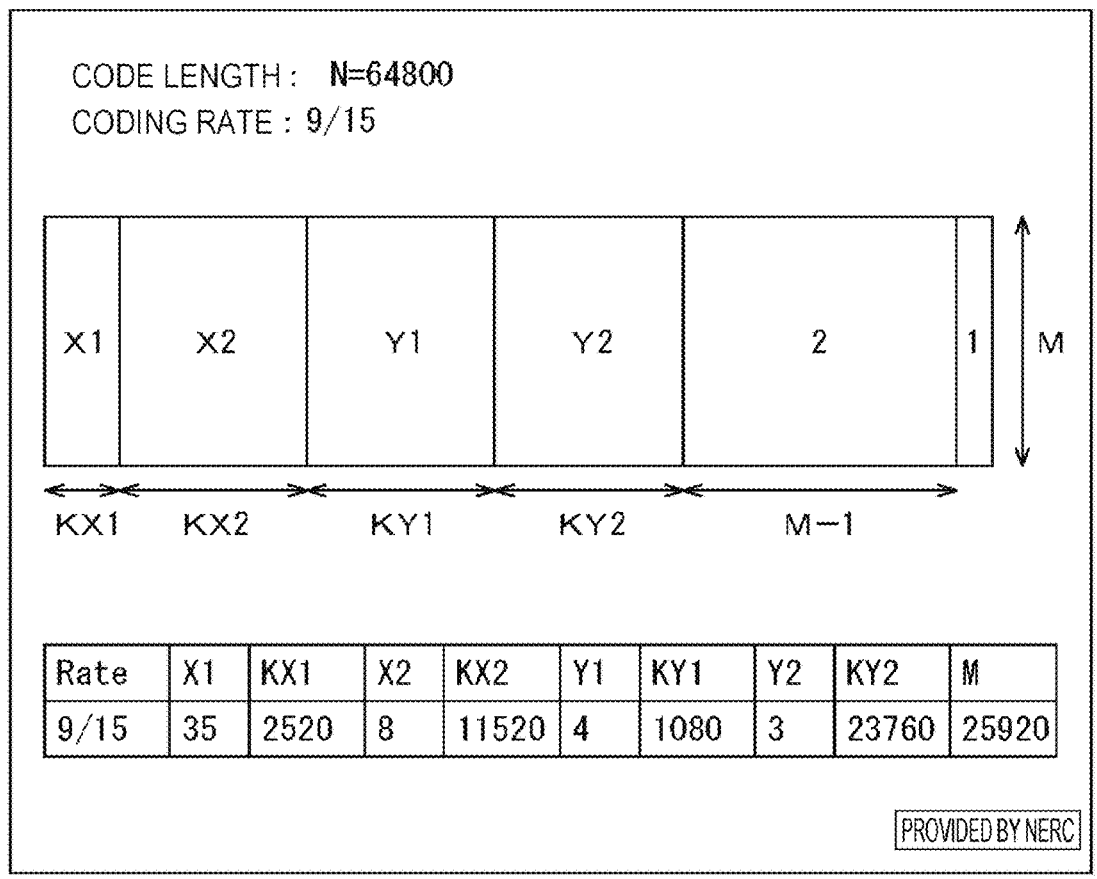
FIG. 80 is a diagram illustrating a parity check matrix.

FIG. 80 is a diagram illustrating a parity check matrix H of a NERC code with (64 k, 9/15).

In the parity check matrix H of the NERC code with (64 k, 9/15), the weight of KX1 columns from the first column is X1, the weight of the next KX2 columns is X2, the weight of the next KY1 columns is Y1, the weight of the next KY2 columns is Y2, the weight of the next M−1 columns is 2, and the weight of the final column is 1.

Here, KX1+KX2+KY1+KY2+M−1+1 is equal to the code length N (=64800 bits) of the NERC code with (64 k, 9/15)

The number of columns KX1, KX2, KY1, KY2, and M and the column weights X1, X2, Y1, and Y2 in the parity check matrix H of the NERC code with (64 k, 9/15) are set as illustrated in FIG. 80.

Figure 81:
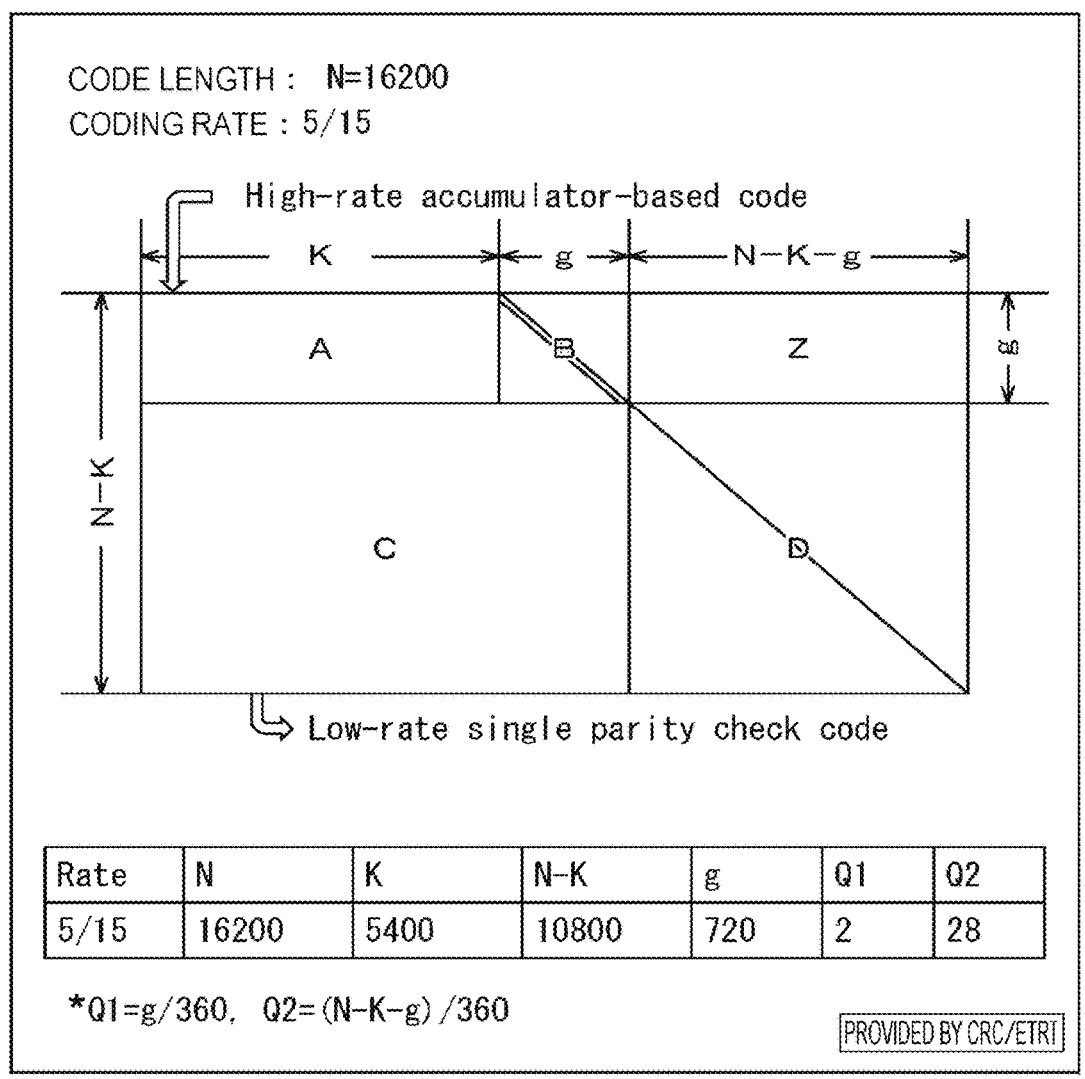
FIG. 81 is a diagram illustrating a parity check matrix.

FIG. 81 is a diagram illustrating a parity check matrix H of an ETRI code with (16 k, 5/15).

For the parity check matrix H of the ETRI code with (16 k, 5/15), a parameter g=$M_1$ is 720.

Since the ETRI code with (16 k, 5/15) has a code length N of 16200 and a coding rate r of 5/15, an information length K=N×r is 16200×5/15=5400 and a parity length M=N−K is 16200−5400=10800.

In addition, a parameter $M_2$=M−$M_1$=N−K−g is 10800−720=10080.

Therefore, a parameter $Q_1$=$M_1$/P is 720/360=2 and a parameter $Q_2$=$M_2$/P is 10080/360=28.

Figure 82:
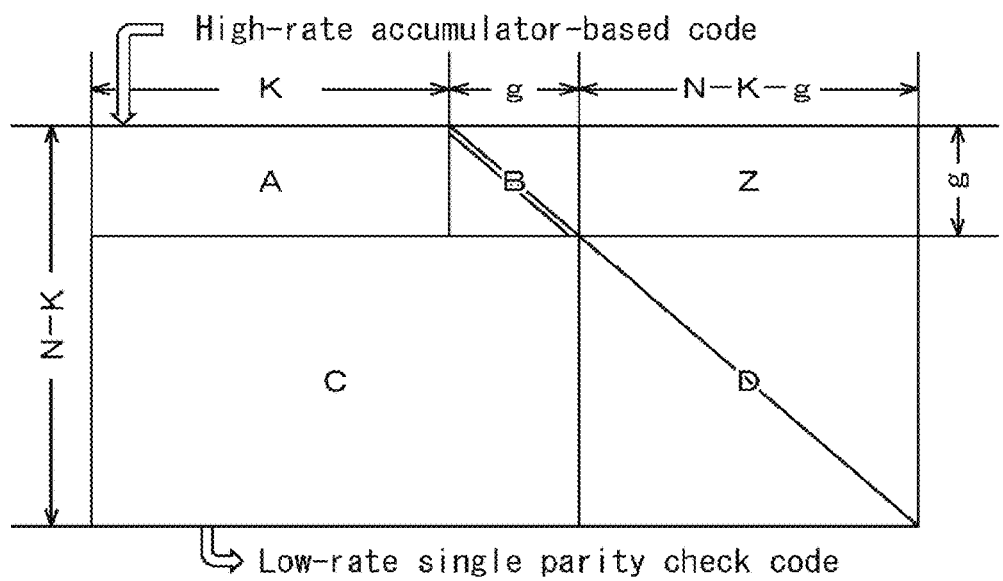
FIG. 82 is a diagram illustrating a parity check matrix.

FIG. 82 is a diagram illustrating a parity check matrix H of ETRI codes with (64 k, 5/15), (64 k, 6/15), and (64 k, 7/15)

For the parity check matrix H of the ETRI codes with (64 k, 5/15), (64 k, 6/15), and (64 k, 7/15), the parameters g=$M_1$, $M_2$, $Q_1$, and $Q_2$ are as illustrated in FIG. 82.

<Constellation>

FIGS. 83 to 92 are diagrams illustrating an example of the type of constellation used in the transmission system illustrated in FIG. 7.

The transmission system illustrated in FIG. 7 can use constellations which are scheduled to be used in, for example, ATSC3.0.

In ATSC3.0, for MODCOD which is a combination of a modulation method and an LDPC code, constellations to be used in MODCOD are set.

Here, in ATSC3 0.0, five types of modulation methods, that is, QPSK, 16QAM, 64QAM, 256QAM, and 1024QAM (1kQAM) are scheduled to be used.

In addition, in ATSC3.0, for two types of code lengths N of 16 k bits and 64 k bits, LDPC codes with nine types of coding rates r of 5/15, 6/15, 7/15, 8/15, 9/15, 10/15, 11/15, 12, 15, and 13/15, that is, 18 (=9×2) types of LDPC codes, are scheduled to be used.

In ATSC3.0, 18 types of LDPC codes are classified into nine types according to the coding rate r (not according to the code length N) and 45 (=9×5) combinations of nine types of LDPC codes (LDPC codes with coding rates r or 5/15, 6/15, 7/15, 8/15, 9/15, 10/15, 11/15, 12, 15, and 13/15) and five types of modulation methods are scheduled to be used as MODCOD.

In ATSC 3.0, one or more constellations are scheduled to be used for one MODCOD.

Examples of the constellation include a uniform constellation (UC) in which the arrangement of signal points is uniform and a non-uniform constellation (NUC) in which the arrangement of signal points is not uniform.

Examples of the NUC include a constellation which is called a 1-dimensional $M^2$-QAM non-uniform constellation (1D NUC) and a constellation which is called a 2-dimensional QQAM non-uniform constellation (2D NUC).

In general, the 1D NUC has a higher BER than the UC, and the 2D NUC has a higher BER than the 1D NUC.

The UC is used as the constellation of QPSK. In addition, for example, the 2D NUC is used as the constellations of 16QAM, 64QAM, and 256QAM. For example, the 1D NUC and the 2D NUC are used as the constellation of 1024QAM.

Hereinafter, it is assumed that an NUC used in MODCOD in which the modulation method maps an m-bit symbol to any one of $2^m$ signal points and the coding rate of the LDPC code is r is referred to as NUC_$2^m$_r (here, m=2, 4, 6, 8, and 10).

For example, "NUC_16_6/15" indicates an NUC constellation used in MODCOD in which the modulation method is 16QAM and the coding rate r of the LDPC code is 6/15.

In ATSC3 0.0, when the modulation method is QPSK, the same constellation is scheduled to be used for nine types of coding rates r of LDPC codes.

In ATSC3.0, when the modulation method is 16QAM, 64QAM, or 256QAM, different 2D NUC constellations are scheduled to be used for nine types of coding rates r of LDPC codes.

In ATSC3.0, when the modulation method is 1024QAM, different 1D NUC and 2D NUC constellations are scheduled to be used for nine types of coding rates r of LDPC codes.

Therefore, in ATSC3.0, one type of constellation is scheduled to be prepared for QPSK, nine types of 2D NUCs are scheduled to be prepared for each of 16QAM, 64QAM, and 256QAM, and a total of 18 types of constellations, that is, nine types of 1D NUCs and nine types of 2D NUCs, are scheduled to be prepared for 1024QAM.

Figure 83:
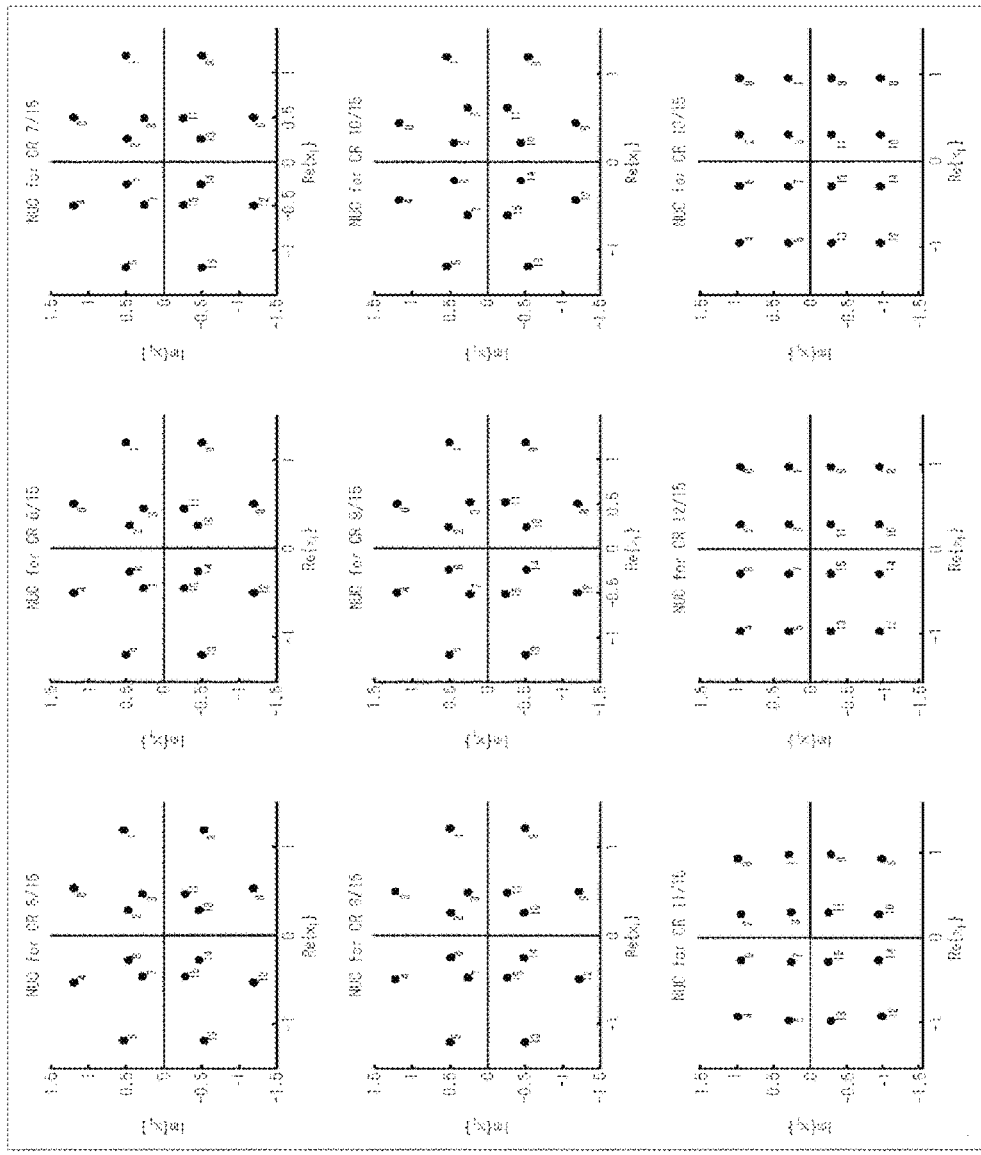
FIG. 83 is a diagram illustrating an example of constellations when a modulation method is 16QAM.

FIG. 83 is a diagram illustrating an example of constellations for nine types of coding rates r (=5/15, 6/15, 7/15, 8/15, 9/15, 10/15, 11/15, 12, 15, and 13/15) of LDPC codes when the modulation method is 16QAM.

Figure 84:
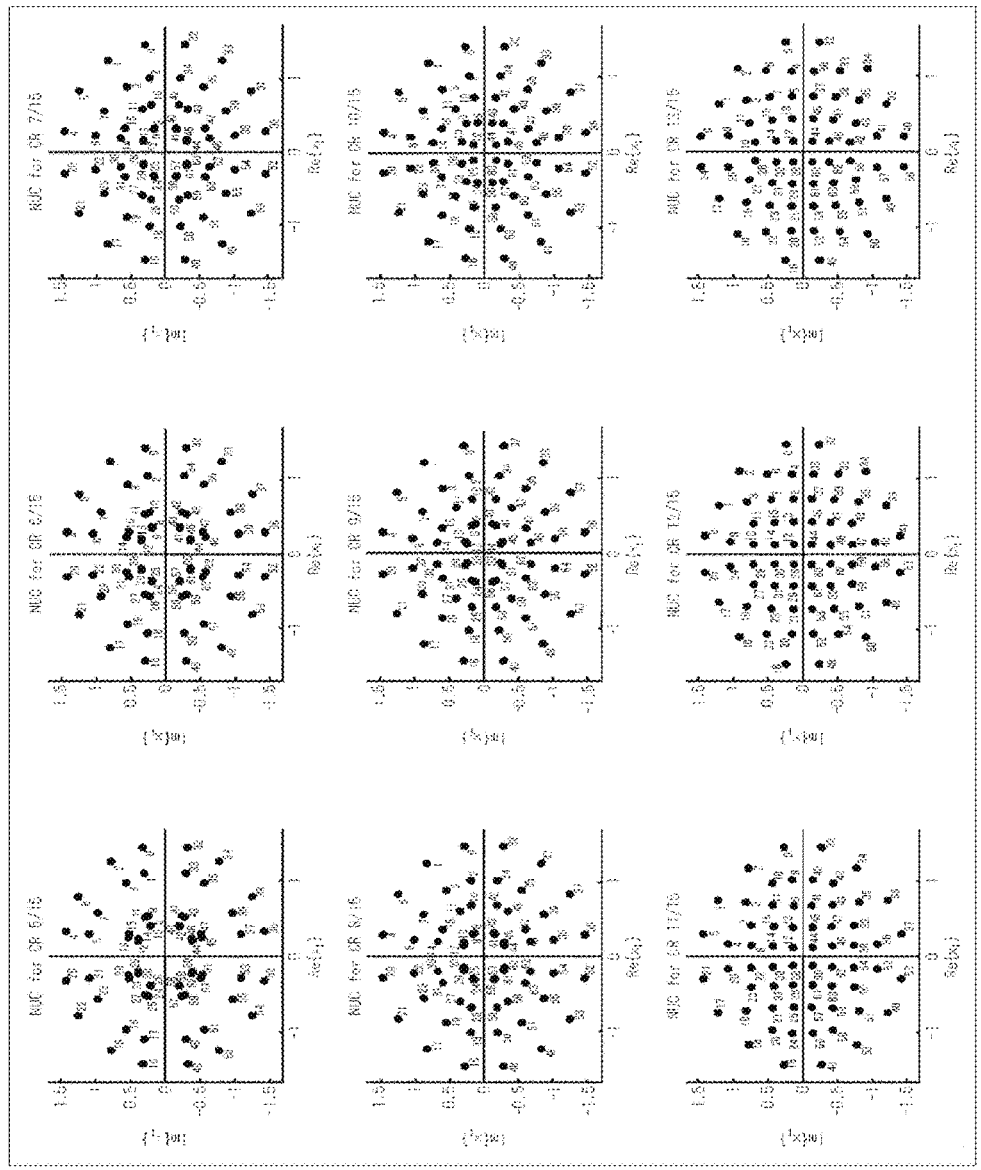
FIG. 84 is a diagram illustrating an example of constellations when the modulation method is 64QAM.

FIG. 84 is a diagram illustrating an example of constellations for nine types of coding rates r (=5/15, 6/15, 7/15, 8/15, 9/15, 10/15, 11/15, 12, 15, and 13/15) of LDPC codes when the modulation method is 64QAM.

Figure 85:
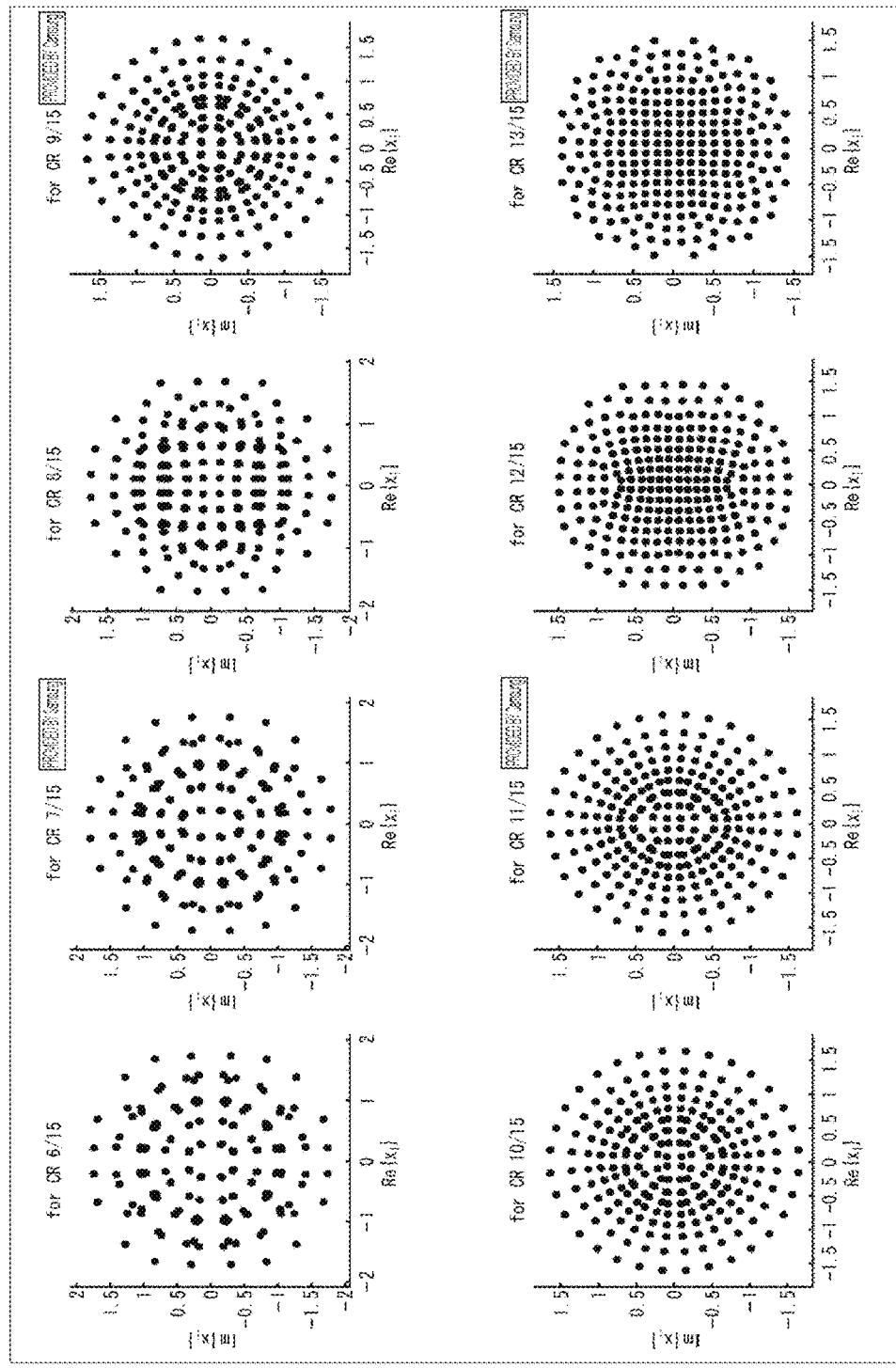
FIG. 85 is a diagram illustrating an example of constellations when the modulation method is 256QAM.

FIG. 85 is a diagram illustrating an example of constellations for eight types of coding rates r (=6/15, 7/15, 8/15, 9/15, 10/15, 11/15, 12, 15, and 13/15) of LDPC codes when the modulation method is 256QAM.

Figure 86:
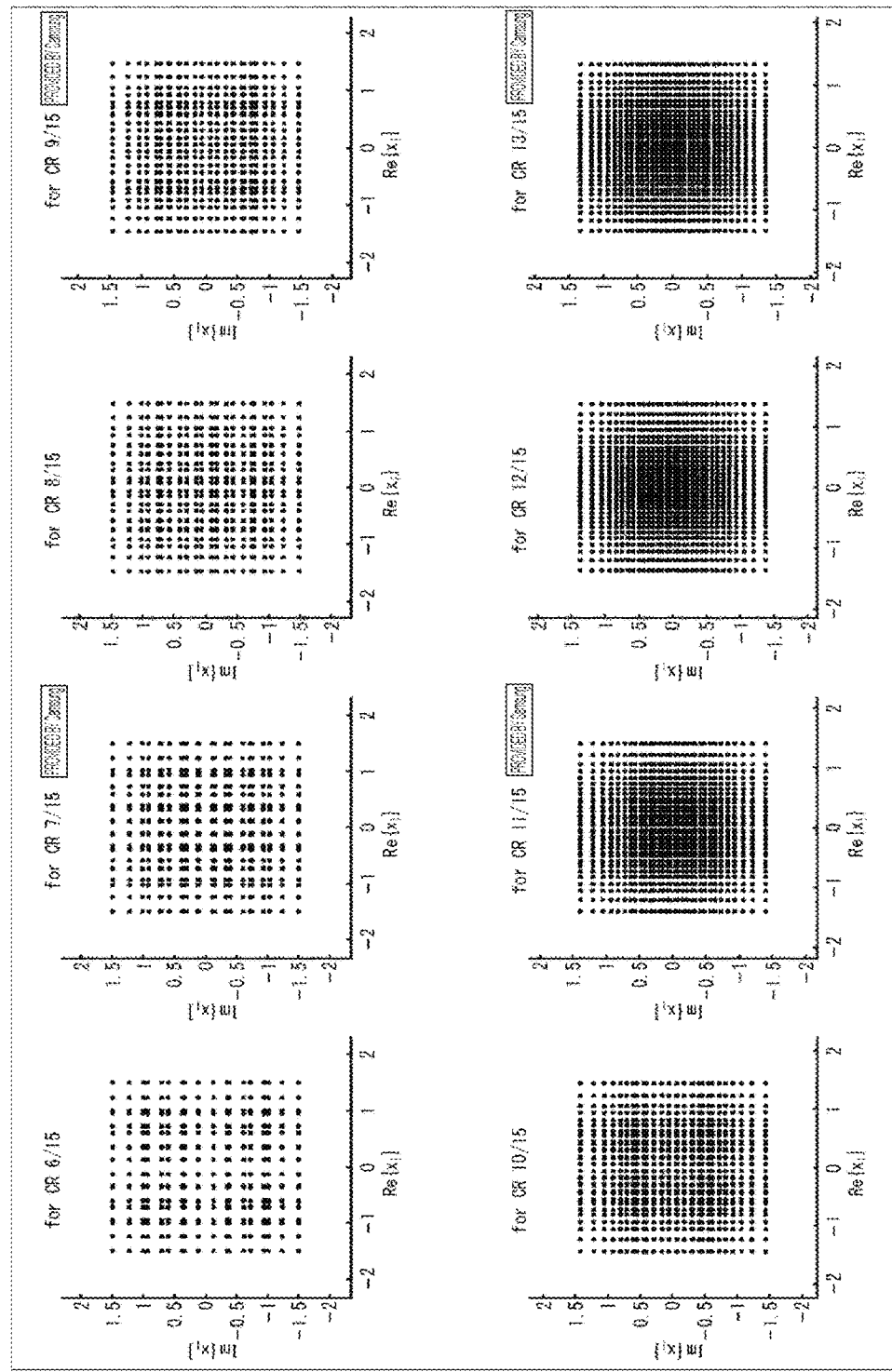
FIG. 86 is a diagram illustrating an example of constellations when the modulation method is 1024QAM.

FIG. 86 is a diagram illustrating an example of 1D NUC constellations for eight types of coding rates r (=6/15, 7/15, 8/15, 9/15, 10/15, 11/15, 12, 15, and 13/15) of LDPC codes when the modulation method is 1024QAM.

In FIGS. 83 to 86, the horizontal axis and the vertical axis indicate an I-axis and a Q-axis, respectively, and Re{$x_1$} and Im{$x_1$} indicate a real part and an imaginary part of a signal point $x_1$ as the coordinates of the signal point $x_1$.

In FIGS. 83 to 86, numerical values which are described after "for CR" indicate the coding rates r of LDPC codes.

FIG. 87 is a diagram illustrating an example of the coordinates of a signal point of a common UC that is used for nine types of coding rates r (=5/15, 6/15, 7/15, 8/15, 9/15, 10/15, 11/15, 12, 15, and 13/15) of LDPC codes when the modulation method is QPSK.

In FIG. 87, "Input cell word y" indicates a 2-bit symbol that is mapped to the UC of QPSK and "Constellation point $z_q$" indicates the coordinates of a signal point $z_q$. In addition, the index q of the signal point $z_q$ indicates the discrete time of the symbol (a time interval between a symbol and the next symbol).

In FIG. 87, the coordinates of the signal point $z_q$ is represented in the form of a complex number and i indicates an imaginary unit ($\sqrt{(-1)}$).

FIG. 88 is a diagram illustrating an example of the coordinates of a signal point of a 2D NUC that is used for nine types of coding rates r (=5/15, 6/15, 7/15, 8/15, 9/15, 10/15, 11/15, 12, 15, and 13/15) of LDPC codes when the modulation method is 16QAM.

FIG. 89 is a diagram illustrating an example of the coordinates of a signal point of a 2D NUC that is used for nine types of coding rates r (=5/15, 6/15, 7/15, 8/15, 9/15, 10/15, 11/15, 12, 15, and 13/15) of LDPC codes when the modulation method is 64QAM.

FIG. 90 is a diagram illustrating an example of the coordinates of a signal point of a 2D NUC that is used for eight types of coding rates r (=6/15, 7/15, 8/15, 9/15, 10/15, 11/15, 12, 15, and 13/15) of LDPC codes when the modulation method is 256QAM.

In FIGS. 88 to 90, NUC_$2^m$_r indicates the coordinates of a signal point of the 2D NUC when the modulation method is $2^m$QAM and the coding rate of the LDPC code is r.

In FIGS. 88 to 90, similarly to FIG. 87, the coordinates of a signal point $z_q$ is represented in the form of a complex number and i indicates an imaginary unit.

In FIGS. 88 to 90, w#k indicates the coordinates of a signal point in a first quadrant of a constellation.

In the 2D NUC, a signal point in a second quadrant of a constellation is arranged at the position that is obtained by symmetrically moving a signal point in the first quadrant with respect to the Q-axis and a signal point in a third quadrant of the constellation is arranged at the position that is obtained by symmetrically moving a signal point in the first quadrant with respect to the origin. In addition, a signal point in a fourth quadrant of the constellation is arranged at the position that is obtained by symmetrically moving a signal point in the first quadrant with respect to the I-axis.

Here, when the modulation method is $2^m$QAM, one m-bit symbol is mapped to a signal point corresponding to the symbol.

The m-bit symbol is represented by, for example, an integer of 0 to $2^m-1$. However, if b is $2^m/4$, symbol y(0), y(1), . . . , y($2^m-1$) which are represented by an integer of 0 to $2^m-1$ can be classified into four groups, that is, a group of symbols y(0) to y(b−1), a group of symbols y(b) to y(2b−1), a group of symbols y(2b) to y(3b−1), and a group of symbols y(3b) to y(4b−1).

In FIGS. 88 to 90, a suffix k of w#k is an integer in the range of 0 to b−1 and w#k indicates the coordinates of a signal point corresponding to a symbol y(k) in the range of symbols y(0) to y(b−1).

The coordinates of a signal point corresponding to a symbol y(k+b) in the range of symbols y(b) to y(2b−1) are represented by −conj (w#k) and the coordinates of a signal point corresponding to a symbol y(k+2b) in the range of symbols y(2b) to y(3b−1) are represented by conj (w#k). In addition, the coordinates of a signal point corresponding to a symbol y(k+3b) in the range of symbols y(3b) to y(4b−1) are represented by −w#k.

Here, conj (w#k) indicates the complex conjugate of w#k.

For example, when the modulation method is 16QAM, "m" is 4 and "b" is 4 (=$2^4$/4). That is, 4-bit symbols y(0), y(1), . . . , y(15) are classified into four groups of symbols y(0) to y(3), symbols y(4) to y(7), symbols y(8) to y(11), and symbols y(12) to y(15)

Among the symbols y(0) to y(15), for example, the symbol y(12) is a symbol y(k+3b)=y(0+3×4) in the range of the symbols y(3b) to y(4b−1) (where k is 0). Therefore, the coordinates of a signal point corresponding to the symbol y(12) are −w#k=−w0.

As can be seen from FIG. 88, when the modulation method is 16QAM and the coding rate r is 9/15 (NUC_16_9/15), w0 is 0.4967+1.1932i. Therefore, when the coding rate r of an LDPC code is, for example, 9/15, the coordinates −w0 of a signal point corresponding to the symbol y(12) are −(0.4967+1.1932i).

FIG. 91 is a diagram illustrating an example of the coordinates of a signal point of a 1D NUC that is used for eight types of coding rates r (=6/15, 7/15, 8/15, 9/15, 10/15, 11/15, 12, 15, and 13/15) of LDPC codes when the modulation method is 1024QAM.

In FIG. 91, the column of NUC_1 k_r indicates the value of u#k indicating the coordinates of a signal point of the 1D NUC that is used when the modulation method is 1024QAM and the coding rate of an LDPC code is r.

In addition, u#k indicates a real part $\text{Re}(z_q)$ and an imaginary part $\text{Im}(z_q)$ of a complex number as the coordinates of a signal point $z_q$ of the 1D NUC.

Figure 92:
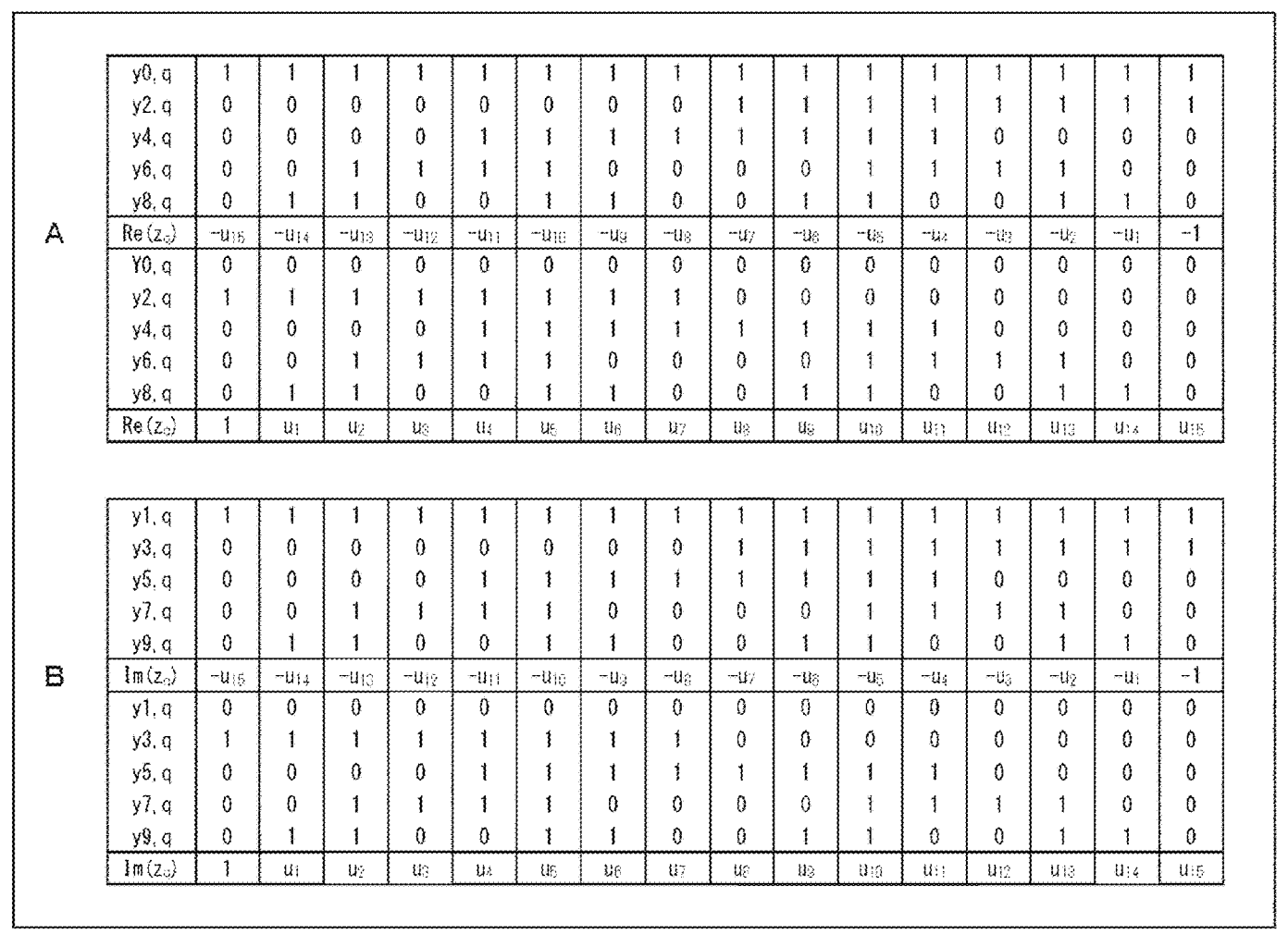

FIG. 92 is a diagram illustrating the relationship between a symbol y and u#k indicating the real part $\text{Re}(z_q)$ and the imaginary part $\text{Im}(z_q)$ of a complex number as the coordinates of a signal point $z_q$ of the 1D NUC corresponding to the symbol y.

It is assumed that a 10-bit symbol y of 1024QAM is represented by $y_{0,q}$, $y_{1,q}$, $y_{2,q}$, $y_{3,q}$, $y_{4,q}$, $y_{5,q}$, $y_{6,q}$, $y_{7,q}$, $y_{8,q}$, and $y_{9,q}$ from the first bit (most significant bit).

A of FIG. 92 illustrates a correspondence relationship between five odd-numbered bits $y_{0,q}$, $y_{2,q}$, $y_{4,q}$, $y_{6,q}$, $y_{8,q}$ of the symbol y and u#k indicating the rear part $\text{Re}(z_q)$ of (the coordinates of) the signal point $z_q$ corresponding to the symbol y.

B of FIG. 92 illustrates a correspondence relationship between five even-numbered bits $y_{1,q}$, $y_{3,q}$, $y_{5,q}$, $y_{7,q}$, $y_{9,q}$ of the symbol y and u#k indicating the imaginary part $\text{Im}(z_q)$ of (the coordinates of) the signal point $z_q$ corresponding to the symbol y.

When a 10-bit symbol y=($y_{0,q}$, $y_{1,q}$, $y_{2,q}$, $y_{3,q}$, $y_{4,q}$, $y_{5,q}$, $y_{6,q}$, $y_{7,q}$, $y_{8,q}$, $y_{9,q}$) of 1024QAM is (0, 0, 1, 0, 0, 1, 1, 1, 0, 0), five odd-numbered bits ($y_{0,q}$, $y_{2,q}$, $y_{4,q}$, $y_{6,q}$, $y_{8,q}$) are (0, 1, 0, 1, 0) and five even-numbered bits ($y_{1,q}$, $y_{3,q}$, $y_{5,q}$, $y_{7,q}$, $y_{9,q}$) are (0, 0, 1, 1, 0).

In A of FIG. 92, five odd-numbered bits (0, 1, 0, 1, 0) are associated with u3. Therefore, the rear part $\text{Re}(z_q)$ of a signal point $z_q$ corresponding to a symbol y=(0, 0, 1, 0, 0, 1, 1, 1, 0, 0) is u3.

In B of FIG. 92, five even-numbered bits (0, 0, 1, 1, 0) are associated with u11. Therefore, the imaginary part $\text{Im}(z_q)$ of the signal point $z_q$ corresponding to the symbol y=(0, 0, 1, 0, 0, 1, 1, 1, 0, 0) is u11.

In contrast, as illustrated in FIG. 91, for 1D NUC (NUC_1 k_7/15) that is used when the modulation method is 1024QAM and the coding rate r of an LDPC code is 7/15, when the coding rate r of an LDPC code is, for example, 7/15, u3 is 1.04 and u11 is 6.28.

Therefore, the rear part $\text{Re}(z_q)$ of the signal point $z_q$ corresponding to the symbol y=(0, 0, 1, 0, 0, 1, 1, 1, 0, 0) is u3=1.04 and the imaginary part $\text{Im}(z_q)$ thereof is u11=6.28. As a result, the coordinates of the signal point $z_q$ corresponding to the symbol y=(0, 0, 1, 0, 0, 1, 1, 1, 0, 0) are represented by 1.04+6.28i.

Signal points of the 1D NUC are arranged in a lattice shape on a straight line that is parallel to the I-axis or on a straight line that is parallel to the Q-axis. The interval between the signal points is not uniform. In addition, in the transmission of (data mapped to) signal points, the average power of the signal points on a constellation is normalized. When the mean square value of the absolute values of (the coordinates of) all of the signal points of the constellation is represented by $P_{ave}$, the normalization is performed by multiplying each signal point $z_q$ on the constellation by the reciprocal $1/(\sqrt{P_{ave}})$ of the square root $\sqrt{P_{ave}}$ of the mean square value $P_{ave}$.

The constellations described in FIGS. 83 to 92 show that a high error rate is obtained.

<Block Interleaver 25>

Figure 93:
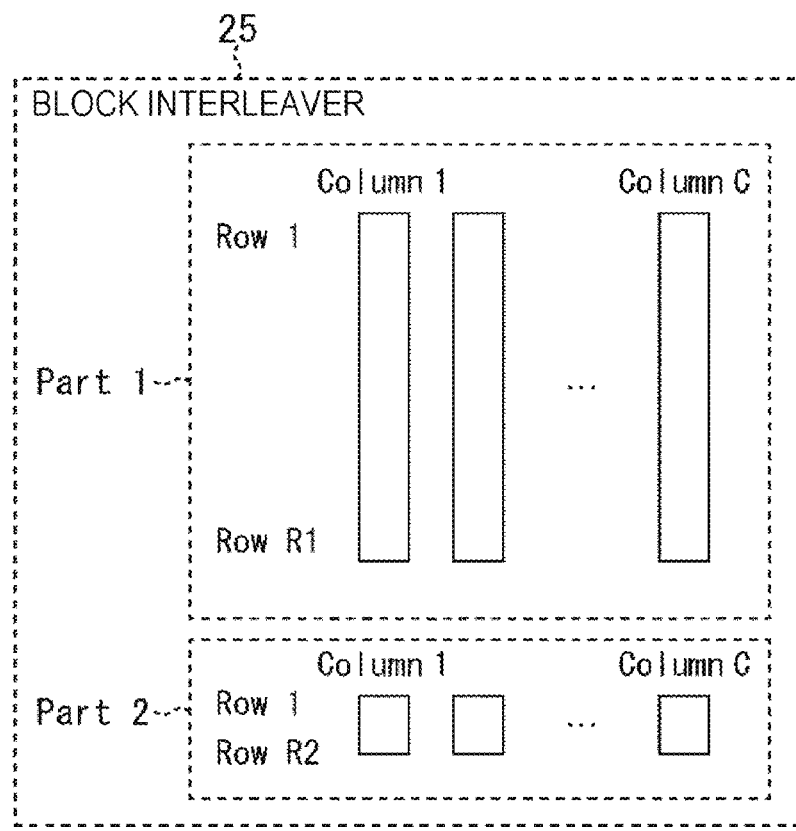
FIG. 93 is a block diagram illustrating an example of the structure of a block interleaver 25.

FIG. 93 is a block diagram illustrating an example of the structure of the block interleaver 25 illustrated in FIG. 9.

The block interleaver 25 has a storage region which is called part 1 and a storage region which is called part 2.

Each of parts 1 and 2 includes C columns which are arranged in the row direction and of which the number is equal to the number of bits m of a symbol. Each of the columns functions as a storage region which stores one bit in the row (horizontal) direction and stores a predetermined number of bits in the column (vertical) direction.

When the number of bits which are stored in a column of part 1 in the column direction (hereinafter, also referred to as a part column length) is represented by R1 and the part column length of a column of part 2 is represented by R2, (R1 +R2)×C is equal to the code length N (64800 bits or 16200 bits in this embodiment) of an LDPC code to be subjected to block interleaving.

In addition, the part column length R1 is equal to a multiple of 360 bits which is the unit size P and the part column length R2 is equal to the remainder obtained when the sum R1+R2 (hereinafter, also referred to as a column length) of the part column length R1 of part 1 and the part column length R2 of part 2 is divided by 360 bits which is the unit size P.

Here, the column length R1+R2 is equal to a value obtained by dividing the code length N of the LDPC code to be subjected to block interleaving by the number of bits m of a symbol.

For example, when 16QAM is used as the modulation method for an LDPC code having a code length N of 16200 bits, the column length R1+R2 is 4050 (=16200/4) since the number of bits m of a symbol is 4 bits.

In addition, when the column length R1+R2=4050 is divided by 360 bits which is the unit size P, the remainder is 90. Therefore, the part column length R2 of part 2 is 90 bits.

Therefore, the part column length R1 of part 1 is R1+R2−R2=4050−90=3960 bits.

FIG. 94 is a diagram illustrating the number of columns C of parts 1 and 2 and the part column lengths (the number of rows) R1 and R2 with respect to combinations of the code lengths N and the modulation methods.

FIG. 94 illustrates the number of columns C of parts 1 and 2 and the part column lengths R1 and R2 with respect to combinations of the LDPC codes having code lengths N of 16200 bits and 64800 bits and the modulation methods QPSK, 16QAM, 64QAM, 256QAM, and 1024QAM.

Figure 95:
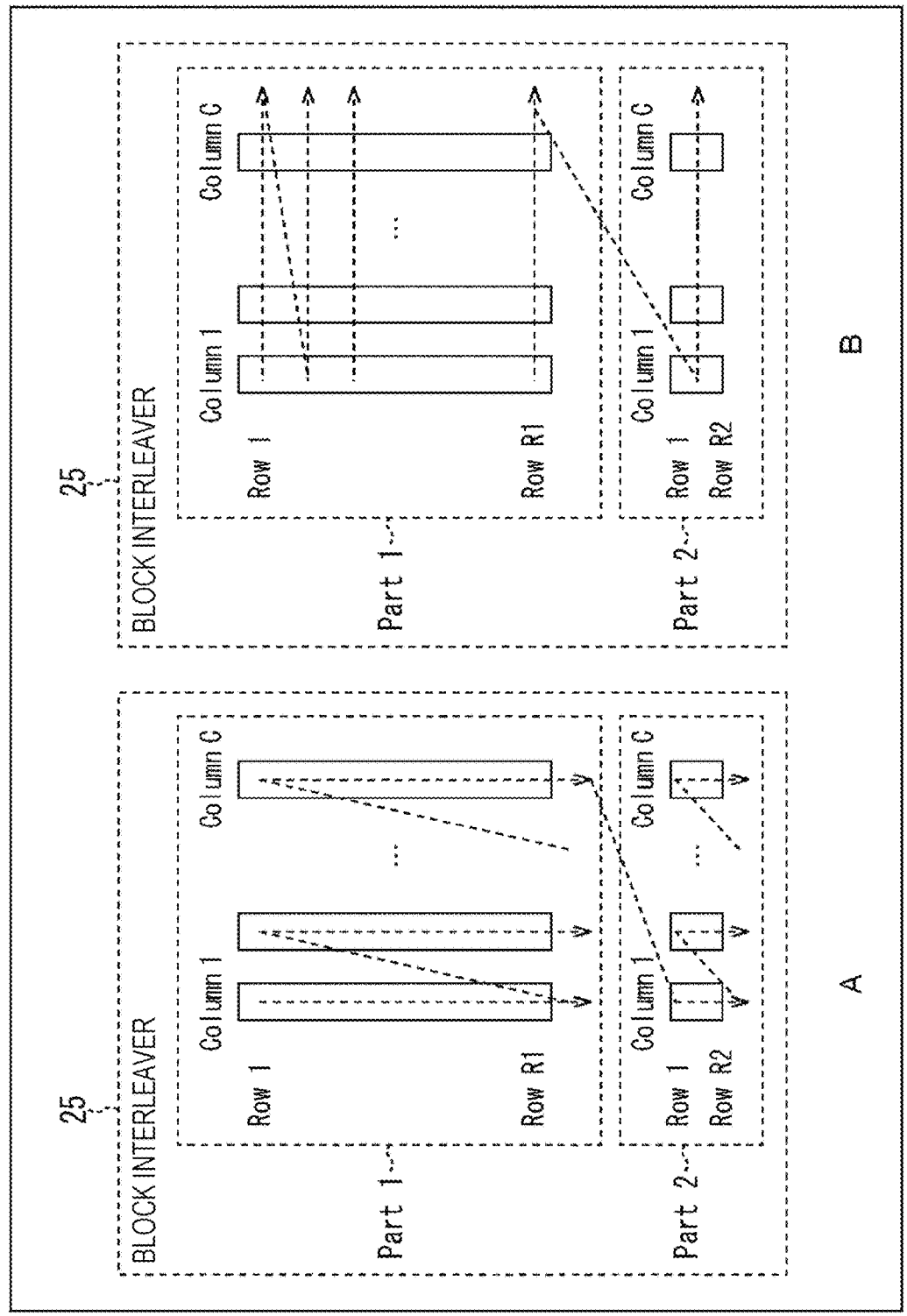
FIG. 95 is a diagram illustrating block interleaving performed by the block interleaver 25.

FIG. 95 is a diagram illustrating block interleaving performed by the block interleaver 25 illustrated in FIG. 93.

The block interleaver 25 writes and reads an LDPC code to and from parts 1 and 2 to perform block interleaving.

That is, in block interleaving, as illustrated in A of FIG. 95, the writing of the code bits of an LDPC code, which is one code word, from the top to the bottom of the columns in part 1 (in the column direction) is performed for the columns from the left to the right.

Then, when the writing of the code bits to the bottom of the rightmost column (C-th column) among the columns in part 1 is completed, the writing of the remaining code bits from the top to the bottom of the columns (column direction) in part 2 is performed for the columns from the left to the right.

Then, when the writing of the code bits to the bottom of the rightmost column (C-th column) among the columns in part 2 is completed, code bits are read from the first row of all of the C columns in part 1 in the row direction in units of C=m bits, as illustrated in B of FIG. 95.

Then, the reading of the code bits from all of the C columns in part 1 is sequentially performed toward the lower rows. When the reading of the code bits from an R1-th row, which is the final row, is completed, code bits are read from the first row of all of the C columns in part 2 in the row direction in units of C=m bits.

The reading of the code bits from all of the C columns in part 2 is sequentially performed toward the lower rows.

The reading of the code bits is performed for an R2-th row which is the final row.

In this way, the code bits which are read from parts 1 and 2 in units of m bits are supplied as symbols to the mapper 117 (FIG. 8).

<Group-Wise Interleaving>

Figure 96:
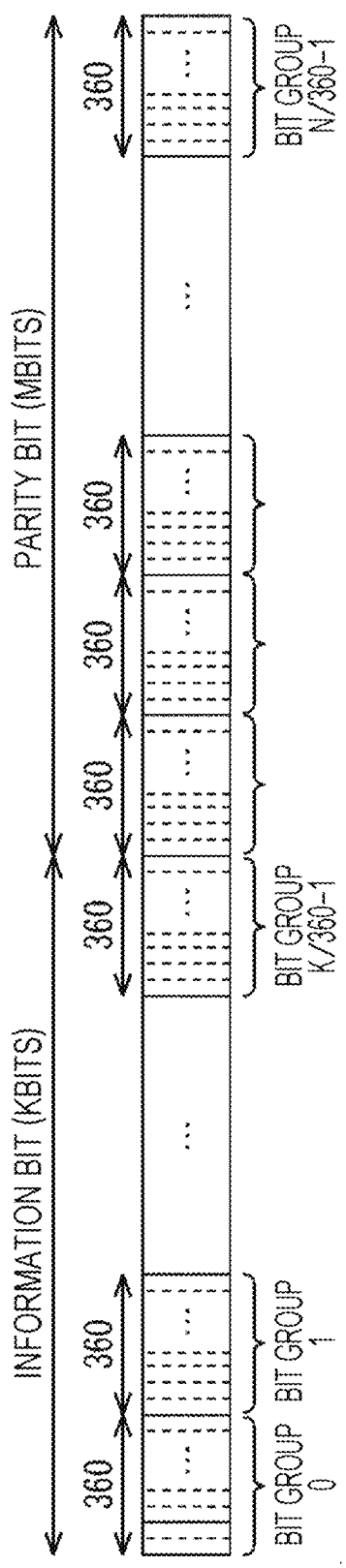
FIG. 96 is a diagram illustrating group-wise interleaving performed by a group-wise interleaver 24.

FIG. 96 is a diagram illustrating group-wise interleaving performed by the group-wise interleaver 24 illustrated in FIG. 9.

In group-wise interleaving, an LDPC code which is one code word is divided into sections of 360 bits that is equal to the unit size P from the head of the LDPC code, one section of 360 bits is used as a bit group, and the LDPC code which is one code word is interleaved in units of bit groups according to a predetermined pattern (hereinafter, also referred to as a GW pattern).

Hereinafter, when an LDPC code which is one code word is divided into bit groups from the head, an (i+1)-th bit group is referred to as a bit group i.

When the unit size P is 360, for example, an LDPC code with a code length N of 1800 bits is divided into five (=1800/360) bit groups, that is, bit groups 0, 1, 2, 3, and 4. In addition, an LDPC code with a code length N of, for example, 16200 bits is sectioned to 45 (=16200/360) bit groups, that is, bit groups 0, 1, . . . , 44. An LDPC code with a code length N of 64800 bits is divided into 180 (=64800/360) bit groups, that is, bit groups 0, 1, . . . , 179.

Hereinafter, the GW pattern is represented by a sequence of numbers indicating bit groups. For example, for the LDPC code with a code length N of 1800 bits, a GW pattern 4, 2, 0, 3, and 1 indicates interleaving (rearranging) a sequence of bit groups 0, 1, 2, 3, and 4 into a sequence of bit groups 4, 2, 0, 3, and 1.

The GW pattern can be set at least for every code length N of LDPC codes.

Figure 97:
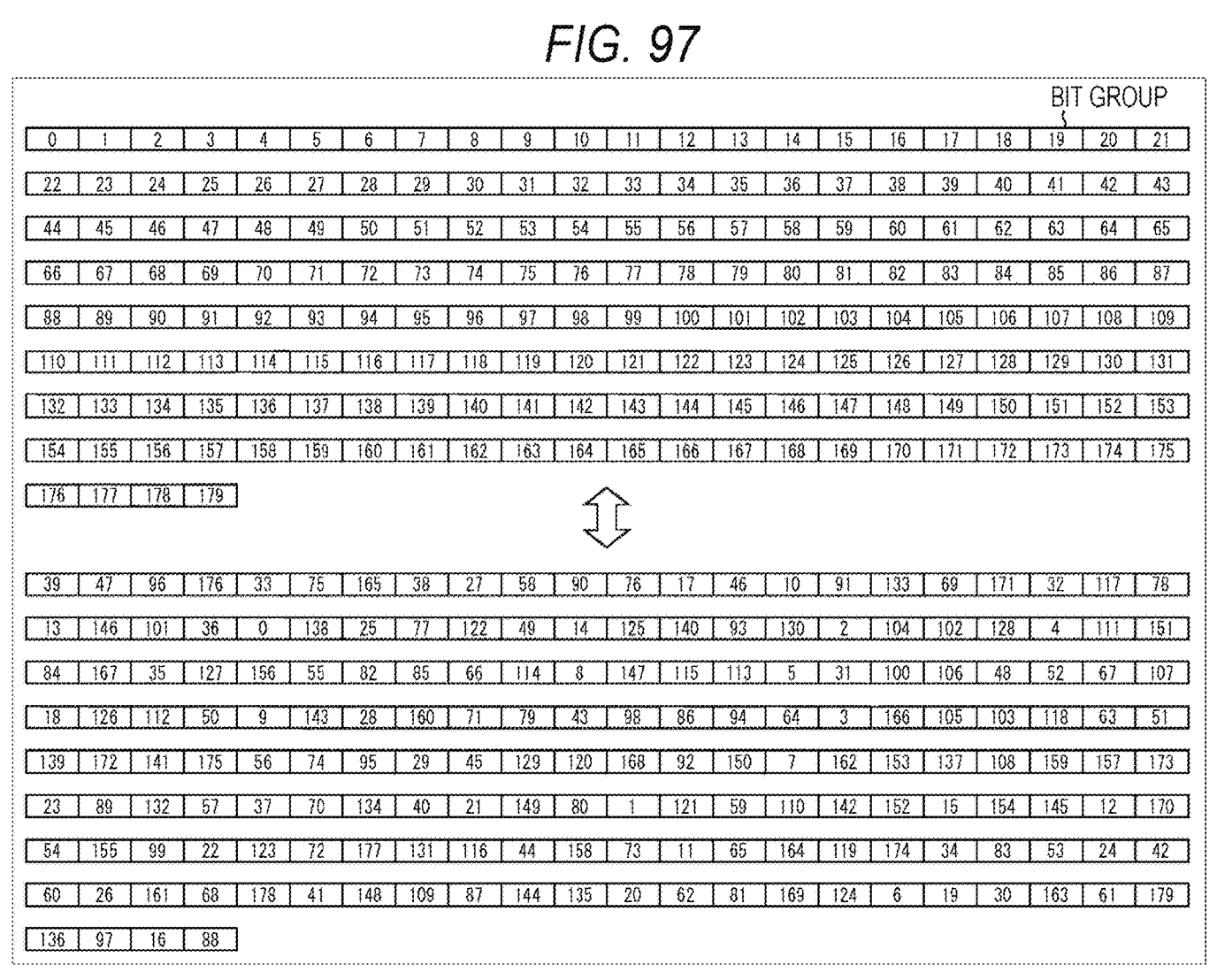

FIG. 97 is a diagram illustrating a first example of a GW pattern for an LDPC code with a code length N of 64 kbits.

According to the GW pattern illustrated in FIG. 97, a sequence of bit groups 0 to 179 of the 64-kbit LDPC code is interleaved into a sequence of the following bit groups.

39, 47, 96, 176, 33, 75, 165, 38, 27, 58, 90, 76, 17, 46, 10, 91, 133, 69, 171, 32, 117, 78, 13, 146, 101, 36, 0, 138, 25, 77, 122, 49, 14, 125, 140, 93, 130, 2, 104, 102, 128, 4, 111, 151, 84, 167, 35, 127, 156, 55, 82, 85, 66, 114, 8, 147, 115, 113, 5, 31, 100, 106, 48, 52, 67, 107, 18, 126, 112, 50, 9, 143, 28, 160, 71, 79, 43, 98, 86, 94, 64, 3, 166, 105, 103, 118, 63, 51, 139, 172, 141, 175, 56, 74, 95, 29, 45, 129, 120, 168, 92, 150, 7, 162, 153, 137, 108, 159, 157, 173, 23, 89, 132, 57, 37, 70, 134, 40, 21, 149, 80, 1, 121, 59, 110, 142, 152, 15, 154, 145, 12, 170, 54, 155, 99, 22, 123, 72, 177, 131, 116, 44, 158, 73, 11, 65, 164, 119, 174, 34, 83, 53, 24, 42, 60, 26, 161, 68, 178, 41, 148, 109, 87, 144, 135, 20, 62, 81, 169, 124, 6, 19, 30, 163, 61, 179, 136, 97, 16, 88

Figure 98:
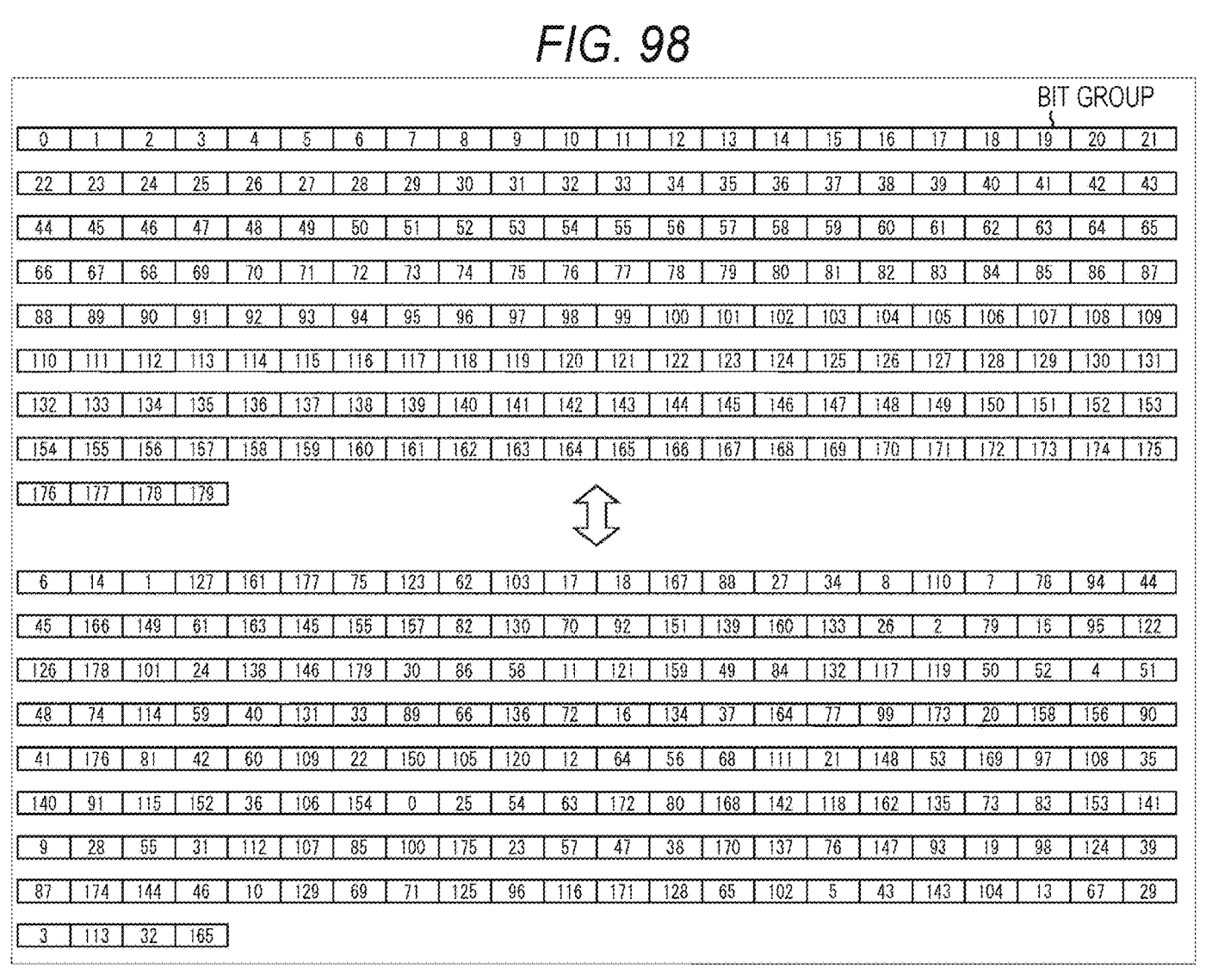

FIG. 98 is a diagram illustrating a second example of the GW pattern for the LDPC code with a code length N of 64 kbits.

According to the GW pattern illustrated in FIG. 98, a sequence of bit groups 0 to 179 of the 64-kbit LDPC code is interleaved into a sequence of the following bit groups.

6, 14, 1, 127, 161, 177, 75, 123, 62, 103, 17, 18, 167, 88, 27, 34, 8, 110, 7, 78, 94, 44, 45, 166, 149, 61, 163, 145, 155, 157, 82, 130, 70, 92, 151, 139, 160, 133, 26, 2, 79, 15, 95, 122, 126, 178, 101, 24, 138, 146, 179, 30, 86, 58, 11, 121, 159, 49, 84, 132, 117, 119, 50, 52, 4, 51, 48, 74, 114, 59, 40, 131, 33, 89, 66, 136, 72, 16, 134, 37, 164, 77, 99, 173, 20, 158, 156, 90, 41, 176, 81, 42, 60, 109, 22, 150, 105, 120, 12, 64, 56, 68, 111, 21, 148, 53, 169, 97, 108, 35, 140, 91, 115, 152, 36, 106, 154, 0, 25, 54, 63, 172, 80, 168, 142, 118, 162, 135, 73, 83, 153, 141, 9, 28, 55, 31, 112, 107, 85, 100, 175, 23, 57, 47, 38, 170, 137, 76, 147, 93, 19, 98, 124, 39, 87, 174, 144, 46, 10, 129, 69, 71, 125, 96, 116, 171, 128, 65, 102, 5, 43, 143, 104, 13, 67, 29, 3, 113, 32, 165

Figure 99:
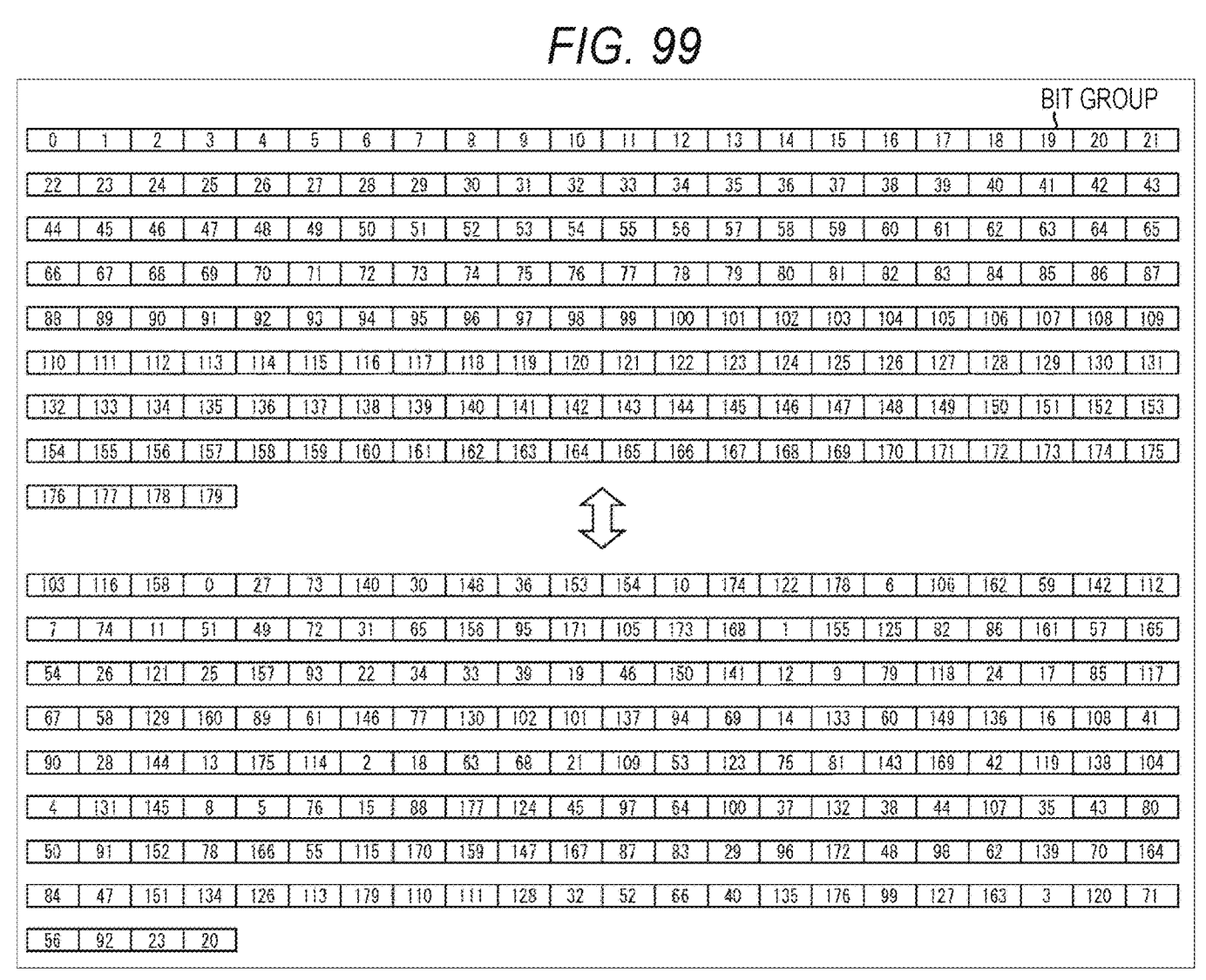

FIG. 99 is a diagram illustrating a third example of the GW pattern for the LDPC code with a code length N of 64 kbits.

According to the GW pattern illustrated in FIG. 99, a sequence of bit groups 0 to 179 of the 64-kbit LDPC code is interleaved into a sequence of the following bit groups.

103, 116, 158, 0, 27, 73, 140, 30, 148, 36, 153, 154, 10, 174, 122, 178, 6, 106, 162, 59, 142, 112, 7, 74, 11, 51, 49, 72, 31, 65, 156, 95, 171, 105, 173, 168, 1, 155, 125, 82, 86, 161, 57, 165, 54, 26, 121, 25, 157, 93, 22, 34, 33, 39, 19, 46, 150, 141, 12, 9, 79, 118, 24, 17, 85, 117, 67, 58, 129, 160, 89, 61, 146, 77, 130, 102, 101, 137, 94, 69, 14, 133, 60, 149, 136, 16, 108, 41, 90, 28, 144, 13, 175, 114, 2, 18, 63, 68, 21, 109, 53, 123, 75, 81, 143, 169, 42, 119, 138, 104, 4, 131, 145, 8, 5, 76, 15, 88, 177, 124, 45, 97, 64, 100, 37, 132, 38, 44, 107, 35, 43, 80, 50, 91, 152, 78, 166, 55, 115, 170, 159, 147, 167, 87, 83, 29, 96, 172, 48, 98, 62, 139, 70, 164, 84, 47, 151, 134, 126, 113, 179, 110, 111, 128, 32, 52, 66, 40, 135, 176, 99, 127, 163, 3, 120, 71, 56, 92, 23, 20

Figure 100:
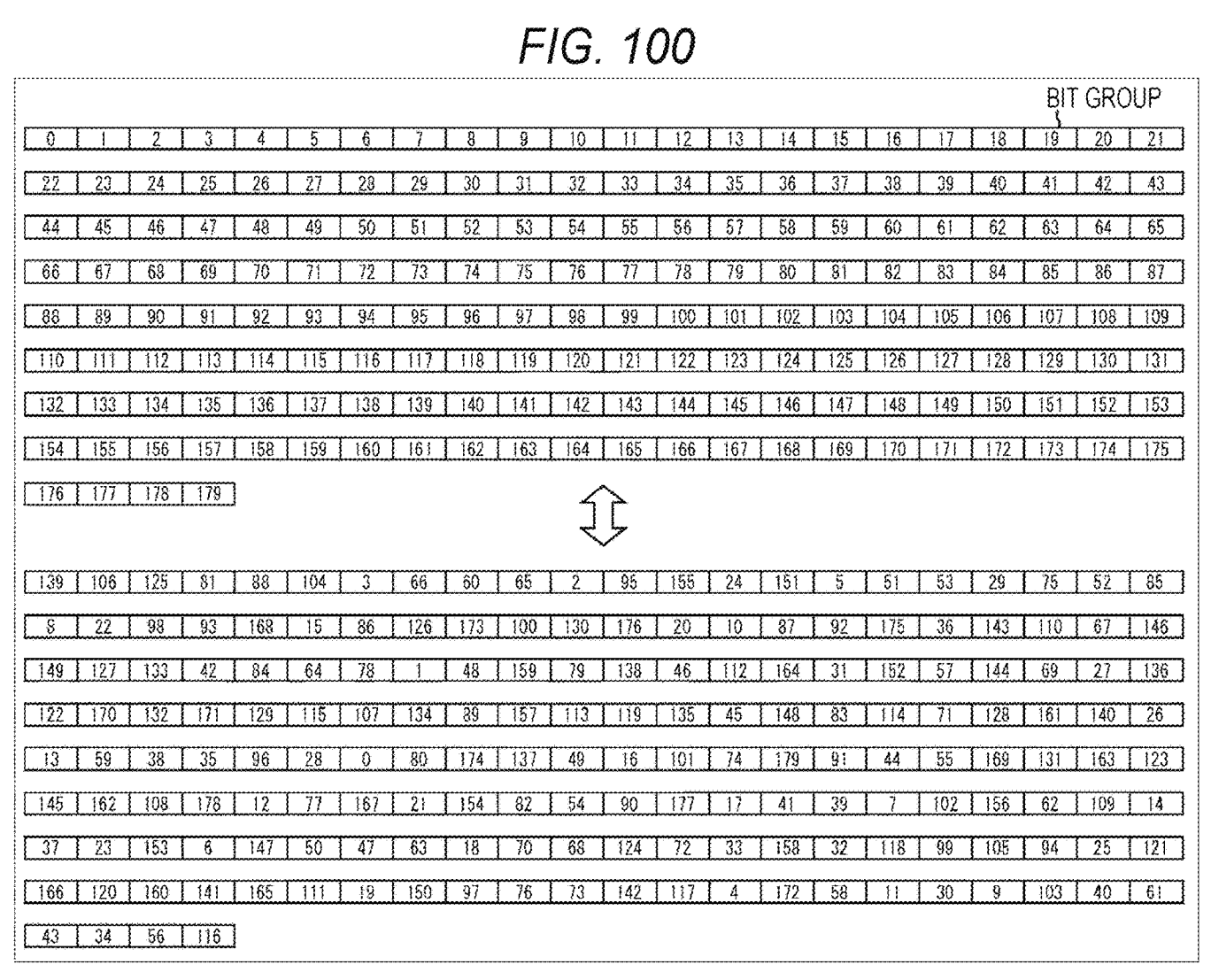

FIG. 100 is a diagram illustrating a fourth example of the GW pattern for the LDPC code with a code length N of 64 kbits.

According to the GW pattern illustrated in FIG. 100, a sequence of bit groups 0 to 179 of the 64-kbit LDPC code is interleaved into a sequence of the following bit groups.

139, 106, 125, 81, 88, 104, 3, 66, 60, 65, 2, 95, 155, 24, 151, 5, 51, 53, 29, 75, 52, 85, 8, 22, 98, 93, 168, 15, 86, 126, 173, 100, 130, 176, 20, 10, 87, 92, 175, 36, 143, 110, 67, 146, 149, 127, 133, 42, 84, 64, 78, 1, 48, 159, 79, 138, 46, 112, 164, 31, 152, 57, 144, 69, 27, 136, 122, 170, 132, 171, 129, 115, 107, 134, 89, 157, 113, 119, 135, 45, 148, 83, 114, 71, 128, 161, 140, 26, 13, 59, 38, 35, 96, 28, 0, 80, 174, 137, 49, 16, 101, 74, 179, 91, 44, 55, 169, 131, 163, 123, 145, 162, 108, 178, 12, 77, 167, 21, 154, 82, 54, 90, 177, 17, 41, 39, 7, 102, 156, 62, 109, 14, 37, 23, 153, 6, 147, 50, 47, 63, 18, 70, 68, 124, 72, 33, 158, 32, 118, 99, 105, 94, 25, 121, 166, 120, 160, 141, 165, 111, 19, 150, 97, 76, 73, 142, 117, 4, 172, 58, 11, 30, 9, 103, 40, 61, 43, 34, 56, 116

Figure 101:
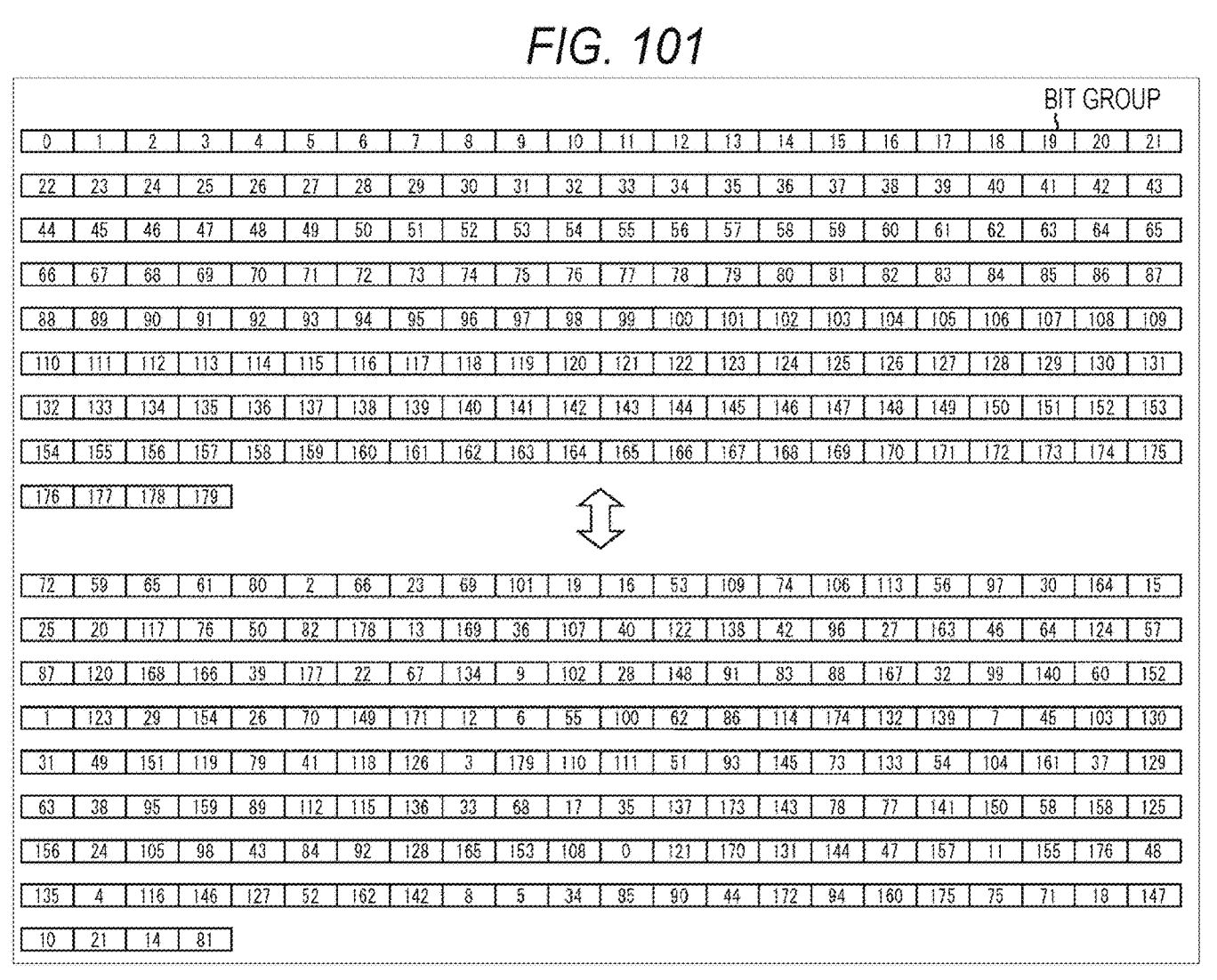

FIG. 101 is a diagram illustrating a fifth example of the GW pattern for the LDPC code with a code length N of 64 kbits.

According to the GW pattern illustrated in FIG. 101, a sequence of bit groups 0 to 179 of the 64-kbit LDPC code is interleaved into a sequence of the following bit groups.

72, 59, 65, 61, 80, 2, 66, 23, 69, 101, 19, 16, 53, 109, 74, 106, 113, 56, 97, 30, 164, 15, 25, 20, 117, 76, 50, 82, 178, 13, 169, 36, 107, 40, 122, 138, 42, 96, 27, 163, 46, 64, 124, 57, 87, 120, 168, 166, 39, 177, 22, 67, 134, 9, 102, 28, 148, 91, 83, 88, 167, 32, 99, 140, 60, 152, 1, 123, 29, 154, 26, 70, 149, 171, 12, 6, 55, 100, 62, 86, 114, 174, 132, 139, 7, 45, 103, 130, 31, 49, 151, 119, 79, 41, 118, 126, 3, 179, 110, 111, 51, 93, 145, 73, 133, 54, 104, 161, 37, 129, 63, 38, 95, 159, 89, 112, 115, 136, 33, 68, 17, 35, 137, 173, 143, 78, 77, 141, 150, 58, 158, 125, 156, 24, 105, 98, 43, 84, 92, 128, 165, 153, 108, 0, 121, 170, 131, 144, 47, 157, 11, 155, 176, 48, 135, 4, 116, 146, 127, 52, 162, 142, 8, 5, 34, 85, 90, 44, 172, 94, 160, 175, 75, 71, 18, 147, 10, 21, 14, 81

Figure 102:
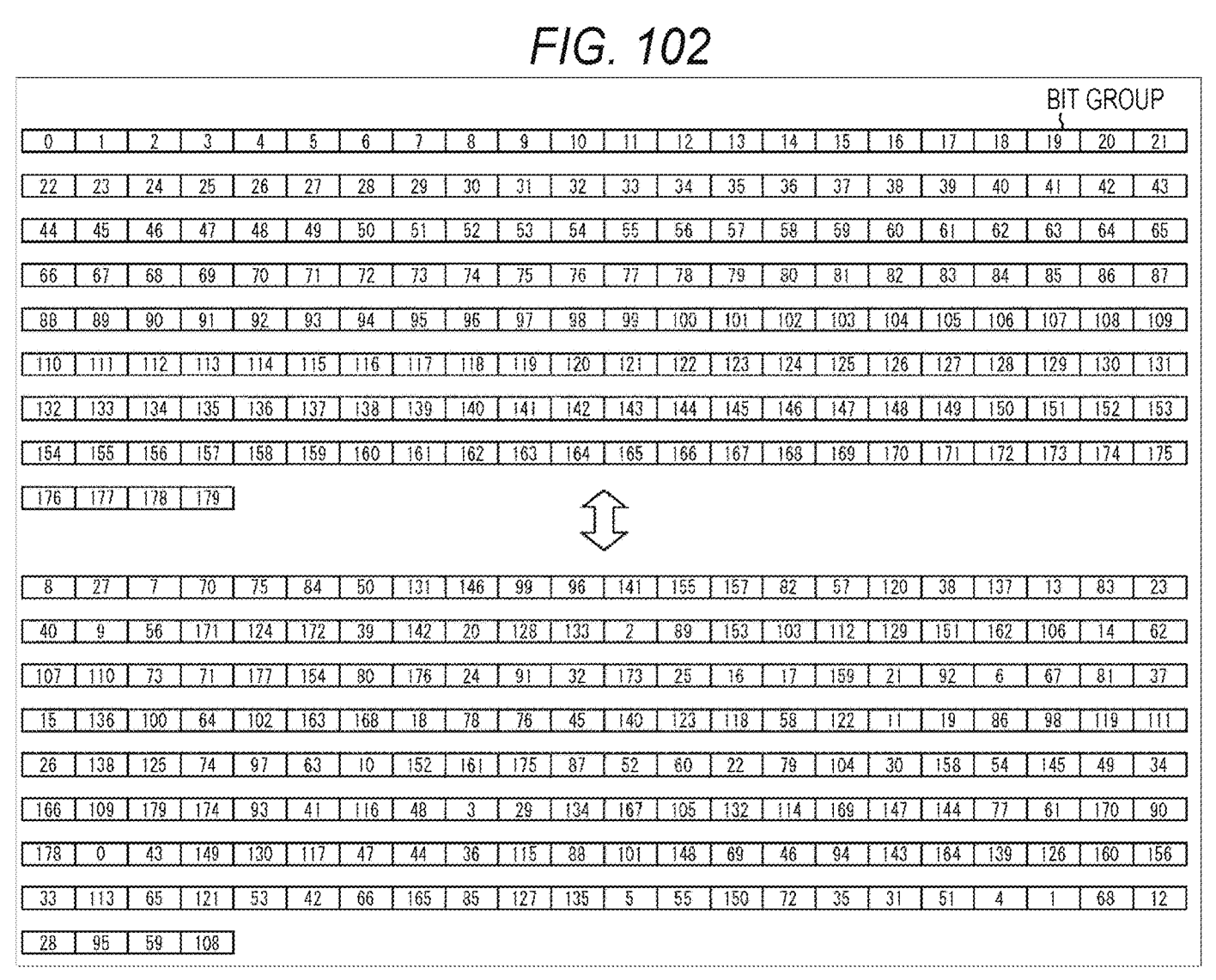

FIG. 102 is a diagram illustrating a sixth example of the GW pattern for the LDPC code with a code length N of 64 kbits.

According to the GW pattern illustrated in FIG. 102, a sequence of bit groups 0 to 179 of the 64-kbit LDPC code is interleaved into a sequence of the following bit groups.

8, 27, 7, 70, 75, 84, 50, 131, 146, 99, 96, 141, 155, 157, 82, 57, 120, 38, 137, 13, 83, 23, 40, 9, 56, 171, 124, 172, 39, 142, 20, 128, 133, 2, 89, 153, 103, 112, 129, 151, 162, 106, 14, 62, 107, 110, 73, 71, 177, 154, 80, 176, 24, 91, 32, 173, 25, 16, 17, 159, 21, 92, 6, 67, 81, 37, 15, 136, 100, 64, 102, 163, 168, 18, 78, 76, 45, 140, 123, 118, 58, 122, 11, 19, 86, 98, 119, 111, 26, 138, 125, 74, 97, 63, 10, 152, 161, 175, 87, 52, 60, 22, 79, 104, 30, 158, 54, 145, 49, 34, 166, 109, 179, 174, 93, 41, 116, 48, 3, 29, 134, 167, 105, 132, 114, 169, 147, 144, 77, 61, 170, 90, 178, 0, 43, 149, 130, 117, 47, 44, 36, 115, 88, 101, 148, 69, 46, 94, 143, 164, 139, 126, 160, 156, 33, 113, 65, 121, 53, 42, 66, 165, 85, 127, 135, 5, 55, 150, 72, 35, 31, 51, 4, 1, 68, 12, 28, 95, 59, 108

Figure 103:
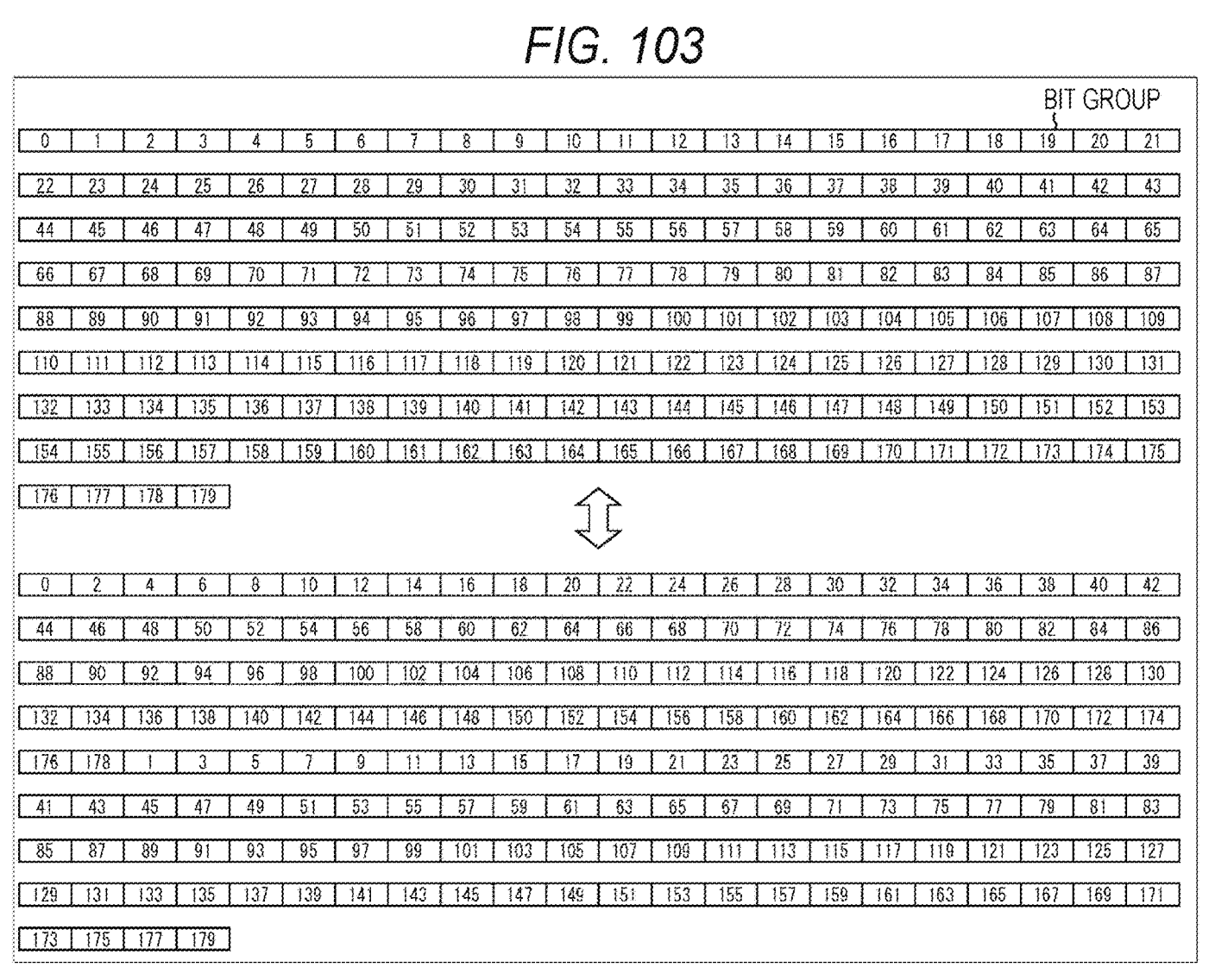

FIG. 103 is a diagram illustrating a seventh example of the GW pattern for the LDPC code with a code length N of 64 kbits.

According to the GW pattern illustrated in FIG. 103, a sequence of bit groups 0 to 179 of the 64-kbit LDPC code is interleaved into a sequence of the following bit groups.

0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, 179

Figure 104:
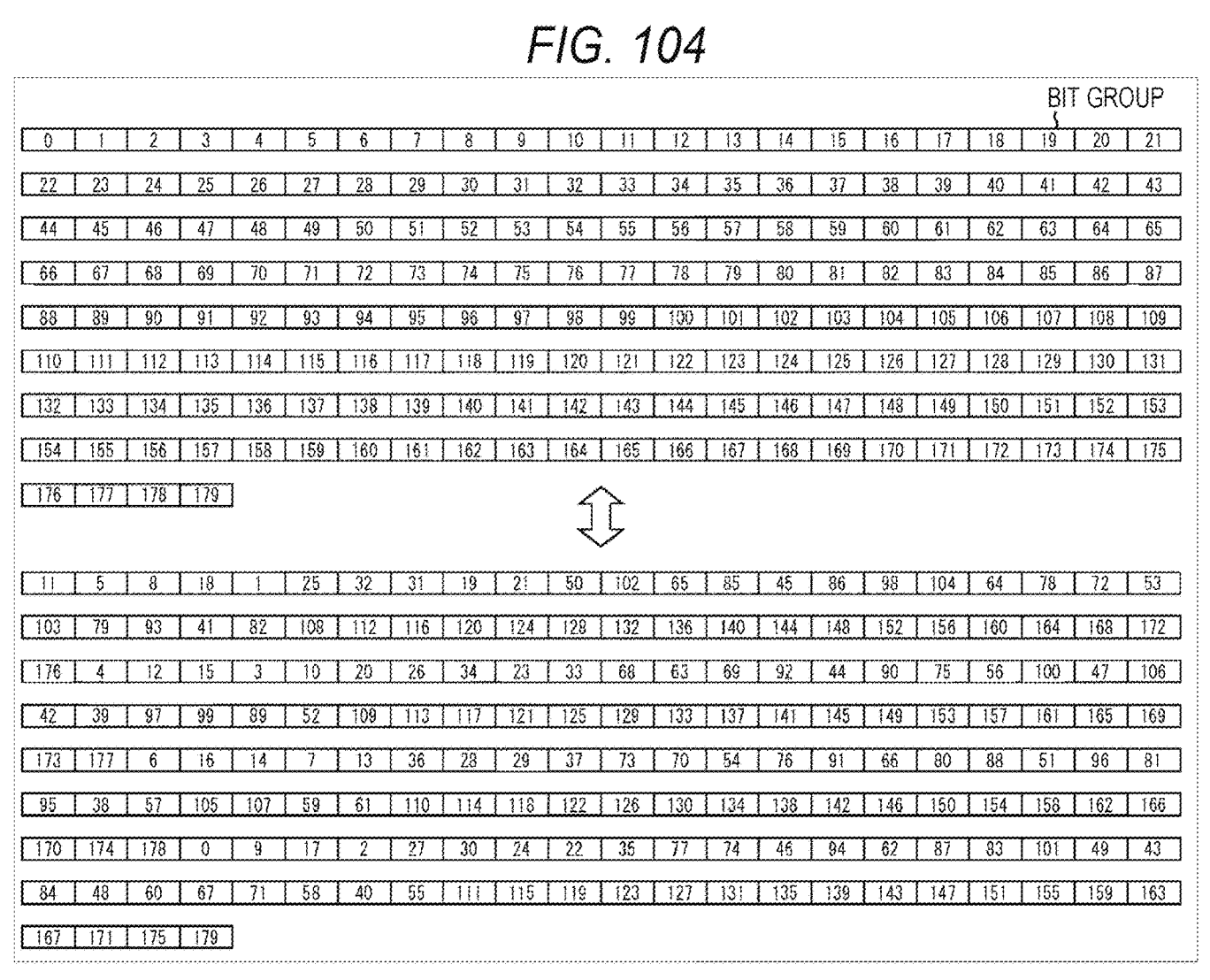

FIG. 104 is a diagram illustrating an eighth example of the GW pattern for the LDPC code with a code length N of 64 kbits.

According to the GW pattern illustrated in FIG. 104, a sequence of bit groups 0 to 179 of the 64-kbit LDPC code is interleaved into a sequence of the following bit groups.

11, 5, 8, 18, 1, 25, 32, 31, 19, 21, 50, 102, 65, 85, 45, 86, 98, 104, 64, 78, 72, 53, 103, 79, 93, 41, 82, 108, 112, 116, 120, 124, 128, 132, 136, 140, 144, 148, 152, 156, 160, 164, 168, 172, 176, 4, 12, 15, 3, 10, 20, 26, 34, 23, 33, 68, 63, 69, 92, 44, 90, 75, 56, 100, 47, 106, 42, 39, 97, 99, 89, 52, 109, 113, 117, 121, 125, 129, 133, 137, 141, 145, 149, 153, 157, 161, 165, 169, 173, 177, 6, 16, 14, 7, 13, 36, 28, 29, 37, 73, 70, 54, 76, 91, 66, 80, 88, 51, 96, 81, 95, 38, 57, 105, 107, 59, 61, 110, 114, 118, 122, 126, 130, 134, 138, 142, 146, 150, 154, 158, 162, 166, 170, 174, 178, 0, 9, 17, 2, 27, 30, 24, 22, 35, 77, 74, 46, 94, 62, 87, 83, 101, 49, 43, 84, 48, 60, 67, 71, 58, 40, 55, 111, 115, 119, 123, 127, 131, 135, 139, 143, 147, 151, 155, 159, 163, 167, 171, 175, 179

Figure 105:
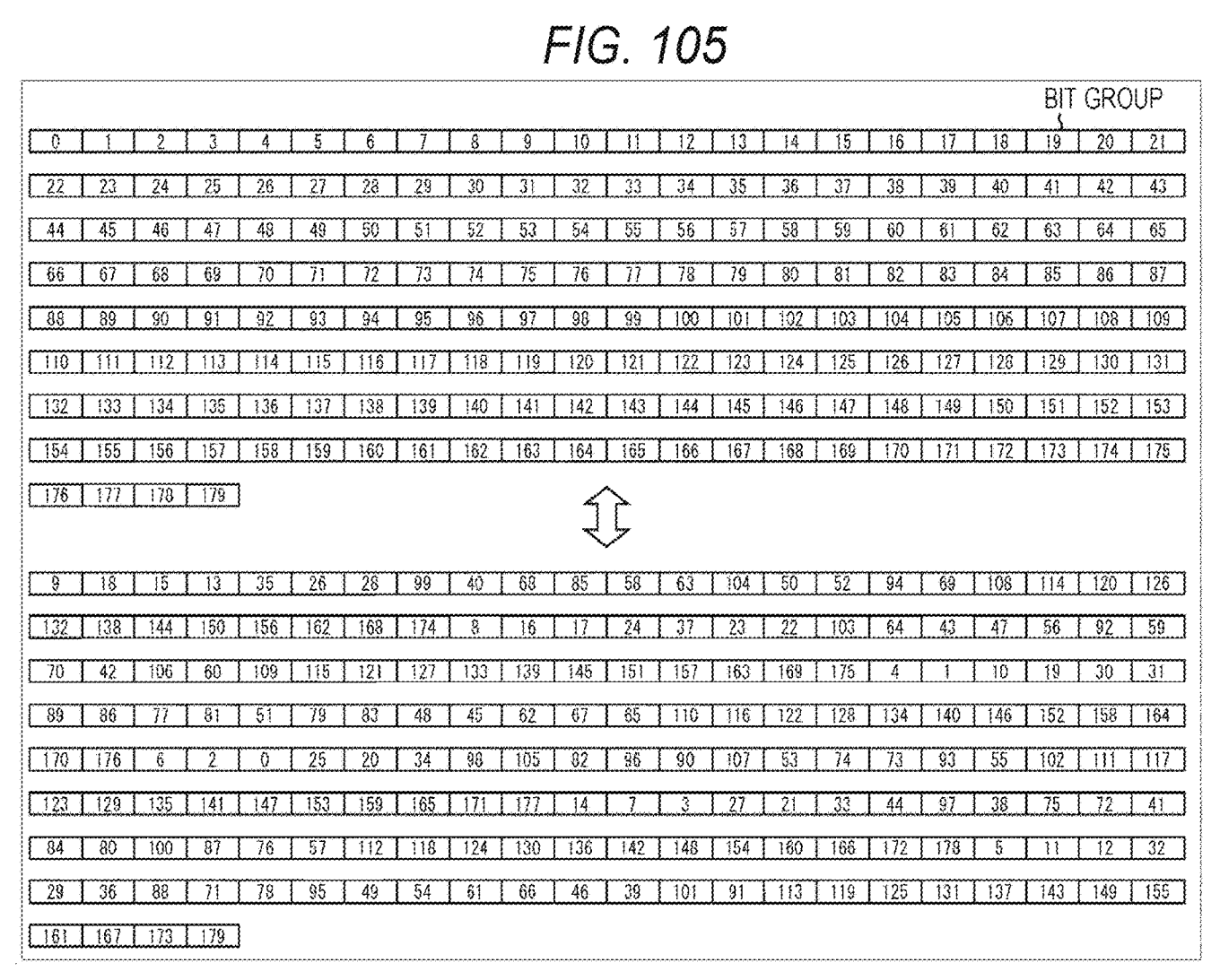

FIG. 105 is a diagram illustrating a ninth example of the GW pattern for the LDPC code with a code length N of 64 kbits.

According to the GW pattern illustrated in FIG. 105, a sequence of bit groups 0 to 179 of the 64-kbit LDPC code is interleaved into a sequence of the following bit groups.

9, 18, 15, 13, 35, 26, 28, 99, 40, 68, 85, 58, 63, 104, 50, 52, 94, 69, 108, 114, 120, 126, 132, 138, 144, 150, 156, 162, 168, 174, 8, 16, 17, 24, 37, 23, 22, 103, 64, 43, 47, 56, 92, 59, 70, 42, 106, 60, 109, 115, 121, 127, 133, 139, 145, 151, 157, 163, 169, 175, 4, 1, 10, 19, 30, 31, 89, 86, 77, 81, 51, 79, 83, 48, 45, 62, 67, 65, 110, 116, 122, 128, 134, 140, 146, 152, 158, 164, 170, 176, 6, 2, 0, 25, 20, 34, 98, 105, 82, 96, 90, 107, 53, 74, 73, 93, 55, 102, 111, 117, 123, 129, 135, 141, 147, 153, 159, 165, 171, 177, 14, 7, 3, 27, 21, 33, 44, 97, 38, 75, 72, 41, 84, 80, 100, 87, 76, 57, 112, 118, 124, 130, 136, 142, 148, 154, 160, 166, 172, 178, 5, 11, 12, 32, 29, 36, 88, 71, 78, 95, 49, 54, 61, 66, 46, 39, 101, 91, 113, 119, 125, 131, 137, 143, 149, 155, 161, 167, 173, 179

Figure 106:
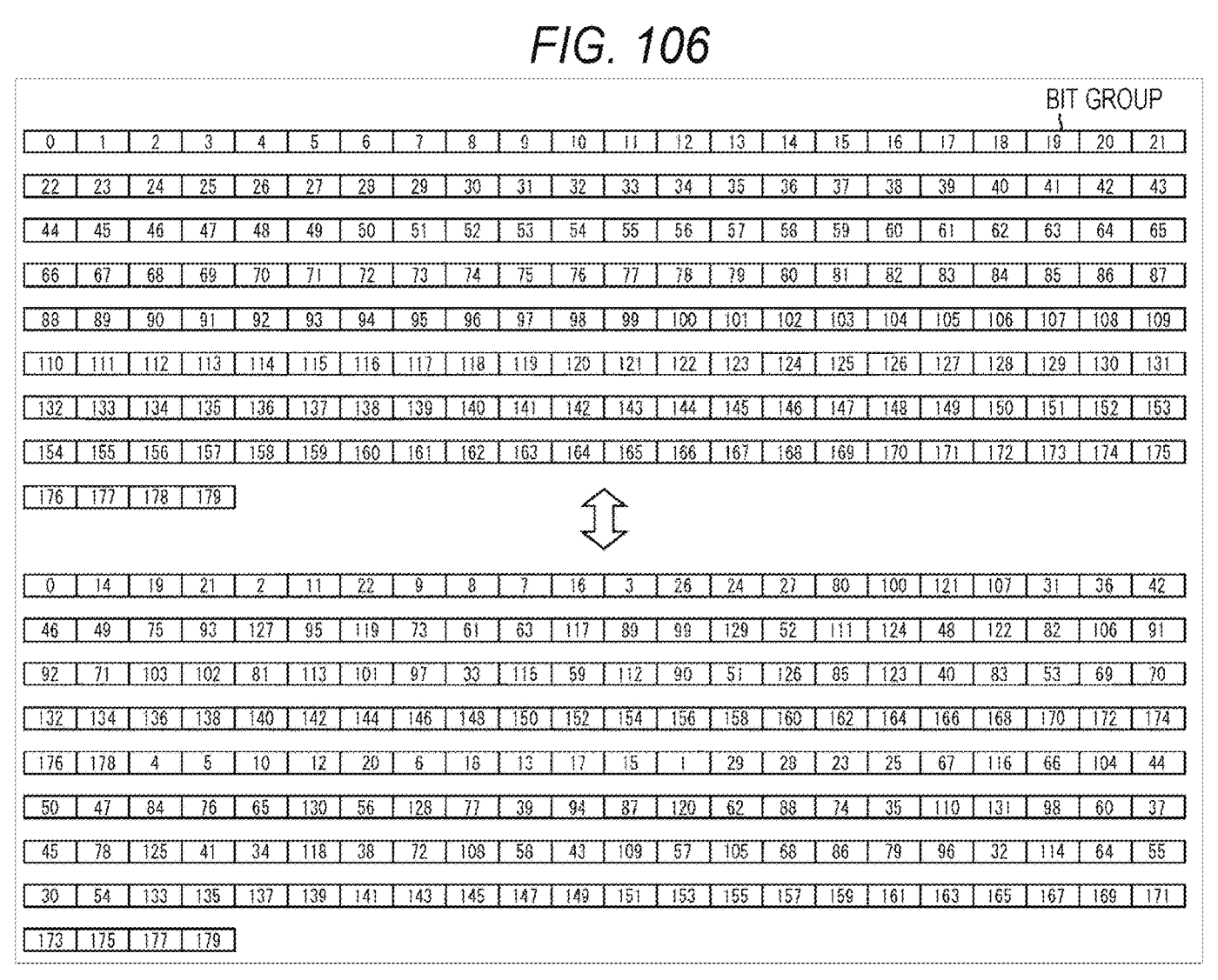

FIG. 106 is a diagram illustrating a tenth example of the GW pattern for the LDPC code with a code length N of 64 kbits.

According to the GW pattern illustrated in FIG. 106, a sequence of bit groups 0 to 179 of the 64-kbit LDPC code is interleaved into a sequence of the following bit groups.

0, 14, 19, 21, 2, 11, 22, 9, 8, 7, 16, 3, 26, 24, 27, 80, 100, 121, 107, 31, 36, 42, 46, 49, 75, 93, 127, 95, 119, 73, 61, 63, 117, 89, 99, 129, 52, 111, 124, 48, 122, 82, 106, 91, 92, 71, 103, 102, 81, 113, 101, 97, 33, 115, 59, 112, 90, 51, 126, 85, 123, 40, 83, 53, 69, 70, 132, 134, 136, 138, 140, 142, 144, 146, 148, 150, 152, 154, 156, 158, 160, 162, 164, 166, 168, 170, 172, 174, 176, 178, 4, 5, 10, 12, 20, 6, 18, 13, 17, 15, 1, 29, 28, 23, 25, 67, 116, 66, 104, 44, 50, 47, 84, 76, 65, 130, 56, 128, 77, 39, 94, 87, 120, 62, 88, 74, 35, 110, 131, 98, 60, 37, 45, 78, 125, 41, 34, 118, 38, 72, 108, 58, 43, 109, 57, 105, 68, 86, 79, 96, 32, 114, 64, 55, 30, 54, 133, 135, 137, 139, 141, 143, 145, 147, 149, 151, 153, 155, 157, 159, 161, 163, 165, 167, 169, 171, 173, 175, 177, 179

Figure 107:
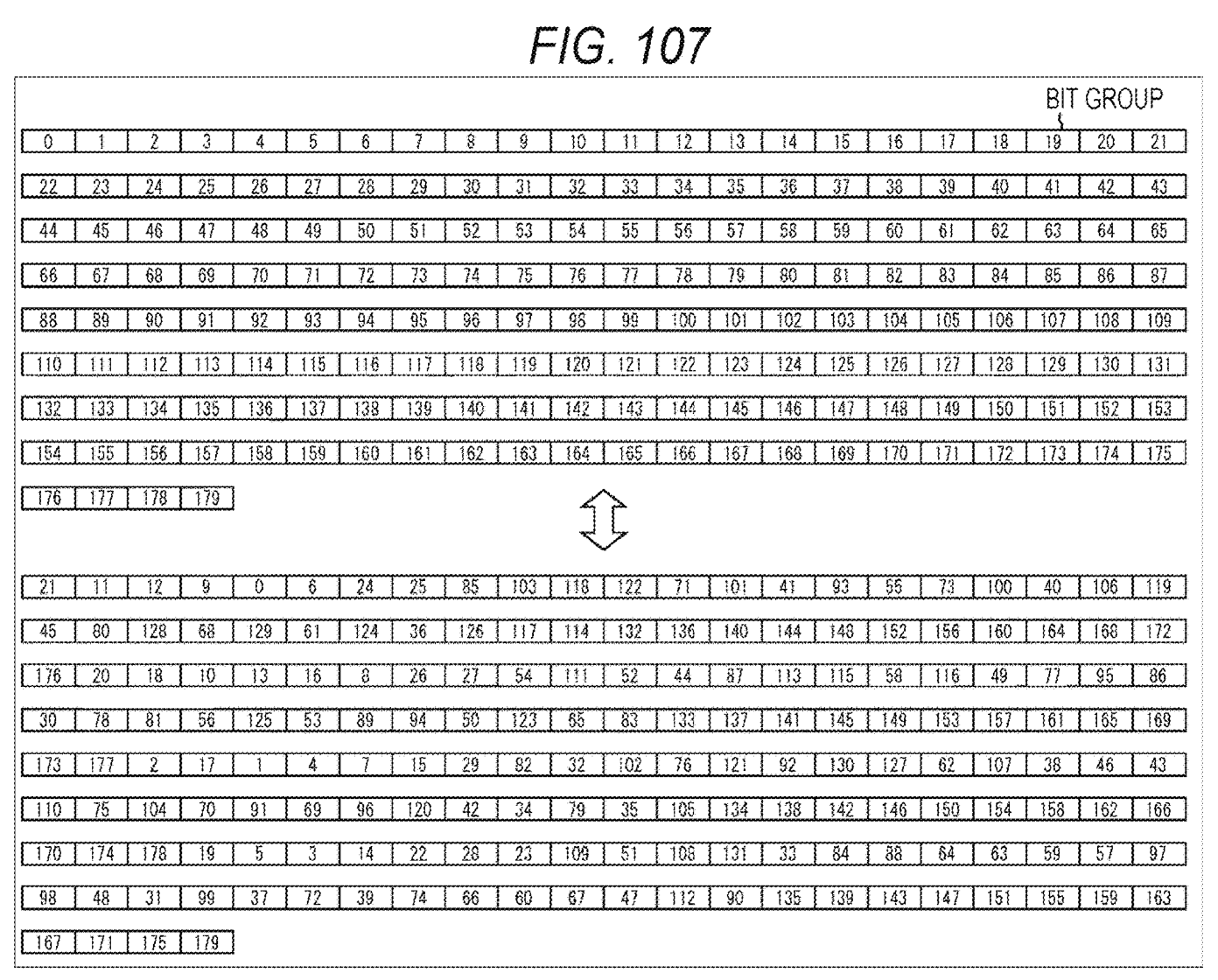

FIG. 107 is a diagram illustrating an eleventh example of the GW pattern for the LDPC code with a code length N of 64 kbits.

According to the GW pattern illustrated in FIG. 107, a sequence of bit groups 0 to 179 of the 64-kbit LDPC code is interleaved into a sequence of the following bit groups.

21, 11, 12, 9, 0, 6, 24, 25, 85, 103, 118, 122, 71, 101, 41, 93, 55, 73, 100, 40, 106, 119, 45, 80, 128, 68, 129, 61, 124, 36, 126, 117, 114, 132, 136, 140, 144, 148, 152, 156, 160, 164, 168, 172, 176, 20, 18, 10, 13, 16, 8, 26, 27, 54, 111, 52, 44, 87, 113, 115, 58, 116, 49, 77, 95, 86, 30, 78, 81, 56, 125, 53, 89, 94, 50, 123, 65, 83, 133, 137, 141, 145, 149, 153, 157, 161, 165, 169, 173, 177, 2, 17, 1, 4, 7, 15, 29, 82, 32, 102, 76, 121, 92, 130, 127, 62, 107, 38, 46, 43, 110, 75, 104, 70, 91, 69, 96, 120, 42, 34, 79, 35, 105, 134, 138, 142, 146, 150, 154, 158, 162, 166, 170, 174, 178, 19, 5, 3, 14, 22, 28, 23, 109, 51, 108, 131, 33, 84, 88, 64, 63, 59, 57, 97, 98, 48, 31, 99, 37, 72, 39, 74, 66, 60, 67, 47, 112, 90, 135, 139, 143, 147, 151, 155, 159, 163, 167, 171, 175, 179

Figure 108:
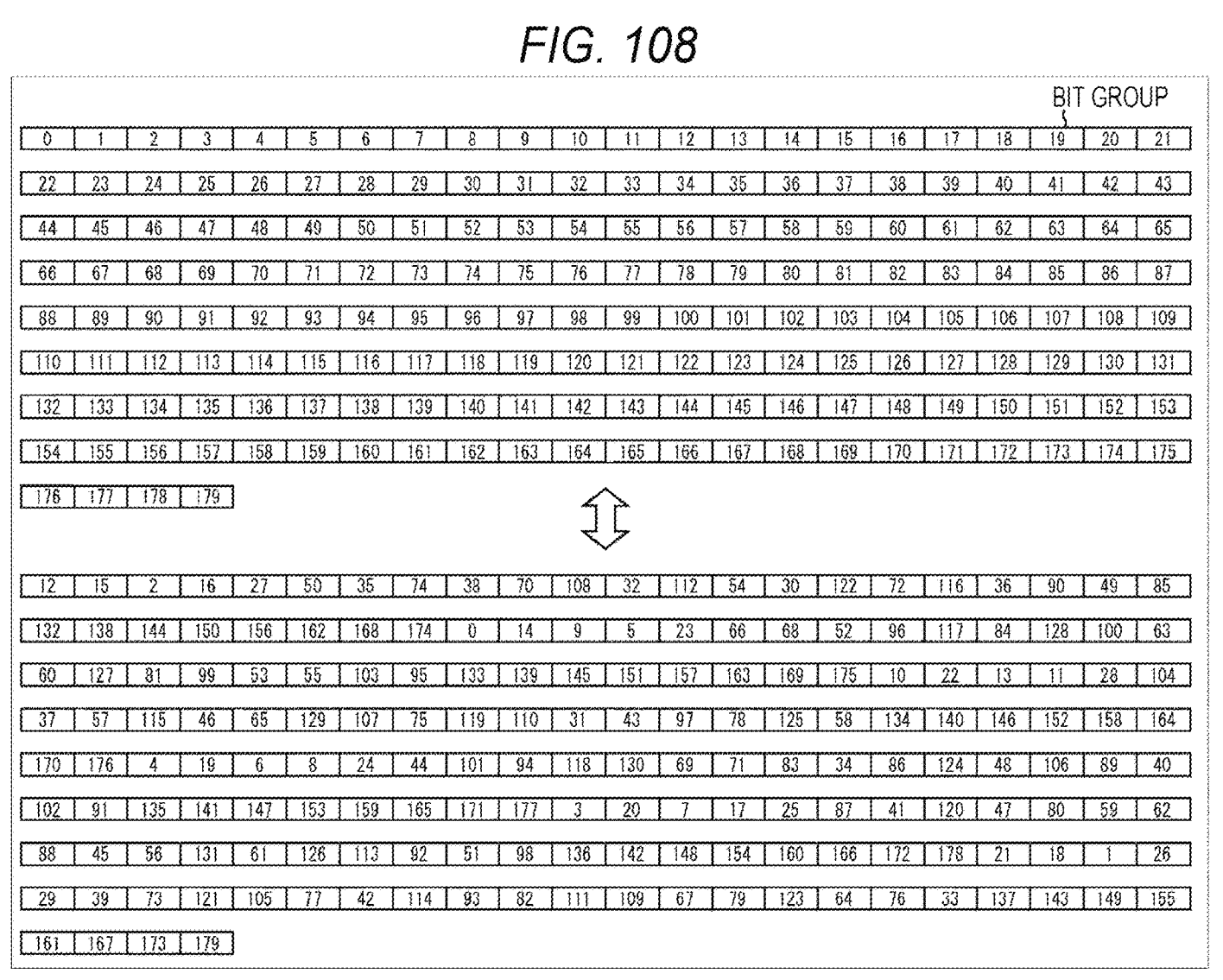

FIG. 108 is a diagram illustrating a twelfth example of the GW pattern for the LDPC code with a code length N of 64 kbits.

According to the GW pattern illustrated in FIG. 108, a sequence of bit groups 0 to 179 of the 64-kbit LDPC code is interleaved into a sequence of the following bit groups.

12, 15, 2, 16, 27, 50, 35, 74, 38, 70, 108, 32, 112, 54, 30, 122, 72, 116, 36, 90, 49, 85, 132, 138, 144, 150, 156, 162, 168, 174, 0, 14, 9, 5, 23, 66, 68, 52, 96, 117, 84, 128, 100, 63, 60, 127, 81, 99, 53, 55, 103, 95, 133, 139, 145, 151, 157, 163, 169, 175, 10, 22, 13, 11, 28, 104, 37, 57, 115, 46, 65, 129, 107, 75, 119, 110, 31, 43, 97, 78, 125, 58, 134, 140, 146, 152, 158, 164, 170, 176, 4, 19, 6, 8, 24, 44, 101, 94, 118, 130, 69, 71, 83, 34, 86, 124, 48, 106, 89, 40, 102, 91, 135, 141, 147, 153, 159, 165, 171, 177, 3, 20, 7, 17, 25, 87, 41, 120, 47, 80, 59, 62, 88, 45, 56, 131, 61, 126, 113, 92, 51, 98, 136, 142, 148, 154, 160, 166, 172, 178, 21, 18, 1, 26, 29, 39, 73, 121, 105, 77, 42, 114, 93, 82, 111, 109, 67, 79, 123, 64, 76, 33, 137, 143, 149, 155, 161, 167, 173, 179

Figure 109:
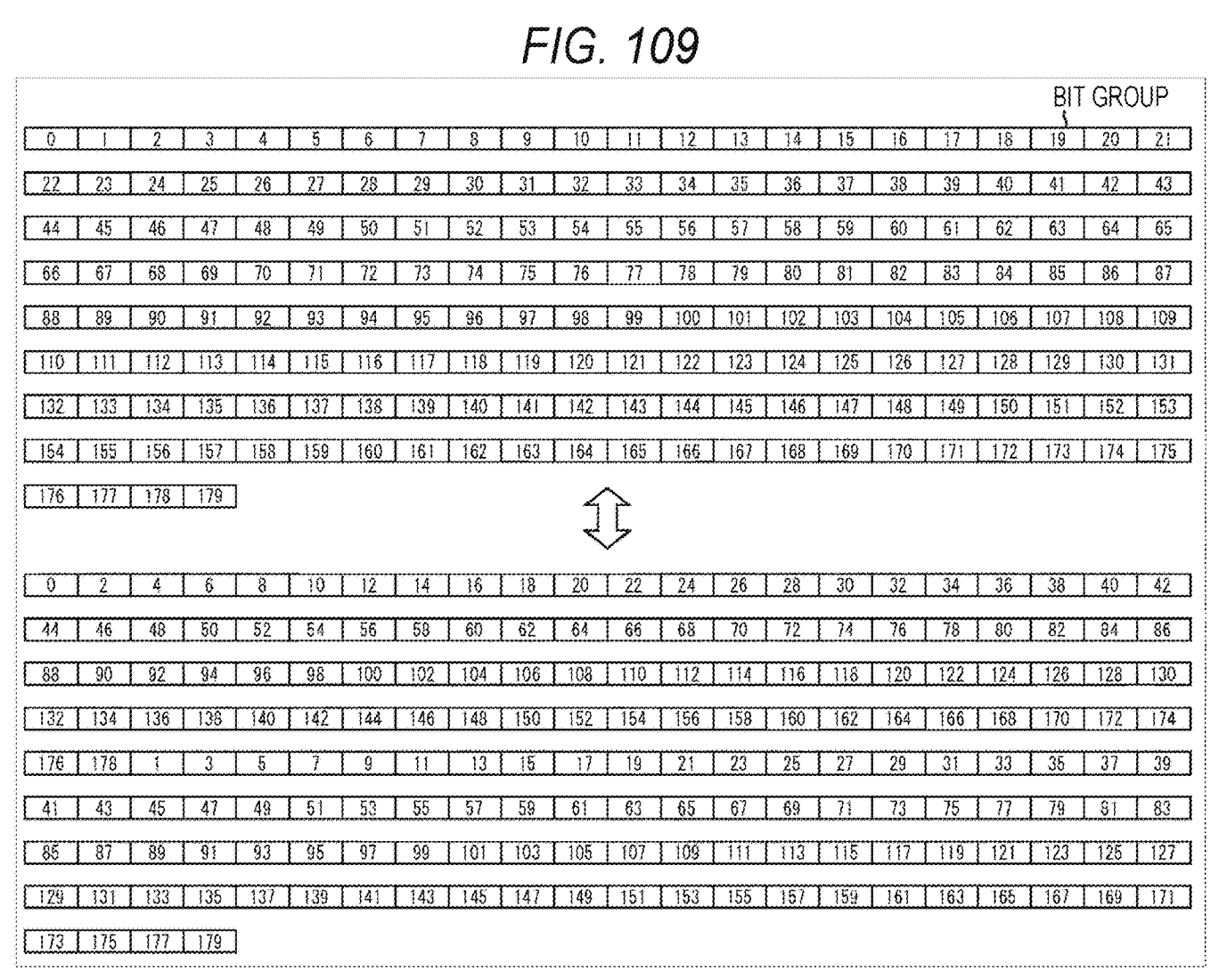

FIG. 109 is a diagram illustrating a thirteenth example of the GW pattern for the LDPC code with a code length N of 64 kbits.

According to the GW pattern illustrated in FIG. 109, a sequence of bit groups 0 to 179 of the 64-kbit LDPC code is interleaved into a sequence of the following bit groups.

0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, 179

Figure 110:
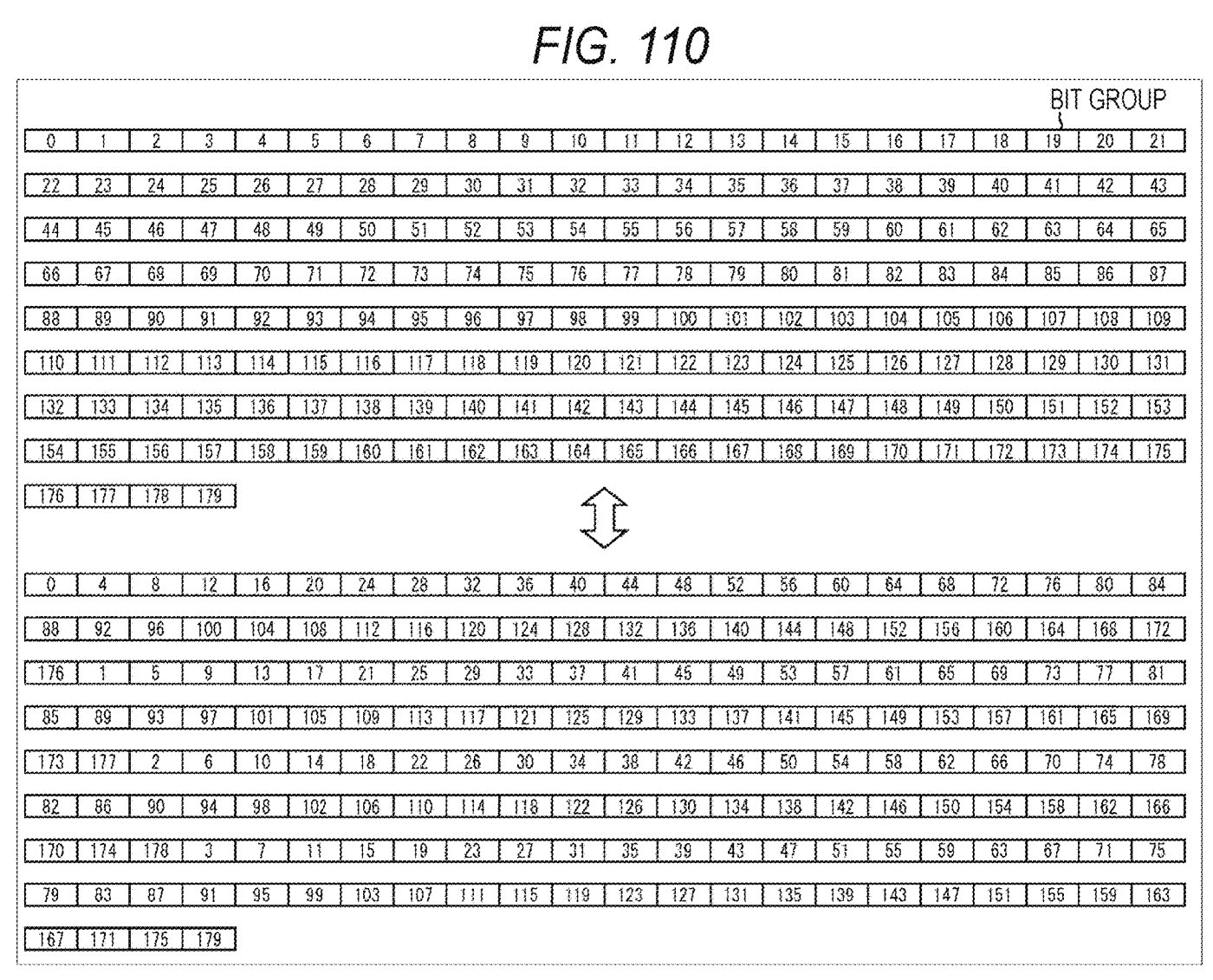

FIG. 110 is a diagram illustrating a fourteenth example of the GW pattern for the LDPC code with a code length N of 64 kbits.

According to the GW pattern illustrated in FIG. 110, a sequence of bit groups 0 to 179 of the 64-kbit LDPC code is interleaved into a sequence of the following bit groups.

0, 4, 8, 12, 16, 20, 24, 28, 32, 36, 40, 44, 48, 52, 56, 60, 64, 68, 72, 76, 80, 84, 88, 92, 96, 100, 104, 108, 112, 116, 120, 124, 128, 132, 136, 140, 144, 148, 152, 156, 160, 164, 168, 172, 176, 1, 5, 9, 13, 17, 21, 25, 29, 33, 37, 41, 45, 49, 53, 57, 61, 65, 69, 73, 77, 81, 85, 89, 93, 97, 101, 105, 109, 113, 117, 121, 125, 129, 133, 137, 141, 145, 149, 153, 157, 161, 165, 169, 173, 177, 2, 6, 10, 14, 18, 22, 26, 30, 34, 38, 42, 46, 50, 54, 58, 62, 66, 70, 74, 78, 82, 86, 90, 94, 98, 102, 106, 110, 114, 118, 122, 126, 130, 134, 138, 142, 146, 150, 154, 158, 162, 166, 170, 174, 178, 3, 7, 11, 15, 19, 23, 27, 31, 35, 39, 43, 47, 51, 55, 59, 63, 67, 71, 75, 79, 83, 87, 91, 95, 99, 103, 107, 111, 115, 119, 123, 127, 131, 135, 139, 143, 147, 151, 155, 159, 163, 167, 171, 175, 179

Figure 111:
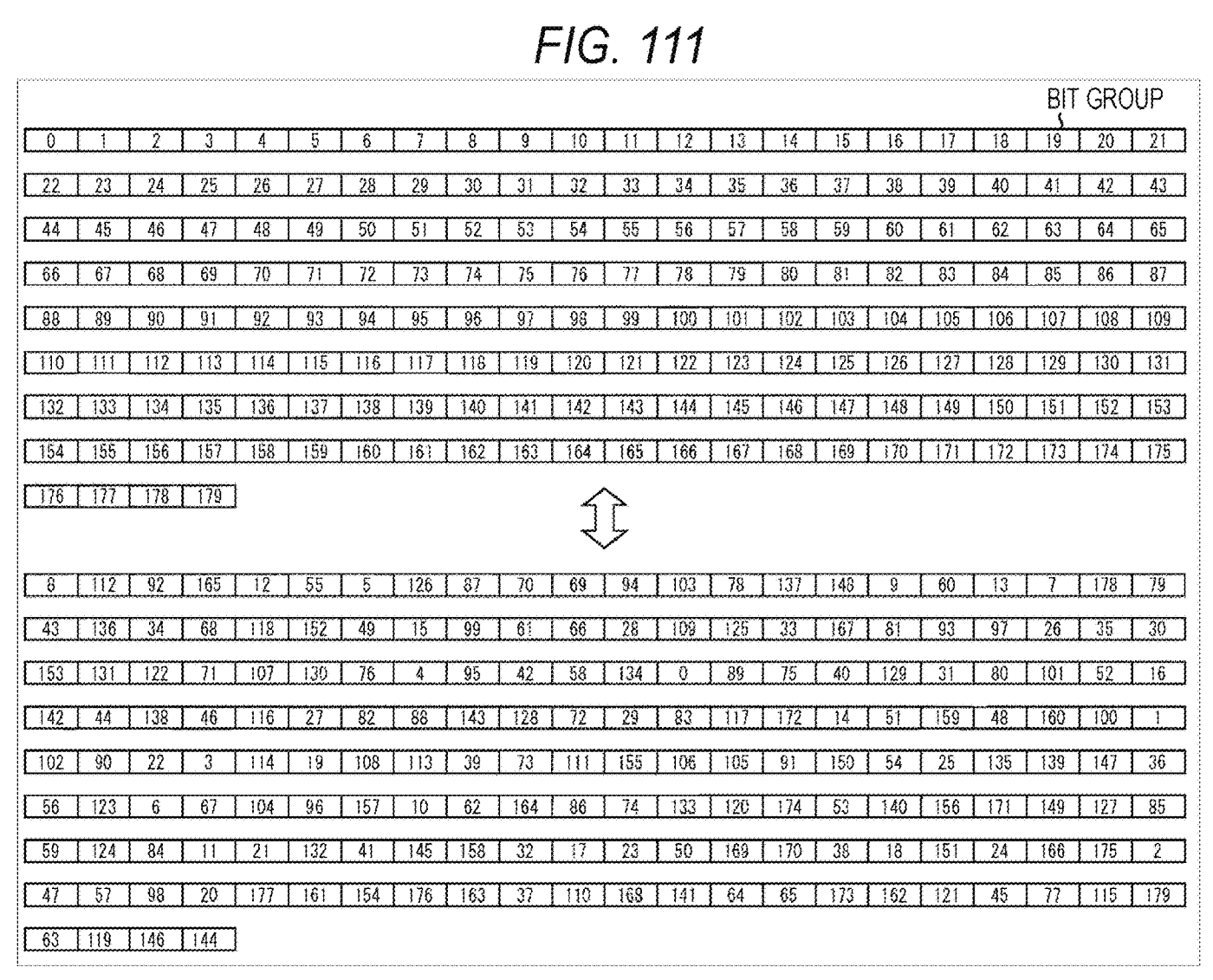

FIG. 111 is a diagram illustrating a fifteenth example of the GW pattern for the LDPC code with a code length N of 64 kbits.

According to the GW pattern illustrated in FIG. 111, a sequence of bit groups 0 to 179 of the 64-kbit LDPC code is interleaved into a sequence of the following bit groups.

8, 112, 92, 165, 12, 55, 5, 126, 87, 70, 69, 94, 103, 78, 137, 148, 9, 60, 13, 7, 178, 79, 43, 136, 34, 68, 118, 152, 49, 15, 99, 61, 66, 28, 109, 125, 33, 167, 81, 93, 97, 26, 35, 30, 153, 131, 122, 71, 107, 130, 76, 4, 95, 42, 58, 134, 0, 89, 75, 40, 129, 31, 80, 101, 52, 16, 142, 44, 138, 46, 116, 27, 82, 88, 143, 128, 72, 29, 83, 117, 172, 14, 51, 159, 48, 160, 100, 1, 102, 90, 22, 3, 114, 19, 108, 113, 39, 73, 111, 155, 106, 105, 91, 150, 54, 25, 135, 139, 147, 36, 56, 123, 6, 67, 104, 96, 157, 10, 62, 164, 86, 74, 133, 120, 174, 53, 140, 156, 171, 149, 127, 85, 59, 124, 84, 11, 21, 132, 41, 145, 158, 32, 17, 23, 50, 169, 170, 38, 18, 151, 24, 166, 175, 2, 47, 57, 98, 20, 177, 161, 154, 176, 163, 37, 110, 168, 141, 64, 65, 173, 162, 121, 45, 77, 115, 179, 63, 119, 146, 144

The first to fifteenth examples of the GW pattern for the LDPC code with a code length N of 64 kbits can also be applied to any combination of an LDPC code with a code length N of 64 kbits and an arbitrary coding rate r and an arbitrary modulation method (constellation).

However, for group-wise interleaving, a GW pattern to be applied can be set for each combination of the code length N of an LDPC code, the coding rate r of an LDPC code, and a modulation method (constellation). In this case, it is possible to further reduce an error rate for each combination.

In particular, the GW pattern illustrated in FIG. 97 can be applied to, for example, a combination of the ETRI code with (64 k, 5/15) and QPSK to achieve a low error rate.

In particular, the GW pattern illustrated in FIG. 98 can be applied to, for example, a combination of the ETRI code with (64 k, 5/15) and 16QAM to achieve a low error rate.

In particular, the GW pattern illustrated in FIG. 99 can be applied to, for example, a combination of the ETRI code with (64 k, 5/15) and 64QAM to achieve a low error rate.

In particular, the GW pattern illustrated in FIG. 100 can be applied to, for example, a combination of the Sony code with (64 k, 7/15) and QPSK to achieve a low error rate.

In particular, the GW pattern illustrated in FIG. 101 can be applied to, for example, a combination of the Sony code with (64 k, 7/15) and 16QAM to achieve a low error rate.

In particular, the GW pattern illustrated in FIG. 102 can be applied to, for example, a combination of the Sony code with (64 k, 7/15) and 64QAM to achieve a low error rate.

In particular, the GW pattern illustrated in FIG. 103 can be applied to, for example, a combination of the Sony code with (64 k, 9/15) and QPSK to achieve a low error rate.

In particular, the GW pattern illustrated in FIG. 104 can be applied to, for example, a combination of the Sony code with (64 k, 9/15) and 16QAM to achieve a low error rate.

In particular, the GW pattern illustrated in FIG. 105 can be applied to, for example, a combination of the Sony code with (64 k, 9/15) and 64QAM to achieve a low error rate.

In particular, the GW pattern illustrated in FIG. 106 can be applied to, for example, a combination of the Sony code with (64 k, 11/15) and QPSK to achieve a low error rate.

In particular, the GW pattern illustrated in FIG. 107 can be applied to, for example, a combination of the Sony code with (64 k, 11/15) and 16QAM to achieve a low error rate.

In particular, the GW pattern illustrated in FIG. 108 can be applied to, for example, a combination of the Sony code with (64 k, 11/15) and 64QAM to achieve a low error rate.

In particular, the GW pattern illustrated in FIG. 109 can be applied to, for example, a combination of the Sony code with (64 k, 13/15) and QPSK to achieve a low error rate.

In particular, the GW pattern illustrated in FIG. 110 can be applied to, for example, a combination of the Sony code with (64 k, 13/15) and 16QAM to achieve a low error rate.

In particular, the GW pattern illustrated in FIG. 111 can be applied to, for example, a combination of the Sony code with (64 k, 13/15) and 64QAM to achieve a low error rate.

Figure 112:
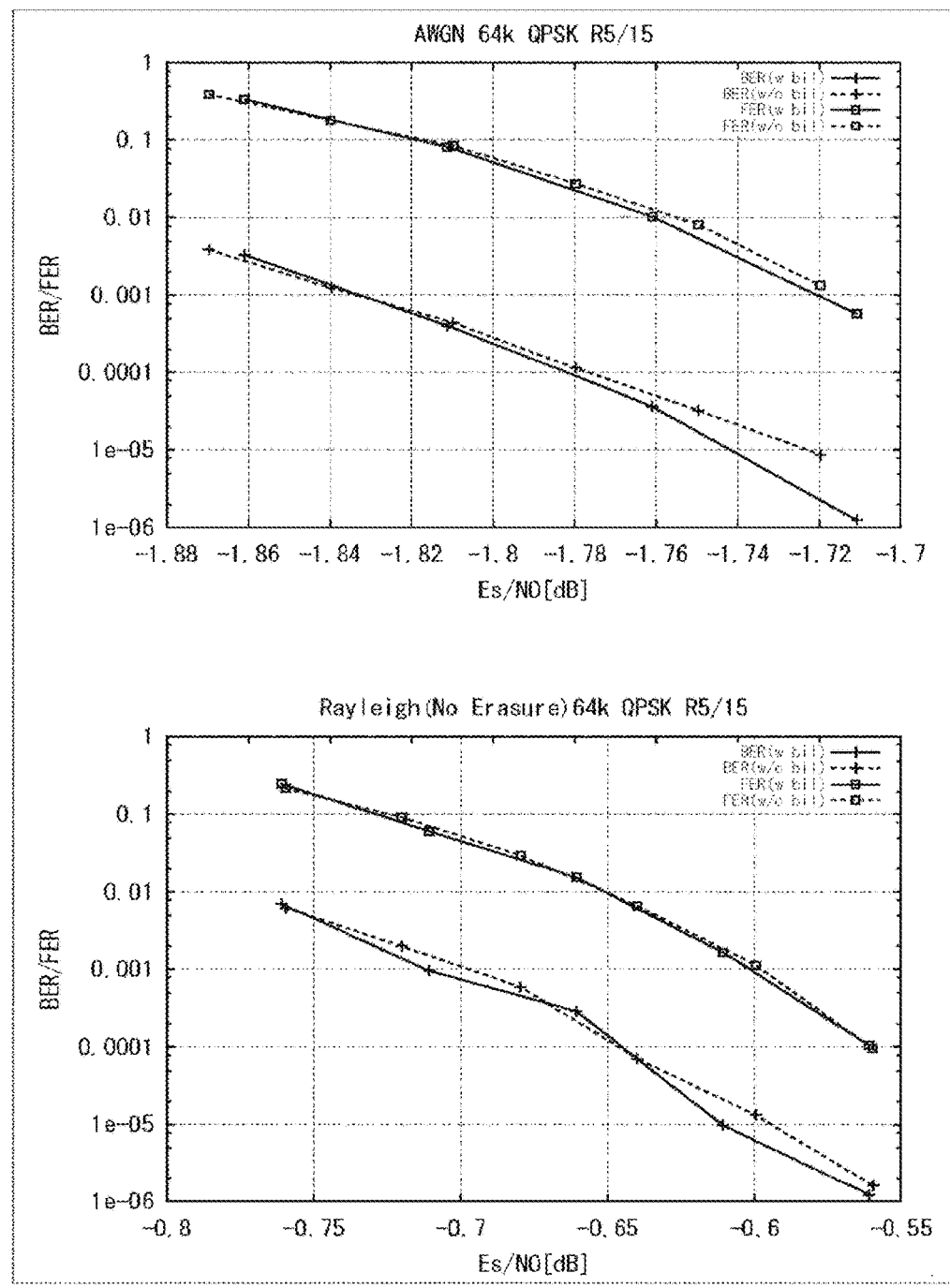
FIG. 112 is a diagram illustrating the results of a simulation for measuring an error rate.

FIG. 112 is a diagram illustrating a BER/FER curve as the result of a simulation which measures an error rate when the GW pattern illustrated in FIG. 97 is applied to a combination of the ETRI code with (64 k, 5/15) and QPSK.

Figure 113:
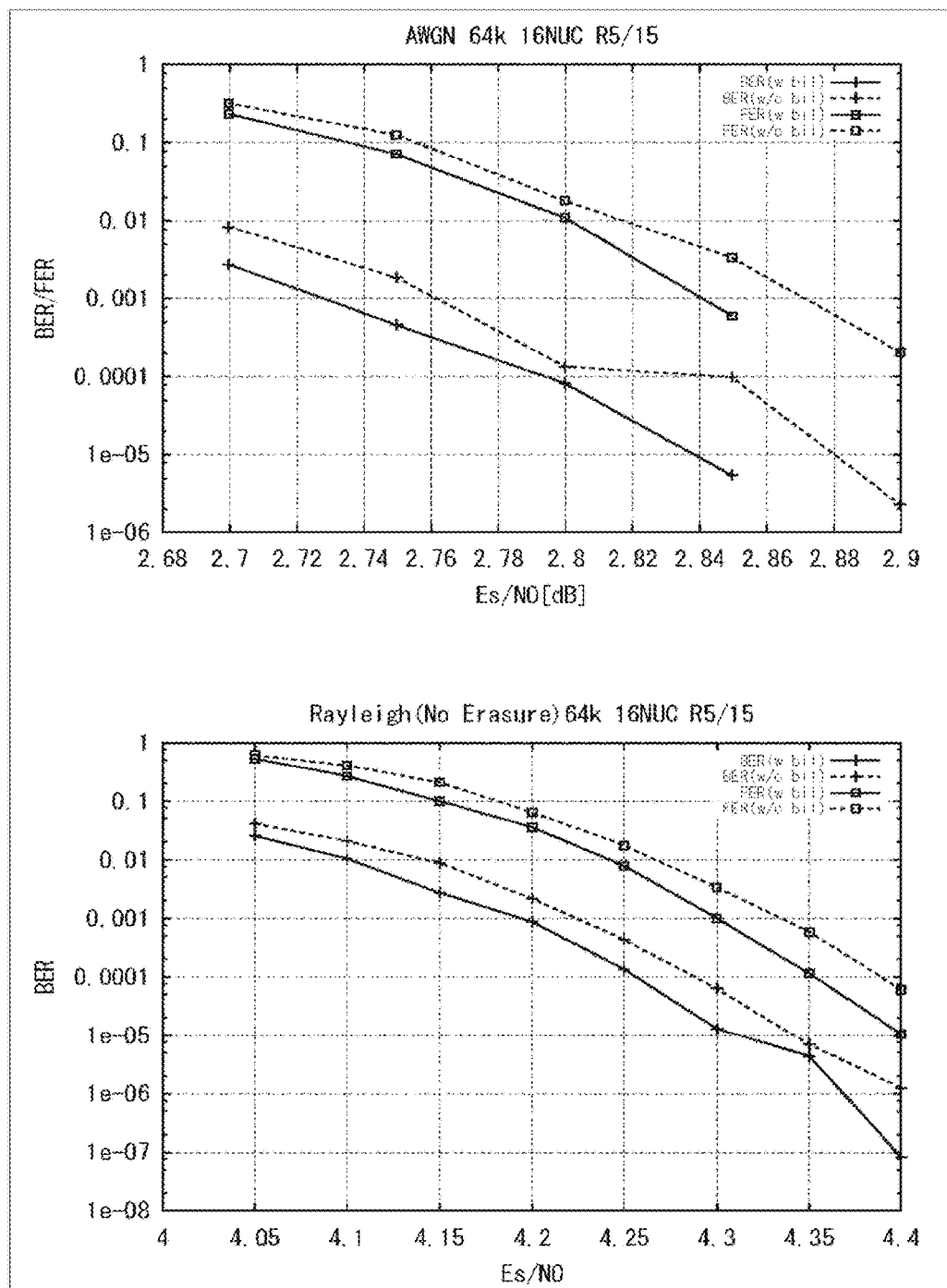
FIG. 113 is a diagram illustrating the results of a simulation for measuring an error rate.

FIG. 113 is a diagram illustrating a BER/FER curve as the result of a simulation which measures an error rate when the GW pattern illustrated in FIG. 98 is applied to a combination of the ETRI code with (64 k, 5/15) and 16QAM.

Figure 114:
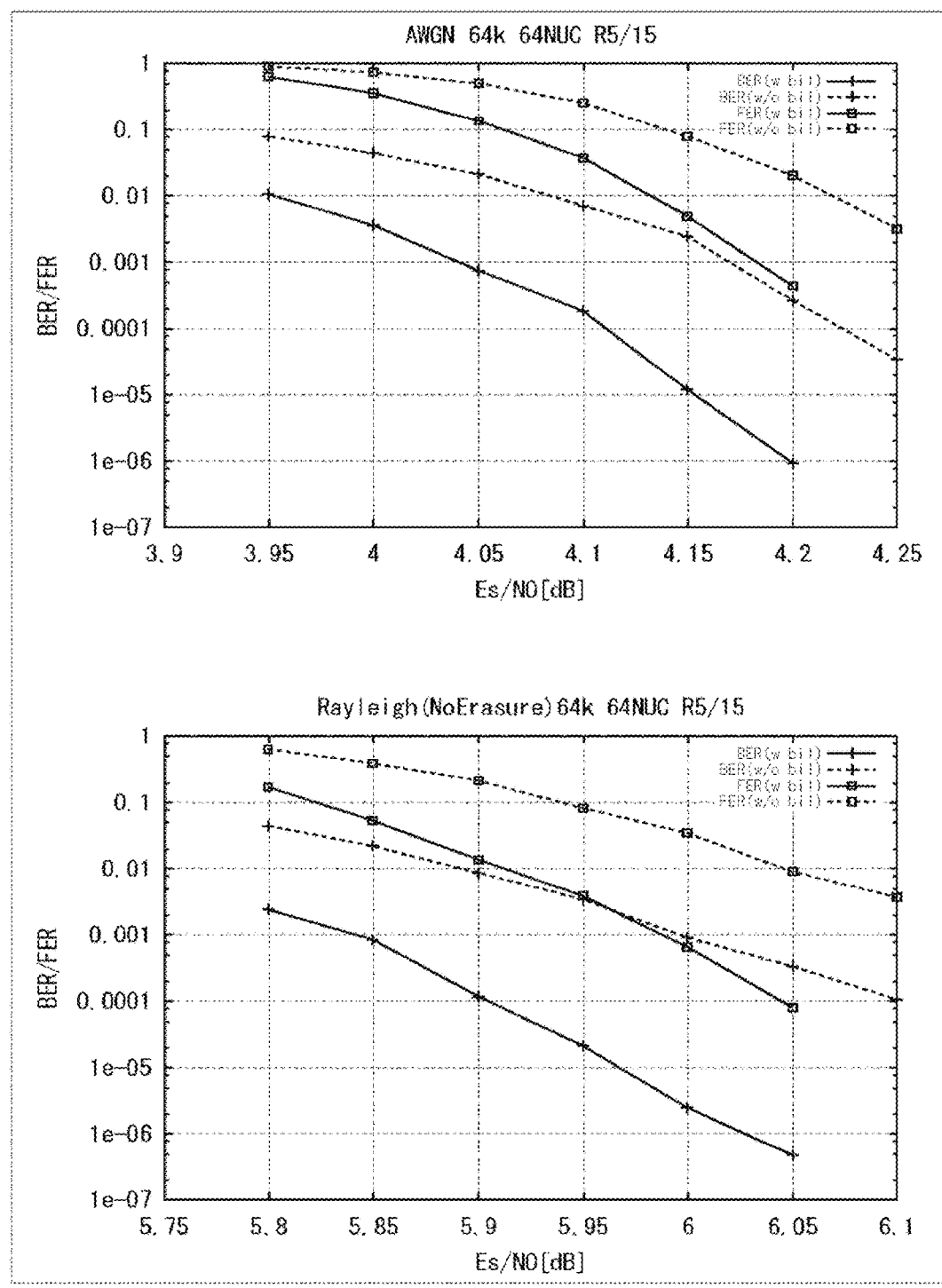
FIG. 114 is a diagram illustrating the results of a simulation for measuring an error rate.

FIG. 114 is a diagram illustrating a BER/FER curve as the result of a simulation which measures an error rate when the GW pattern illustrated in FIG. 99 is applied to a combination of the ETRI code with (64 k, 5/15) and 64QAM.

Figure 115:
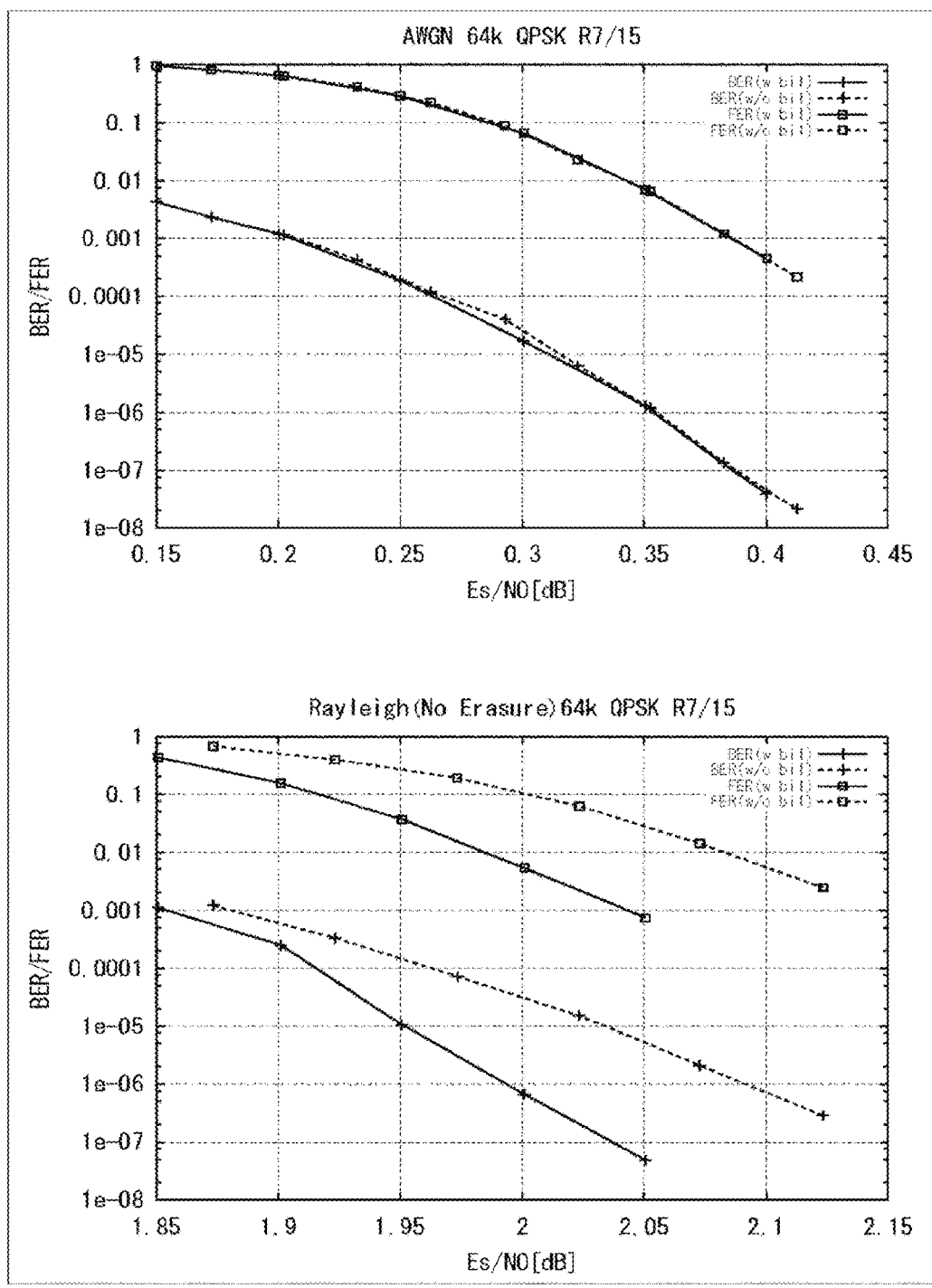
FIG. 115 is a diagram illustrating the results of a simulation for measuring an error rate.

FIG. 115 is a diagram illustrating a BER/FER curve as the result of a simulation which measures an error rate when the GW pattern illustrated in FIG. 100 is applied to a combination of the Sony code with (64 k, 7/15) and QPSK.

Figure 116:
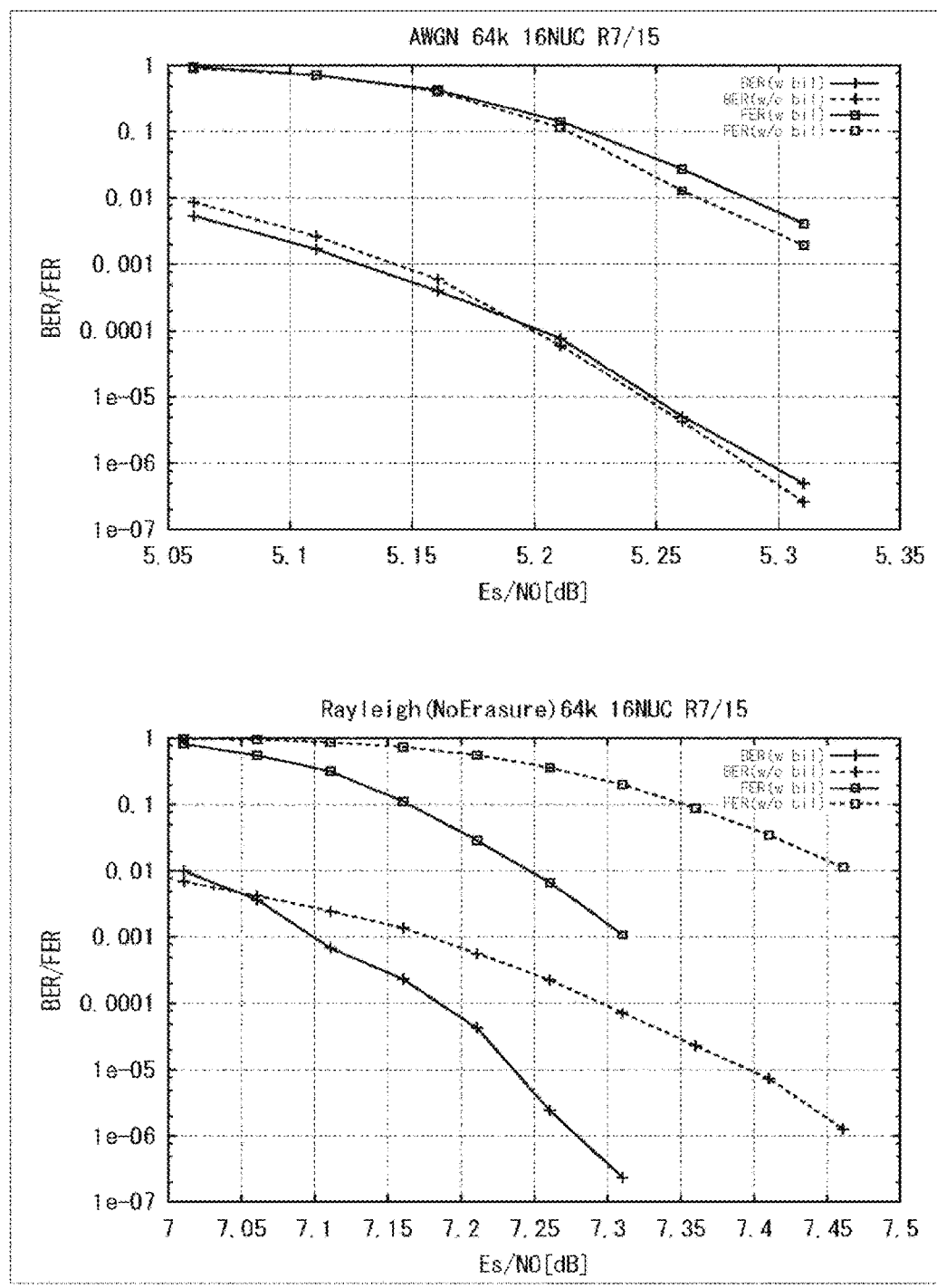
FIG. 116 is a diagram illustrating the results of a simulation for measuring an error rate.

FIG. 116 is a diagram illustrating a BER/FER curve as the result of a simulation which measures an error rate when the GW pattern illustrated in FIG. 101 is applied to a combination of the Sony code with (64 k, 7/15) and 16QAM.

Figure 117:
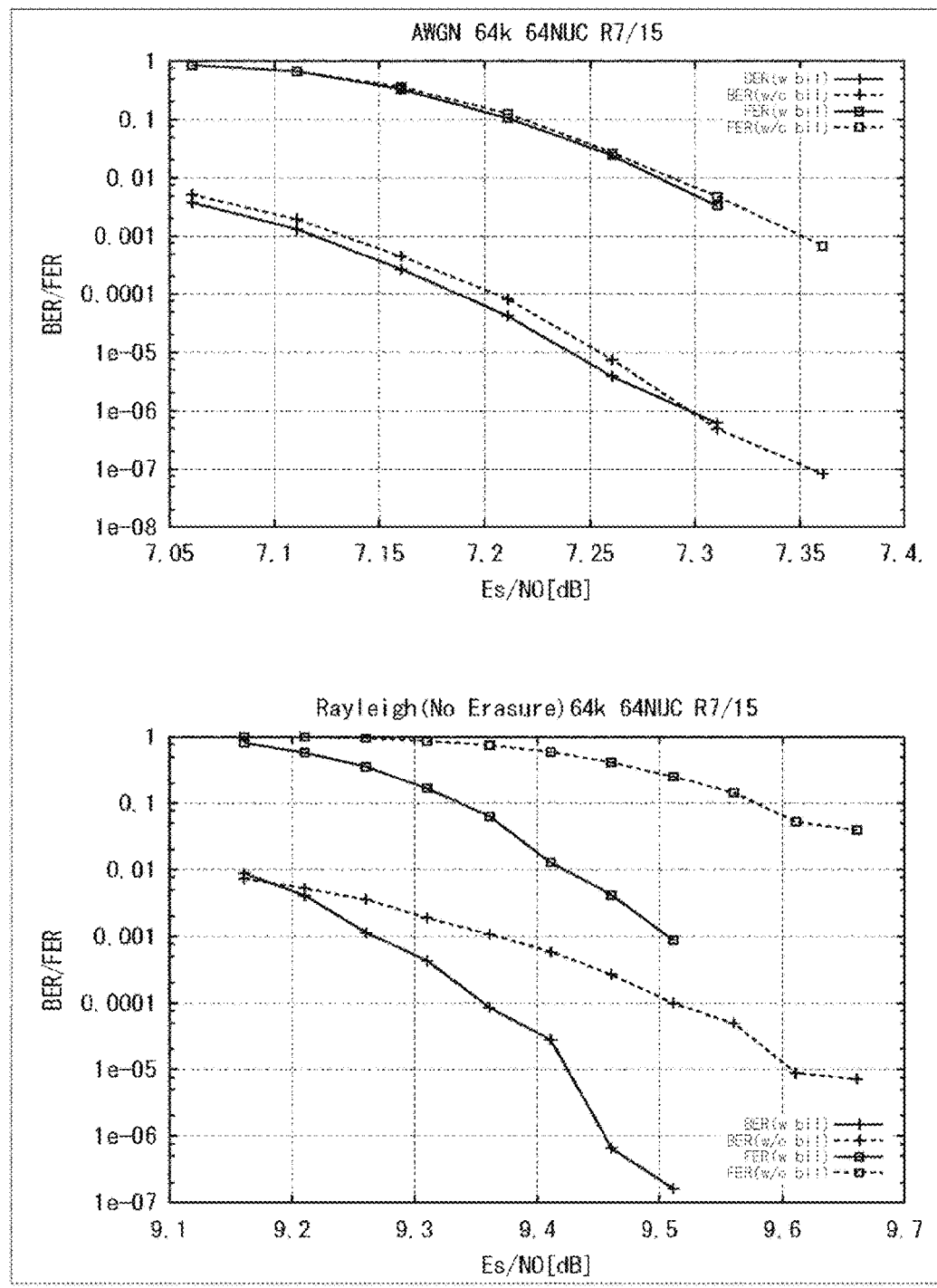
FIG. 117 is a diagram illustrating the results of a simulation for measuring an error rate.

FIG. 117 is a diagram illustrating a BER/FER curve as the result of a simulation which measures an error rate when the GW pattern illustrated in FIG. 102 is applied to a combination of the Sony code with (64 k, 7/15) and 64QAM.

Figure 118:
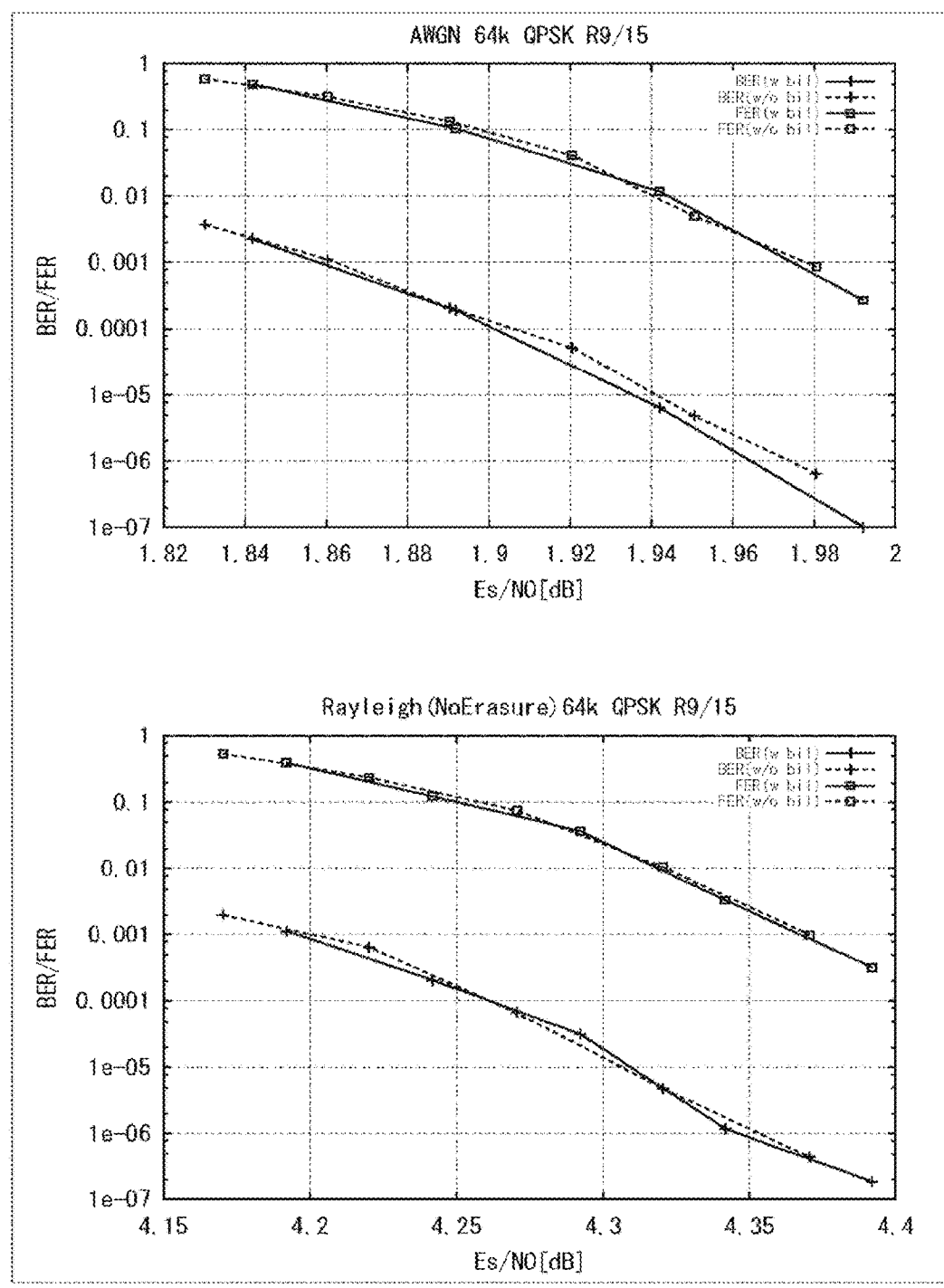
FIG. 118 is a diagram illustrating the results of a simulation for measuring an error rate.

FIG. 118 is a diagram illustrating a BER/FER curve as the result of a simulation which measures an error rate when the GW pattern illustrated in FIG. 103 is applied to a combination of the Sony code with (64 k, 9/15) and QPSK.

Figure 119:
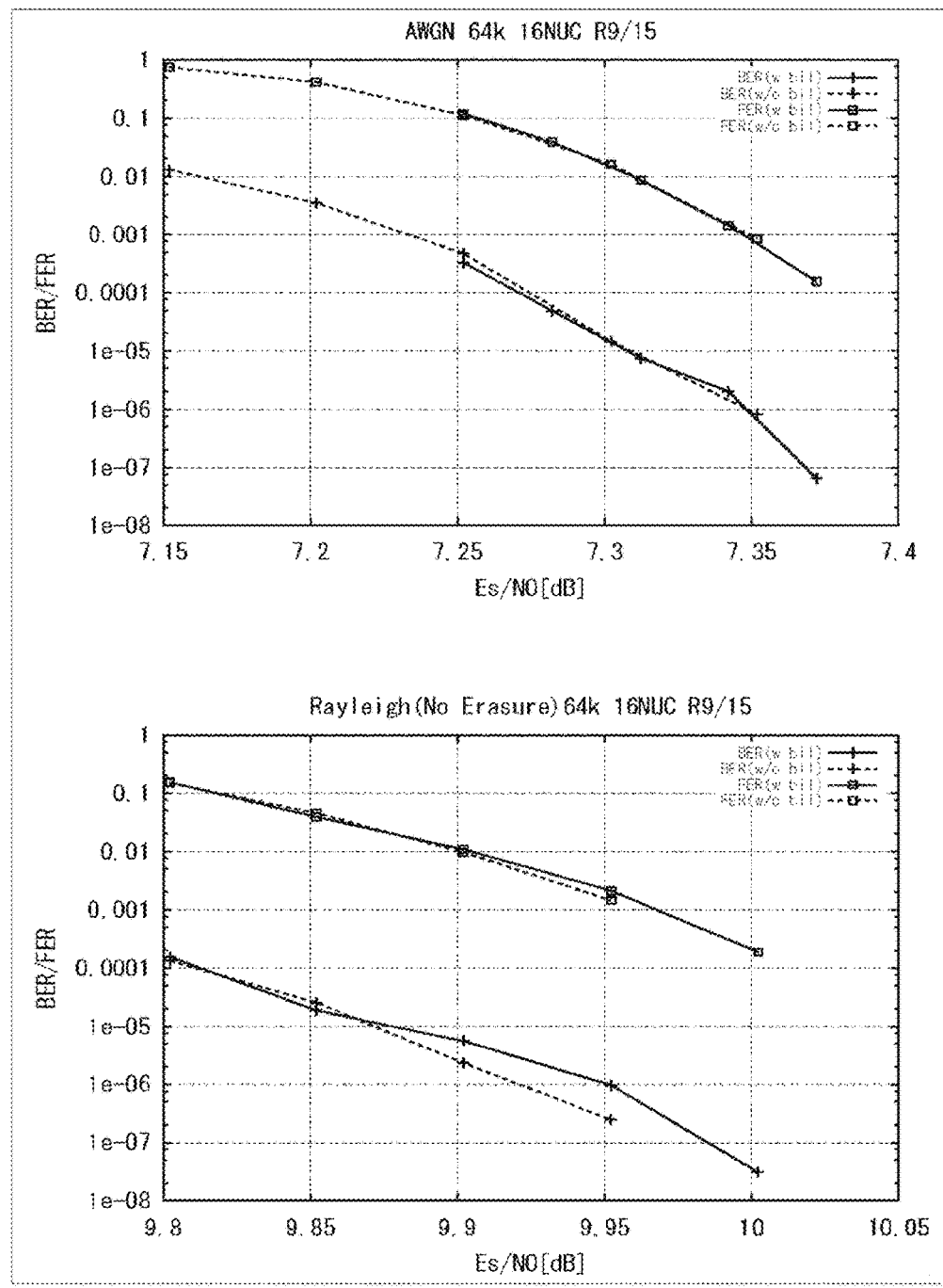
FIG. 119 is a diagram illustrating the results of a simulation for measuring an error rate.

FIG. 119 is a diagram illustrating a BER/FER curve as the result of a simulation which measures an error rate when the GW pattern illustrated in FIG. 104 is applied to a combination of the Sony code with (64 k, 9/15) and 16QAM.

Figure 120:
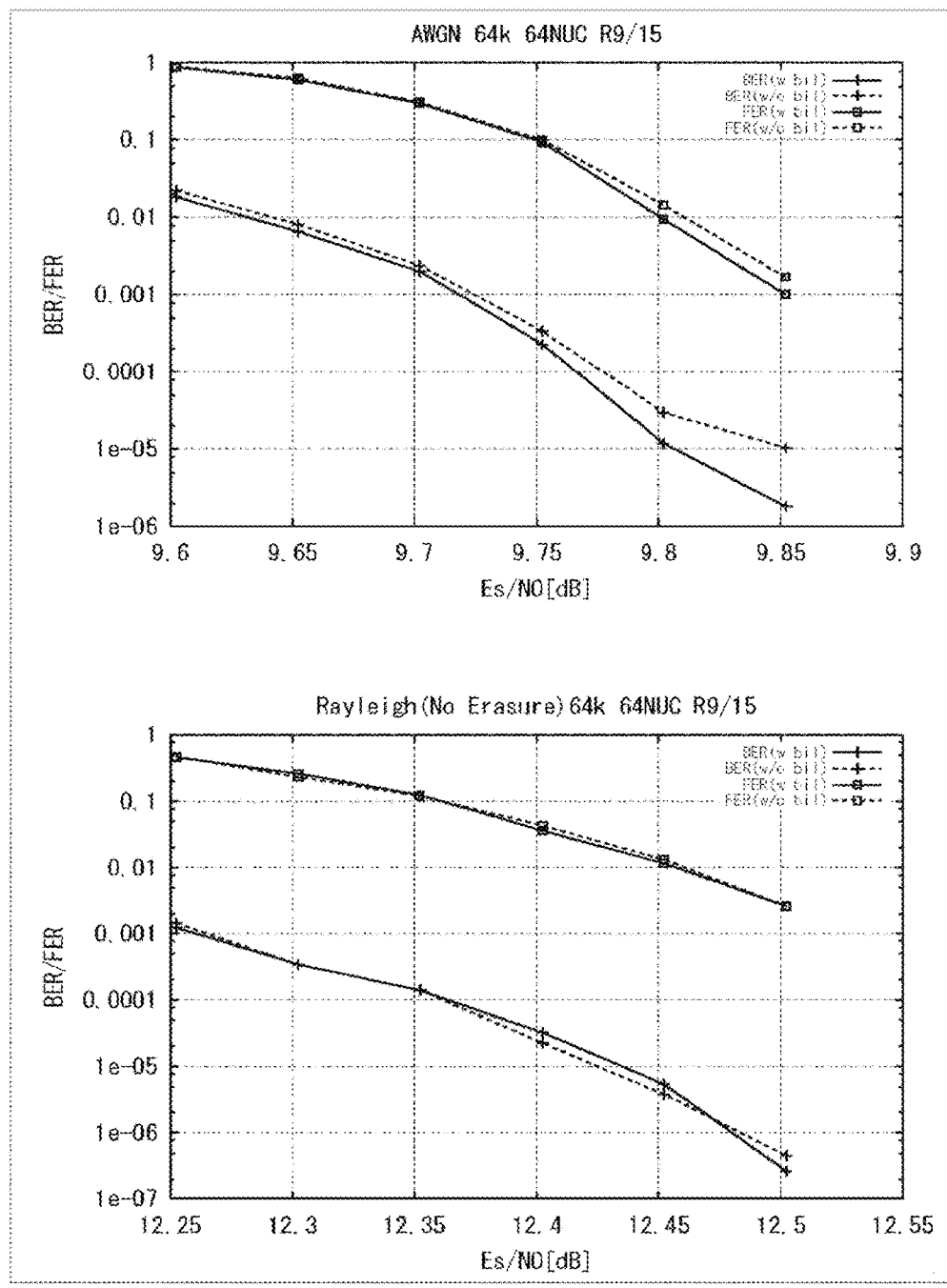
FIG. 120 is a diagram illustrating the results of a simulation for measuring an error rate.

FIG. 120 is a diagram illustrating a BER/FER curve as the result of a simulation which measures an error rate when the GW pattern illustrated in FIG. 105 is applied to a combination of the Sony code with (64 k, 9/15) and 64QAM.

Figure 121:
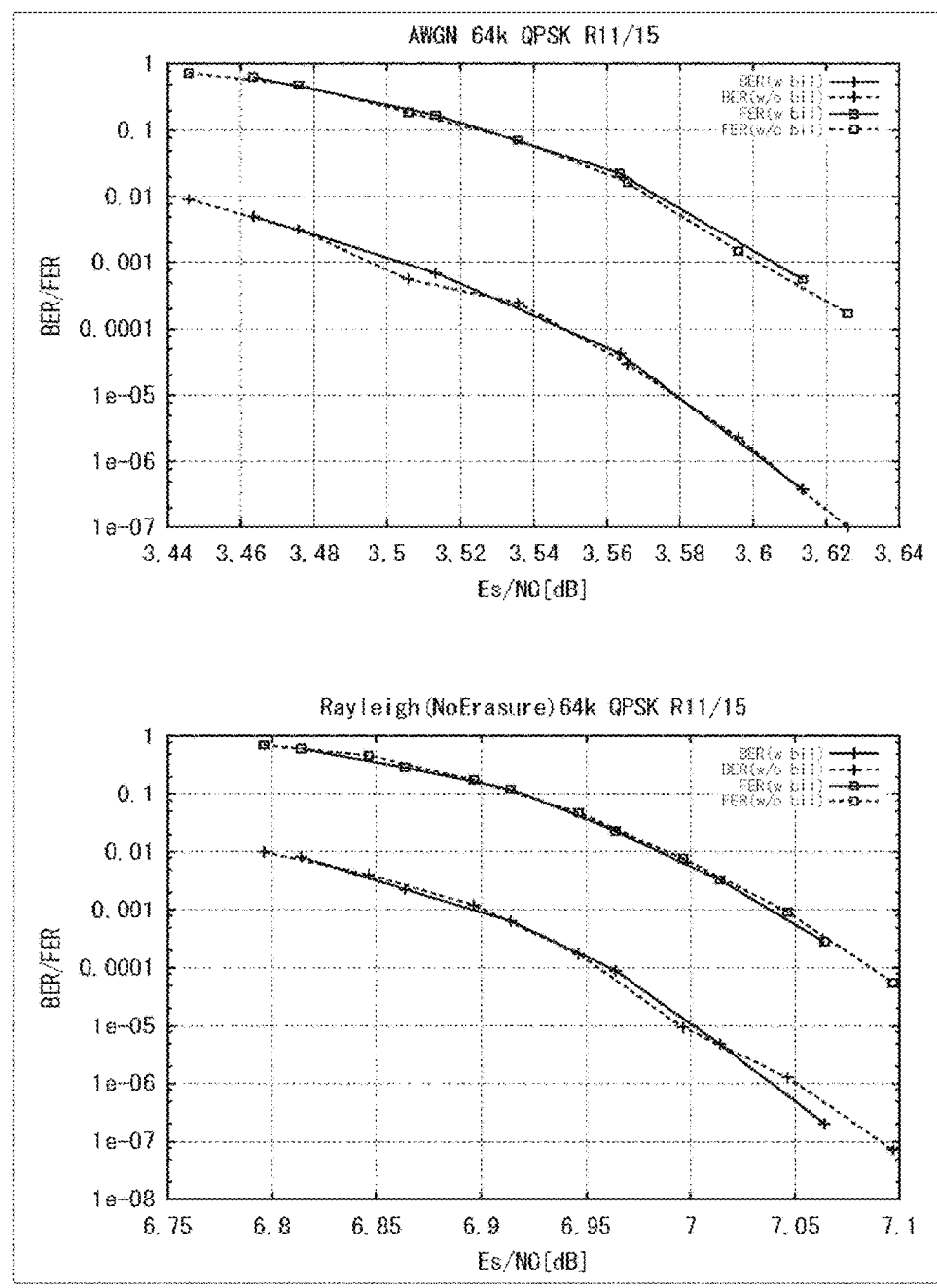
FIG. 121 is a diagram illustrating the results of a simulation for measuring an error rate.

FIG. 121 is a diagram illustrating a BER/FER curve as the result of a simulation which measures an error rate when the GW pattern illustrated in FIG. 106 is applied to a combination of the Sony code with (64 k, 11/15) and QPSK.

Figure 122:
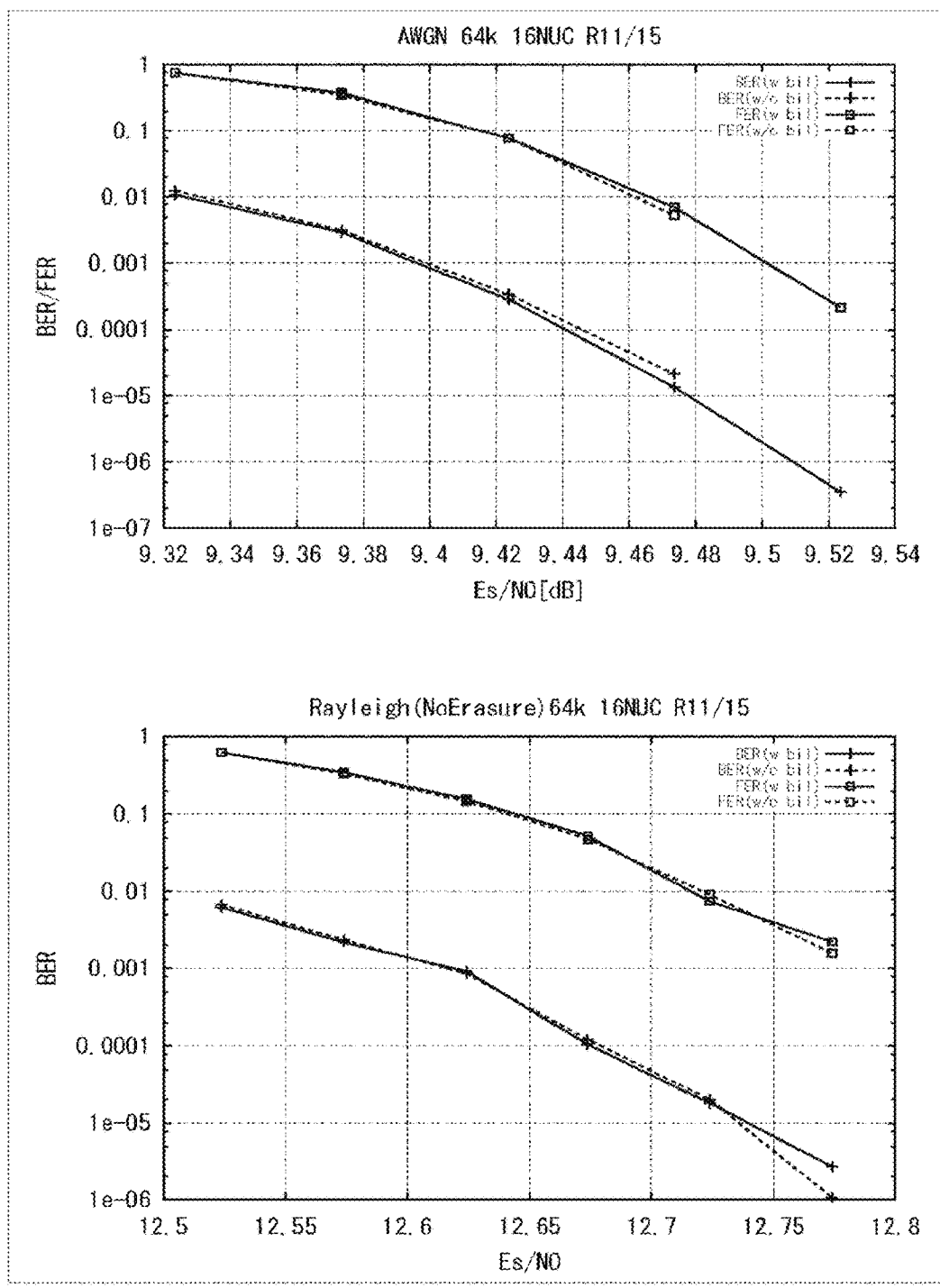
FIG. 122 is a diagram illustrating the results of a simulation for measuring an error rate.

FIG. 122 is a diagram illustrating a BER/FER curve as the result of a simulation which measures an error rate when the GW pattern illustrated in FIG. 107 is applied to a combination of the Sony code with (64 k, 11/15) and 16QAM.

Figure 123:
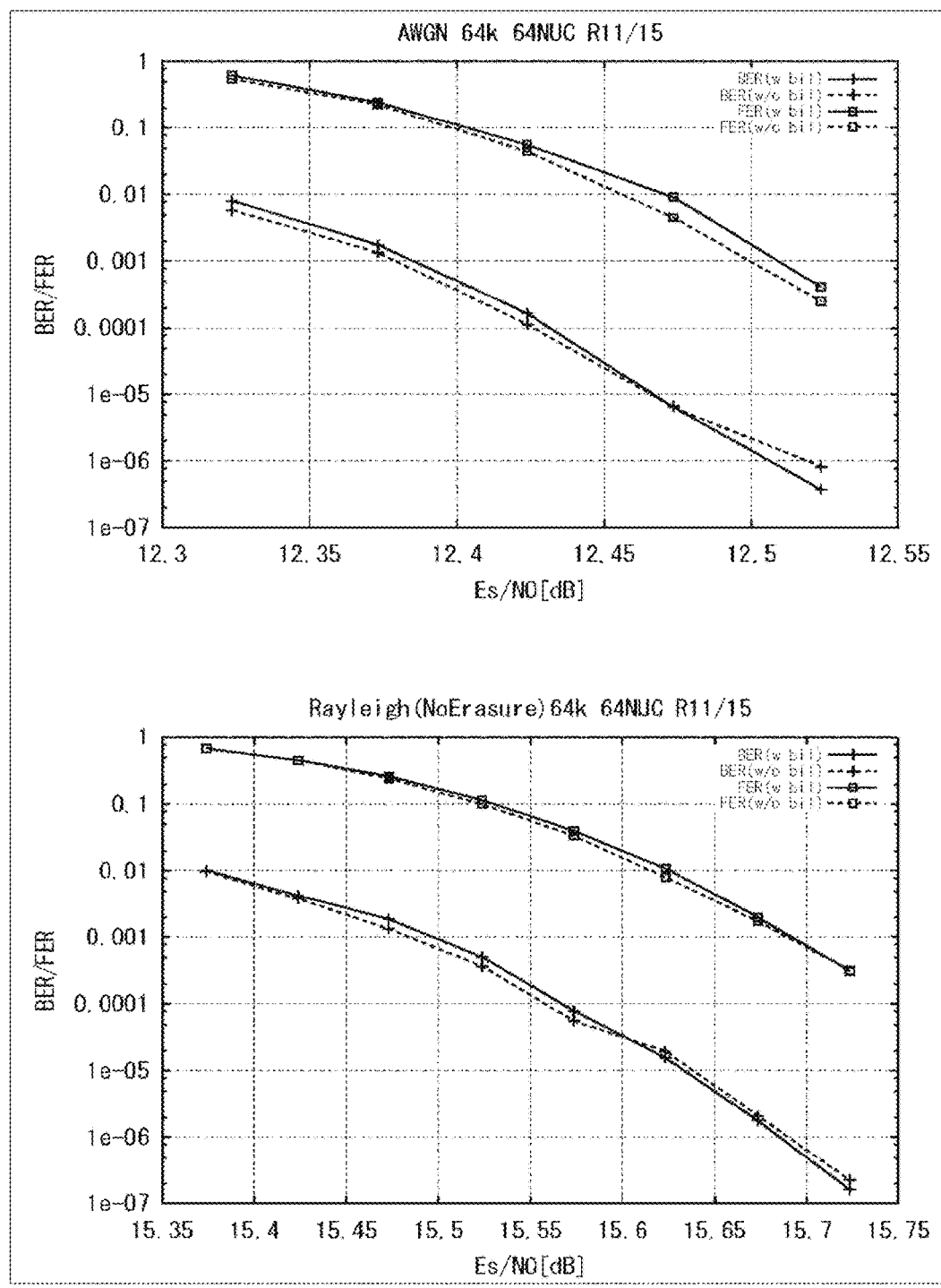
FIG. 123 is a diagram illustrating the results of a simulation for measuring an error rate.

FIG. 123 is a diagram illustrating a BER/FER curve as the result of a simulation which measures an error rate when the GW pattern illustrated in FIG. 108 is applied to a combination of the Sony code with (64 k, 11/15) and 64QAM.

Figure 124:
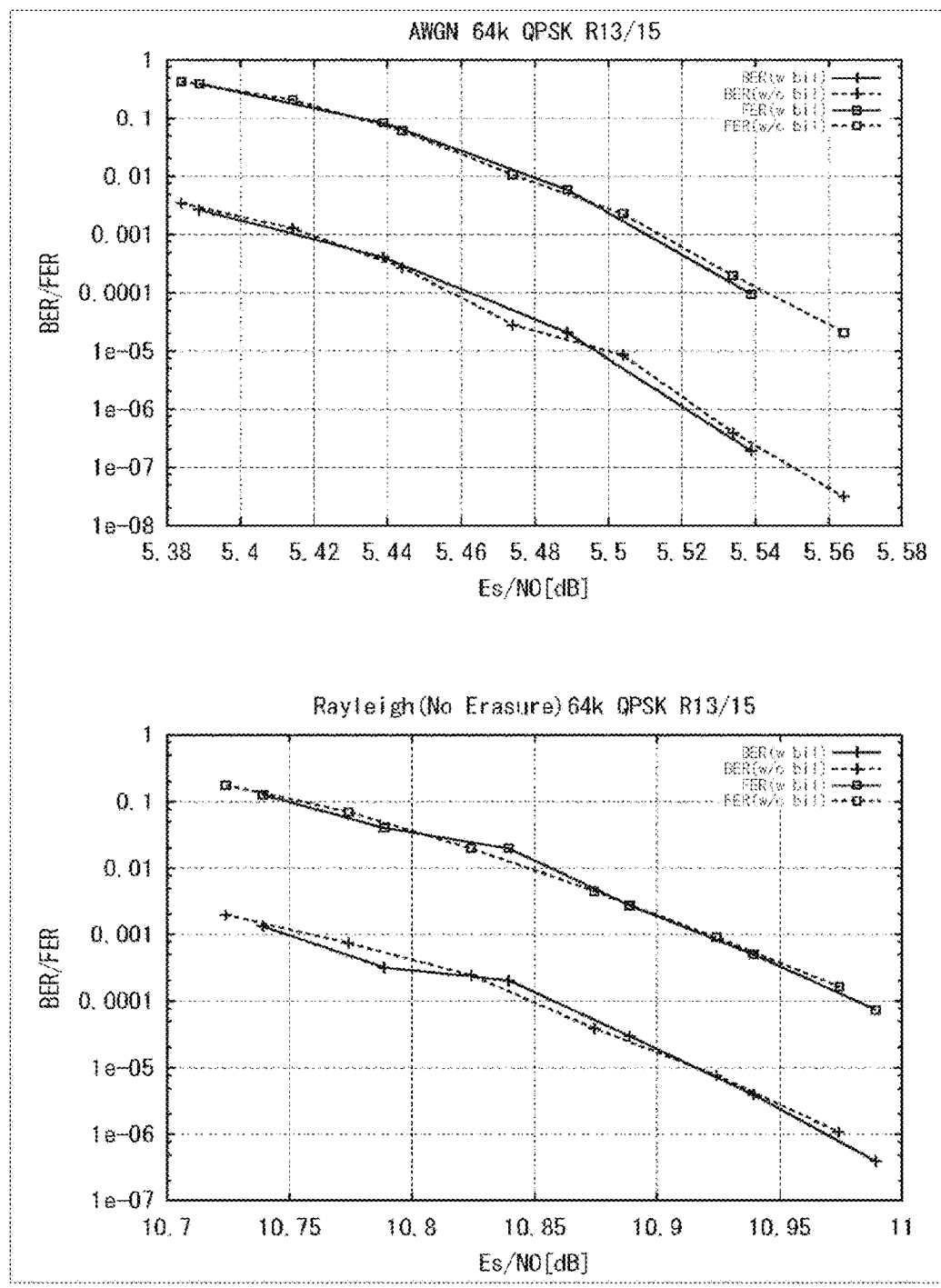
FIG. 124 is a diagram illustrating the results of a simulation for measuring an error rate.

FIG. 124 is a diagram illustrating a BER/FER curve as the result of a simulation which measures an error rate when the GW pattern illustrated in FIG. 109 is applied to a combination of the Sony code with (64 k, 13/15) and QPSK.

Figure 125:
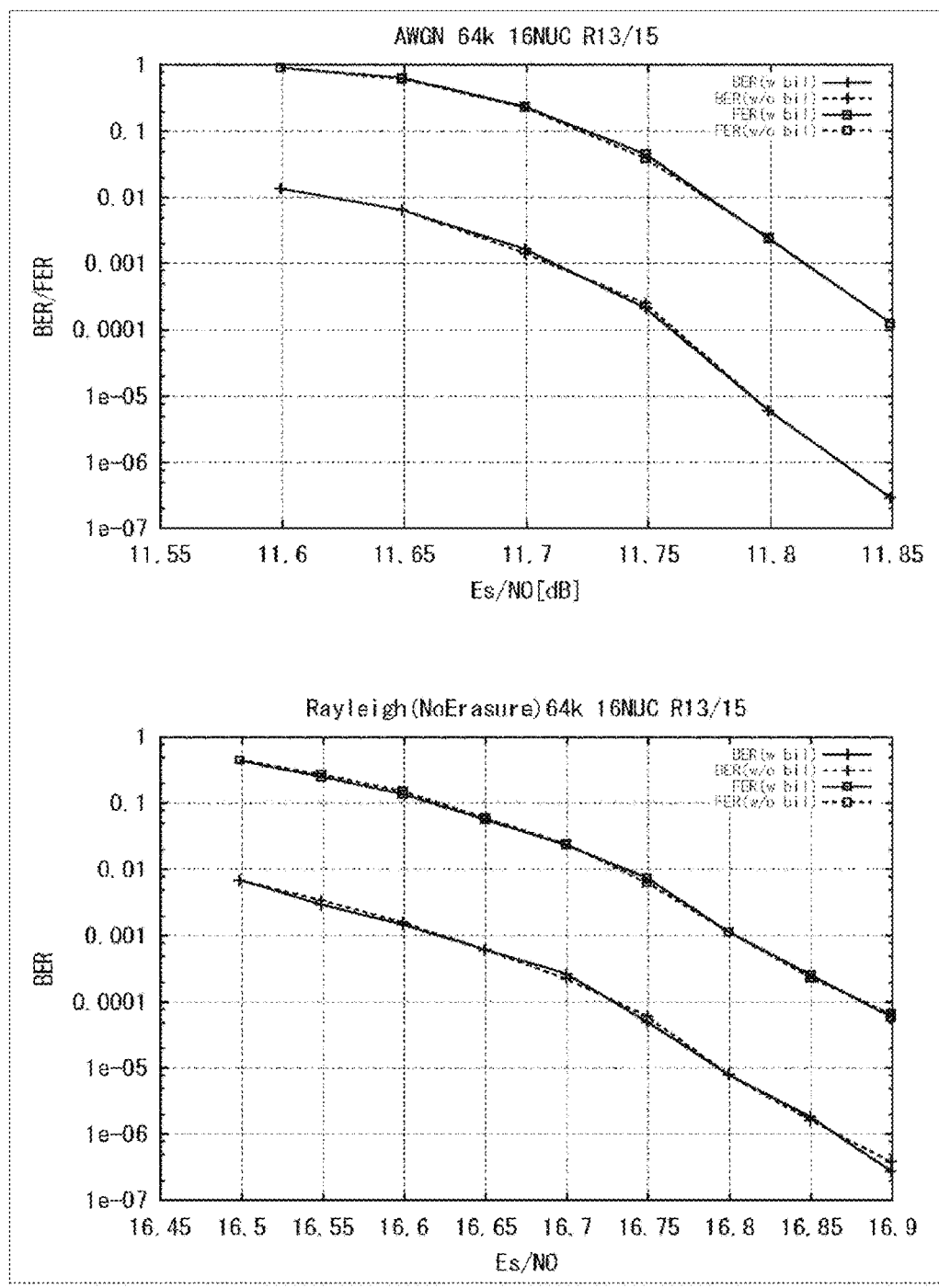
FIG. 125 is a diagram illustrating the results of a simulation for measuring an error rate.

FIG. 125 is a diagram illustrating a BER/FER curve as the result of a simulation which measures an error rate when the GW pattern illustrated in FIG. 110 is applied to a combination of the Sony code with (64 k, 13/15) and 16QAM.

Figure 126:
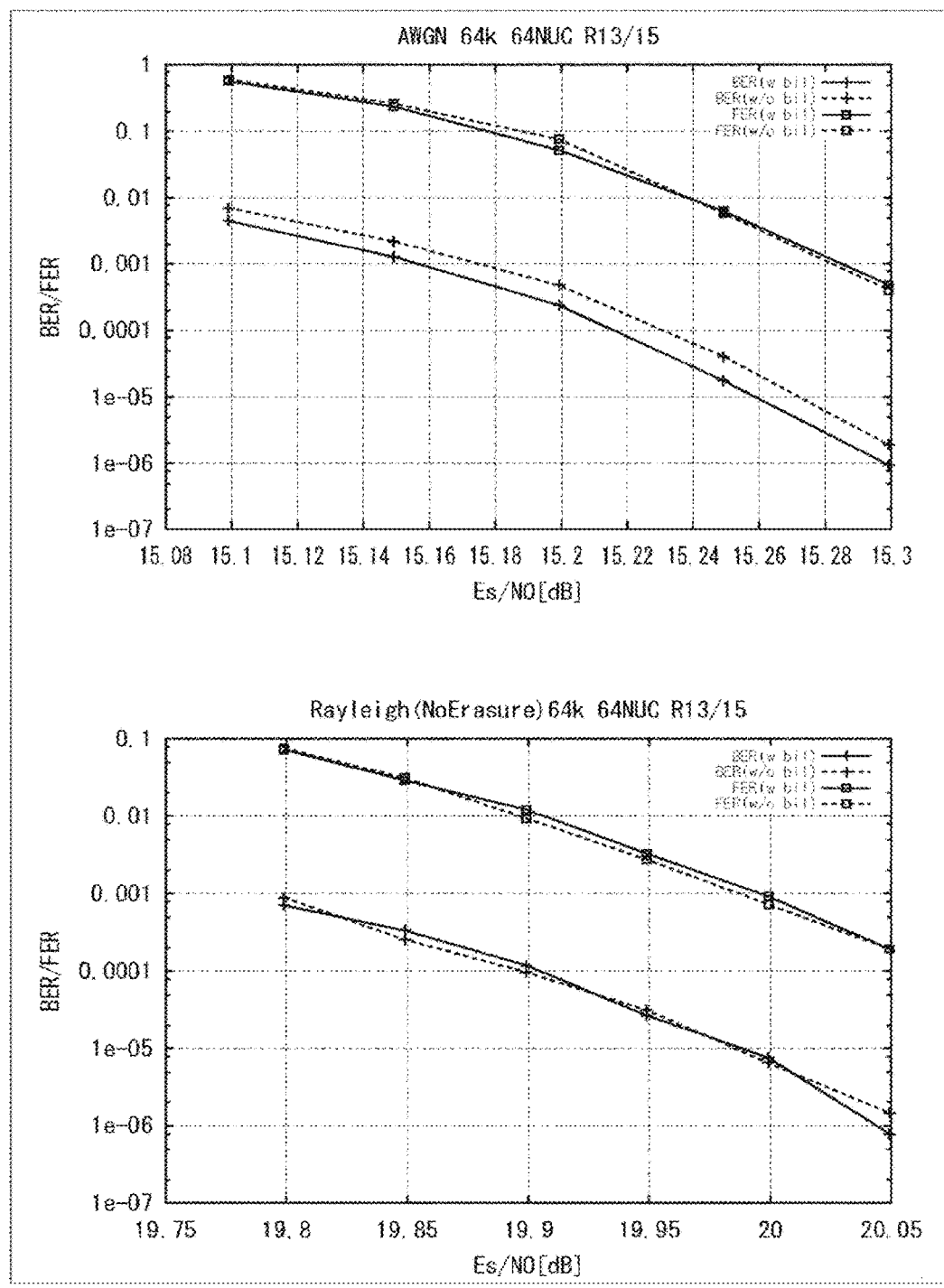
FIG. 126 is a diagram illustrating the results of a simulation for measuring an error rate.

FIG. 126 is a diagram illustrating a BER/FER curve as the result of a simulation which measures an error rate when the GW pattern illustrated in FIG. 111 is applied to a combination of the Sony code with (64 k, 13/15) and 64QAM.

FIGS. 112 to 126 illustrate BER/FER curves when an AWGN channel is used as the communication path 13 (FIG. 7) (upper graphs) and when a Rayleigh (fading) channel is used as the communication path 13 (lower graphs).

In FIGS. 112 to 126, solid lines (w bil) indicate BER/FER curves when parity interleaving, group-wise interleaving, and block-wise interleaving are performed and dotted lines (w/o bil) indicate BER/FER curves when parity interleaving, group-wise interleaving, and block-wise interleaving are not performed.

As can be seen from FIGS. 112 to 126, when parity interleaving, group-wise interleaving, and block-wise interleaving are performed, it is possible to improve BER/FER and to achieve a low error rate, as compared to a case in which parity interleaving, group-wise interleaving, and block-wise interleaving are not performed.

The GW patterns illustrated in FIGS. 97 to 111 can be applied to, for example, constellations obtained by symmetrically moving the signal point constellations illustrated in FIGS. 87 to 89 with respect to the I-axis or the Q-axis, constellations obtained by symmetrically moving the signal point constellations with respect to the origin, and constellations obtained by rotating the signal point constellations about the origin by an arbitrary angle, in addition to the signal point constellations of QPSK, 16QAM, and 64QAM illustrated in FIGS. 87 to 89. In this case, it is possible to obtain the same effect as that when the GW patterns are applied to the signal point constellations of QPSK, 16QAM, and 64QAM illustrated in FIGS. 87 to 89.

In addition, the GW patterns illustrated in FIGS. 97 to 111 can be applied to, for example, constellations obtained by interchanging the most significant bit (MSB) and the least significant bit (LSB) of the symbols corresponding (allocated) to the signal points in the signal point constellations illustrated in FIGS. 87 to 89, in addition to the signal point constellations of QPSK, 16QAM, and 64QAM illustrated in FIGS. 87 to 89. In this case, it is possible to obtain the same effect as that when the GW patterns are applied to the signal point constellations of QPSK, 16QAM, and 64QAM illustrated in FIGS. 87 to 89.

<Example of Structure of Receiving Device 12>

Figure 127:
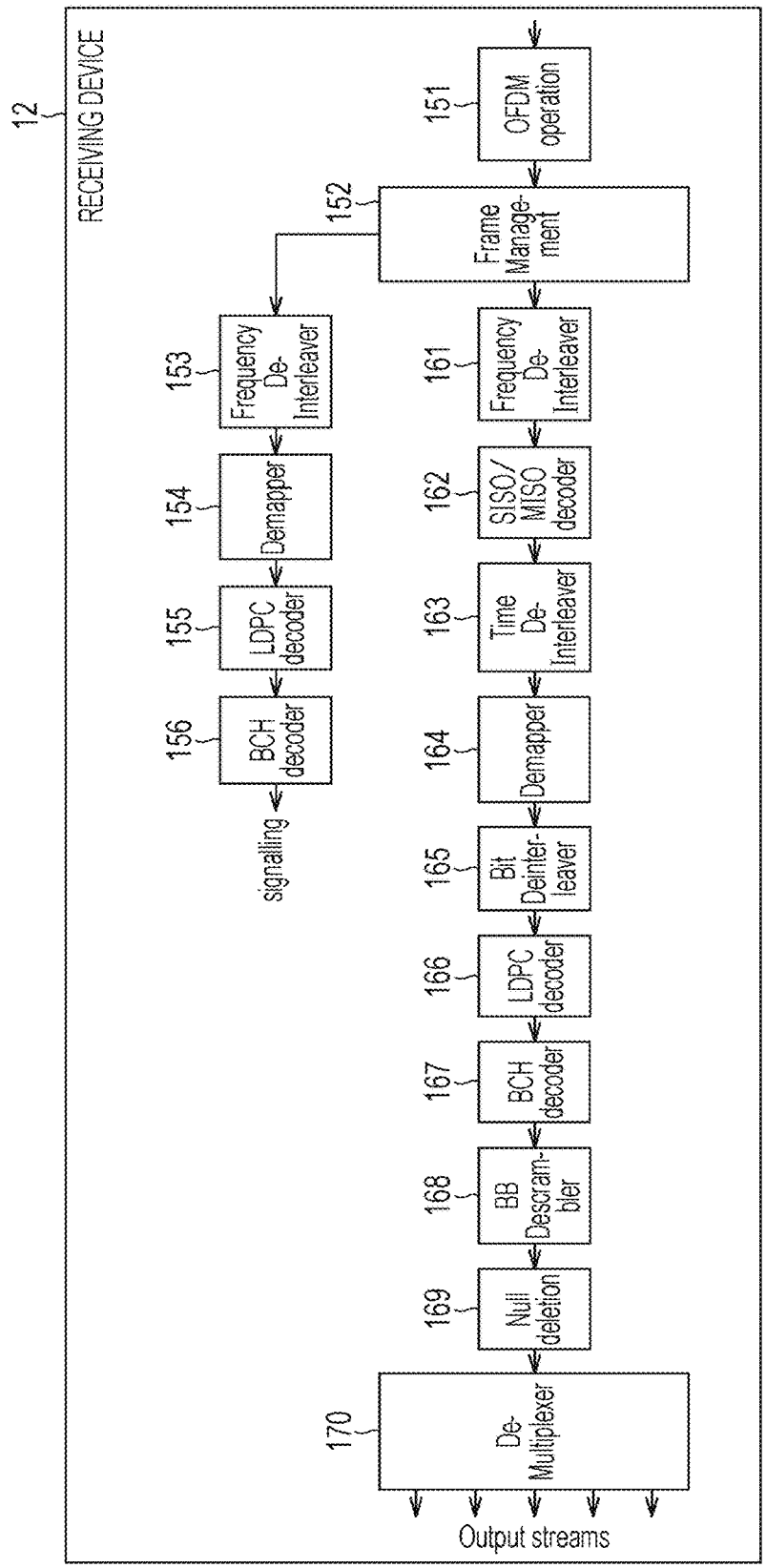
FIG. 127 is a block diagram illustrating an example of the structure of a receiving device 12.

FIG. 127 is a block diagram illustrating an example of the structure of the receiving device 12 illustrated in FIG. 7.

An OFDM processing (OFDM operation) unit 151 receives an OFDM signal from the transmitting device 11 (FIG. 7) and performs signal processing for the OFDM signal. Data which is obtained by the signal processing of the OFDM processing unit 151 is supplied to a frame management unit 152.

The frame management unit 152 processes (interprets) a frame which is formed by the data supplied from the OFDM processing unit 151 and supplies a target data signal obtained by the processing and a control data signal to frequency deinterleavers 161 and 153.

The frequency deinterleaver 153 performs frequency deinterleaving for the data from the frame management unit 152 in units of symbols and supplies the data to a demapper 154.

The demapper 154 performs demapping (signal point constellation decoding) for the data (data on the constellation) transmitted from the frequency deinterleaver 153, on the basis of the signal point constellation which is determined by the quadrature modulation performed by the transmitting device 11, to perform quadrature demodulation and supplies data obtained by the quadrature demodulation ((the likelihood of) the LDPC code) to an LDPC decoder 155.

The LDPC decoder 155 decodes the LDPC code from the demapper 154 and supplies LDPC target data (here, a BCH code) obtained by the decoding to a BCH decoder 156.

The BCH decoder 156 performs BCH decoding for the LDPC target data from the LDPC decoder 155 and outputs control data (signaling) obtained by the BCH decoding.

The frequency deinterleaver 161 performs frequency deinterleaving for the data from the frame management unit 152 in units of symbols and supplies the data to a SISO/MISO decoder 162.

The SISO/MISO decoder 162 performs spatiotemporal decoding for the data transmitted from the frequency deinterleaver 161 and supplies the data to a time deinterleaver 163.

The time deinterleaver 163 performs time deinterleaving for the data transmitted from the SISO/MISO decoder 162 in units of symbols and supplies the data to a demapper 164.

The demapper 164 performs demapping (signal point constellation decoding) for the data (data on the constellation) transmitted from the time deinterleaver 163, on the basis of the signal point constellation which is determined by the quadrature modulation performed by the transmitting device 11, to perform quadrature demodulation and supplies data obtained by the quadrature demodulation to a bit deinterleaver 165.

The bit deinterleaver 165 performs bit deinterleaving for the data transmitted from the demapper 164 and supplies (the likelihood of) an LDPC code, which is bit-interleaved data, to an LDPC decoder 166.

The LDPC decoder 166 performs LDPC decoding for the LDPC code transmitted from the bit deinterleaver 165 and supplies LDPC target data (here, a BCH code) obtained by the LDPC decoding to a BCH decoder 167.

The BCH decoder 167 performs BCH decoding for the LDPC target data transmitted from the LDPC decoder 155 and supplies data obtained by the BCH decoding to a BB descrambler 168.

The BB descrambler 168 performs BB descrambling for the data transmitted from the BCH decoder 167 and supplies data obtained by the BB descrambling to a null deletion unit 169.

The null deletion unit 169 deletes null data inserted by the padder 112 illustrated in FIG. 8 from the data transmitted from the BB descrambler 168 and supplies the data to a demultiplexer 170.

The demultiplexer 170 separates one or more streams (target data) which are multiplexed into the data from the null deletion unit 169, performs necessary processing, and outputs the target data as output streams.

The receiving device 12 can be configured without some of the blocks illustrated in FIG. 127. That is, for example, when the transmitting device 11 (FIG. 8) is configured without the time interleaver 118, the SISO/MISO encoder 119, the frequency interleaver 120, and the frequency interleaver 124, the receiving device 12 can be configured without the time deinterleaver 163, the SISO/MISO decoder 162, the frequency deinterleaver 161, and the frequency deinterleaver 153 which are blocks corresponding to the time interleaver 118, the SISO/MISO encoder 119, the frequency interleaver 120, and the frequency interleaver 124 of the transmitting device 11, respectively.

<Example of Structure of Bit Deinterleaver 165>

Figure 128:
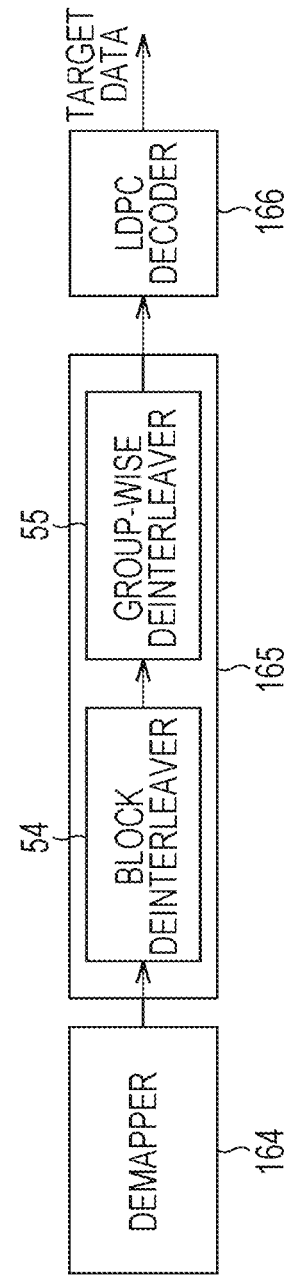
FIG. 128 is a block diagram illustrating an example of the structure of a bit deinterleaver 165.

FIG. 128 is a block diagram illustrating an example of the structure of the bit deinterleaver 165 illustrated in FIG. 127.

The bit deinterleaver 165 includes a block deinterleaver 54 and a group-wise deinterleaver 55 and performs (bit) deinterleaving for the symbol bits of symbols which are data from the demapper 164 (FIG. 127).

That is, the block deinterleaver 54 performs block deinterleaving (an inverse process of block interleaving) corresponding to the block interleaving which is performed by the block interleaver 25 illustrated in FIG. 9, that is, block deinterleaving which returns the positions of (the likelihood of) the code bits of the LDPC code rearranged by the block interleaving to the original positions, for the symbol bits of the symbols transmitted from the demapper 164 and supplies the LDPC code obtained by the block deinterleaving to the group-wise deinterleaver 55.

The group-wise deinterleaver 55 performs group-wise deinterleaving (an inverse process of group-wise interleaving) corresponding to the group-wise interleaving which is performed by the group-wise interleaver 24 illustrated in FIG. 9, that is, group-wise deinterleaving that returns the sequences of the code bits of the LDPC code, which are changed in units of bit groups by the group-wise interleaving described in FIG. 96, to the original sequences, for the LDPC code transmitted from the block deinterleaver 54, by rearranging the code bits in units of bit groups.

Here, when parity interleaving, group-wise interleaving, and block interleaving are performed for the LDPC code which is supplied from the demapper 164 to the bit deinterleaver 165, the bit deinterleaver 165 can perform all of parity deinterleaving corresponding to the parity interleaving (an inverse process of the parity interleaving, that is, parity deinterleaving which returns the sequence of the code bits of the LDPC code changed by the parity interleaving to the original sequence), block deinterleaving corresponding to the block interleaving, and group-wise deinterleaving corresponding to the group-wise interleaving.

In the bit deinterleaver 165 illustrated in FIG. 128, the block deinterleaver 54 which performs block deinterleaving corresponding to the block interleaving and the group-wise deinterleaver 55 which performs group-wise deinterleaving corresponding to the group-wise interleaving are provided. However, a block which performs parity deinterleaving corresponding to the parity interleaving is not provided. Therefore, parity deinterleaving is not performed.

Therefore, the LDPC code which has been subjected to block deinterleaving and group-wise deinterleaving, but has not been subjected to parity deinterleaving is supplied from (the group-wise deinterleaver 55 of) the bit deinterleaver 165 to the LDPC decoder 166.

The LDPC decoder 166 performs LDPC decoding for the LDPC code transmitted from the bit deinterleaver 165, using a transformed parity check matrix obtained by performing at least column permutation corresponding to parity interleaving for the parity check matrix H based on the DVB method which is used for LDPC coding by the LDPC encoder 115 illustrated in FIG. 8 (or the transformed parity check matrix (FIG. 29) obtained by performing row permutation for the parity check matrix (FIG. 27) based on the ETRI method), and outputs data obtained by the LDPC decoding as the decoding result of the LDPC target data.

Figure 129:
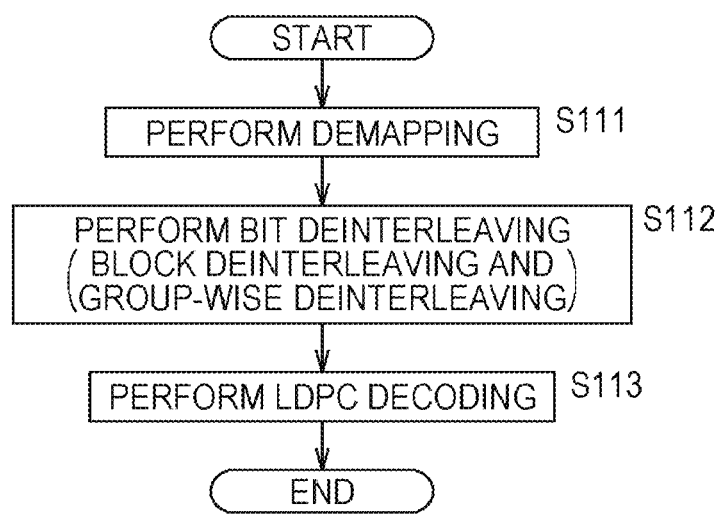
FIG. 129 is a flow chart describing an example of a process performed by a demapper 164, the bit deinterleaver 165, and an LDPC decoder 166.

FIG. 129 is a flowchart illustrating the process performed by the demapper 164, the bit deinterleaver 165, and the LDPC decoder 166 illustrated in FIG. 128.

In Step S111, the demapper 164 demaps the data from the time deinterleaver 163 (data on the constellation which is mapped to signal points) to perform quadrature demodulation and supplies the data to the bit deinterleaver 165. Then, the process proceeds to Step S112.

In Step S112, the bit deinterleaver 165 performs deinterleaving (bit deinterleaving) for the data from the demapper 164. Then, the process proceeds to Step S113.

That is, in Step S112, in the bit deinterleaver 165, the block deinterleaver 54 performs block deinterleaving for the data (symbols) from the demapper 164 and supplies the code bits of the LDPC code obtained by the block deinterleaving to the group-wise deinterleaver 55.

The group-wise deinterleaver 55 performs group-wise deinterleaving for the LDPC code from the block deinterleaver 54 and supplies (the likelihood of) the LDPC code obtained by the group-wise deinterleaving to the LDPC decoder 166.

In Step S113, the LDPC decoder 166 performs LDPC decoding for the LDPC code from the group-wise deinterleaver 55, using the parity check matrix H which is used for LDPC coding by the LDPC encoder 115 illustrated in FIG. 8, that is, using, for example, the transformed parity check matrix obtained from the parity check matrix H, and outputs data obtained by the LDPC decoding to the BCH decoder 167 as the decoding result of the LDPC target data.

In FIG. 128, similarly to FIG. 9, for simplicity of explanation, the block deinterleaver 54 which performs block deinterleaving and the group-wise deinterleaver 55 which performs group-wise deinterleaving are separately provided. However, the block deinterleaver 54 and the group-wise deinterleaver 55 may be integrally provided.

<LDPC Decoding>

The LDPC decoding performed by the LDPC decoder 166 illustrated in FIG. 127 will be further described.

As described above, the LDPC decoder 166 illustrated in FIG. 127 performs LDPC decoding for the LDPC code from the group-wise deinterleaver 55, which has been subjected to block deinterleaving and group-wise deinterleaving, but has not been subjected to parity deinterleaving, using the transformed parity check matrix obtained by performing at least column permutation corresponding to parity interleaving for the parity check matrix H based on the DVB method which is used for LDPC coding by the LDPC encoder 115 illustrated in FIG. 8 (or the transformed parity check matrix (FIG. 29) obtained by performing row permutation for the parity check matrix (FIG. 27) based on the ETRI method).

Here, LDPC decoding has been proposed which is performed using a transformed parity check matrix and can maintain an operation frequency in a sufficiently feasible range while preventing an increase in a circuit size (for example, see Japanese Patent No. 4224777).

First, the LDPC decoding using the transformed parity check matrix which has been proposed will be described with reference to FIGS. 130 to 133.

Figure 130:
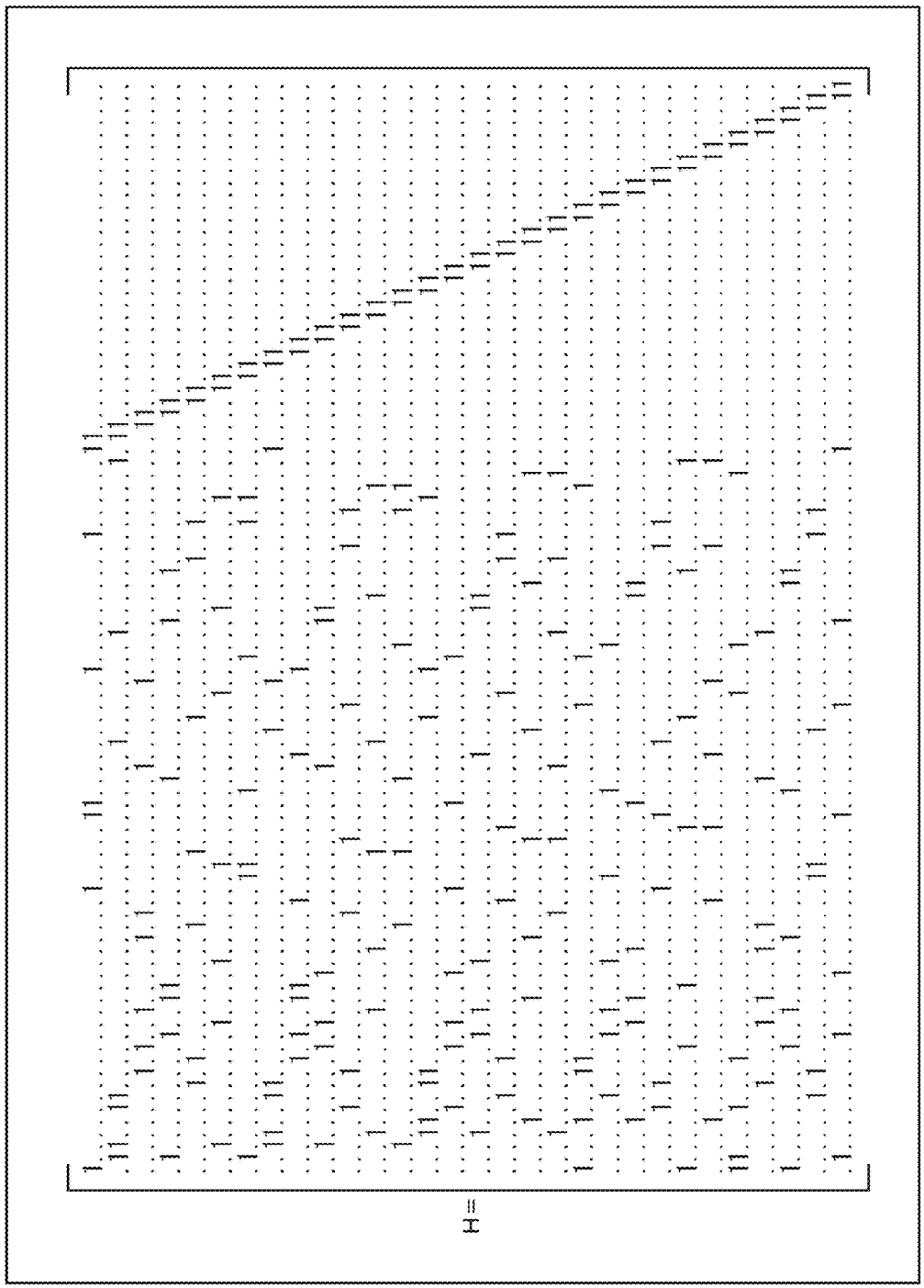
FIG. 130 is a diagram illustrating an example of a parity check matrix of an LDPC code.

FIG. 130 is a diagram illustrating an example of a parity check matrix H of an LDPC code with a code length N of 90 and a coding rate of 2/3.

In FIG. 130, 0 is represented by a period (.) (which holds for FIGS. 131 and 132).

In the parity check matrix H illustrated in FIG. 130, a parity matrix has a dual diagonal structure.

Figure 131:
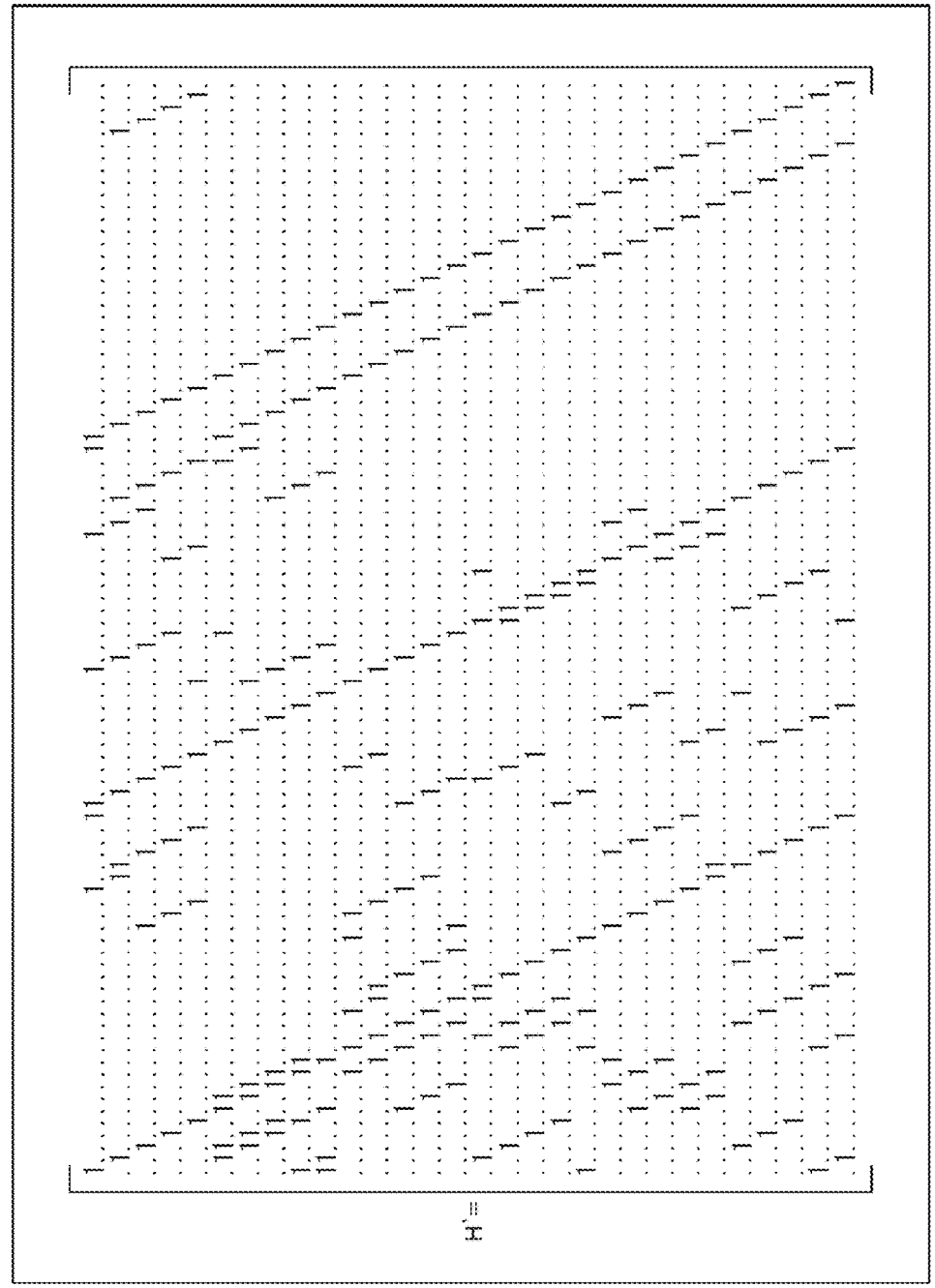
FIG. 131 is a diagram illustrating an example of a matrix (transformed parity check matrix) obtained by performing row permutation and column permutation for a parity check matrix.

FIG. 131 is a diagram illustrating a parity check matrix H' which is obtained by performing row permutation represented by Formula (11) and column permutation represented by Formula (12) for the parity check matrix H illustrated in FIG. 130.

$$\text{Row permutation: } a(6s+t+1)\text{-}th \text{ row} \rightarrow a(5t+s+1)\text{-}th \text{ row} \quad (11)$$

$$\text{Column permutation: } a(6x+y+61)\text{-}th \text{ column} \rightarrow a(5y+x+61)\text{-}th \text{ column} \quad (12)$$

In Formulas (11) and (12), s, t, x, and y are integers in the ranges of $0 \leq s < 5$, $0 \leq t < 6$, $0 \leq x < 5$, and $0 \leq t < 6$, respectively.

According to the row permutation represented by Formula (11), the 1st, 7th, 13th, 19th, and 25th rows which have the remainder of 1 when their numbers are divided by 6 are substituted with the 1st, 2nd, 3rd, 4th, and 5th rows and the 2nd, 8th, 14th, 20th, and 26th rows which have the remainder of 2 when their numbers are divided by 6 are substituted with the 6th, 7th, 8th, 9th, and 10th rows.

According to the column permutation represented by Formula (12), for columns after a 61st column (parity matrix), the 61st, 67th, 73rd, 79th, and 85th columns which have the remainder of 1 when their numbers are divided by 6 are substituted with the 61st, 62nd, 63rd, 64th, and 65th columns and the 62nd, 68th, 74th, 80th, and 86th columns have the remainder of 2 when their numbers are divided by 6 are substituted with the 66th, 67th, 68th, 69th, and 70th columns.

In this way, a matrix which is obtained by performing row permutation and column permutation for the parity check matrix H illustrated in FIG. 130 is the parity check matrix H' illustrated in FIG. 131.

Here, even when row permutation is performed for the parity check matrix H, the sequence of the code bits of the LDPC code is not affected by the row permutation.

In addition, the column permutation represented by Formula (12) corresponds to parity interleaving which interleaves a (K+qx+y+1)-th code bit into the position of a (K+Py+x+1)-th code bit when an information length K is 60, the unit size P is 5, and a divisor q (=M/P) of a parity length M (here, 30) is 6.

Therefore, the parity check matrix H' illustrated in FIG. 131 is a transformed parity check matrix obtained by performing at least column permutation which substitutes the (K+qx+y+1)-th column with the (K+Py+x+1)-th column in the parity check matrix (hereinafter, appropriately referred to as the original parity check matrix) H illustrated in FIG. 130.

When the parity check matrix H' illustrated in FIG. 131 is multiplied by a matrix that is obtained by performing the same permutation as that represented by Formula (12) for the LDPC code with the original parity check matrix H illustrated in FIG. 130, a zero vector is output. That is, when a row vector that is obtained by performing the column permutation represented by Formula (12) for a row vector c serving as the LDPC code (one code word) with the original parity check matrix H is represented by c', $Hc^T$ becomes a zero vector from the properties of the parity check matrix. Therefore, $H'c'^T$ is also a zero vector.

Based on the above, the parity check matrix H' illustrated in FIG. 131 is a parity check matrix of the LDPC code c' obtained by performing the column permutation represented by Formula (12) for the LDPC codec with the original parity check matrix H.

As described above, the column permutation represented by Formula (12) is performed for the LDPC codec with the original parity check matrix H, the LDPC code c' subjected to the column permutation is decoded (LDPC-decoded), using the transformed parity check matrix H' illustrated in FIG. 131, and permutation reverse to the column permutation represented by Formula (12) is performed for the decoding result. Therefore, it is possible to obtain the same decoding result as that obtained when the LDPC code with the original parity check matrix H is decoded using the parity check matrix H.

Figure 132:
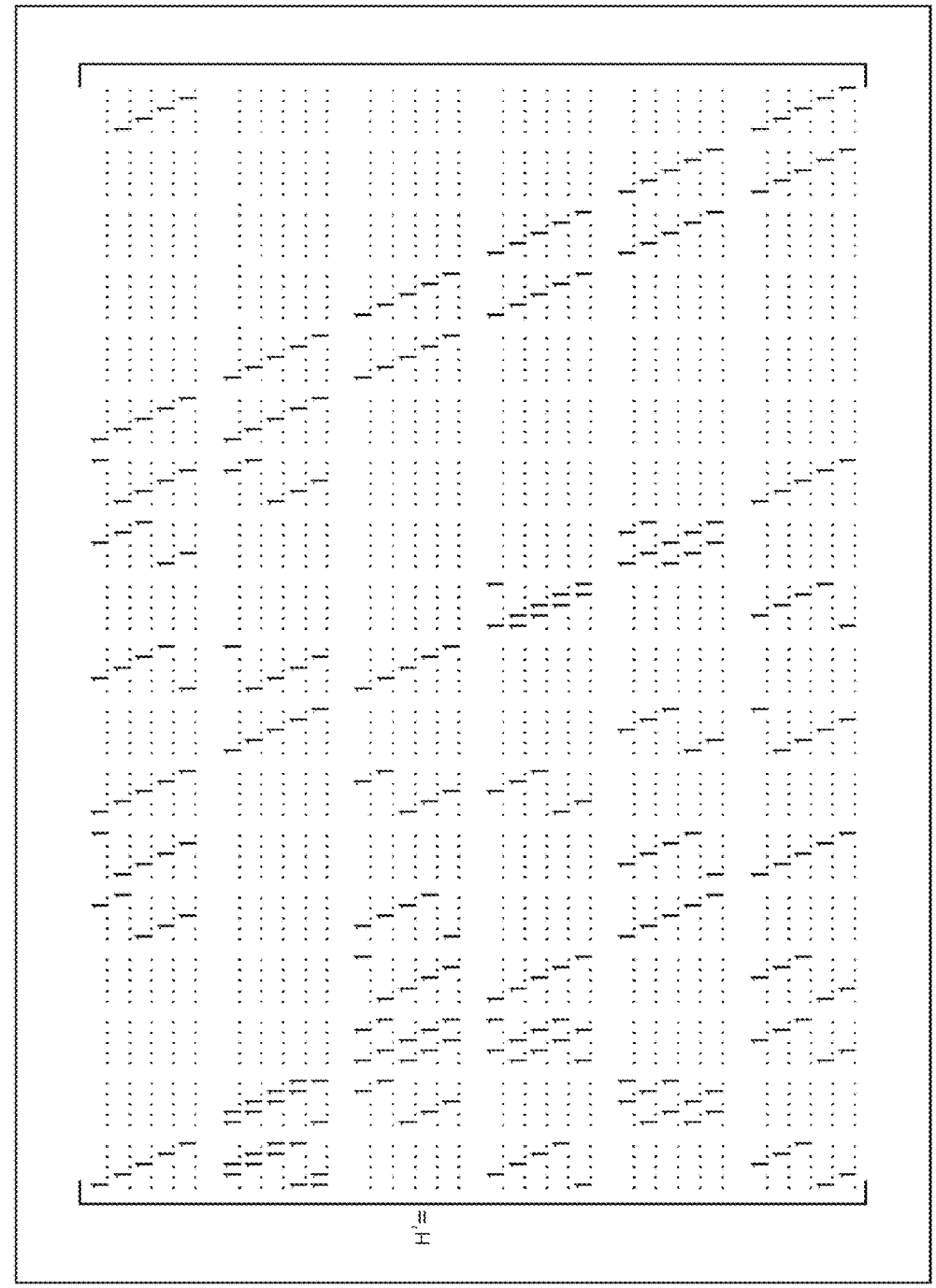
FIG. 132 is a diagram illustrating an example of a transformed parity check matrix which is divided into 5×5 unit matrices.

FIG. 132 is a diagram illustrating the transformed parity check matrix H' illustrated in FIG. 131 which has 5×5 unit matrices.

In FIG. 132, the transformed parity check matrix H' is represented by a combination of a 5×5 (=P×P) unit matrix, a matrix (hereinafter, appropriately referred to as a quasi unit matrix) obtained by substituting one or more 1s in the unit matrix with 0, a matrix (hereinafter, appropriately referred to as a shifted matrix) obtained by cyclically shifting the unit matrix or the quasi unit matrix, the sum (hereinafter, appropriately referred to as a sum matrix) of two or more of the unit matrix, the quasi unit matrix, and the shifted matrix, and a 5×5 zero matrix.

It can be said that the transformed parity check matrix H' illustrated in FIG. 132 is formed by 5×5 unit matrices, quasi unit matrices, shifted matrices, sum matrices, and zero matrices. Therefore, hereinafter, the 5×5 matrices (the unit matrix, the quasi unit matrix, the shifted matrix, the sum matrix, and the zero matrix) that form the transformed parity check matrix H' are appropriately referred to as constitutive matrices.

An architecture in which check node operations and variable node operations are simultaneously performed P times can be used to decode an LDPC code with a parity check matrix represented by P×P constitutive matrices.

Figure 133:
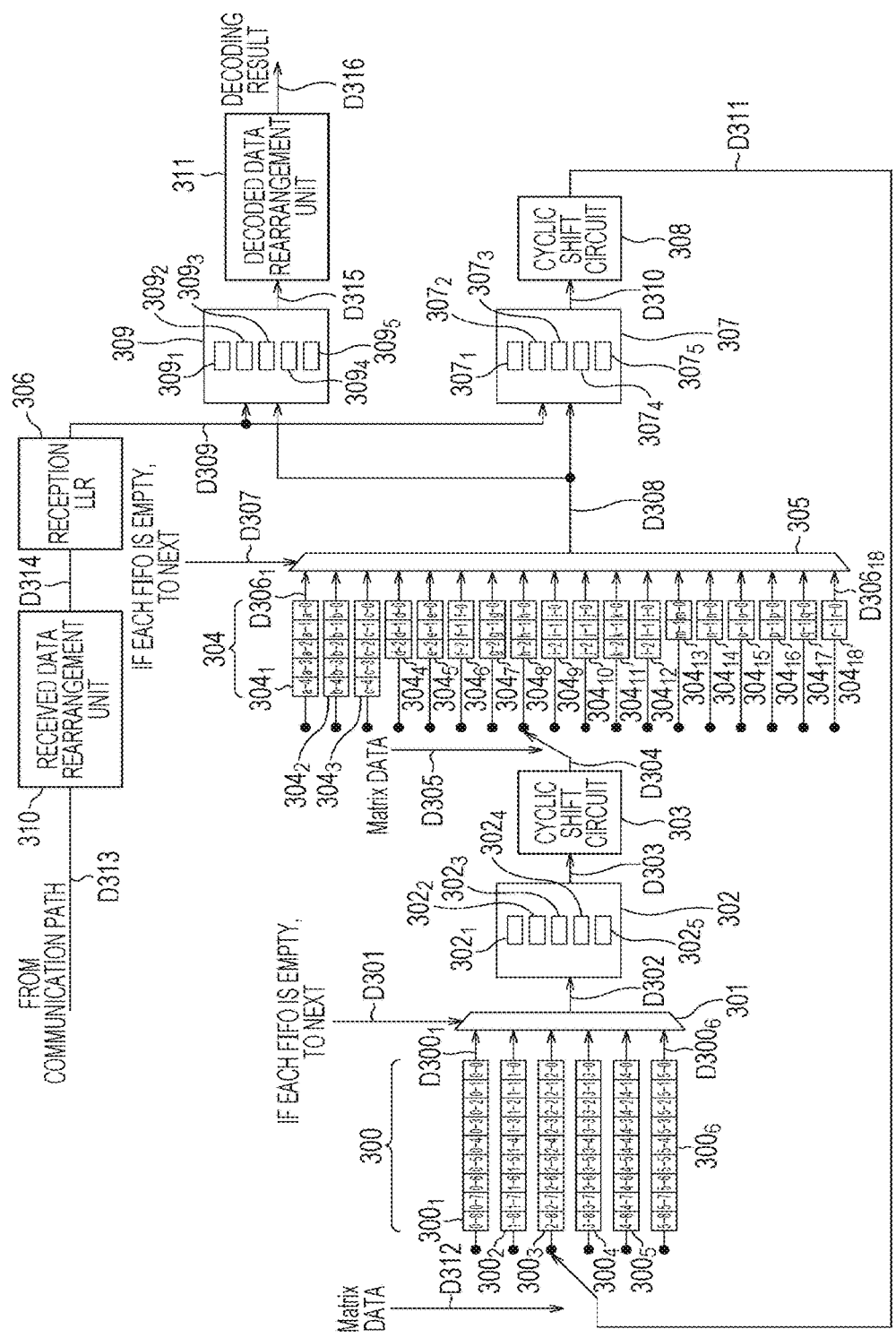
FIG. 133 is a block diagram illustrating an example of the structure of a decoding device which collectively performs P node operations.

FIG. 133 is a block diagram illustrating an example of the structure of a decoding device which decodes the LDPC code.

That is, FIG. 133 illustrates an example of the structure of the decoding device that decodes an LDPC code using the transformed parity check matrix H' illustrated in FIG. 132 which is obtained by performing at least the column permutation represented by Formula (12) for the original parity check matrix H illustrated in FIG. 130.

The decoding device illustrated in FIG. 133 includes an edge data storage memory 300 including six FIFOs $300_1$ to $300_6$, a selector 301 that selects one of the FIFOs $300_1$ to $300_6$, a check node calculation unit 302, two cyclic shift circuits 303 and 308, an edge data storage memory 304 including 18 FIFOs $304_1$ to $304_{18}$, a selector 305 that selects one of the FIFOs $304_1$ to $304_{18}$, a received data memory 306 that stores received data, a variable node calculation unit 307, a decoding word calculation unit 309, a received data rearrangement unit 310, and a decoded data rearrangement unit 311.

First, a method for storing data in the edge data storage memories 300 and 304 will be described.

The edge data storage memory 300 includes six FIFOs $300_1$ to $300_6$ of which the number is equal to a value obtained by dividing the number of rows 30 in the transformed parity check matrix H' illustrated in FIG. 132 by the number of rows 5 (the unit size P) in the constitutive matrix. A FIFO $300_y$ (y=1, 2, . . . , 6) includes storage regions in a plurality of stages. Messages corresponding to five edges, of which the number is equal to the number of rows and the number of columns (the unit size P) in the constitutive matrix, can be simultaneously read and written from and to the storage region in each stage. The number of stages of the storage regions in the FIFO $300_y$ is 9 that is the maximum number of Is (Hamming weight) of the row direction of the transformed parity check matrix illustrated in FIG. 132.

Data (messages $v_i$ from variable nodes) which corresponds to the positions of Is in the first to fifth rows of the transformed parity check matrix H' illustrated in FIG. 132 is stored in the FIFO $300_1$ such that each row is filled with data in the lateral direction (0 is ignored). That is, when a j-th row and an i-th column are represented as (j, i), data corresponding to the positions of Is in a 5×5 unit matrix from (1, 1) to (5, 5) of the transformed parity check matrix H' is stored in the storage region in the first stage of the FIFO $300_1$. Data which corresponds to the positions of Is in a shifted matrix (a shifted matrix obtained by cyclically shifting the 5×5 unit matrix to the right by 3) from (1, 21) to (5, 25) of the transformed parity check matrix H' is stored in the storage region in the second stage. Similarly, data is stored in the storage regions in the third to eighth stages so as to be associated with the transformed parity check matrix H'. Data which corresponds to the positions of 1s in a shifted matrix (a shifted matrix obtained by substituting 1 in the first row of the 5×5 unit matrix with 0 and cyclically shifting the unit matrix to the left by 1) from (1, 86) to (5, 90) of the transformed parity check matrix H' is stored in the storage region in the ninth stage.

Data which corresponds to the positions of 1s in the sixth to tenth rows of the transformed parity check matrix H' illustrated in FIG. 132 is stored in the FIFO $300_2$. That is, data which corresponds to the positions of Is in a first shifted matrix forming a sum matrix (a sum matrix which is the sum of the first shifted matrix obtained by cyclically shifting the 5×5 unit matrix to the right by 1 and a second shifted matrix obtained by cyclically shifting the 5×5 unit matrix to the right by 2) from (6, 1) to (10, 5) of the transformed parity check matrix H' is stored in the storage region in the first stage of the FIFO $300_2$. In addition, data which corresponds to the positions of 1s in the second shifted matrix forming the sum matrix from (6, 1) to (10, 5) of the transformed parity check matrix H' is stored in the storage region in the second stage.

That is, when a constitutive matrix having a weight of 2 or greater is represented in the form of the sum of two or more of a P×P unit matrix having a weight of 1, a quasi unit matrix obtained by substituting one or more of elements "1" in the unit matrix with 0, and a shifted matrix obtained by cyclically shifting the unit matrix or the quasi unit matrix, data corresponding to the positions of Is in the unit matrix having a weight of 1, the quasi unit matrix, or the shifted matrix (messages corresponding to edges belonging to the unit matrix, the quasi unit matrix, or the shifted matrix) is stored at the same address (the same FIFO among the FIFOs $300_1$ to $300_6$).

Similarly, data is stored in the storage regions in the third to ninth stages so as to be associated with the transformed parity check matrix H'

Similarly, data is stored in the FIFOs $300_3$ to $300_6$ so as to be associated with the transformed parity check matrix H'.

The edge data storage memory 304 includes 18 FIFOs $304_1$ to $304_{18}$ of which the number is obtained by dividing the number of columns 90 of the transformed parity check matrix H' by the number of columns 5 (the unit size P) of the constitutive matrix. A FIFO $304_x$ (x=1, 2, ..., 18) includes storage regions in a plurality of stages. Messages corresponding to five edges of which the number is equal to the number of rows and the number of columns (the unit size P) in the constitutive matrix can be simultaneously read and written from and to the storage region in each stage.

Data (messages $u_j$ from check nodes) which corresponds to the positions of 1s in the first to fifth rows of the transformed parity check matrix H' illustrated in FIG. 132 is stored in the FIFO $304_1$ such that each column is filled with data in the longitudinal direction (0 is ignored). That is, data corresponding to the positions of Is in a 5×5 unit matrix from (1, 1) to (5, 5) of the transformed parity check matrix H' is stored in the storage region in the first stage of the FIFO $304_1$. Data which corresponds to the positions of Is in a first shifted matrix forming a sum matrix (a sum matrix which is the sum of the first shifted matrix obtained by cyclically shifting the 5×5 unit matrix to the right by 1 and a second shifted matrix obtained by cyclically shifting the 5×5 unit matrix to the right by 2) from (6, 1) to (10, 5) of the transformed parity check matrix H' is stored in the storage region in the second stage. In addition, data which corresponds to the positions of 1s in the second shifted matrix forming the sum matrix from (6, 1) to (10, 5) of the transformed parity check matrix H' is stored in the storage region in the third stage.

That is, when a constitutive matrix having a weight of 2 or more is represented in the form of the sum of two or more of a P×P unit matrix having a weight of 1, a quasi unit matrix obtained by substituting one or more of elements "1" in the unit matrix with 0, and a shifted matrix obtained by cyclically shifting the unit matrix or the quasi unit matrix, data corresponding to the positions of 1s in the unit matrix having a weight of 1, the quasi unit matrix, or the shifted matrix (messages corresponding to edges belonging to the unit matrix, the quasi unit matrix, or the shifted matrix) is stored at the same address (the same FIFO among the FIFOs $304_1$ to $304_{18}$)

Similarly, data is stored in the storage regions in the fourth and fifth stages so as to be associated with the transformed parity check matrix H'. The number of stages of the storage regions in the FIFO $304_1$ is 5 that is the maximum number of 1s (Hamming weight) in the row direction in the first to fifth columns of the transformed parity check matrix H'

Similarly, data is stored in the FIFOs $304_2$ and $304_3$ so as to be associated with the transformed parity check matrix H' and the length (the number of stages) of each of the FIFOs $304_2$ and $304_3$ is 5. Similarly, data is stored in the FIFOs $304_4$ to $304_{12}$ so as to be associated with the transformed parity check matrix H' and the length of each of the FIFOs $304_4$ to $304_{12}$ is 3. Similarly, data is stored in the FIFOs $304_{13}$ to $304_{18}$ so as to be associated with the transformed parity check matrix H' and the length of each of the FIFOs $304_{13}$ to $304_{18}$ is 2.

Next, the operation of the decoding device illustrated in FIG. 133 will be described.

The edge data storage memory 300 includes six FIFOs $300_1$ to $300_6$, selects a FIFO in which data is to be stored from the FIFOs $300_1$ to $300_6$, according to information (matrix data) D312 indicating to which row of the transformed parity check matrix H' illustrated in FIG. 132 five messages D311 supplied from a cyclic shift circuit 308 in the previous stage belong, and collectively stores the five messages D311 in the selected FIFO in order. In addition, when reading data, the edge data storage memory 300 sequentially reads five messages $D300_1$ from the FIFO $300_1$ and supplies the five messages $D300_1$ to a selector 301 in the next stage. After ending the reading of the messages from the FIFO $300_1$, the edge data storage memory 300 sequentially reads messages from the FIFOs $300_2$ to $300_6$ and supplies the messages to the selector 301.

The selector 301 selects five messages from the FIFO from which data is currently being read among the FIFOs $300_1$ to $300_6$, according to a selection signal D301, and supplies the selected messages as messages D302 to the check node calculation unit 302.

The check node calculation unit 302 includes five check node calculators $302_1$ to $302_5$, performs a check node operation according to Formula (7), using the messages D302 ($D302_1$ to $D302_5$) (messages $v_i$ in Formula (7)) supplied through the selector 301, and supplies five messages D303 ($D303_1$ to $D303_5$) (messages $u_j$ in Formula (7)) obtained by the check node operation to a cyclic shift circuit 303.

The cyclic shift circuit 303 cyclically shifts the five messages $D303_1$ to $D303_5$ calculated by the check node calculation unit 302, on the basis of information (matrix data) D305 indicating how many unit matrices (or quasi unit matrices) in which the corresponding edges serve as bases in the transformed parity check matrix H' are cyclically shifted, and supplies the result as messages D304 to the edge data storage memory 304.

The edge data storage memory 304 includes 18 FIFOs $304_1$ to $304_{18}$, selects a FIFO in which data is to be stored from the FIFOs $304_1$ to $304_{18}$, according to information D305 indicating to which row of the transformed parity check matrix H' the five messages D304 supplied from the cyclic shift circuit 303 in the previous stage belong, and collectively stores the five messages D304 in the selected FIFO in order. In addition, when reading data, the edge data storage memory 304 sequentially reads five messages $D306_1$ from the FIFO $304_1$ and supplies the five messages $D306_1$ to a selector 305 in the next stage. After ending the reading of the messages from the FIFO $304_1$, the edge data storage memory 304 sequentially reads messages from the FIFOs $304_2$ to $304_{18}$ and supplies the messages to the selector 305.

The selector 305 selects five messages from the FIFO from which data is currently being read among the FIFOs $304_1$ to $304_{18}$, according to a selection signal D307, and supplies the selected messages as messages D308 to the variable node calculation unit 307 and the decoding word calculation unit 309.

The received data rearrangement unit 310 rearranges the LDPC code D313 corresponding to the parity check matrix H illustrated in FIG. 130, which is received through the communication path 13, using the column permutation represented by Formula (12), and supplies the LDPC code as received data D314 to the received data memory 306. The received data memory 306 calculates a reception log likelihood ratio (LLR) from the received data D314 supplied from the received data rearrangement unit 310, stores the reception LLR, and supplies each set of five reception LLRs as a reception value D309 to the variable node calculation unit 307 and the decoding word calculation unit 309.

The variable node calculation unit 307 includes five variable node calculators $307_1$ to $307_5$, performs a variable node operation according to Formula (1), using the messages D308 ($D308_1$ to $D308_5$) (messages $u_j$ in Formula (1)) which are supplied through the selector 305 and the five reception values D309 (reception values $u_{0\,i}$ in Formula (1)) which are supplied from the received data memory 306, and supplies messages D310 ($D310_1$ to $D310_5$) (messages $v_i$ in Formula (1)) obtained by the operation to the cyclic shift circuit 308.

The cyclic shift circuit 308 cyclically shifts the messages $D310_1$ to $D310_5$ calculated by the variable node calculation unit 307, on the basis of information indicating how many unit matrices (or quasi unit matrices) in which the corresponding edges serve as bases in the transformed parity check matrix H' are cyclically shifted, and supplies the result as messages D311 to the edge data storage memory 300.

The above-mentioned operation can be performed in one cycle to decode (perform the variable node operation and the check node operation) the LDPC code once. In the decoding device illustrated in FIG. 133, after the LDPC code is decoded a predetermined number of times, the decoding word calculation unit 309 and the decoded data rearrangement unit 311 calculate a final decoding result and output the decoding result.

That is, the decoding word calculation unit 309 includes five decoding word calculators $309_1$ to $309_5$, calculates a decoding result (decoding word) on the basis of Formula (5) as a final stage among a plurality of decoding stages, using the five messages D308 ($D308_1$ to $D308_5$) (messages $u_j$ in Formula (5)) which are output from the selector 305 and the five reception values D309 (reception values $u_{0\,i}$ in Formula (5)) which are supplied from the received data memory 306, and supplies decoded data D315 as the decoding result to the decoded data rearrangement unit 311.

The decoded data rearrangement unit 311 performs inverse permutation of the column permutation represented by Formula (12) for the decoded data D315 which is supplied from the decoding word calculation unit 309 to rearrange the order of the data and outputs the decoded data as a final decoding result D316.

As described above, it is possible to use an architecture in which one or both of row permutation and column permutation are performed for the parity check matrix (original parity check matrix) to transform the parity check matrix into a parity check matrix (transformed parity check matrix) that can be represented by a combination of a P×P unit matrix, a quasi unit matrix obtained by substituting one or more of elements "1" of the unit matrix with 0, a shifted matrix obtained by cyclically shifting the unit matrix or the quasi unit matrix, a sum matrix which is the sum of two or more of the unit matrix, the quasi unit matrix, and the shifted matrix, and a P×P zero matrix, that is, a combination of constitutive matrices. According to the architecture, the check node operation and the variable node operation can be simultaneously performed P times which are less than the number of rows or the number of columns of the parity check matrix, in order to decode the LDPC code. When the architecture in which the node operations (the check node operation and the variable node operation) are simultaneously performed P times which are less than the number of rows or the number of columns of the parity check matrix is used, an operation frequency can be kept in a feasible range and decoding can be repeated a number of times, as compared to a case in which the number of node operations that are simultaneously performed is equal to the number of rows or the number of columns of the parity check matrix.

The LDPC decoder 166 forming the receiving device 12 illustrated in FIG. 127 simultaneously performs the check node operation and the variable node operation P times to perform LDPC decoding, for example, similarly to the decoding device illustrated in FIG. 133.

That is, for simplicity of explanation, assuming that the parity check matrix of the LDPC code which is output from the LDPC encoder 115 forming the transmitting device 11 illustrated in FIG. 8 is, for example, the parity check matrix H illustrated in FIG. 130 in which the parity matrix has a dual diagonal structure, the parity interleaver 23 of the transmitting device 11 performs parity interleaving which interleaves the (K+qx+y+1)-th code bit into the position of the (K+Py+x+1)-th code bit for an LDPC code in which the information length K is 60, the unit size P is 5, and the divisor q (=M/P) of the parity length M is 6.

As described above, since the parity interleaving corresponds to the column permutation represented by Formula (12), the LDPC decoder 166 does not need to perform the column permutation represented by Formula (12).

Therefore, in the receiving device 12 illustrated in FIG. 127, as described above, the group-wise deinterleaver 55 supplies the LDPC code which has not been subjected to parity deinterleaving, that is, the LDPC code which has been subjected to the column permutation represented by Formula (12), to the LDPC decoder 166 and the LDPC decoder 166 performs the same process as the decoding device illustrated in FIG. 133 except that the column permutation represented by Formula (12) is not performed.

Figure 134:
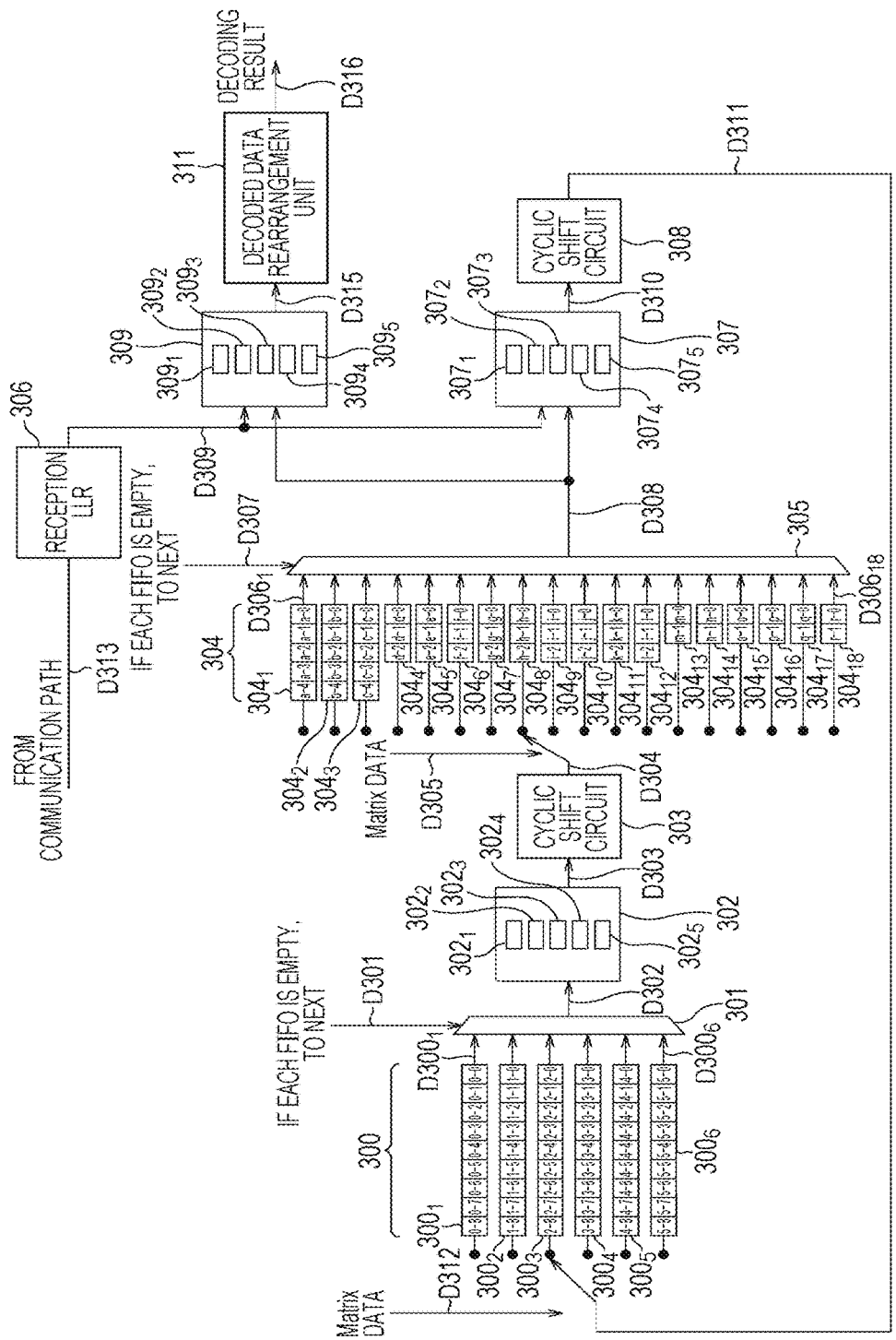
FIG. 134 is a block diagram illustrating an example of the structure of the LDPC decoder 166.

That is, FIG. 134 is a diagram illustrating an example of the structure of the LDPC decoder 166 illustrated in FIG. 127.

In FIG. 134, the LDPC decoder 166 has the same structure as the decoding device illustrated in FIG. 133 except that it does not include the received data rearrangement unit 310 illustrated in FIG. 133 and performs the same process as the decoding device illustrated in FIG. 133 except that the column permutation represented by Formula (12) is not performed.

Therefore, the description thereof will not be repeated. As described above, since the LDPC decoder 166 can be configured without the received data rearrangement unit 310, the size of the LDPC decoder 166 can be smaller than that of the decoding device illustrated in FIG. 133.

For simplicity of illustration, in FIGS. 130 to 134, the code length N of the LDPC code is 90, the information length K is 60, the unit size (the number of rows and the number of columns of the constitutive matrix) P is 5, and the divisor q (=M/P) of the parity length M is 6. However, the code length N, the information length K, the unit size P, and the divisor q (=M/P) are not limited to the above-mentioned values.

That is, in the transmitting device 11 illustrated in FIG. 8, the LDPC encoder 115 outputs, for example, an LDPC code having a code length N of 64800 or 16200, an information length K of N−Pq (=N−M), a unit size P of 360, and a divisor q of M/P. The LDPC decoder 166 illustrated in FIG. 134 can be applied to a case in which the check node operation and the variable node operation are simultaneously performed P times for the LDPC code to perform LDPC decoding.

When a parity portion of the decoding result is unnecessary and only the information bits of the decoding result are output after the LDPC code is decoded by the LDPC decoder 166, the LDPC decoder 166 can be configured without the decoded data rearrangement unit 311.

<Example of Structure of Block Deinterleaver 54>

Figure 135:
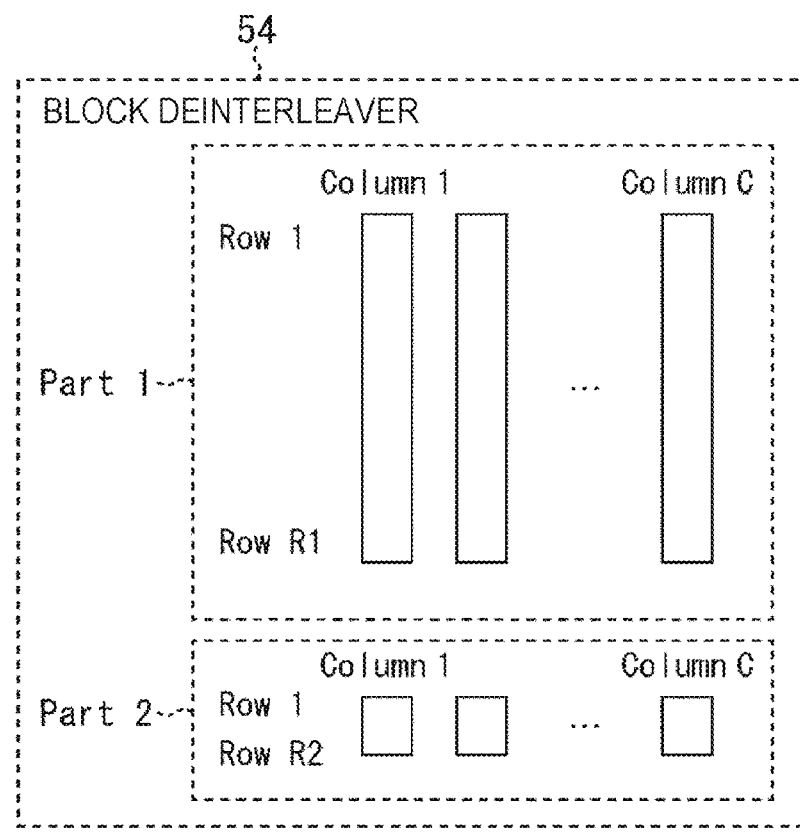
FIG. 135 is a block diagram illustrating an example of the structure of a block deinterleaver 54.

FIG. 135 is a block diagram illustrating an example of the structure of the block deinterleaver 54 illustrated in FIG. 128.

The block deinterleaver 54 has the same structure as the block interleaver 25 described in FIG. 93.

Therefore, the block deinterleaver 54 has a storage region which is called part 1 and a storage region which is called part 2. Each of parts 1 and 2 includes C columns which are arranged in the row direction and of which the number is equal to the number of bits m of a symbol. Each of the columns functions as a storage region which stores one bit in the row direction and stores a predetermined number of bits in the column direction.

The block deinterleaver 54 writes and reads an LDPC code to and from parts 1 and 2 to perform block deinterleaving.

However, in block deinterleaving, the LDPC code (symbol) is written in the order in which the LDPC code is read by the block interleaver 25 illustrated in FIG. 93.

In addition, in block deinterleaving, the LDPC code is read in the order in which the LDPC code is written by the block interleaver 25 illustrated in FIG. 93.

That is, in the block interleaving performed by the block interleaver 25 illustrated in FIG. 93, the LDPC code is written to parts 1 and 2 in the column direction and is read from parts 1 and 2 in the row direction. However, in the block deinterleaving performed by the block deinterleaver 54 illustrated in FIG. 135, the LDPC code is written to parts 1 and 2 in the row direction and is read from parts 1 and 2 in the column direction.

<Another Example of Structure of Bit Deinterleaver 165>

Figure 136:
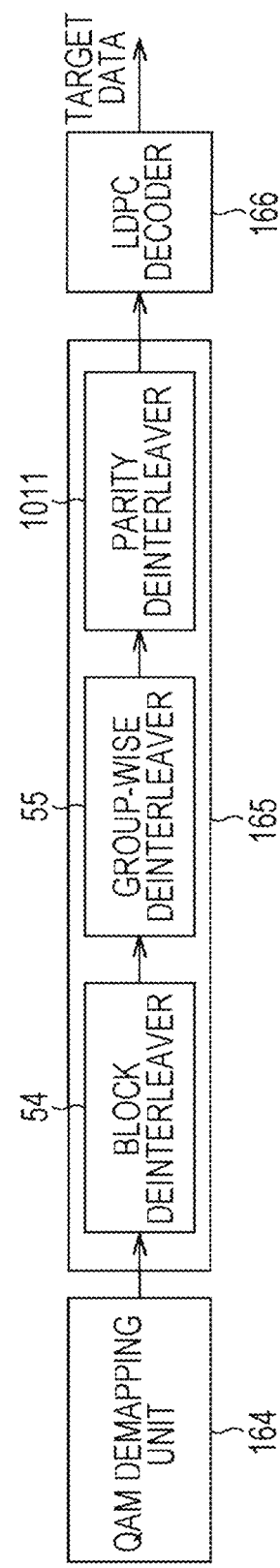
FIG. 136 is a block diagram illustrating another example of the structure of the bit deinterleaver 165.

FIG. 136 is a block diagram illustrating another example of the structure of the bit deinterleaver 165 illustrated in FIG. 127.

In FIG. 136, portions corresponding to those illustrated in FIG. 128 are denoted by the same reference numerals and the description thereof will be appropriately omitted.

That is, the bit deinterleaver 165 illustrated in FIG. 136 has the same structure as that illustrated in FIG. 128 except that it newly includes a parity deinterleaver 1011.

In FIG. 136, the bit deinterleaver 165 includes the block deinterleaver 54, the group-wise deinterleaver 55, and the parity deinterleaver 1011 and performs bit deinterleaving for the code bits of the LDPC code transmitted from the demapper 164.

That is, the block deinterleaver 54 performs block deinterleaving (an inverse process of block interleaving) corresponding to the block interleaving performed by the block interleaver 25 of the transmitting device 11, that is, block deinterleaving which returns the positions of the code bits rearranged by the block interleaving to the original positions, for the LDPC code transmitted from the demapper 164 and supplies the LDPC code obtained by the block deinterleaving to the group-wise deinterleaver 55.

The group-wise deinterleaver 55 performs group-wise deinterleaving corresponding to the group-wise interleaving which is performed as a rearrangement process by the group-wise interleaver 24 of the transmitting device 11 for the LDPC code transmitted from the block deinterleaver 54.

The LDPC code obtained by the group-wise deinterleaving is supplied from the group-wise deinterleaver 55 to the parity deinterleaver 1011.

The parity deinterleaver 1011 performs parity deinterleaving (an inverse process of parity interleaving) corresponding to the parity interleaving performed by the parity interleaver 23 of the transmitting device 11, that is, parity deinterleaving that returns the code bits of the LDPC code, of which the sequence has been changed by the parity interleaving, to the original arrangement, for the code bits which have been subjected to the group-wise deinterleaving by the group-wise deinterleaver 55.

The LDPC code obtained by the parity deinterleaving is supplied from the parity deinterleaver 1011 to the LDPC decoder 166.

Therefore, in the bit deinterleaver 165 illustrated in FIG. 136, the LDPC code that has been subjected to block deinterleaving, group-wise deinterleaving, and parity deinterleaving, that is, the LDPC code obtained by LDPC coding using the parity check matrix H, is supplied to the LDPC decoder 166.

The LDPC decoder 166 performs LDPC decoding for the LDPC code transmitted from the bit deinterleaver 165, using the parity check matrix H which has been used for LDPC coding by the LDPC encoder 115 of the transmitting device 11. That is, the LDPC decoder 166 performs LDPC decoding for the LDPC code transmitted from the bit deinterleaver 165, using the parity check matrix H (based on the DVB method) which has been used for LDPC coding by the LDPC encoder 115 of the transmitting device 11 or the transformed parity check matrix obtained by performing at least column permutation corresponding to parity interleaving for the parity check matrix H (for the ETRI method, the parity check matrix (FIG. 28) obtained by performing column permutation for the parity check matrix (FIG. 27) used for LDPC coding or the transformed parity check matrix (FIG. 29) obtained by performing row permutation for the parity check matrix (FIG. 27) used for LDPC coding).

Here, in FIG. 136, the LDPC code obtained by LDPC coding using the parity check matrix H is supplied from (the parity deinterleaver 1011 of) the bit deinterleaver 165 to the LDPC decoder 166. Therefore, when LDPC decoding is performed for the LDPC code, using the parity check matrix H (based on the DVB method) which has been used for LDPC coding by the LDPC encoder 115 of the transmitting device 11 (for the ETRI method, the parity check matrix (FIG. 28) obtained by performing column permutation for the parity check matrix (FIG. 27) which has been used for LDPC coding), the LDPC decoder 166 can be a decoding device which performs LDPC decoding using, for example, a full serial decoding method that sequentially calculates messages (a check node message and a variable node message) for each node, or a decoding device which performs LDPC decoding using a full parallel decoding method that calculates messages for all nodes at the same time (in parallel).

In addition, when the LDPC decoder 166 performs LDPC decoding for the LDPC code, using the transformed parity check matrix (for the ETRI method, the transformed parity check matrix (FIG. 29) obtained by performing row permutation for the parity check matrix (FIG. 27) which has been used for LDPC coding) obtained by performing at least column permutation corresponding to parity interleaving for the parity check matrix H (based on the DVB method) which has been used for LDPC coding by the LDPC encoder 115 of the transmitting device 11, the LDPC decoder 166 can be a decoding device (FIG. 133) that has an architecture which simultaneously performs the check node operation and the variable node operation P times (or a divisor of P other than 1) and includes the received data rearrangement unit 310 which performs the same column permutation as the column permutation (parity interleaving) for obtaining the transformed parity check matrix for the LDPC code to rearrange the code bits of the LDPC code.

In FIG. 136, for convenience of explanation, the block deinterleaver 54 which performs block deinterleaving, the group-wise deinterleaver 55 which performs group-wise deinterleaving, and the parity deinterleaver 1011 which performs parity deinterleaving are separately provided.

However, two or more of the block deinterleaver 54, the group-wise deinterleaver 55, and the parity deinterleaver 1011 can be integrally provided, similarly to the parity interleaver 23, the group-wise interleaver 24, and the block interleaver 25 of the transmitting device 11.

<Example of Structure of Receiving System>

Figure 137:
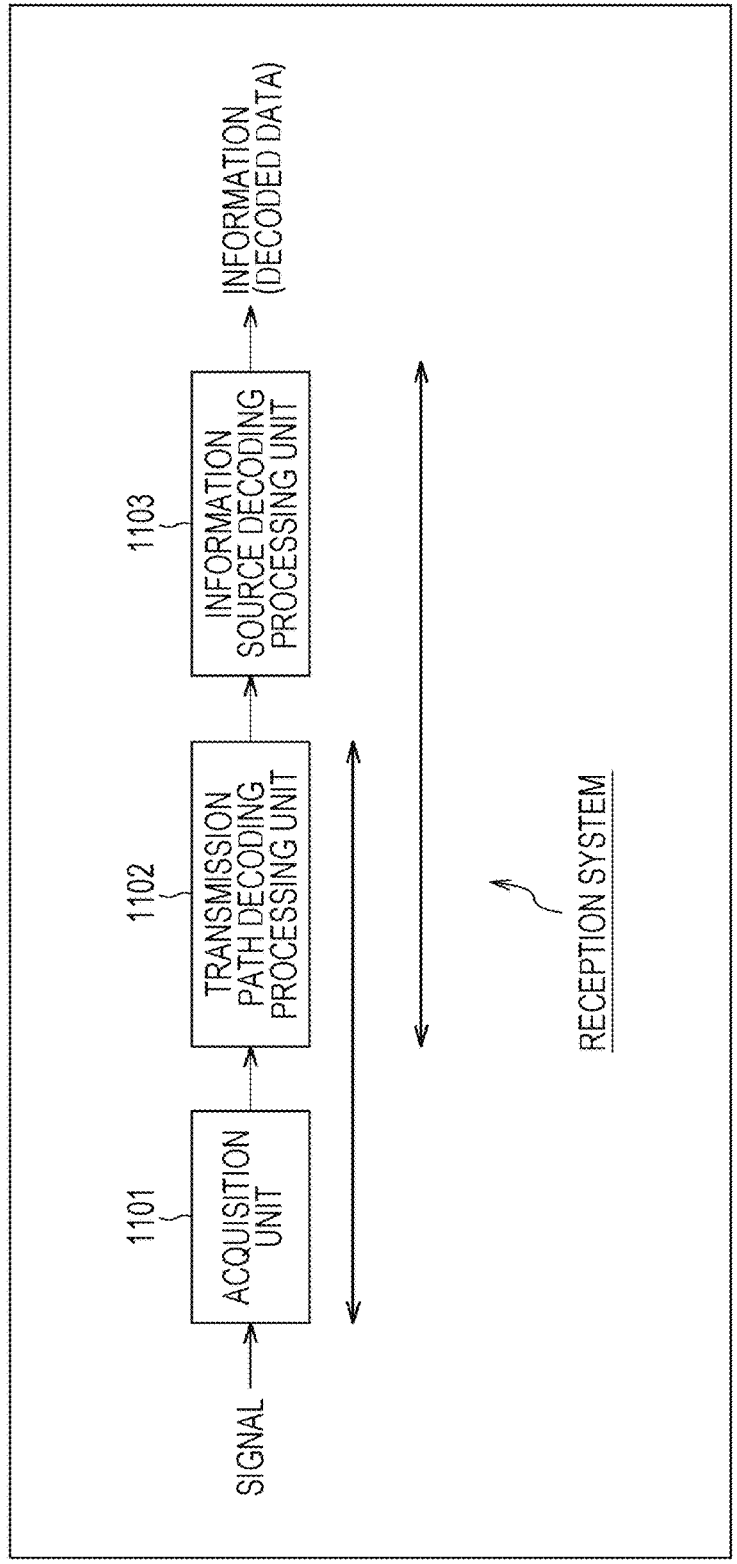
FIG. 137 is a block diagram illustrating a first example of the structure of a receiving system to which the receiving device 12 can be applied.

FIG. 137 is a block diagram illustrating a first example of the structure of a receiving system to which the receiving device 12 can be applied.

In FIG. 137, the receiving system includes an acquisition unit 1101, a transmission path decoding processing unit 1102, and an information source decoding processing unit 1103.

The acquisition unit 1101 acquires a signal including an LDPC code which is obtained by performing at least LDPC coding for LDPC target data, such as image data or audio data of a program, through a transmission path (communication path) (not illustrated), such as a digital terrestrial broadcasting network, a digital satellite broadcasting network, a CATV network, the Internet, or other networks, and supplies the signal to the transmission path decoding processing unit 1102.

Here, when the signal acquired by the acquisition unit 1101 is broadcast from a broadcasting station through, for example, terrestrial waves, satellite waves, or a cable television (CATV) network, the acquisition unit 1101 includes, for example, a tuner and a set-top box. In addition, when the signal acquired by the acquisition unit 1101 is transmitted from, for example, a web server in a multicast manner as in an Internet protocol television (IPTV) network, the acquisition unit 1101 includes a network interface (I/F) such as a network interface card (NIC).

The transmission path decoding processing unit 1102 corresponds to the receiving device 12. The transmission path decoding processing unit 1102 performs a transmission path decoding process which includes at least a process of correcting an error occurring in the transmission path for the signal acquired by the acquisition unit 1101 through the transmission path and supplies a signal obtained by the process to the information source decoding processing unit 1103.

That is, the signal acquired by the acquisition unit 1101 through the transmission path is a signal obtained by performing at least error correction coding for correcting an error occurring in the transmission path. The transmission path decoding processing unit 1102 performs a transmission path decoding process, such as an error correction process, for the signal.

Examples of the error correction coding include LDPC coding and BCH coding. Here, at least the LDPC coding is performed as the error correction coding.

The transmission path decoding process includes a process of demodulating a modulated signal.

The information source decoding processing unit 1103 performs an information source decoding process including at least a process of decompressing compressed information into original information for the signal that has been subjected to the transmission path decoding process.

That is, in some cases, compression coding which compresses information in order to reduce the amount of data, such as image data or audio data, as information is performed for the signal to be acquired by the acquisition unit 1101 through the transmission path. In this case, the information source decoding processing unit 1103 performs an information source decoding process, such as a process (decompression process) of decompressing compressed information into the original information, for the signal that has been subjected to the transmission path decoding process.

When the acquisition unit 1101 acquires the signal which has not been subjected to the compression coding through the transmission path, the information source decoding processing unit 1103 does not perform the process of decompressing compressed information into the original information.

Here, the decompress process is, for example, MPEG decoding. In addition, in some cases, the transmission path decoding process includes, for example, descrambling in addition to the decompress process.

In the receiving system having the above-mentioned structure, the acquisition unit 1101 acquires a signal which is obtained by sequentially performing compression coding, such as MPEG coding, and error correction coding, such as LDPC coding, for image data or audio data through a transmission path and supplies the signal to the transmission path decoding processing unit 1102.

The transmission path decoding processing unit 1102 performs, for example, the same process as the receiving device 12 as the transmission path decoding process for the signal from the acquisition unit 1101 and supplies the processed signal to the information source decoding processing unit 1103.

The information source decoding processing unit 1103 performs an information source decoding process, such as MPEG decoding, for the signal from the transmission path decoding processing unit 1102 and outputs images or sounds obtained by the process.

The receiving system illustrated in FIG. 137 can be applied to, for example, a television tuner that receives television broadcasting as digital broadcasting.

The acquisition unit 1101, the transmission path decoding processing unit 1102, and the information source decoding processing unit 1103 may be provided as independent devices (hardware (for example, integrated circuits (ICs)) or software modules).

In addition, for the acquisition unit 1101, the transmission path decoding processing unit 1102, and the information source decoding processing unit 1103, a set of the acquisition unit 1101 and the transmission path decoding processing unit 1102, a set of the transmission path decoding processing unit 1102 and the information source decoding processing unit 1103, and a set of the acquisition unit 1101, the transmission path decoding processing unit 1102, and the information source decoding processing unit 1103 may be provided as independent devices.

Figure 138:
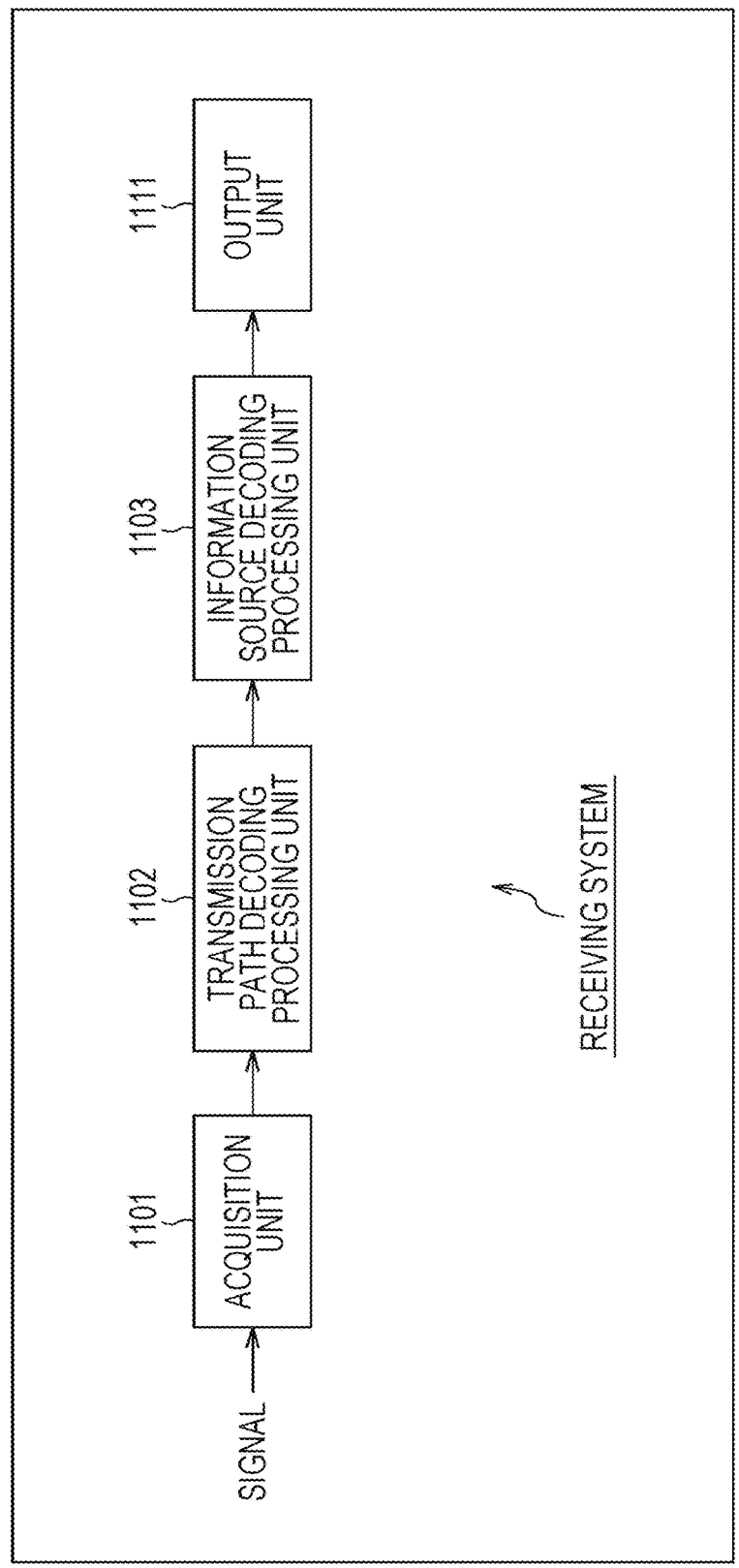
FIG. 138 is a block diagram illustrating a second example of the structure of the receiving system to which the receiving device 12 can be applied.

FIG. 138 is a block diagram illustrating a second example of the structure of the receiving system to which the receiving device 12 can be applied.

In FIG. 138, portions corresponding to those illustrated in FIG. 137 are denoted by the same reference numerals and the description thereof will be appropriately omitted below.

A receiving system illustrated in FIG. 138 is similar to the receiving system illustrated in FIG. 137 in that it includes the acquisition unit 1101, the transmission path decoding processing unit 1102, and the information source decoding processing unit 1103 and differs from the receiving system illustrated in FIG. 137 in that it newly includes an output unit 1111.

The output unit 1111 is, for example, a display device which displays images or a speaker which outputs sounds and outputs images or sounds as signals output from the information source decoding processing unit 1103. That is, the output unit 1111 displays images or outputs sounds.

The receiving system illustrated in FIG. 138 can be applied to, for example, a television receiver (TV) which receives television broadcasting as digital broadcasting or a radio receiver which receives radio broadcasting.

When the acquisition unit 1101 receives the signal which has not been subjected to compression coding, the signal output by the transmission path decoding processing unit 1102 is supplied to the output unit 1111.

Figure 139:
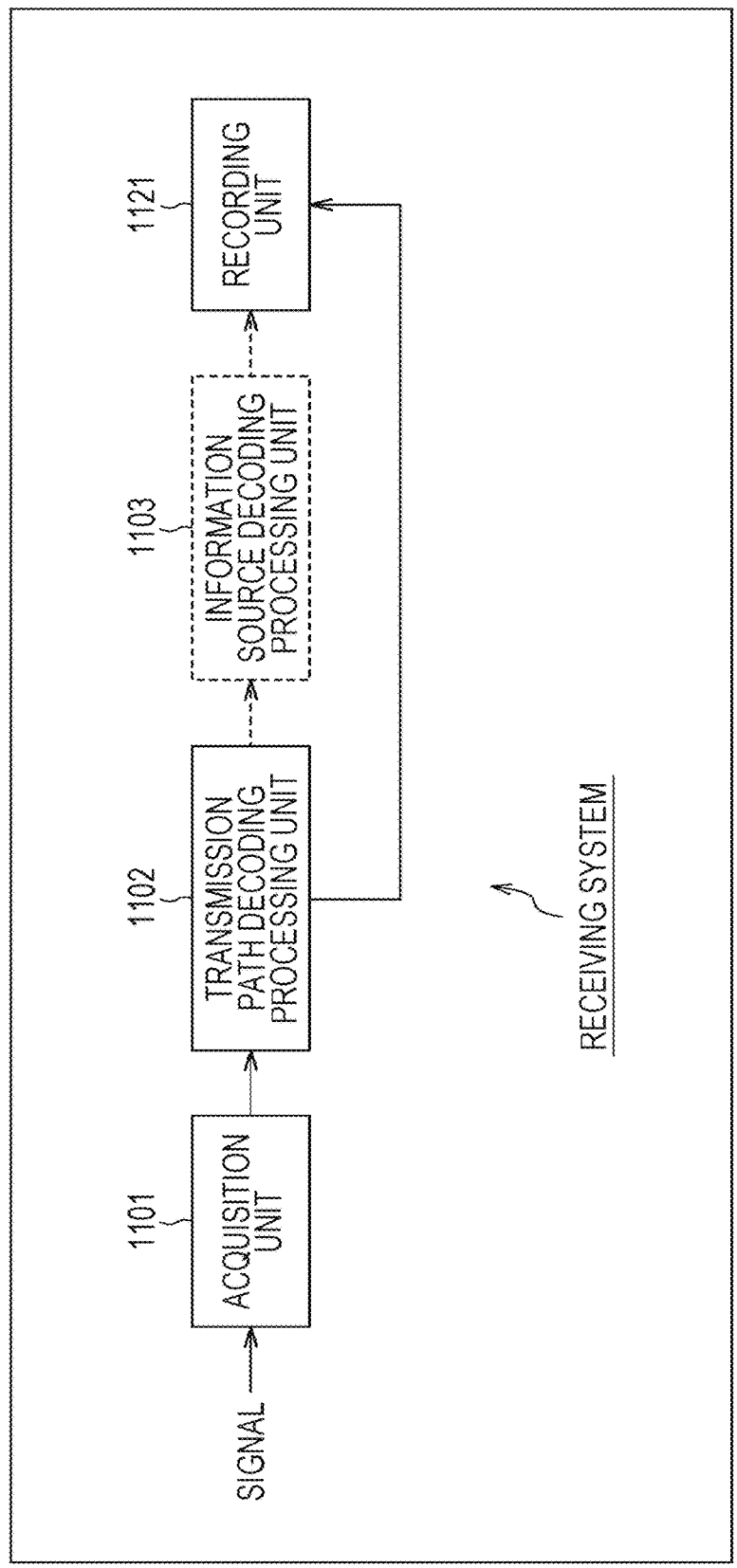
FIG. 139 is a block diagram illustrating a third example of the structure of the receiving system to which the receiving device 12 can be applied.

FIG. 139 is a block diagram illustrating a third example of the structure of the receiving system to which the receiving device 12 can be applied.

In FIG. 139, portions corresponding to those illustrated in FIG. 137 are denoted by the same reference numerals and the description thereof will be appropriately omitted below.

A receiving system illustrated in FIG. 139 is similar to the receiving system illustrated in FIG. 137 in that it includes the acquisition unit 1101 and the transmission path decoding processing unit 1102.

However, the receiving system illustrated in FIG. 139 differs from the receiving system illustrated in FIG. 137 in that it does not include the information source decoding processing unit 1103 and newly includes a recording unit 1121.

The recording unit 1121 records (stores) the signal (for example, a MPEG TS packet) output by the transmission path decoding processing unit 1102 on a recording (storage) medium, such as an optical disc, a hard disk (magnetic disk), or a flash memory.

The receiving system illustrated in FIG. 139 can be applied to, for example, a recorder which records television broadcasting.

In FIG. 139, the receiving system may include the information source decoding processing unit 1103 and the recording unit 1121 may record a signal which has been subjected to an information source decoding process by the information source decoding processing unit 1103, that is, images or sounds obtained by decoding.

<Embodiment of Computer>

The above-mentioned series of processes may be performed by hardware or software. When the series of processes is performed by software, a program forming the software is installed in, for example, a general-purpose computer.

Figure 140:
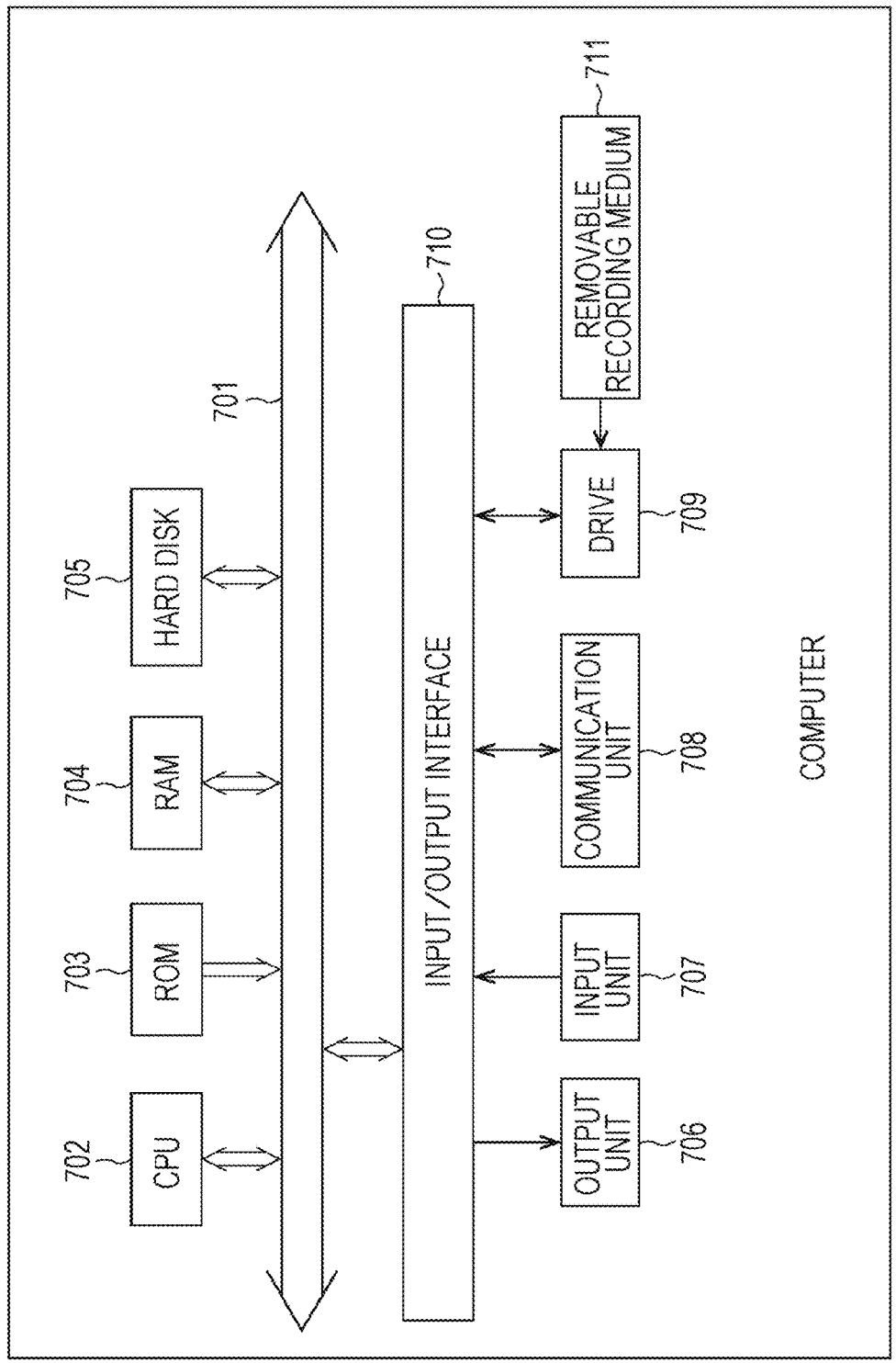
FIG. 140 is a block diagram illustrating an example of the structure of an embodiment of a computer to which the present technology is applied.

FIG. 140 illustrates an example of the structure of an embodiment of the computer in which a program for executing the series of processes is installed.

The program can be recorded in advance on a hard disk 705 or a ROM 703 serving as a recording medium which is provided in the computer.

Alternatively, the program can be temporarily or permanently stored (recorded) in a removable recording medium 711, such as a flexible disk, a compact disc read only memory (CD-ROM), a magneto-optical (MO) disc, a digital versatile disc (DVD), a magnetic disk, or a semiconductor memory. The removable recording medium 711 can be provided as so-called package software.

In addition to being installed in the computer from the removable recording medium 711, the program can be wirelessly transmitted from a download site to the computer through a satellite for digital satellite broadcasting or can be transmitted from the download site to the computer through a network, such as a local area network (LAN) or the Internet, in a wired manner. In the computer, the transmitted program can be received by a communication unit 708 and can be installed in the built-in hard disk 705.

The computer includes a central processing unit (CPU) 702. The CPU 702 is connected to an input/output interface 710 through a bus 701. When a command which is input by the user through an input unit 707 including, for example, a keyboard, a mouse, and a microphone is received through the input/output interface 710, the CPU 702 executes a program stored in the read only memory (ROM) 703 in response to the command. Alternatively, the CPU 702 loads a program which has been stored in the hard disk 705, a program which has been transmitted from a satellite or a network, received by the communication unit 708, and then installed in the hard disk 705, or a program which has been read from the removable recording medium 711 inserted into a drive 709 and then installed in the hard disk 705 to a random access memory (RAM) 704 and executes the program. In this way, the CPU 702 performs the processes corresponding to the above-described flowcharts or the processes performed by the structures of the above-described block diagrams. Then, the CPU 702 outputs the processing result from an output unit 706 including, for example, a liquid crystal display (LCD) or a speaker, or transmits the processing result from the communication unit 708 and records the processing result on the hard disk 705 through the input/output interface 710, if necessary.

In the specification, processing steps for describing a program which causes a computer to perform various types of processes are not necessarily performed in time series in the order described as flowcharts and include processes (for example, parallel processing or processing by an object) which are performed separately or in parallel.

In addition, the program may be processed by one computer or may be distributedly processed by a plurality of computers. Further, the program may be transmitted to a remote computer and then executed by the remote computer.

The embodiment of the present technology is not limited to the above-described embodiments and can be modified in various ways, without departing from the scope and spirit of the present technology.

That is, for example, (the parity check matrix initial value table of) the above-mentioned new LDPC code can be used when the communication path 13 (FIG. 7) is any one of a satellite channel, a terrestrial channel, a cable (wired line), and other channels. Further, the new LDPC code can be used in data transmission other than digital broadcasting.

In addition, the above-mentioned GW pattern can be applied to codes other than the new LDPC code. Furthermore, a modulation method to which the above-mentioned GW pattern is applied is not limited to 16QAM, 64QAM, 256QAM, and 1024QAM.

The effects described in the specification are illustrative. The invention is not limited to the above-mentioned effects and may have other effects.

REFERENCE SIGNS LIST

11 Transmitting device
12 Receiving device
23 Parity interleaver
24 Group-wise interleaver
25 Block interleaver
54 Block deinterleaver 55 Group-wise deinterleaver
111 Mode adaptation/multiplexer
112 Padder
113 BB scrambler
114 BCH encoder
115 LDPC encoder
116 Bit interleaver
117 Mapper
118 Time interleaver
119 SISO/MISO encoder
120 Frequency interleaver
121 BCH encoder
122 LDPC encoder
123 Mapper
124 Frequency interleaver
131 Frame builder/resource allocation unit
132 OFDM generation unit
151 OFDM processing unit
152 Frame management unit
153 Frequency deinterleaver
154 Demapper
155 LDPC decoder
156 BCH decoder
161 Frequency deinterleaver
162 SISO/MISO decoder
163 Time deinterleaver
164 Demapper
165 Bit deinterleaver
166 LDPC decoder
167 BCH decoder
168 BB descrambler
169 Null deletion unit
170 Demultiplexer
300 Edge data storage memory
301 Selector
302 Check node calculation unit
303 Cyclic shift circuit
304 Edge data storage memory
305 Selector
306 Received data memory
307 Variable node calculation unit
308 Cyclic shift circuit
309 Decoding word calculation unit
310 Received data rearrangement unit
311 Decoded data rearrangement unit
601 Coding processing unit
602 Storage unit
611 Coding rate setting unit
612 Initial value table reading unit
613 Parity check matrix generation unit
614 Information bit reading unit
615 Coding parity calculation unit
616 Control unit
701 Bus
702 CPU
703 ROM
704 RAM
705 Hard disk
706 Output unit
707 Input unit
708 Communication unit
709 Drive
710 Input/output interface
711 Removable recording medium
1001 Inverse Reordering unit
1002 Memory
1011 Parity deinterleaver
1101 Acquisition unit
1101 Transmission path decoding processing unit
1103 Information source decoding processing unit
1111 Output unit
1121 Recording unit

The invention claimed is:

1. A method for generating a digital television broadcast signal and for decreasing a signal-to-noise power ratio of the generated digital television broadcast signal, the method comprising:
receiving data to be transmitted in a digital television broadcast signal;
performing low density parity check (LDPC) encoding in an LDPC encoding circuitry, on input bits of the received data according to a parity check matrix of an LDPC code having a code length N of 64800 bits and a coding rate r of 9/15 to generate an LDPC code word,
the LDPC code enabling error correction processing to correct errors generated in a transmission path of the digital television broadcast signal;
the LDPC code word includes information bits and parity bits, the parity bits being processed by a receiving device to recover information bits corrupted by transmission path errors,
the parity check matrix includes an information matrix portion corresponding to the information bits and a parity matrix portion corresponding to the parity bits,
the information matrix portion is represented by a parity check matrix initial value table, and
the parity check matrix initial value table, having each row indicating positions of elements '1' in corresponding 360 columns of the information matrix portion corresponding to a subset of information bits used in calculating the parity bits in the LDPC encoding, is as follows
113 1557 3316 5680 6241 10407 13404 13947 14040 14353 15522 15698 16079 17363 19374 19543 20530 22833 24339
271 1361 6236 7006 7307 7333 12768 15441 15568 17923 18341 20321 21502 22023 23938 25351 25590 25876 25910
73 605 872 4008 6279 7653 10346 10799 12482 12935 13604 15909 16526 19782 20506 22804 23629 24859 25600
1445 1690 4304 4851 8919 9176 9252 13783 16076 16675 17274 18806 18882 20819 21958 22451 23869 23999 24177
1290 2337 5661 6371 8996 10102 10941 11360 12242 14918 16808 20571 23374 24046 25045 25060 25662 25783 25913
28 42 1926 3421 3503 8558 9453 10168 15820 17473 19571 9685 22790 23336 23367 23890 24061 25657 25680
0 1709 4041 4932 5968 7123 8430 9564 10596 11026 14761 19484 20762 20858 23803 24016 24795 25853 25863
29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915

7520 7690 8855 9183 14654 16695 17121 17854 18083 18428 19633 20470 20736 21720 22335 23273 25083 25293 25403

48 58 410 1299 3786 10668 18523 18963 20864 22106 22308 23033 23107 23128 23990 24286 24409 24595 25802

12 51 3894 6539 8276 10885 11644 12777 13427 14039 15954 17078 19053 20537 22863 24521 25087 25463 25838

3509 8748 9581 11509 15884 16230 17583 19264 20900 21001 21310 22547 22756 22959 24768 24814 25594 25626 25880

21 29 69 1448 2386 4601 6626 6667 10242 13141 13852 14137 18640 19951 22449 23454 24431 25512 25814

18 53 7890 9934 10063 16728 19040 19809 20825 21522 21800 23582 24556 25031 25547 25562 25733 25789 25906

4096 4582 5766 5894 6517 10027 12182 13247 15207 17041 18958 20133 20503 22228 24332 24613 25689 25855 25883

0 25 819 5539 7076 7536 7695 9532 13668 15051 17683 19665 20253 21996 24136 24890 25758 25784 25807

34 40 44 4215 6076 7427 7965 8777 11017 15593 19542 22202 22973 23397 23423 24418 24873 25107 25644

1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20375 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 256622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609;

group-wise interleaving, by interleaving circuitry, the LDPC code word in units of bit groups of 360 bits to generate a group-wise interleaved LDPC code word;

wherein, in the group-wise interleaving, when an (i+1)-th bit group from a head of the generated LDPC code word is indicated by a bit group i, a sequence of bit groups 0 to 179 of the generated LDPC code word of 64800 bits is interleaved into a following sequence of bit groups

0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141,

143, 145, 147, 149, 151, 153, 155, 157, 159, 161, 163, 165, 167, 169, 171, 173, 175, 177, 179;

mapping the group-wise interleaved LDPC code word to any one of 4 signal points in a modulation scheme in units of 2 bits; and transmitting, by a broadcast transmitter, the digital television broadcast signal including the mapped group-wise interleaved LDPC code word in units of 2 bits.

2. The method according to claim 1, wherein the LDPC encoding is performed in accordance with an Advanced Television Systems Committee (ATSC) 3.0 standard.

3. A receiving device for use in an environment where a signal-to-noise power ratio of a received digital television broadcast signal can he reduced, the receiving device comprising:

a receiver configured to receive a digital television broadcast signal including a mapped group-wise interleaved low density parity check (LDPC) code word; and circuitry configured to:
  process the mapped group-wise interleaved LDPC code word to obtain a group-wise interleaved LDPC code word, wherein each unit of 2 bits of the group-wise interleaved LDPC code word is mapped to one of 4 signal points of a modulation scheme,
  process the group-wise interleaved LDPC code word in units of bit groups of 360 bits to obtain an LDPC code word,
  decode the LDPC code word, and
  process the decoded LDPC code word for presentation of the digital television broadcast signal, wherein input bits of data to be transmitted in the digital television broadcast signal are LDPC encoded according to a parity check matrix initial value table of an LDPC code having a code length N of 64800 bits and an encoding rate r of 9/15 to generate the LDPC code word, the LDPC code enabling error correction processing to correct errors generated in a transmission path of the digital television broadcast signal, the LDPC code word includes information bits and parity bits, the parity bits being processed by the receiving device to recover information bits corrupted by transmission path errors, the parity check matrix initial value table of the LDPC code according to which the input bits are LDPC encoded is as follows 113 1557 3316 5680 6241 10407 13404 13947 14040 14353 15522 15698 16079 17363 19374 19543 20530 22833 24339
271 1361 6236 7006 7307 7333 12768 15441 15568 17923 18341 20321 21502 22023 23938 25351 25590 25876 25910
73 605 872 4008 6279 7653 10346 10799 12482 12935 13604 15909 16526 19782 20506 22804 23629 24859 25600
1445 1690 4304 4851 8919 9176 9252 13783 16076 16675 17274 18806 18882 20819 21958 22451 23869 23999 24177
1290 2337 5661 6371 8996 10102 10941 11360 12242 14918 16808 20571 23374 24046 25045 25060 25662 25783 25913
28 42 1926 3421 3503 8558 9453 10168 15820 17473 19571 19685 22790 23336 23367 23890 24061 25657 25680
0 1709 4041 4932 5968 7123 8430 9564 10596 11026 14761 19484 20762 20858 23803 24016 24795 25853 25863
29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915
7520 7690 8855 9183 14654 16695 17121 17854 18083 18428 19633 20470 20736 21720 22335 23273 25083 25293 25403
48 58 410 1299 3786 10668 18523 18963 20864 22106 22308 23033 23107 23128 23990 24286 24409 24595 25802
12 51 3894 6539 8276 10885 11644 12777 13427 14039 15954 17078 19053 20537 22863 24521 25087 25463 25838
3509 8748 9581 11509 15884 16230 17583 19264 20900 21001 21310 22547 22756 22959 24768 24814 25594 25626 25880
21 29 69 1448 2386 4601 6626 6667 10242 13141 13852 14137 18640 19951 22449 23454 24431 25512 25814
18 53 7890 9934 10063 16728 19040 19809 20825 21522 21800 23582 24556 25031 25547 25562 25733 25789 25906
4096 4582 5766 5894 6517 10027 12182 13247 15207 17041 18958 20133 20503 22228 24332 24613 25689 25855 25883
0 25 819 5539 7076 7536 7695 9532 13668 15051 17683 19665 20253 21996 24136 24890 25758 25784 25807
34 40 44 4215 6076 7427 7965 8777 11017 15593 19542 22202 22973 23397 23423 24418 24873 25107 25644
1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164

```
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25829
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609,
``` the LDPC code word is group-wise interleaved in units of bit groups of 360 bits to generate the group-wise interleaved LDPC code word such that when an (i+1)-th bit group from a head of the generated LDPC code word is indicated by a bit group i, a sequence of bit groups 0 to 179 of the generated LDPC code word of 64800 bits is interleaved into a following sequence of bit groups 0, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126 128, 130, 132, 134, 136, 138, 140, 142, 144, 146, 148, 150, 152, 154, 156, 158, 160, 162, 164, 166, 168, 170, 172, 174, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, 179; and the group-wise interleaved LDPC code word is mapped to one of the 4 signal points in the modulation scheme in units of 2 bits.

4. The receiving device according to claim 3, wherein the LDPC encoding is performed in accordance with an Advanced Television Systems Committee (ATSC) 3.0 standard.

5. The receiving device according to claim 3, wherein the LDPC code word is encoded according to a parity check matrix of the LDPC code, the parity check matrix includes an information matrix part corresponding to the information bits and a parity matrix part corresponding to the parity bits, the information matrix part is represented by the parity check matrix initial value table, and each row of the parity check matrix initial value table indicating positions of elements '1' in corresponding 360 columns of an information matrix portion corresponding to a subset of information bits used in calculating the parity bits in the LDPC encoding.

6. A method for use in an environment ere a signal-to-noise power ratio of a digital television broadcast signal can be reduced, the method comprising:

receiving a digital television broadcast signal including a mapped group-wise interleaved low density parity check (LDPC) code word;

processing the mapped group-wise interleaved LDPC code word to obtain a group-wise interleaved LDPC code word, wherein each unit of 2 bits of the group-wise interleaved LDPC code word is mapped to one of 4 signal points of a modulation scheme;

processing the group-wise interleaved LDPC code word in units of bit groups of 360 bits to obtain an LDPC code word;

decoding, by decoding circuitry, the LDPC code word; and processing the decoded LDPC code word for presentation of the digital television broadcast signal, wherein input bits of data to be transmitted in the digital television broadcast signal are LDPC encoded according to a parity check matrix initial value table of an LDPC code having a code length of N of 64800 bits and an encoding rate r of 9/15 to generate the LDPC code word, the LDPC code enabling error correction processing to correct errors generated in a transmission path of the digital television broadcast signal, the LDPC code word includes information bits and parity bits, the parity bits being processed by a receiving device to recover information bits corrupted by transmission path errors, the parity check matrix initial value table of the LDPC code according to which the input bits are LDPC encoded is as follows

```
113 1557 3316 5680 6241 10407 13404 13947 14040
    14353 15522 15698 16079 17363 19374 19543 20530
    22833 24339
```

271 1361 6236 7006 7307 7333 12768 15441 15568
  17923 18341 20321 21502 22023 23938 25351 25590
  25876 25910
73 605 872 4008 6279 7653 10346 10799 12482 12935
  13604 15909 16526 19782 20506 22804 23629 24859
  25600
1445 1690 4304 4851 8919 9176 9252 13783 16076
  16675 17274 18806 18882 20819 21958 22451 23869
  23999 24177
1290 2337 5661 6371 8996 10102 10941 11360 12242
  14918 16808 20571 23374 24046 25045 25060 25662
  25783 25913
28 42 1926 3421 3503 8558 9453 10168 15820 17473
  19571 19685 22790 23336 23367 23890 24061 25657
  25680
0 1709 4041 4932 5968 7123 8430 9564 10596 11026
  14761 19484 20762 20858 23803 24016 24795 25853
  25863
29 1625 6500 6609 16831 18517 18568 18738 19387
  20159 20544 21603 21941 24137 24269 24416 24803
  25154 25395
55 66 871 3700 11426 13221 15001 16367 17601 18380
  22796 23488 23938 25476 25635 25678 25807 25857
  25872
1 19 5958 8548 8860 11489 16845 18450 18469 19496
  20190 23173 25262 25566 25668 25679 25858 25888
  25915
7520 7690 8855 9183 14654 16695 17121 17854 18083
  18428 19633 20470 20736 21720 22335 23273 25083
  25293 25403
48 58 410 1299 3786 10668 18523 18963 20864 22106
  22308 23033 23107 23128 23990 24286 24409 24595
  25802
12 51 3894 6539 8276 10885 11644 12777 13427 14039
  15954 17078 19053 20537 22863 24521 25087 25463
  25838
3509 8748 9581 11509 15884 16230 17583 19264 20900
  21001 21310 22547 22756 22959 24768 24814 25594
  25626 25880
21 29 69 1448 2386 4601 6626 6667 10242 13141 13852
  14137 18640 19951 22449 23454 24431 25512 25814
18 53 7890 9934 10063 16728 19040 19809 20825 21522
  21800 23582 24556 25031 25547 25562 25733 25789
  25906
4096 4582 5766 5894 6517 10027 12182 13247 15207
  17041 18958 20133 20503 22228 24332 24613 25689
  25855 25883
0 25 819 5539 7076 7536 7695 9532 13668 15051 17683
  19665 20253 21996 24136 24890 25758 25784 25807
34 40 44 4215 6076 7427 7965 8777 11017 15593 19542
  22202 22973 23397 23423 24418 24873 25107 25644
1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955

212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670

47 22512 25472
8867 24704 25279
6742 21623 22745
147 9948 24178
8522 24261 24307
19202 22406 24609, the LDPC code word is group-wise interleaved in units of bit groups of 360 bits to generate the group-wise interleaved LDPC code word such that when an (i+1)-th bit group from a head of the generated LDPC code word is indicated by a bit group i, a sequence of bit groups 0 to 179 of the generated LDPC code word of 64800 bits is interleaved into a following sequence of bit groups 0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, 179; and the group-wise interleaved LDPC code word is mapped to one of the 8 signal points in the modulation scheme in units of 2 bits.

7. The method according to claim 6, wherein the LDPC encoding is performed in accordance with an Advanced Television Systems Committee (ATSC) 3.0 standard.

8. The method according to claim 6, wherein the LDPC code word is encoded according to a parity check matrix of the LDPC code, the parity check matrix includes an information matrix part corresponding to the information bits and a parity matrix part corresponding to the parity bits, the information matrix part is represented by the parity check matrix initial value table, and each row of the parity check matrix initial value table indicating positions of elements '1' in corresponding 360 columns of an information matrix portion corresponding to a subset of information bits used in calculating the parity bits in the LDPC encoding.

* * * * *